(12) United States Patent
Kimura et al.

(10) Patent No.: US 8,664,981 B2
(45) Date of Patent: Mar. 4, 2014

(54) SEMICONDUCTOR DEVICE AND ELECTRONIC DEVICE INCLUDING SEMICONDUCTOR DEVICE

(71) Applicant: Semiconductor Energy Laboratory Co., Ltd., Atsugi (JP)

(72) Inventors: Hajime Kimura, Kanagawa (JP); Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/661,165

(22) Filed: Oct. 26, 2012

(65) Prior Publication Data

US 2013/0043911 A1  Feb. 21, 2013

Related U.S. Application Data

(62) Division of application No. 12/730,976, filed on Mar. 24, 2010, now Pat. No. 8,319,528.

(30) Foreign Application Priority Data

Mar. 26, 2009  (JP) .................................. 2009-077203

(51) Int. Cl.
*H03K 3/00* (2006.01)
(52) U.S. Cl.
USPC ............................. 327/108; 326/87; 345/100
(58) Field of Classification Search
USPC ............................................. 327/108; 326/87
See application file for complete search history.

(56) References Cited

U.S. PATENT DOCUMENTS

| | | | |
|---|---|---|---|
| 5,410,583 | A | 4/1995 | Weisbrod et al. |
| 5,517,542 | A | 5/1996 | Huq |
| 5,812,284 | A | 9/1998 | Mizutani et al. |
| 6,064,713 | A | 5/2000 | Lebrun et al. |
| 6,300,928 | B1 | 10/2001 | Kim |
| 6,426,743 | B1 | 7/2002 | Yeo et al. |
| 6,556,646 | B1 | 4/2003 | Yeo et al. |

(Continued)

FOREIGN PATENT DOCUMENTS

| | | | |
|---|---|---|---|
| JP | 2005-050502 A | 2/2005 | |
| JP | 2006-024350 A | 1/2006 | |

(Continued)

OTHER PUBLICATIONS

Jang et al.; "Integrated Gate Driver Circuit Using a-Si TFT with Dual Pull-down Structure"; IDW '04 : Proceedings of the 11th International Display Workshops; Dec. 8, 2004; pp. 333-336.

*Primary Examiner* — Kenneth B. Wells
(74) *Attorney, Agent, or Firm* — Fish & Richardson P.C.

(57) ABSTRACT

It is an object to suppress deterioration in characteristics of a transistor in a driver circuit. A driver circuit includes a first transistor, a second transistor including a gate and one of a source and a drain to which a second signal is inputted, a third transistor whose gate is electrically connected to one of a source and a drain of the first transistor and which controls whether a voltage state of an output signal is set or not by being turned on/off, and a fourth transistor whose gate is electrically connected to the other of the source and the drain of the second transistor and which controls whether a voltage state of an output signal is set or not by being turned on/off.

18 Claims, 51 Drawing Sheets

(56) References Cited

U.S. PATENT DOCUMENTS

| | | |
|---|---|---|
| 6,690,347 B2 | 2/2004 | Jeon et al. |
| 6,845,140 B2 | 1/2005 | Moon et al. |
| 6,876,353 B2 | 4/2005 | Morosawa et al. |
| 7,050,036 B2 | 5/2006 | Kim et al. |
| 7,268,756 B2 | 9/2007 | Koyama et al. |
| 7,443,944 B2 | 10/2008 | Tobita et al. |
| 7,486,269 B2 | 2/2009 | Moon |
| 7,492,853 B2 | 2/2009 | Tobita |
| 7,528,820 B2 | 5/2009 | Yoon et al. |
| 7,633,477 B2 | 12/2009 | Jang et al. |
| 7,800,576 B2 | 9/2010 | Jinta |
| 7,936,331 B2 | 5/2011 | Uh et al. |
| 8,031,160 B2 | 10/2011 | Chen et al. |
| 8,319,528 B2 * | 11/2012 | Kimura et al. ............... 327/108 |
| 2004/0090412 A1 | 5/2004 | Jeon et al. |
| 2006/0001637 A1 | 1/2006 | Pak et al. |
| 2007/0040792 A1 | 2/2007 | Kwag et al. |
| 2007/0070020 A1 | 3/2007 | Edo et al. |
| 2007/0079191 A1 | 4/2007 | Shin |
| 2007/0086558 A1 | 4/2007 | Wei et al. |
| 2007/0247932 A1 | 10/2007 | Tobita |
| 2007/0274433 A1 | 11/2007 | Tobita |
| 2010/0026619 A1 | 2/2010 | Umezaki |
| 2010/0245307 A1 | 9/2010 | Kimura et al. |
| 2010/0245335 A1 | 9/2010 | Kimura et al. |

FOREIGN PATENT DOCUMENTS

| | | | |
|---|---|---|---|
| JP | 2006-189762 A | 7/2006 |
| JP | 2006-351171 A | 12/2006 |
| JP | 2007-250052 A | 9/2007 |

* cited by examiner

FIG. 22A
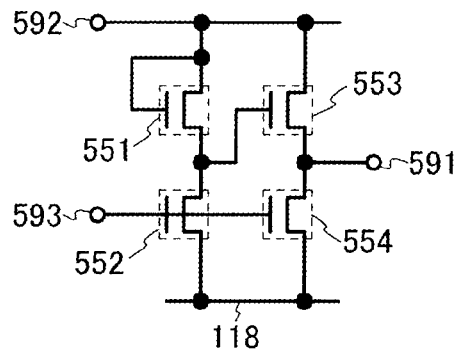
FIG. 22B
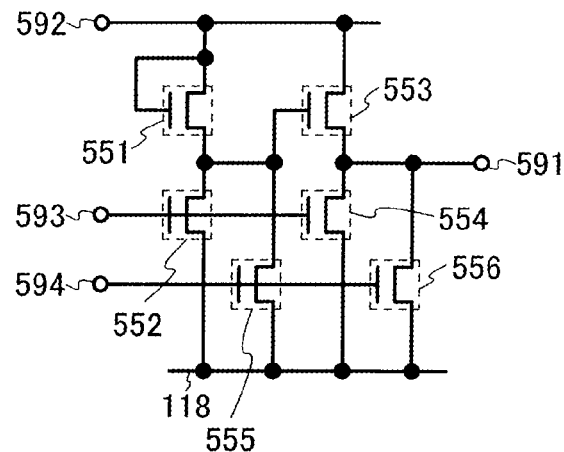
FIG. 22C
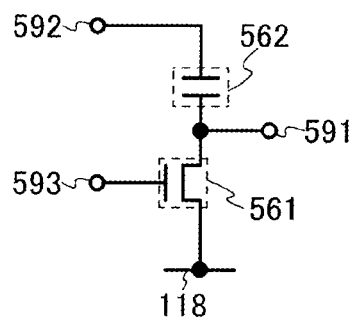
FIG. 22D
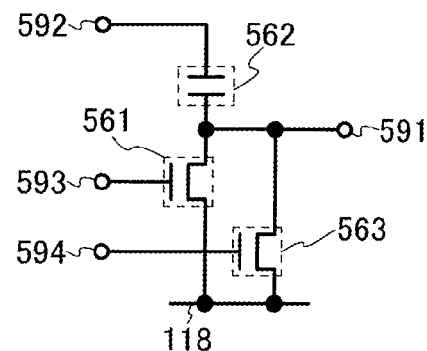
FIG. 22E
FIG. 22F
FIG. 22G
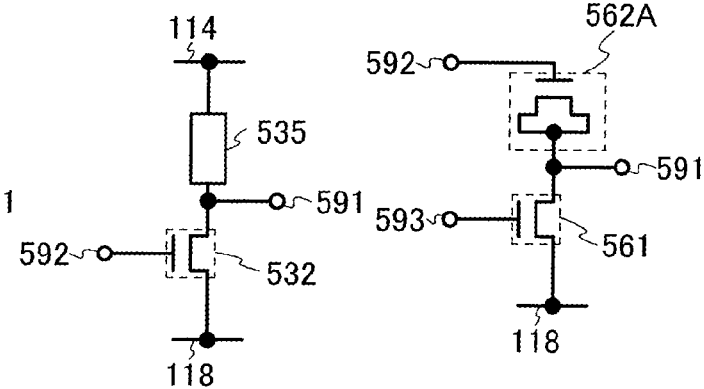

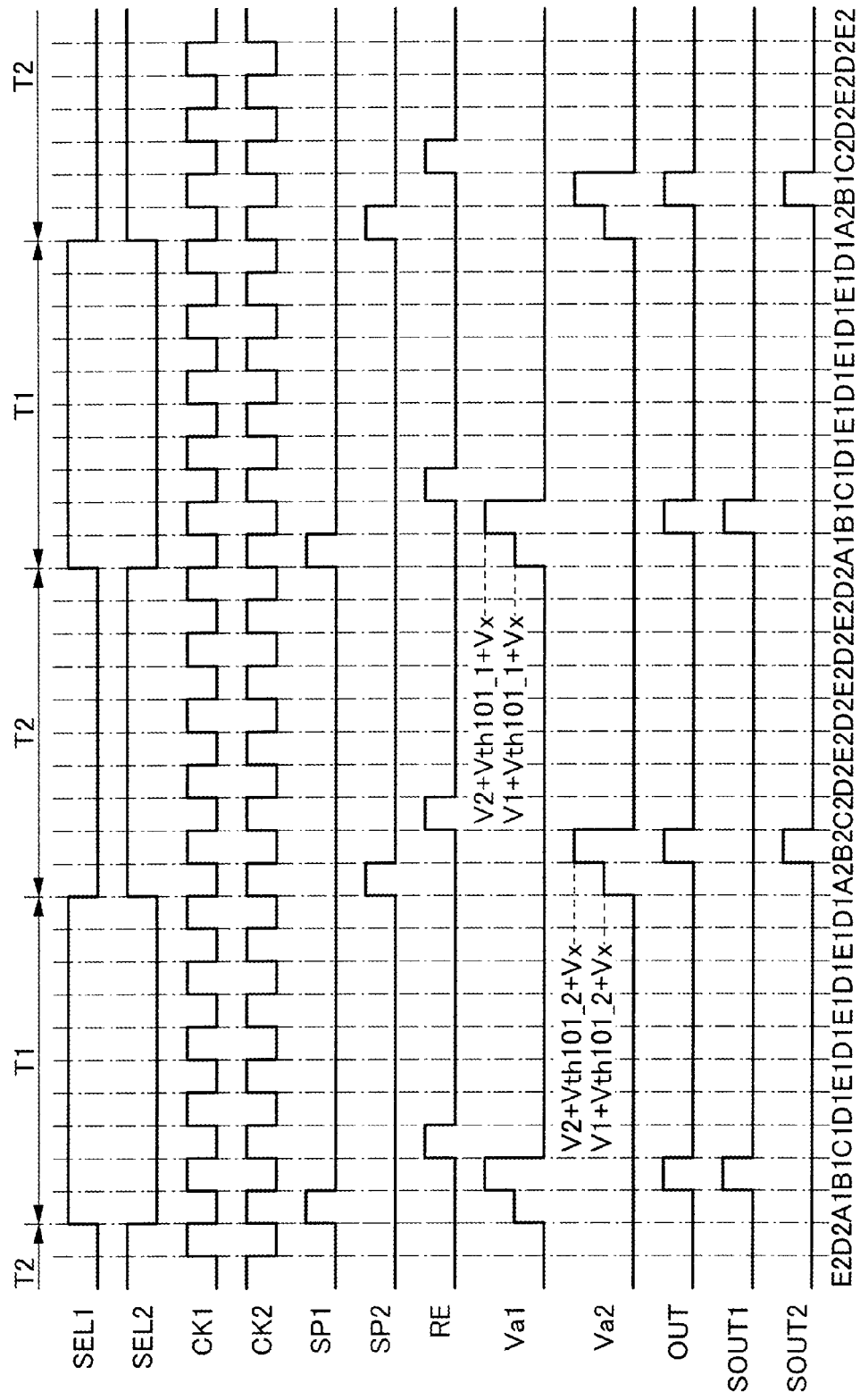

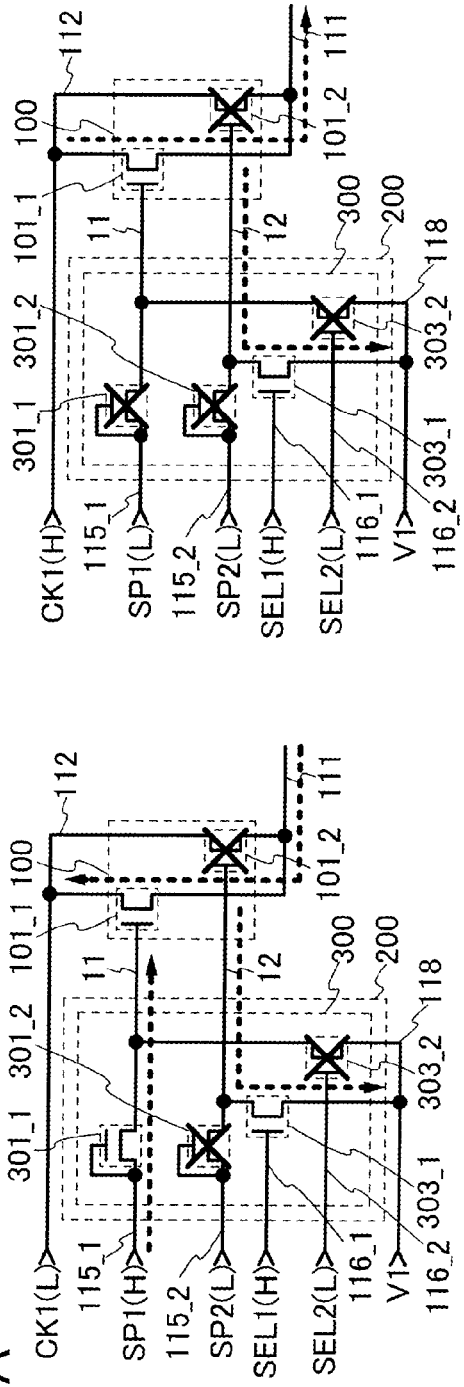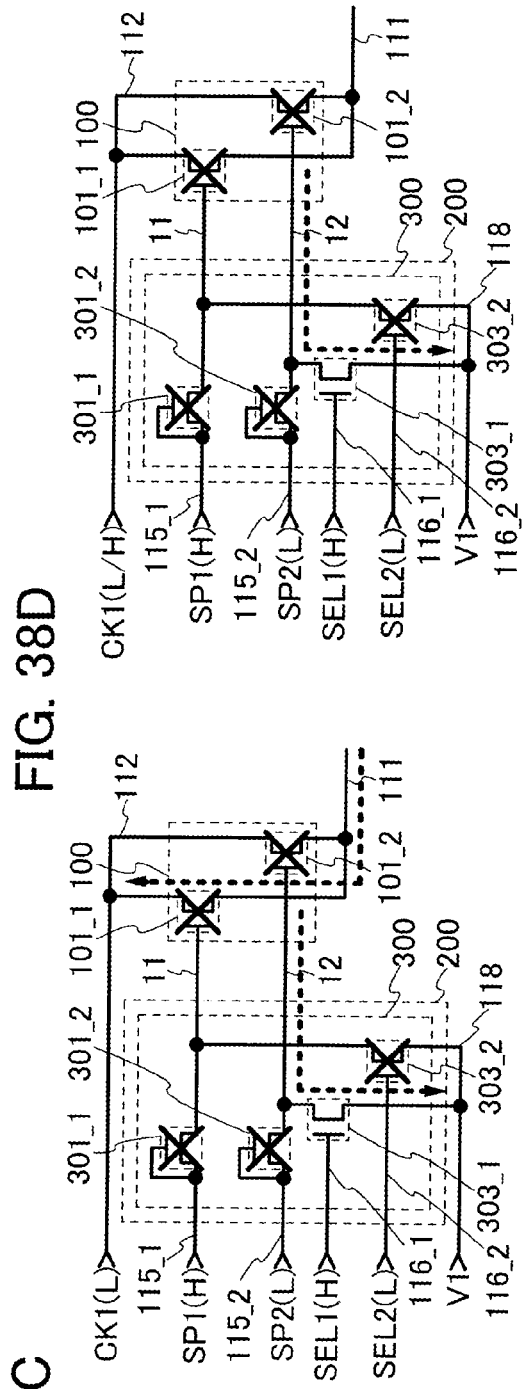

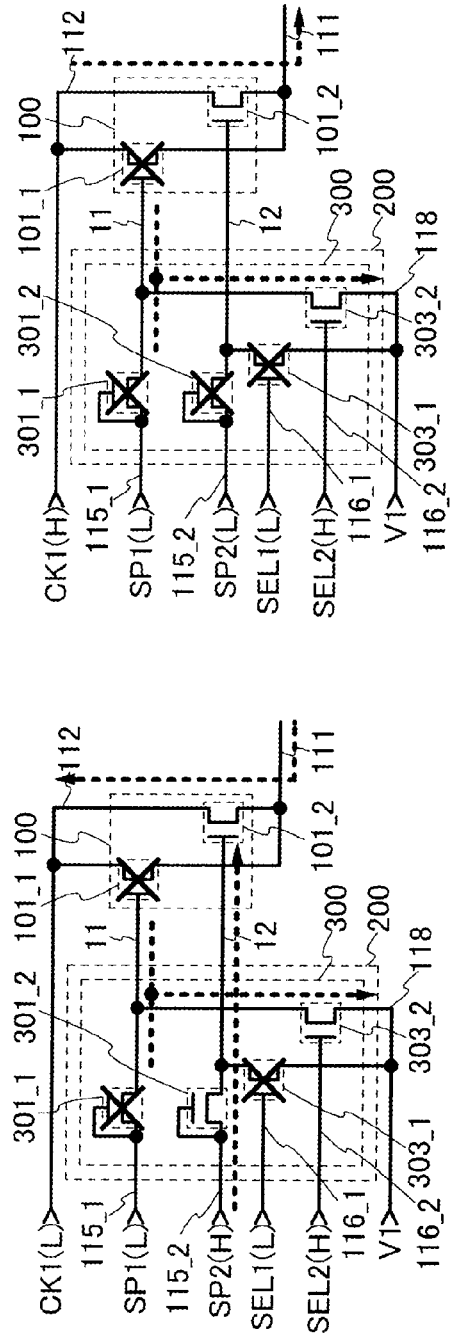
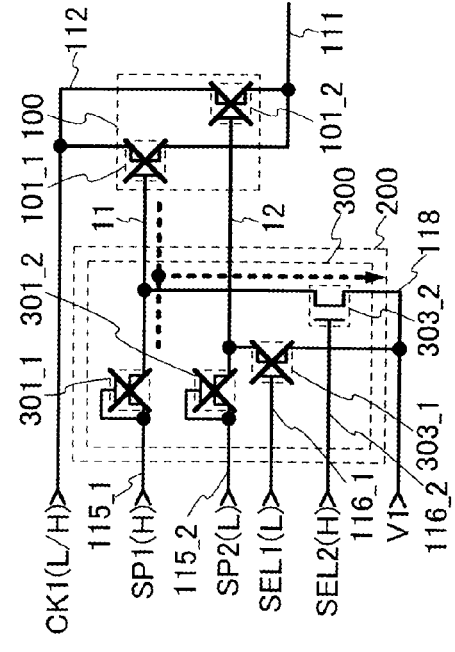
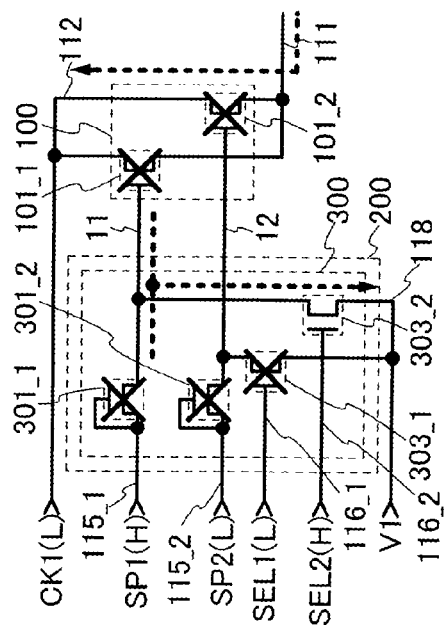
FIG. 39A  FIG. 39B  FIG. 39C  FIG. 39D

SEMICONDUCTOR DEVICE AND ELECTRONIC DEVICE INCLUDING SEMICONDUCTOR DEVICE

CROSS-REFERENCE TO RELATED APPLICATIONS

This application is a divisional of U.S. application. Ser. No. 12/730,976, filed Mar. 24, 2010, now U.S. Pat. No. 8,319,528, which claims the benefit of a foreign priority application filed in Japan as Serial No. 2009-077203 on Mar. 26, 2009, both of which are incorporated by reference.

BACKGROUND OF THE INVENTION

1. Field of the Invention

The present invention relates to a semiconductor device, a display device, a liquid crystal display device, a light-emitting device, a method for driving these devices, and a method for manufacturing these devices. The present invention particularly relates to a semiconductor device, a display device, a liquid crystal display device, and a light-emitting device which include a driver circuit formed over the same substrate as a pixel portion, and a method for driving these devices. Further, the present invention relates to an electronic device including the semiconductor device, the display device, the liquid crystal display device, and the light emitting device.

2. Description of the Related Art

In recent years, with the increase of large display devices such as liquid crystal televisions, display devices have been actively developed. In particular, a technique for forming a driver circuit such as a gate driver over the same substrate as a pixel portion by using transistors including a non-single-crystal semiconductor has been actively developed because the technique greatly contributes to reduction in cost and improvement in reliability.

In a transistor including a non-single-crystal semiconductor, degradation such as change in threshold voltage or reduction in mobility occurs. As such degradation of the transistor progresses, it becomes difficult to operate a driver circuit and incapable of displaying images. Patent Documents 1 and 2, and Non-patent Document 1 each disclose a shift register in which degradation of transistors (hereinafter, also referred to as a pull-down transistor) which include a function of maintaining an output signal of a flip flop in the Low level or a function of decrease the output signal to a Low level can be suppressed. In these documents, two pull-down transistors are used. The two pull-down transistors are connected between an output terminal of a flip flop and a wiring to which low power supply voltage (also referred to as a voltage Vss or negative power supply) is supplied. Moreover, one pull-down transistor and the other one pull-down transistor are alternately turned on (also referred to as an on state). Accordingly, the time during which the each pull-down transistor is on is reduced, so that degradation of characteristics of the one pull-down transistors can be suppressed.

REFERENCE

Patent Document

Patent Document 1: Japanese Published Patent Application No. 2005-050502
Patent Document 2: Japanese Published Patent Application No. 2006-024350

Non-Patent Document

Non Patent Document 1: Yong Ho Jang et al., "Integrated Gate Driver Circuit Using a-Si TFT with Dual Pull-down Structure", Proceedings of The 11th International Display Workshops 2004, pp. 333-336

SUMMARY OF THE INVENTION

In a structure of a conventional device, a voltage of a gate of a transistor (hereinafter, also referred to as a pull-up transistor) for controlling an output signal in a High level is higher than positive power supply voltage, or a voltage of a clock signal in a High level in some cases. Therefore, a voltage having a large value is applied to a pull-up transistor in some cases. Alternatively, a voltage having a large value is applied to a transistor connected to a gate of a pull-up transistor in some cases. In addition, the channel width of a transistor is sometimes made larger in order to operate a shift register even when characteristics of the transistor deteriorate. When the channel width of a transistor is larger, a gate and a source or a drain of the transistor are likely to be short-circuited. Moreover, when the channel width of a transistor is larger, parasitic capacitance of transistors included in the shift register may be increased in some cases.

An object of one embodiment of the present invention is as follows: to suppress degradation of characteristics of a transistor, to reduce the channel width of a transistor, to suppress deterioration in characteristics of a pull-up transistor, to reduce the channel width of a pull-up transistor, to increase the amplitude of an output signal, to make a time during which a transistor included in a pixel is on longer, to prevent a shortage of a writing of a pixel, to shorten falling time of an output signal, to shorten rising time of an output signal, to prevent a video signal for a pixel which belongs to a row from being written to another pixel which belongs to a different row, to reduce variation in falling time of an output signal of a driver circuit, to uniform feedthrough in pixel transistors, to reduce crosstalk, to reduce the layout area, to reduce the size of the frame of a display device, to realize higher definition of a display device, to increase the yield, to reduce manufacturing costs, to reduce distortion of an output signal, to reduce delay of an output signal, to reduce power consumption, to decrease the current supply capability of an external circuit, or to reduce the size of an external circuit or the size of a display device including the external circuit. Note that the description of these objects does not preclude the existence of other objects. Further, one embodiment of the present invention does not necessarily achieve all the above objects.

An embodiment of the present invention is a semiconductor device including a first transistor, a second transistor, a third transistor, and a fourth transistor. The first to fourth transistors each include a gate, a source, and a drain. A first signal is inputted to the gate and one of the source and the drain of the first transistor. A second signal is inputted to the gate and one of the source and the drain of the second transistor. The gate of the third transistor is electrically connected to the other of the source and the drain of the first transistor. The third transistor controls whether a voltage state of the output signal is set or not by being turned on and off. The gate of the fourth transistor is electrically connected to the other of the source and the drain of the second transistor. The fourth transistor controls whether a voltage state of the output signal is set or not by being turned on and off.

An embodiment of the present invention is a semiconductor device including a first wiring, a second wiring, a third wiring, a fourth wiring, a first transistor, a second transistor, a third transistor, and a fourth transistor. A first input signal is inputted to the first wiring. A second input signal is inputted to the second wiring. A third input signal is inputted to the third wiring. The first to fourth transistors each include a gate, a source, and a drain. The gate and one of the source and the drain of the first transistor are electrically connected to the first wiring. The gate and one of the source and the drain of the second transistor are electrically connected to the second wiring. The gate of the third transistor is electrically connected to the other of the source and the drain of the first transistor. One of the source and, the drain of the third transistor is electrically connected to the third wiring. The gate of the fourth transistor is electrically connected to the other of the source and the drain of the second transistor. One of the source and the drain of the fourth transistor is electrically connected to the third wiring. The fourth wiring is electrically connected to the other of the source and the drain of the third transistor and the other of the source and the drain of the fourth transistor. A voltage which is given to the fourth wiring is a voltage of an output signal.

An embodiment of the present invention is a semiconductor device including a first wiring, a second wiring, a third wiring, a fourth wiring, a fifth wiring, a first transistor, a second transistor, a third transistor, and a fourth transistor. A first input signal is inputted to the first wiring. A second input signal is inputted to the second wiring. A third input signal is inputted to the third wiring. A fourth input signal is inputted to the fourth wiring. The first to fourth transistors each include a gate, a source, and a drain. The gate and one of the source and the drain of the first transistor are electrically connected to the first wiring. The gate and one of the source6 and the drain of the second transistor are electrically connected to the second wiring. The gate of the third transistor is electrically connected to the other of the source and the drain of the first transistor. One of the source and the drain of the third transistor are electrically connected to the third wiring. The gate of the fourth transistor is electrically connected to the other of the source and the drain of the second transistor. One of the source and the drain of the fourth transistor is electrically connected to the fourth wiring. The fifth wiring is electrically connected to the other of the source and the drain of the third transistor and the other of the source and the drain of the fourth transistor. A voltage which is given to the fifth wiring is a voltage of an output signal.

An embodiment of the present invention is a semiconductor device including a first wiring, a second wiring, a third wiring, a first transistor, a second transistor, a third transistor, and a fourth transistor. A first input signal is inputted to the first wiring. A second input signal is inputted to the second wiring. The first to fourth transistors each include a gate, a source, and a drain. The gate and one of the source and the drain of the first transistor are electrically connected to the first wiring. The gate and one of the source and the drain of the second transistor are electrically connected to the second wiring. The gate and one of the source and the drain of the third transistor are electrically connected to the other of the source and the drain of the first transistor. The gate and one of the source and the drain of the fourth transistor are electrically connected to the other of the source and the drain of the second transistor. The third wiring is electrically connected to the other of the source and the drain of the third transistor and the other of the source and the drain of the fourth transistor. A voltage which is given to the third wiring is a voltage of an output signal.

Note that, in an embodiment of the present invention, the channel width of the third transistor can be equal to the channel width of the fourth transistor.

Further, in an embodiment of the present invention, the channel width of the first transistor can be smaller than the channel width of the third transistor, and the channel width of the second transistor can be smaller than the channel width of the fourth transistor.

An embodiment of the present invention is a semiconductor device including a first wiring, a second wiring, a third wiring, a first transistor, a second transistor, a first diode, and a second diode. A first input signal is inputted to the first wiring. A second input signal is inputted to the second wiring. The first and second transistors each include a gate, a source, and a drain. The gate and one of the source and the drain of the first transistor are electrically connected to the first wiring. The gate and one of the source and the drain of the second transistor are electrically connected to the second wiring. The first and second diodes each include a positive electrode and a negative electrode. The positive electrode of the first diode is electrically connected to the other of the source and the drain of the first transistor. The positive electrode of the second diode is electrically connected to the other of the source and the drain of the second transistor. The third wiring is electrically connected to the negative electrode of the first diode and the negative electrode of the second diode. A voltage which is given to the third wiring is a voltage of an output signal.

Further, in an embodiment of the present invention, the channel width of the first transistor can be equal to the channel width of the second transistor.

An embodiment of the present invention is an electronic device including a semiconductor device described in any one of the above and an operation switch controlling an operation of the semiconductor device.

An embodiment of the present invention includes a first transistor, a second transistor, a first switch, and a second switch. The first and second transistors each include a gate, a source, and a drain. A first signal is inputted to the gate and one of the source and the drain of the first transistor. A second signal is inputted to the gate and one of the source and the drain of the second transistor. The first switch and the second switch are switches connected to each other in parallel. One of the switches control whether a voltage state of an output signal is set or not by being turned on and off in accordance with the first input signal. The other of the switches controls whether a voltage state of an output signal is set or not by being turned on and off in accordance with the second input signal. One of the switches is on when the other of the switches is off; and one of the switches is off when the other of the switches is off.

An embodiment of the present invention is a semiconductor device including a first transistor, a second transistor, a first switch, and a second switch. The first and second transistors each include a gate, a source, and a drain. A first signal is inputted to the gate and one of the source and the drain of the first transistor. A second signal is inputted to the gate and one of the source and the drain of the second transistor. The first switch and the second switch are switches connected to each other in parallel. One of the switches control whether a voltage state of an output signal is set or not by being turned on and off in accordance with the first input signal. The other of the switches controls whether a voltage state of an output signal is set or not by being turned on and off in accordance with the second input signal. One of the switches is on when the other of the switches is off; and one of the switches is off when the other of the switches is off.

Note that a variety of switches can be used as the switch. For example, an electrical switch or a mechanical switch can be used. That is, any element can be used as long as it can control a current flow, without limitation on a certain element. For example, a transistor (e.g., a bipolar transistor or a MOS transistor), or a diode (e.g., a PN diode, a PIN diode, a Schottky diode, an MIM (metal insulator metal) diode, an MIS (metal insulator semiconductor) diode, or a diode-connected transistor) can be used as the switch. Alternatively, a logic circuit in which such elements are combined can be used as the switch.

An example of a mechanical switch is a switch formed using a MEMS (micro electro mechanical system) technology similarly to a digital micromirror device (DMD). Such a switch includes an electrode which can be moved mechanically, and controls conduction and non-conduction in accordance with movement of the electrode.

Note that a CMOS switch may be used as the switch by using both an n-channel transistor and a p-channel transistor.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be provided between elements having a connection relation illustrated in drawings and texts, without limitation on a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) may be connected between A and B. In the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a voltage level converter circuit such as a power supply circuit (e.g., a dc-dc converter, a step-up dc-dc converter, or a step-down dc-dc converter) or a level shifter circuit for changing a voltage level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is provided between A and B, A and B are functionally connected.

Note that when it is explicitly described that "A and B are electrically connected", the case where A and B are electrically connected (i.e., the case where A and B are connected with another element or another circuit therebetween), the case where A and B are functionally connected (i.e., the case where A and B are functionally connected with another circuit therebetween), and the case where A and B are directly connected (i.e., the case where A and B are connected without another element or another circuit therebetween) are included therein. That is, when it is explicitly described that "A and B are electrically connected", the description is the same as the case where it is explicitly only described that "A and B are connected".

Note that a display element, a display device which is a device including a display element, a light-emitting element, and a light-emitting device which is a device including a light-emitting element can employ a variety of modes and include a variety of elements. For example, a display element, a display device, a light-emitting element, and a light-emitting device can include a display medium whose contrast, luminance, reflectivity, transmittance, or the like changes by electromagnetic action, such as an EL (electroluminescence) element (e.g., an EL element containing organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a digital micromirror device (DMD), or a carbon nanotube. In addition, a display device can be a plasma display or a piezoelectric ceramic display. Note that display devices using an EL element include an EL display; display devices using an electron emitter include a field emission display (FED) and an SED-type (surface-conduction electron-emitter display) flat panel display; display devices using a liquid crystal element include a liquid crystal display (e.g., a transmissive liquid crystal display, a transflective liquid crystal display, a reflective liquid crystal display, a direct-view liquid crystal display, or a projection liquid crystal display); and display devices using electronic ink or an electrophoretic element include electronic paper in their respective categories.

A liquid crystal element is an element that controls transmission or non-transmission of light by an optical modulation action of liquid crystal, and includes a pair of electrodes and liquid crystal. The optical modulation action of liquid crystal is controlled by an electric field (including a lateral electric field, a vertical electric field, and a diagonal electric field) applied to the liquid crystal. The following liquid crystal can be used for a liquid crystal element: nematic liquid crystal, cholesteric liquid crystal, smectic liquid crystal, discotic liquid crystal, thermotropic liquid crystal, lyotropic liquid crystal, low molecular weight liquid crystal, high molecular weight liquid crystal, polymer dispersed liquid crystal (PDLC), ferroelectric liquid crystal, anti-ferroelectric liquid crystal, main chain type liquid crystal, side chain type polymer liquid crystal, plasma addressed liquid crystal (PALC), and banana-shaped liquid crystal. Moreover, the following methods can be used for driving the liquid crystal, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue phase mode. Note that various kinds of liquid crystal elements can be used without limitation on those described above.

As a transistor, a variety of transistors can be used. There is no limitation on the type of transistors. For example, a thin film transistor (TFT) including a non-single-crystal semiconductor film typified by a film made of amorphous silicon, polycrystalline silicon, microcrystalline (also referred to as microcrystal, nanocrystal, or semi-amorphous) silicon, or the like can be used.

Note that by using a catalyst (e.g., nickel) in the case of forming polycrystalline silicon, crystallinity can be further improved and a transistor having excellent electrical characteristics can be formed. Further, by using a catalyst (e.g., nickel) in the case of forming microcrystalline silicon, crystallinity can be further improved and a transistor having excellent electric characteristics can be formed. Note that it is possible to form polycrystalline silicon and microcrystalline silicon without using a catalyst (e.g., nickel).

The crystallinity of silicon is preferably enhanced to polycrystallinity or microcrystallinity in the entire panel, but not limited thereto. The crystallinity of silicon may be improved only in part of the panel.

In addition, a transistor including a compound semiconductor or an oxide semiconductor, such as ZnO, a-InGaZnO, SiGe, GaAs, IZO (indium zinc oxide), ITO (indium tin oxide), SnO, TiO, or AlZnSnO (AZTO) and a thin film transistor or the like obtained by thinning such a compound semiconductor or oxide semiconductor can be used. Note that such a compound semiconductor or oxide semiconductor can be used for not only a channel portion of a transistor but also for other applications. For example, such a compound semiconductor or oxide semiconductor can be used for a resistor, a pixel electrode, or a light-transmitting electrode. Further, since such an element can be formed at the same time as the transistor, the costs can be reduced.

A transistor or the like formed by an inkjet method or a printing method can also be used.

Further, a transistor or the like including an organic semiconductor or a carbon nanotube can be used. Accordingly, such a transistor can be formed using a flexible substrate. A semiconductor device using such a substrate can resist a shock.

In addition, various types of transistors can be used. For example, a MOS transistor, a junction transistor, a bipolar transistor, or the like can be employed.

Further, a MOS transistor, a bipolar transistor, and/or the like may be formed over one substrate.

A transistor can be formed using various types of substrates. The type of a substrate is not limited to a certain type. As the substrate, a semiconductor substrate (a single crystalline substrate (e.g., a silicon substrate)), an SOI substrate, a glass substrate, a quartz substrate, a plastic substrate, a metal substrate, a stainless steel substrate, a substrate including a stainless steel foil, a tungsten substrate, a substrate including a tungsten foil, or a flexible substrate can be used, for example. Examples of the glass substrate are barium borosilicate glass and aluminoborosilicate glass. Examples of the flexible substrate are flexible synthetic resin such as plastics typified by polyethylene terephthalate (PET), polyethylene naphthalate (PEN), and polyethersulfone (PES), and acrylic. Alternatively, an attachment film (formed using polypropylene, polyester, vinyl, polyvinyl fluoride, polyvinyl chloride, or the like), paper including a fibrous material, a base material film (polyester, polyamide, polyimide, an inorganic vapor deposition film, paper, or the like), or the like can be used. Alternatively, the transistor may be formed using one substrate, and then, the transistor may be transferred to another substrate. As a substrate to which the transistor is transferred, a single crystal substrate, an SOT substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. Alternatively, the transistor may be formed using one substrate and the substrate may be thinned by polishing. As a substrate to be polished, a single crystal substrate, an SOI substrate, a glass substrate, a quartz substrate, a plastic substrate, a stainless steel substrate, a substrate including a stainless steel foil, or the like can be used. By using such a substrate, a transistor with excellent properties or low power consumption can be foamed, a device with high durability or high heat resistance can be provided, or reduction in weight or thickness can be achieved.

Note that the structure of a transistor is not limited to a certain structure. For example, a multi-gate structure having two or more gate electrodes can be used.

As another example, a structure where gate electrodes are formed above and below a channel can be used. Note that when the gate electrodes are formed above and below the channel, a structure which is equal to a structure where a plurality of transistors are connected in parallel is provided.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used. Moreover, a structure where a source electrode or a drain electrode overlaps with a channel region (or part thereof) can be used.

Note that a variety of transistors can be used and the transistor can be formed using a variety of substrates. Accordingly, all the circuits which are necessary to realize predetermined functions can be formed using one substrate. For example, all the circuits which are necessary to realize the predetermined functions can be formed using one glass substrate, plastic substrate, single crystal substrate, SOI substrate, or any other substrate. Alternatively, some of the circuits which are necessary to realize the predetermined functions can be formed using one substrate and some of the circuits which are necessary to realize the predetermined functions can be formed using another substrate. That is, not all the circuits which are necessary to realize the predetermined functions need to be formed using one substrate. For example, some of the circuits which are necessary to realize the predetermined functions can be formed by transistors using a glass substrate, some of the circuits which are necessary to realize the predetermined functions can be formed using a single crystal substrate, and an IC chip including transistors formed using the single crystal substrate can be connected to the glass substrate by COG (chip on glass) so that the IC chip is provided over the glass substrate. Alternatively, the IC chip can be connected to the glass substrate by TAB (tape automated bonding) or a printed wiring board.

Note that a transistor may be an element having at least three terminals: a gate, a drain, and a source. The element has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Thus, a region which serves as a source or a drain is not referred to as a source or a drain in some cases. In such a case, one of the source and the drain may be referred to as a first terminal and the other of the source and the drain may be referred to as a second terminal, for example. Alternatively, one of the source and the drain may be referred to as a first electrode and the other of the source and the drain may be referred to as a second electrode. Further alternatively, one of the source and the drain may be referred to as a first region and the other of the source and the drain may be referred to as a second region. Alternatively, one of the source and the drain may be referred to as one of the source and the drain and the other of the source and the drain may be referred to as the other of the source and the drain. In addition, the gate of the transistor may be referred to as a third terminal or a third electrode.

Note that a transistor may be an element having at least three terminals of a base, an emitter, and a collector. In this case also, the emitter and the collector may be referred to as a first terminal and a second terminal, for example. Note that a base can be referred to as a gate. Therefore, a gate, a first terminal, a second terminal can also referred to as a base, one of an emitter and a collector, the other of an emitter and a collector, respectively.

Note that when it is explicitly described that B is formed on or over A, it does not necessarily mean that B is formed in direct contact with A. The description includes the case where A and B are not in direct contact with each other, that is, the case where another object is placed between A and B. Here, each of A and B is an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A; and the case where another layer (e.g., a layer C or a layer D) is formed in direct contact with the layer A, and the layer B is formed in direct contact with the layer C or the layer D. Note that another layer (e.g., the layer C or the layer D) may be a single layer or a plurality of layers.

Similarly, when it is explicitly described that B is formed above A, it does not necessarily mean that B is formed in direct contact with A, and another object may be placed between A and B. Accordingly, the case where a layer B is formed above a layer A includes the case where the layer B is formed in direct contact with the layer A and the case where another layer (e.g., a layer C and a layer D) is formed in direct contact with the layer A and the layer B is formed in direct contact with the layer C or the layer D. Note that another layer (e.g., the layer C or the layer D) may be a single layer or a plurality of layers.

Note that when it is explicitly described that B is formed over, on, or above A, it includes the case where B is formed obliquely over/above A.

Note that the same can be said when it is explicitly described that B is formed below or under A.

Explicit singular forms preferably mean singular forms. However, embodiments of the present invention are not limited thereto, and such singular forms can include plural forms. Similarly, explicit plural forms preferably mean plural forms. However, embodiments of the present invention are not limited thereto, and such plural forms can include singular forms.

Note that the size, the thickness of layers, or regions in diagrams is sometimes exaggerated for simplicity. Therefore, embodiments of the present invention are not limited to such scales.

Note that a diagram schematically illustrates an ideal example, and embodiments of the present invention are not limited to the shape or the value illustrated in the diagram. For example, the following can be included: variation in shape due to a manufacturing technique or dimensional deviation; or variation in signal, a voltage, or current due to noise or difference in timing.

Technical expression are used in order to describe a specific embodiment or the like in many cases, and there are no limitations on expression.

Expression which are not defined (including expression used for science and technology, such as technical expression and academic parlance) can be used as the expression which have a meaning equivalent to a general meaning that an ordinary person skilled in the art understands. It is preferable that the term defined by dictionaries or the like be construed as a consistent meaning with the background of related art.

The expression such as first, second, and third are used for distinguishing various elements, members, regions, layers, and areas from others. Therefore, the expression such as first, second, and third do not limit the number of elements, members, regions, layers, areas, or the like. Further, for example, "first" can be replaced with "second", "third", or the like.

Expression for describing spatial arrangement, such as "over", "above", "under", "below", "laterally", "right", "left", "obliquely", "back", "front", "inside", "outside", and "into" are often used for briefly showing, with reference to a diagram, a relation between an element and another element or between some characteristics and other characteristics. Note that embodiments of the present invention are not limited thereto, and such expression for describing spatial arrangement can indicate not only the direction illustrated in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that embodiments of the present invention are not limited thereto, and "over" can refer to other directions described by "laterally", "right", "left", "obliquely", "back", "front", "inside", "outside", and "into" in addition to the directions described by "over" and "under" because a device in a diagram can be rotated in a variety of directions.

An embodiment of the present invention includes a first transistor and a second transistor. A first terminal of the first transistor is electrically connected to a first wiring. A second terminal of the first transistor is electrically connected to a second wiring. A gate of the first transistor is electrically connected to a third wiring. A first terminal of the second transistor is electrically connected to the first wiring. A second terminal of the second transistor is electrically connected to the second wiring. A gate of the second transistor is electrically connected to a fourth wiring.

An embodiment of the present invention includes a first period and a second period. The first period includes a first subperiod and a second subperiod. The second period includes a third subperiod and a fourth subperiod. In the first subperiod, a first transistor is on and a second transistor is off. In the second subperiod, the first transistor is off and second transistor is off. In the third subperiod, the first transistor is off and the second transistor is on. In the fourth subperiod, the first transistor is off and the second transistor is off.

An embodiment of the present invention includes a first transistor, a second transistor, a third transistor, and a fourth transistor. A first terminal of the first transistor is electrically connected to a first wiring. A second terminal of the first transistor is electrically connected to a second wiring. A first terminal of the second transistor is electrically connected to the first wiring. A second terminal of the second transistor is electrically connected to the second wiring. A first terminal of the third transistor is connected to a third wiring. A second terminal of the third transistor is electrically connected to a gate of the first transistor. A gate of the third transistor is electrically connected to the third wiring. A first terminal of the fourth transistor is electrically connected to a fourth wiring. A second terminal of the fourth transistor is electrically connected to a gate of the second transistor. A gate of the fourth transistor is electrically connected to the fourth wiring. The gate of the third transistor is electrically connected to a fifth wiring. The gate of the fourth transistor is electrically connected to the fifth wiring.

An embodiment of the present invention includes a first transistor, a second transistor, and a first circuit. A first terminal of the first transistor is electrically connected to a first wiring. A second terminal of the first transistor is electrically connected to a second wiring. A first terminal of the second transistor is electrically connected to the first wiring. A second terminal of the second transistor is electrically connected to the second wiring. The first circuit has a function of turning on the first transistor when a first signal is in a first voltage state and a function of turning on the second transistor when a second signal is in the first voltage state.

Note that an embodiment of the present invention has a second circuit. The second circuit may have a function of maintaining a voltage of a gate of a first transistor at a second voltage state in a certain period, a function of maintaining a voltage of a gate of a second transistor at the second voltage state in a certain period, and a function of maintaining a voltage of a second wiring at the second voltage state in a certain period.

Note that an embodiment of the present invention includes a third circuit. The third circuit may have a function of setting a voltage of a gate of a first transistor at a second voltage state, a function of setting a voltage of a gate of a second transistor at the second voltage state, and a function of setting a voltage of a second wiring at the second voltage state An embodiment of the present invention can suppress characteristic deterioration of a transistor. Alternatively, an embodiment of the present invention can make the channel width of a transistor smaller. In particular, characteristic deterioration of a pull-up transistor can be suppressed or the channel width of a pull-up transistor can be smaller. Alternatively, an embodiment of the present invention can make the amplitude of a signal larger. Alternatively, an embodiment of the present invention can make a time during which a transistor included in a pixel is on longer. Alternatively, an embodiment of the present invention can improve a shortage of writing to a pixel. Alternatively, an embodiment of the present invention can make a falling time of a signal shorter. Alternatively, an embodiment of the present invention can make a rising time of a signal shorter. Alternatively, an embodiment of the present invention can prevent a video signal for a pixel in a row from being written to a pixel in another row. Alternatively, an embodiment of the present invention can reduce variation of falling times of a signal. Alternatively, an embodiment of the present invention can make an influence of feedthrough on a pixel even. Alternatively, cross talk can be reduced. Alternatively, an embodiment of the present invention can make the area of layout smaller. Alternatively, an embodiment of the present invention can make a frame of a display device narrower. Alternatively, an embodiment of the present invention can make a display device have higher definition. Alternatively, an embodiment of the present invention can improve yield. Alternatively, an embodiment of the present invention can reduce costs. Alternatively, an embodiment of the present invention can reduce distortion of a signal. Alternatively, an embodiment of the present invention can reduce delay of a signal. Alternatively, an embodiment of the present invention can reduce power consumption. Alternatively, an embodiment of the present invention can reduce current supply capability of an external circuit. Alternatively, an embodiment of the present invention can reduce the size of an external circuit or the size of a display device including the external circuit.

BRIEF DESCRIPTION OF THE DRAWINGS

In the accompanying drawings;

FIGS. 22A to 22G are examples of a circuit diagram of a semiconductor device in Embodiment 3;

FIG. 25 is an example of a timing chart illustrating operations of the semiconductor device in FIGS. 24A to 24F;

FIGS. 38A to 38D are examples of schematic diagrams illustrating an operation of a semiconductor device in FIGS. 12A to 12F;

FIGS. 39A to 39D are examples of schematic diagrams illustrating an operation of a semiconductor device in FIGS. 12A to 12F;

DETAILED DESCRIPTION OF THE INVENTION

Figure 1A:
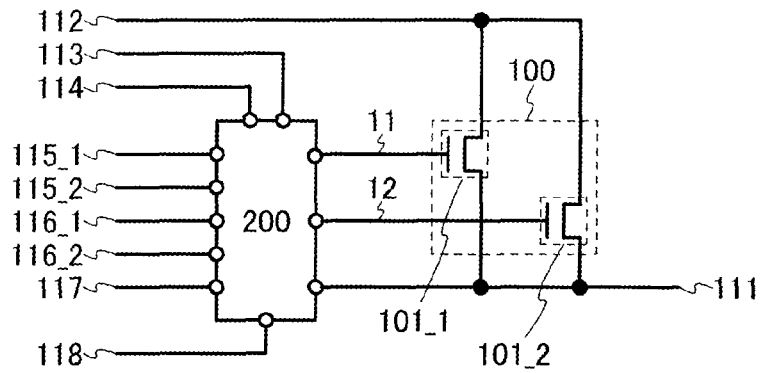
FIGS. 1A to 1F are examples of a circuit diagram of a semiconductor device in Embodiment 1.

Embodiments will be described below with reference to the accompanying drawings. Note that the embodiments can be implemented in various modes, and it is easily understood by those skilled in the art that modes and details can be variously changed without departing from the spirit and the scope of the present invention. Therefore, the present invention is not construed as being limited to the description of the following embodiments. Note that in the structures described below, reference numerals denoting the same components are used in common in different drawings, and detailed description of the same portions or portions having similar functions is not repeated.

Note that an embodiment can be formed as follows: what is described (or part thereof) in one embodiment can be applied to, combined with, or exchanged with another content in the same embodiment and/or what is described (or part thereof) in another embodiment or other embodiments. Therefore, for example, in a diagram (e.g., a cross-sectional view, a plan view, a circuit diagram, a block diagram, a flow chart, a process diagram, a perspective view, a cubic diagram, a layout diagram, timing chart, a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, it is possible to take out part of the diagram or the text and form one embodiment of the invention. For example, it is possible to take out M pieces of circuit elements (e.g., transistors or capacitors) (M is an integer, where M<N) from a circuit diagram in which N pieces of circuit elements (e.g., transistors or capacitors) (N is an integer) and constitute one embodiment of the invention. As another example, it is possible to take out M pieces of layers from a cross-sectional view in which N pieces of layers (N is an integer) are provided and constitute one embodiment of the invention. As another example, it is possible to take out Mpieces of elements from a flow chart in which N pieces of elements are provided and constitute one embodiment of the invention.

Embodiment 1

In this embodiment, an example of a semiconductor device which is an embodiment of the present invention will be described. A semiconductor device in this embodiment can be used for various driver circuits such as a shift register, a gate driver, or a source driver. Note that the semiconductor device in this embodiment can be referred to as a driver circuit or a circuit.

First, a circuit structure of the semiconductor device in this embodiment is described with reference to FIG. 1A. The semiconductor device shown in FIG. 1A includes a circuit 100 (also referred to as a second control circuit) and a circuit 200 (also referred to as a first control circuit). The circuit 100 includes a plurality of transistors which are transistors 101_1 and 101_2.

Note that the transistors 101_1 and 101_2 are n-channel transistors, for example. An n-channel transistor is turned on when a potential difference (Vgs) between a gate and a source is larger than threshold voltage (Vth). Note that the embodiment is not limited thereto. The transistors 101_1 and/or 101_2 can be a p-channel transistor. A p-channel transistor is turned on when a potential difference (Vgs) between a gate and a source is smaller than threshold voltage (Vth).

Then, connection relation of the semiconductor device shown in FIG. 1A is described. A first terminal of the transistor 101_1 is connected to a wiring 112. A second terminal of the transistor 101_1 is connected to a wiring 111. A first terminal of the transistor 101_2 is connected to the wiring 112. A second terminal of the transistor 101_2 is connected to the wiring 111. Further, as shown in FIG. 1A, the circuit 200 is connected to a wiring 113, a wiring 114, a wiring 115_1, a wiring 115_2, a wiring 116_1, a wiring 116_2, a wiring 117, a wiring 118, a gate of the transistor 101_1, a gate of the transistor 101_2, and a wiring 111. Note that this embodiment is not limited thereto. The wirings connected to the semiconductor device illustrated in FIG. 1A is an example. Therefore, in this embodiment, wirings connected to the semiconductor device can be increased or can be decreased. For example, the circuit 200 can be connected to various wirings or various nodes in accordance with the structure. Alternatively, it is acceptable that the circuit 200 is not connected to any of the wirings.

Note that in FIG. 1A, a connection portion of the gate of the transistor 101_1 and the circuit 200 is denoted by a node 11. A connection portion of the gate of the transistor 101_2 and the circuit 200 is denoted by a node 12.

Then, voltages or signals which are inputted or outputted to/from wirings are described.

A signal OUT is outputted from the wiring 111, for example. A voltage state of the signal OUT is set in accordance with a signal inputted to the semiconductor device. In addition, the signal OUT can be a signal having a first voltage state and a second voltage state. For example, in many cases, the signal OUT is a digital signal having two voltage states, which are a High level and a Low level, and can function as an output signal of the semiconductor device. Therefore, the wiring 111 can function as a signal line or an output signal line. Note that this embodiment is not limited thereto. For example, the wiring 111 can be provided so as to extend to a pixel portion. Then, the wiring 111 can be connected to a pixel. For example, in the case of a liquid crystal display device, the wiring 111 is connected to a pixel including a liquid crystal element, and a voltage which is applied to the liquid crystal element in accordance with a voltage of the wiring 111 can be set. Alternatively, the wiring 111 can be connected to a gate of a transistor (for example, a selecting transistor or a switching transistor) included in the pixel. Therefore, the wiring 111 can function as a gate signal line (hereinafter, also referred to as a gate line) or a scan line. In such a case, the signal OUT can function as a gate signal or a scan signal.

A signal CK1 is inputted to the wiring 112 and can have a first voltage state and a second voltage state. For example, in many cases, the signal CK1 is a digital signal where two voltage states of the High level and the Low level are repeated and can function as a clock signal. Therefore, the wiring 112 can function as a signal line or a clock signal line (hereinafter, also referred to as a clock line or a clock supply line). Note that this embodiment is not limited thereto. A voltage can be supplied to the wiring 112. Therefore, the wiring 112 can function as a power supply line.

For example, a signal CK2 is inputted to the wiring 113 and can have the first voltage state and the second voltage state. For example, in many cases, the signal CK2 is a digital signal where two voltage states of the High level and the Low level are repeated and can function as an inverted clock signal. Note that the signal CK2 can be an inverted signal of the signal CK1 or a signal which is out of phase with the signal CK1 by approximate 180°. Therefore, the wiring 113 can function as a signal line or an inverted clock signal line (hereinafter, also referred to as an inverted clock line or an inverted clock supply line).

A voltage V2 is supplied to the wiring 114, for example. The voltage V2 often has a value which is approximately equal to a High-level signal, and can function as a power supply voltage, a reference voltage, or a positive power supply voltage. Therefore, the wiring 114 can function as a power supply line.

For example, a signal SP1 is inputted to the wiring 115_1 can have the first voltage state and the second voltage state. For example, the signal SP1 is a digital signal which has two voltage states, which are the High level and the Low level, in many cases, and can function as a start signal. Therefore, the wiring 115_1 can function as a signal line. Note that this embodiment is not limited thereto. For example, in the case where a plurality of semiconductor devices are connected in cascade, the wiring 115_1 can be connected to the wiring 111 in another stage (e.g., the preceding stage) or another wiring. Therefore, the wiring 115_1 can function as an output signal line, a gate signal line, or a scan line. In such a case, the signal SP1 can function as a transfer signal, a gate signal, or a scan signal.

A signal SP2 is inputted to the wiring 115_2, for example. The signal SP2 can have the first voltage state and the second voltage state. For example, the signal SP2 is a digital signal in many cases and can function as a start signal. Therefore, the wiring 115_2 can function as a signal line. Note that this embodiment is not limited thereto. For example, in the case where a plurality of semiconductor devices are connected in cascade, the wiring 115_2 can be connected to the wiring 111 in another stage (e.g., the preceding stage) or another wiring. Therefore, the wiring 115_2 can function as an output signal line, a gate signal line, or a scan line. In such a case, the signal SP2 can function as a transfer signal, a gate signal, or a scan signal.

A signal SEL1 is inputted to the wiring 116_1, for example. For example, the signal SEL1 can have the first voltage state and the second voltage state. For example, in many cases, the signal SEL1 is a digital signal where two voltage states of the High level and the Low level are repeated every one period (e.g., every one frame period) and can function as a control signal or a clock signal. Therefore, the wiring 116_1 can function as a signal line, a control line, or a clock signal line.

A signal SEL2 is inputted to the wiring 116_2, as an example. For example, the signal SEL2 can have the first voltage state and the second voltage state. For example, the signal SEL2 is a digital signal where two voltage states of the High level and the Low level are repeated every one period (e.g., every one frame period) in many cases. Then, the signal SEL2 is an inverted signal of the signal SEL1 or a signal which is out of phase with the signal SEL1 by approximate 180° in many cases, and can function as a control signal or an inverted clock signal. Therefore, the wiring 116_2 can function as a signal line, a control line, or an inverted clock signal line.

A signal RE is inputted to the wiring 117, for example. The signal RE can have the first voltage state and the second voltage state. For example, the signal RE is a digital signal in many cases and can function as a reset signal. Therefore, the wiring 117 can function as a signal line. Note that this embodiment is not limited thereto. For example, in the case where a plurality of semiconductor devices are connected in cascade, the wiring 117 can be connected to the wiring 111 in another stage (e.g., the following stage) or another wiring. Therefore, the wiring 117 can function as an output signal line, a gate signal line, or a scan line. In such a case, the signal RE can function as a transfer signal, a gate signal, or a scan signal.

A voltage V1 is supplied to the wiring 118 as an example. The voltage V1 often has a value which is approximately equal to a Low-level signal, and can function as a power supply voltage, a reference voltage, a ground voltage, or a negative power supply voltage. Therefore, the wiring 118 can function as a power supply line or a ground line.

Note that this embodiment is not limited thereto. Various signals or various voltages can be inputted to the wiring 111, the wiring 112, the wiring 113, the wiring 114, the wiring 115_1, the wiring 115_2, the wiring 116_1, the wiring 116_2, the wiring 117, and the wiring 118. Therefore, the wirings can have various functions, and do not need to have all the above functions.

Note that the term "approximately" is used in consideration of various kinds of variation such as variation due to noise, variation due to process variation, variation due to variation of steps for manufacturing an element, and/or measurement deviation.

Note that a voltage generally indicates a potential difference between two points. A potential sometimes indicates a static electric energy (electrical potential energy) unit charge which is at a point in a static electric field has. However, in an electronic circuit, a difference between a potential at a certain point and a reference potential (e.g., a ground potential) is often shown as the voltage at the certain point. Therefore, in this specification, the term "a voltage at one point" means a difference between a potential at one point and a reference potential except for the case where definition is particularly appointed.

Note that as an example, the first voltage state, that is, a voltage of a Low-level signal is V1, and the second voltage state, that is, a voltage of a High-level signal is V2. In addition, V2 is larger than V1. Accordingly, the voltage V1 has a value which is approximately equal to that of a Low-level signal. Further, "the voltage V2" has a value which is approximately equal to that of a High-level signal. Note that this embodiment is not limited thereto. The voltage of a Low-level signal can be lower than V1 or higher than V1. Moreover, the voltage of a High-level signal can be lower than V2 or higher than V2. For example, depending on a circuit structure, the voltage of a High-level signal can be lower than V2 or higher than V2. Moreover, depending on a circuit structure, the voltage of a Low-level signal can be lower than V1 or higher than V1.

Note that the signal CK1 and/or the signal CK2 can be a balanced signal or an unbalanced signal. The balanced signal is a signal in which the length of a period in which the signal is in the High level and the length of a period in which the signal is in the Low level are approximately equal in one cycle. The unbalanced signal is a signal in which the length of the period in which the signal is in a High level and the length of the period in which the signal is in the Low level are different from each other. Here, the term "different" is used in consideration of the case except the case where the length of the periods is approximately equal to each other.

Note that when the signal CK1 and the signal CK2 are unbalanced signals, the signal CK2 is not an inverted signal of the signal CK1 in some cases. In this case, the length of a period in which the signal CK1 is in the High level and the length of a period in which the signal CK2 is in the High level can be approximately equal. Note that this embodiment is not limited thereto.

Next, a function of each of a circuit and a transistor is described.

For example, the circuit 100 has a function of determining a voltage state of the signal OUT in accordance with a signal inputted from the circuit 200. Alternatively, the circuit 100 has a function of controlling an electrical continuity state of the wirings 112 and 111 in accordance with a voltage of node 11 and/or a voltage of node 12. Alternatively, the circuit 100 has a function of controlling a timing of supplying the voltage of the wiring 112 to the wiring 111. For example, when a voltage such as the voltage V2 or a signal such as the signal CK1 is supplied to the wiring 112, the circuit 100 has a function of controlling a timing of supplying a voltage, a signal, or the like, which is supplied to the wiring 112, to the wiring 111. Alternatively, the circuit 100 has a function of controlling a timing of supplying a High-level signal (e.g., the signal CK1) to the wiring 111. Alternatively, the circuit 100 has a function of controlling a timing of increasing the voltage of the wiring 111 to V2, for example. Alternatively, the circuit 100 has a function of controlling a timing of supplying a Low-level signal (e.g., the signal CK1) to the wiring 111. Alternatively, the circuit 100 has a function of controlling a timing of decreasing the voltage of the wiring 111 to V1, for example. Alternatively, the circuit 100 has a function of keeping the voltage of the wiring 111. Alternatively, the circuit 100 has a function of controlling a timing of increasing the voltage of the node 11 and/or the voltage of the node 12 to V2 or more, for example, by a bootstrap operation. As thus described, the circuit 100 can function as a control circuit, a buffer circuit, a switch, or the like. Note that this embodiment is not limited thereto. The circuit 100 can have a variety of other functions. Note that the circuit 100 does not need to have all the above functions.

For example, the circuit 200 to which at least two signals are inputted has a function of outputting the inputted signal selectively. Alternatively, the circuit 200 has a function of controlling the voltage of the node 11, the voltage of the node 12, and/or the voltage of the wiring 111 in accordance with an inputted signal or a voltage (the signal CK2, the signal SP1, the signal SP2, the signal RE, the voltage of the node 11, the voltage of the node 12, the signal OUT, and/or the like). Alternatively, the circuit 200 has a function of controlling a timing of supplying a High-level signal or the voltage V2 to the node 11 and/or the node 12. Alternatively, the circuit 200 has a function of controlling a timing of supplying a Low-level signal or the voltage V1 to the node 11 and/or the node 12. Alternatively, the circuit 200 has a function of stopping supplying a signal or a voltage to the node 11 and/or the node 12. Alternatively, the circuit 200 has a function of making the node 11 and/or the node 12 go into a floating state. Alternatively, the circuit 200 has a function of controlling a timing of supplying a Low-level signal or the voltage V1 to the wiring 111. Alternatively, the circuit 200 has a function of controlling a timing of decreasing the voltage of the wiring 111 to V1, for example. Alternatively, the circuit 200 has a function of keeping the voltage of the wiring 111. As thus described, the circuit 200 can function as a control circuit. Note that this embodiment is not limited thereto. The circuit 200 can have a variety of other functions. Note that the circuit 200 does not need to have all the above functions.

For example, the transistor 101_1 has a function of controlling an electrical continuity state of the wirings 112 and 111 in accordance with the voltage of the node 11. Alternatively, the transistor 101_1 has a function of controlling a timing of supplying the voltage of the wiring 112 to the wiring 111. For example, when a voltage such as the voltage V2 or a signal such as the CK1 is supplied to the wiring 112, the transistor 101_1 has a function of controlling a timing of supplying a voltage, a signal, or the like, which is supplied to the wiring 112, to the wiring 111. Alternatively, the transistor 101_1 has a function of controlling a timing of supplying a High-level signal (e.g., the signal CK1) to the wiring 111. Alternatively, the transistor 101_1 has a function of controlling a timing of increasing the voltage of the wiring 111. Alternatively, the transistor 101_1 has a function of controlling a timing of supplying a Low-level signal (e.g., the signal CK1) to the wiring 111. Alternatively, the transistor 101_1 has a function of controlling a timing of decreasing the voltage of the wiring 111 to V1, for example; that is, a function of controlling the voltage of the wiring 111 so as to set it to V1. Alternatively, the transistor 101_1 has a function of keeping the voltage of the wiring 111. Alternatively, the transistor 101_1 has a function of performing a bootstrap operation. Alternatively, the transistor 101_1 has a function of increasing the voltage of the node 11 to V2 or more, for example, by a bootstrap operation. Alternatively, the transistor 101_1 has a function of determining whether a voltage state of the signal OUT is determined or not by be turned on or off. As thus described, the transistor 101_1 can function as a buffer circuit, a switch, or the like. Note that this embodiment is not limited thereto. The transistor 101_1 can have a variety of other functions. Note that the transistor 101_1 does not need to have all the above functions.

For example, the transistor 101_2 has a function of controlling an electrical continuity state of the wirings 112 and 111 in accordance with the voltage of the node 12. Alternatively, the transistor 101_2 has a function of controlling a timing of supplying the voltage of the wiring 112 to the wiring 111. For example, when a voltage such as the voltage V2 or a signal such as the CK1 is supplied to the wiring 112, the transistor 101_2 has a function of controlling a timing of supplying a voltage, a signal, or the like, which is supplied to the wiring 112, to the wiring 111. Alternatively, the transistor 101_2 has a function of controlling a timing of supplying a High-level signal (e.g., the signal CK1) to the wiring 111. Alternatively, the transistor 101_2 has a function of controlling a timing of increasing the voltage of the wiring 111 to V2, for example. Alternatively, the transistor 101_2 has a function of controlling a timing of supplying a Low-level signal (e.g., the signal CK1) to the wiring 111. Alternatively, the transistor 101_2 has a function of controlling a timing of decreasing the voltage of the wiring 111 to V1, for example; that is, a function of controlling the voltage of the wiring 111 so as to set it to the voltage V1. Alternatively, the transistor 101_2 has a function of keeping the voltage of the wiring 111. Alternatively, the transistor 101_2 has a function of performing a bootstrap operation. Alternatively, the transistor 101_2 has a function of increasing the voltage of the node 12 to V2 or more, for example, by a bootstrap operation. Alternatively, the transistor 101_2 has a function of determining whether the voltage state of the signal OUT is determined or not by being turned on or off. As thus described, the transistor 101_2 can function as a buffer circuit, a switch, or the like. Note that this embodiment is not limited thereto. The transistor 101_2 can have a variety of other functions. Note that the transistor 101_2 does not need to have all the above functions.

Figure 2:
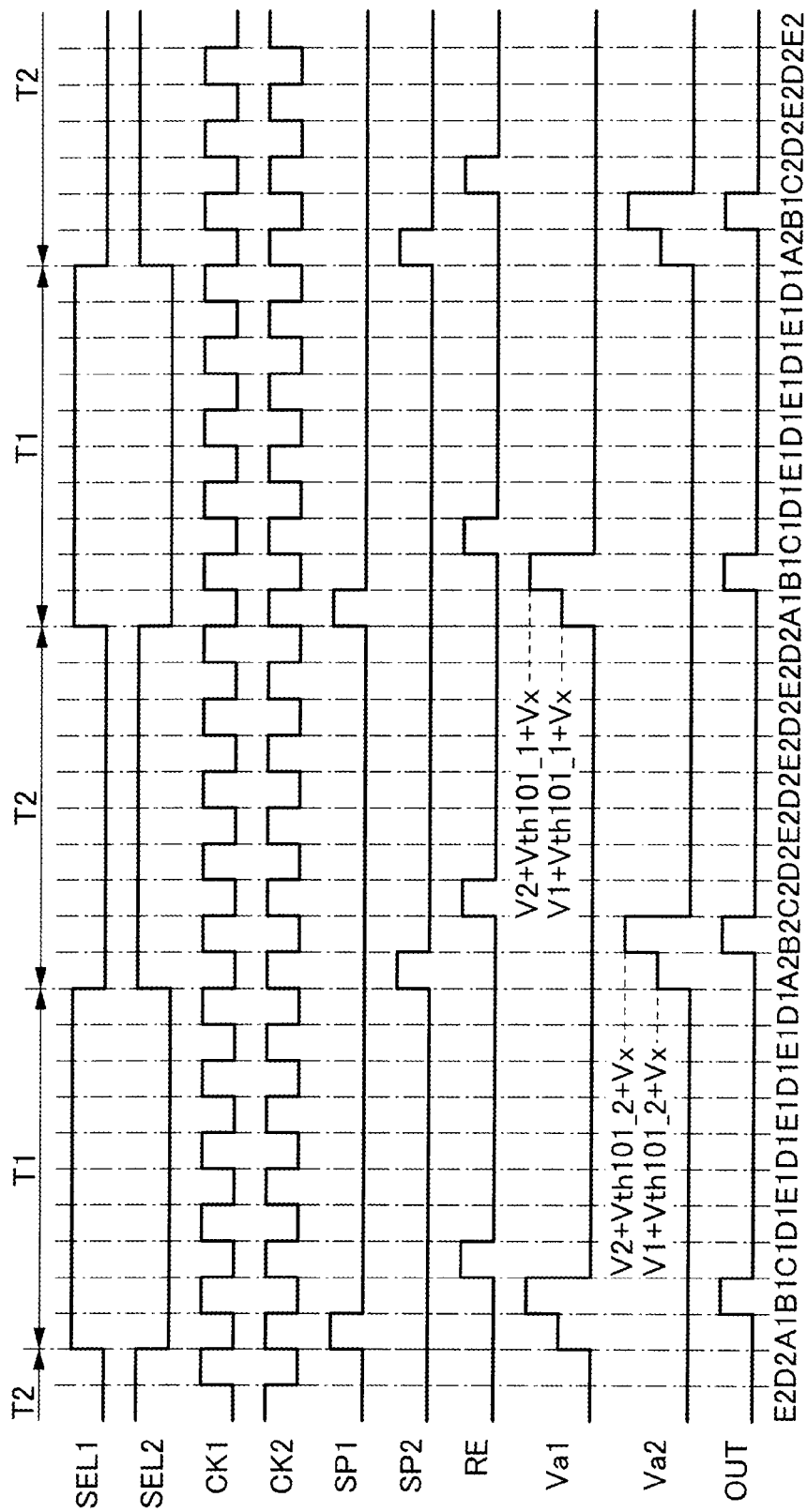
FIG. 2 is an example of a timing chart illustrating operations of a semiconductor device in FIGS. 1A to 1E.

Next, an operation of the semiconductor device in FIG. 1A will be described with reference to a timing chart in FIG. 2. The timing chart in FIG. 2 illustrates the signal SEL1, the signal SEL2, the signal CK1, the signal CK2, the signal SP1, the signal SP2, the signal RE, the voltage of the node 11 (Va1), the voltage of the node 12 (Va2), and the signal OUT. Note that the timing of controlling the semiconductor device in FIG. 1A is not limited to that shown in the timing chart in FIG. 2; the semiconductor device in FIG. 1A can be controlled at a variety of timings.

Note that in the timing chart of FIG. 2, a plurality of periods (hereinafter, a period is also referred to as a frame period) are shown, each of which includes a plurality of subperiods (hereinafter, a subperiod is also referred to as one gate selection period). For example, in the timing chart of FIG. 2, a plurality of periods, periods T1 and T2, are shown. The period T1 includes a plurality of subperiods, periods A1, B1, C1, D1, and E1. The period T2 includes a plurality of subperiods, periods A2, B2, C2, D2, and E2. Note that this embodiment is not limited thereto. For example, in the timing chart of FIG. 2, another period can be included or one of the periods T1 and T2 can be omitted. Alternatively, in the period T1, a variety of periods can be included in addition to the periods A1 to E1 or any of the periods A1 to E1 can be omitted. Alternatively, in the period T2, a variety of periods can be included in addition to the periods A2 to E2 or any of/any one of the periods A2 to E2 can be omitted.

For example, an operation of the period T1 and an operation of the period T2 are alternately performed. Note that this embodiment is not limited thereto. The operation of the period T1 and the operation of the period T2 can be performed in a variety of orders.

For example, in the period T1, an operation of the period A1, an operation of the period B1, and an operation of the period C1 are performed in this order. After that, an operation of the period D1 and an operation of the period E1 are alternately performed until the end of the period T1 (or until the start of the period T2). Note that this embodiment is not limited thereto. The operation of the periods A1 to E1 can be performed in various orders. For example, the operation of the period. D1 and/or the operation of the period E1 can be performed in a period between the start of the period T1 and the start of the period A1.

For example, in the period T2, an operation of the period A2, an operation of the period B2, and an operation of the period C2 are performed in this order. After that, an operation of the period D2 and an operation of the period E2 are alternately performed until the end of the period T2 (or until the start of the period T1). Note that this embodiment is not limited thereto. The operations of the periods A2 to E2 can be performed in various orders. For example, the operation of the period D2 and/or the operation of the period E2 can be performed in a period between the start of the period T2 and the start of the period A2.

First, an operation of the period T1 is described. In the period T1, the signal SP1 is in the High level in the period A1 and is in the Low level in the periods B1 to E1, the signal SP2 is in the Low level in the periods A1 to E1, and the signal SEL1 is in the High level, and the signal SEL2 goes into the Low level.

Figure 3A:
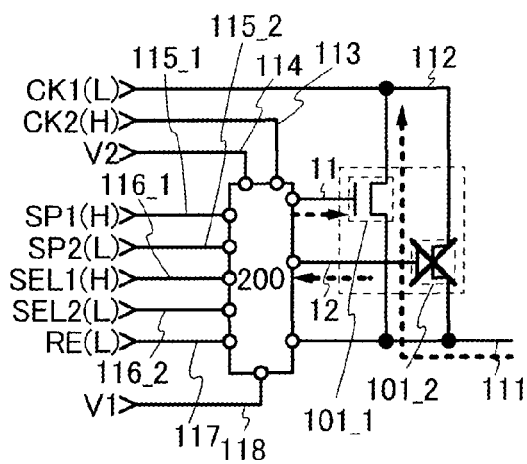
FIGS. 3A to 3D are examples of schematic diagrams illustrating operations of a semiconductor device in FIGS. 1A to 1E.

As shown in FIG. 3A, in the period A1, since the signal SP1 is in the High level, the circuit 200 supplies the voltage V2 or a High-level signal to the node 11. Therefore, the voltage of the node 11 starts to increase. At that time, since the signal SP2 is in the Low level, the circuit 200 supplies the voltage V1 or a Low-level signal to the node 12. Therefore, the voltage of the node 12 becomes V1. Alternatively, the circuit 200 does not supply a voltage, a signal, or the like to the node 12, whereby the circuit 200 and the node 12 are out of electrical continuity. Therefore, the voltage of the node 12 is maintained as V1 when an initial value of the voltage of the node 12 is V1. As a result, the transistor 101_2 is turned off (such a state is also referred to as an off state). After that, the voltage of the node 11 continues to be increased. After a while, when the voltage of the node 11 reaches (V1+Vth101_1+Vx) (Vth101_1 is the threshold voltage of the transistor 101_1), the transistor 101_1 is turned on. At that time, Vx has a value larger than 0. Accordingly, since the wirings 112 and 111 are brought into electrical continuity through the transistor 101_1, the signal CK1 in the Low-level is supplied from the wiring 112 to the wiring 111 through the transistor 101_1. As a result, the signal OUT goes into the Low level. After that, the voltage of the node 11 continues to be further increased. After a while, the circuit 200 stops supplying a voltage or a signal to the node 11, so that the circuit 200 and the node 11 are brought out of electrical continuity. As a result, the node 11 goes into a floating state and the voltage of the node 11 is maintained as (V1+Vth101_1+Vx). However, this embodiment is not limited thereto. For example, the circuit 200 can continue to supply the voltage (V1+Vth101_1+Vx) to the node 11.

Note that in the period A1, the circuit 200 can supply the voltage V1 or a signal in the Low level to the wiring 111. Alternatively, it is acceptable that the circuit 200 does not supply a voltage, a signal, or the like to the wiring 111.

Figure 3B:
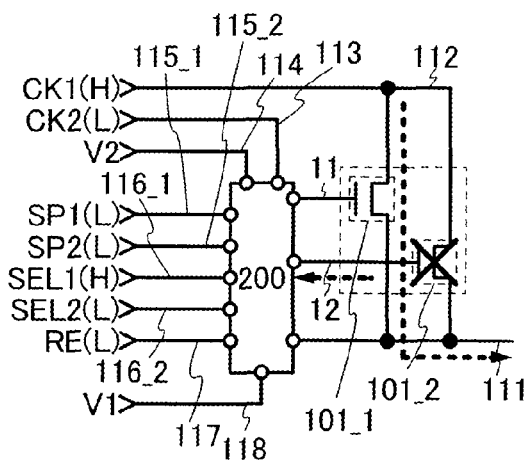

Next, as shown in FIG. 3B, in the period B1, since the signal SP1 is in the Low level, the circuit 200 still does not supply a voltage, a signal, or the like to the node 11. Therefore, the node 11 remains in the floating state, and the value of the voltage of the node 11 remains as (V1+Vth101_1+Vx). That is, the transistor 101_1 remains on, so that the wiring 112 and the wiring 111 remain in an electrical continuity through the transistor 101_1. Meanwhile, the signal SP2 remains in the Low level, so that the circuit 200 supplies the voltage V1 or a Low-level signal to the node 12. Alternatively, the circuit 200 supplies no voltage or signal to the node 12, and the circuit 200 and the node 12 are brought out of electrical continuity. Therefore, the voltage of the node 12 is maintained as V1. As a result, the transistor 101_2 remains off. At this time, the signal CK1 is increased from the Low level to the High level, so that the voltage of the wiring 111 starts to be increased. Since the node 11 remains in the floating state, the voltage of the node 11 is increased by the parasitic capacitance between the gate and the second terminal of the transistor 101_1. This is so-called a bootstrap operation. In this manner, it is possible for the value of the voltage of the wiring 111 to be larger than V2 by increasing the voltage of the node 11 to (V2+Vth101_1+Vx). The signal OUT goes into the High level in such a manner.

Note that in the period B1, the circuit 200 does not supply a voltage, a signal, or the like to the wiring 111 in many cases. Note that this embodiment is not limited thereto. The circuit 200 can supply the voltage V2, a signal in the High level, or the like to the wiring 111.

Figure 3C:
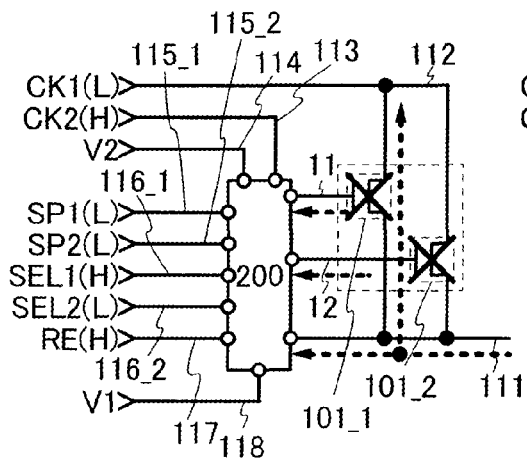

Next, as shown in FIG. 3C, in the period C1, the signal RE is in the High level, so that the circuit 200 supplies the voltage V1 or a Low-level signal to the node 11, the node 12, and/or the wiring 111. Then, the voltage of the node 11, the voltage of the node 12, and/or the voltage of the wiring 111 goes into V1. Therefore, since the transistors 101_1 and 101_2 are off, the wiring 112 and the wiring 111 are brought out of electrical continuity. Thus, the signal OUT goes into the Low level.

Note that in the period C1, timing of when the signal CK1 goes into the Low level is earlier than timing of when the voltage of the node 11 decreases in some cases. That is, the signal CK1 sometimes goes into the Low level before the transistor 101_1 is turned off. Therefore, the signal CK1 in the Low-level is sometimes supplied from the wiring 112 to the wiring 111 through the transistor 101_1. In such a case, the channel width of the transistor 101_1 is often larger than that of another transistor in the case where another transistor is included, whereby a falling time of the signal OUT can be shortened. Therefore, in the period C1, the following cases are considered: the case where the circuit 200 supplies the Low-level signal or the voltage V1 to the wiring 111, the case where the Low-level signal is supplied from the wiring 112 to the wiring 111 through the transistor 101_1, and the case where the Low-level signal or the voltage V1 is supplied from the circuit 200 to the wiring 111 and the Low-level signal is supplied from the wiring 112 to the wiring 111 through the transistor 101_1.

Figure 3D:
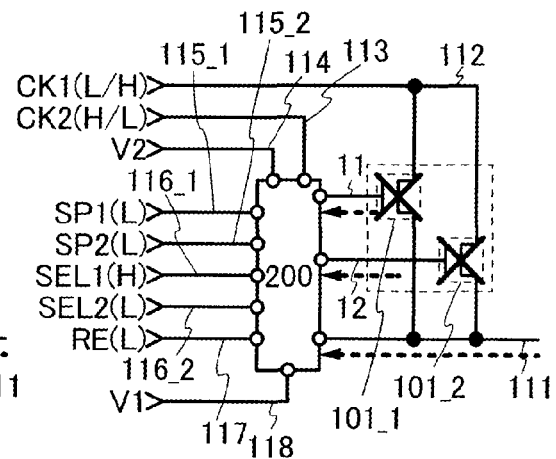

Next, as shown in FIG. 3D, in the periods D1 and E1, the circuit 200 supplies the voltage V1 or the Low-level signal to the node 11, the node 12, and/or the wiring 111. Then, the voltage of the node 11, the voltage of the node 12, and/or the voltage of the wiring 111 remains as V1. Therefore, since the transistors 101_1 and 101_2 remain off, the wiring 112 and the wiring 111 are out of electrical continuity. Thus, the signal OUT remains at the Low level.

Note that in one of the periods D1 and E1, the circuit 200 can supply the voltage V1 or the Low-level signal to the node 11, the node 12, and/or the wiring 111. In the other of periods D1 and E1, it is acceptable that the circuit 200 does not supply the voltage V1 or the Low-level signal to the node 11, the node 12, and/or the wiring 111.

Next, an operation of the period T2 is described. In the period T2, the signal SP1 is in the Low level in the periods A2 to E2, the signal SP2 is in the High level in the period A2 and is in the Low level in the periods B2 to E2, and the signal SEL1 is in the Low level, and the signal SEL2 is in the High level.

Figure 4A:
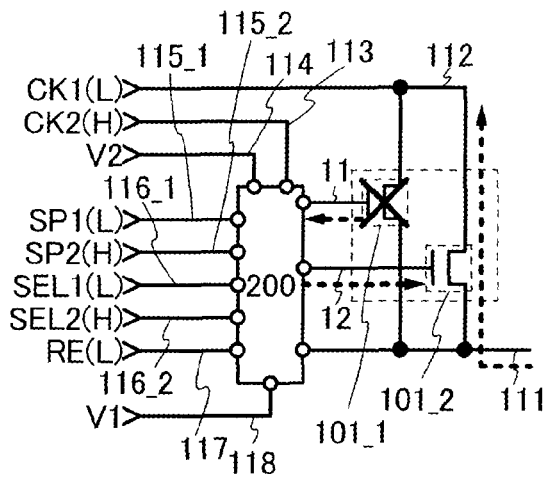
FIGS. 4A to 4D are examples of schematic diagrams illustrating operations of a semiconductor device in FIGS. 1A to 1E.

As shown in FIG. 4A, in the period A2, since the signal SP2 is in the High level, the circuit 200 supplies the voltage V2 or a High-level signal to the node 12. Therefore, the voltage of the node 12 starts to increase. At that time, since the signal SP1 is in the Low level, the circuit 200 supplies the voltage V1 or a Low-level signal to the node 11. Therefore, the voltage of the node 11 becomes V1. Alternatively, the circuit 200 does not supply a voltage, a signal, or the like to the node 11, whereby the circuit 200 and the node 11 are out of electrical continuity. Therefore, the voltage of the node 11 is maintained as V1 when an initial value of the voltage of the node 11 is V1. As a result, the transistor 101_1 is turned off. After that, the voltage of the node 12 continues to be increased. After a while, when the voltage of the node 12 reaches (V1+Vth101_2+Vx) (Vth101_2 is the threshold voltage of the transistor 101_2), the transistor 101_2 is turned on. At that time, Vx has a value larger than 0. Accordingly, since the wirings 112 and 111 are brought into electrical continuity through the transistor 101_2, the signal CK1 in the Low-level is supplied from the wiring 112 to the wiring 111 through the transistor 101_2. As a result, the signal OUT goes into the Low level. After that, the voltage of the node 12 continues to be further increased. After a while, the circuit 200 stops supplying a voltage or a signal to the node 12, so that the circuit 200 and the node 12 are brought out of electrical continuity. As a result, the node 12 goes into a floating state and the voltage of the node 12 is maintained as (V1+Vth101_2+Vx). However, this embodiment is not limited thereto. For example, the circuit 200 can continue to supply the voltage (V1+Vth101_2+Vx) to the node 12.

Note that in the period A2, the circuit 200 can supply the voltage V1 or a signal in the Low level to the wiring 111. Alternatively, it is acceptable that the circuit 200 does not supply a voltage, a signal, or the like to the wiring 111.

Figure 4B:
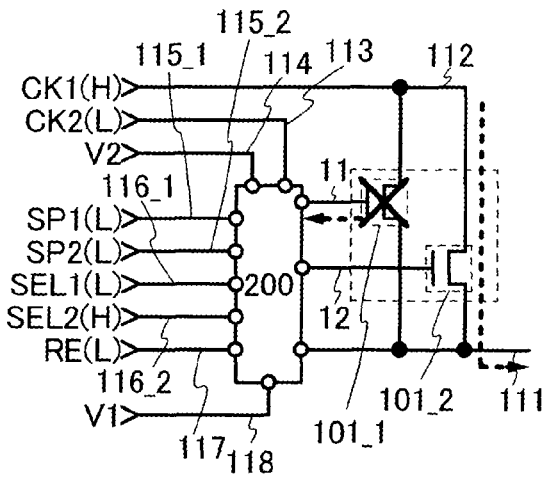

Next, as shown in FIG. 4B, in the period B2, since the signal SP2 is in the Low level, the circuit 200 still does not supply a voltage, a signal, or the like to the node 12. Therefore, the node 12 remains in the floating state, and the value of the voltage of the node 12 remains as (V1+Vth101_2+Vx). That is, the transistor 101_2 remains on, so that the wiring 112 and the wiring 111 remain in an electrical continuity through the transistor 101_2. Meanwhile, the signal SP1 remains in the Low level, so that the circuit 200 supplies the voltage V1 or a Low-level signal to the node 11. Alternatively, the circuit 200 supplies no voltage or signal to the node 11, and the circuit 200 and the node 11 are brought out of electrical continuity. Therefore, the voltage of the node 11 is maintained as V1. As a result, the transistor 101_1 remains off. At this time, the signal CK1 is increased from the Low level to the High level, so that the voltage of the wiring 111 starts to be increased. Since the node 12 remains in the floating state, the voltage of the node 12 is increased by the parasitic capacitance between the gate and the second terminal of the transistor 101_2. This is so-called a bootstrap operation. In this manner, it is possible for the value of the voltage of the wiring 111 to be larger than V2 by increasing the voltage of the node 12 to (V2+Vth101_2+Vx). The signal OUT goes into the High level in such a manner.

Note that in the period B2, the circuit 200 does not supply a voltage, a signal, or the like to the wiring 111 in many cases. Note that this embodiment is not limited thereto. The circuit 200 can supply the voltage V2, a signal in the High level, or the like to the wiring 111.

Figure 4C:
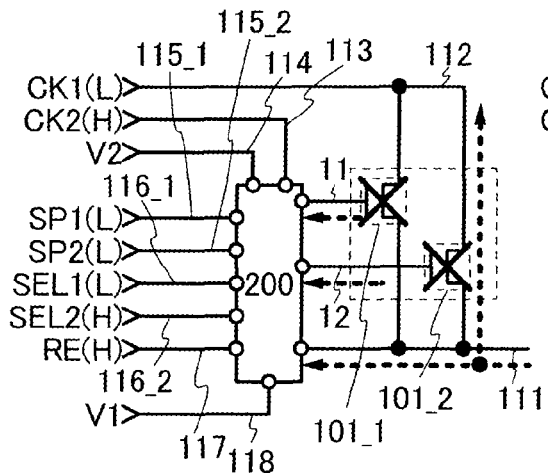

Next, as shown in FIG. 4C, in the period C2, the signal RE is in the High level, so that the circuit 200 supplies the voltage V1 or a Low-level signal to the node 11, the node 12, and/or the wiring 111. Then, the voltage of the node 11, the voltage of the node 12, and/or the voltage of the wiring 111 goes into V1. Therefore, since the transistors 101_1 and 101_2 are off, the wiring 112 and the wiring 111 are brought out of electrical continuity. Thus, the signal OUT goes into the Low level.

Note that in the period C2, timing of when the signal CK1 goes into the Low level is earlier than timing of when the voltage of the node 12 decreases in some cases. That is, the signal CK1 sometimes goes into the Low level before the transistor 101_2 is turned off. Therefore, the signal CK1 in the Low-level is sometimes supplied from the wiring 112 to the wiring 111 through the transistor 101_2. In such a case, the channel width of the transistor 101_2 is often larger than that of another transistor in the case where another transistor is included, whereby a falling time of the signal OUT can be shortened. Therefore, in the period C2, the following cases are considered: the case where the circuit 200 supplies the Low-level signal or the voltage V1 to the wiring 111, the case where the Low-level signal is supplied from the wiring 112 to the wiring 111 through the transistor 101_2, and the case where the Low-level signal or the voltage V1 is supplied from the circuit 200 to the wiring 111 and the Low-level signal is supplied from the wiring 112 to the wiring 111 through the transistor 101_2.

Figure 4D:
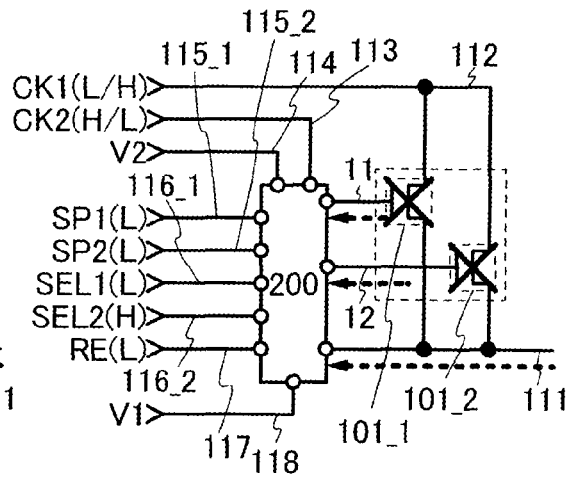

Next, as shown in FIG. 4D, in the periods D2 and E2, the circuit 200 supplies the voltage V1 or the Low-level signal to the node 11, the node 12, and/or the wiring 111. Then, the voltage of the node 11, the voltage of the node 12, and/or the voltage of the wiring 111 remains as V1. Therefore, since the transistors 101_1 and 101_2 remain off, the wiring 112 and the wiring 111 are out of electrical continuity. Thus, the signal OUT remains at the Low level.

Note that, only in one of the periods D2 and E2, the circuit 200 can supply the voltage V1 and the Low-level signal to the node 11, the node 12, and/or the wiring 111.

As thus described, the transistor 101_2 can be off in the period T1, and the transistor 101_1 can be off in the period T2. Therefore, since the number of times each of the transistors 101_1 and 101_2 are turned on and the length of time during which each of the transistors 101_1 and 101_2 is on can be reduced, deterioration in characteristics of the transistors 101_1 and 101_2 can be suppressed.

Alternatively, deterioration in characteristics of the transistors can be suppressed, and a variety of advantages can be obtained. For example, in the case where the wiring 111 can function as a gate signal line or a scan line or in the case where the wiring 111 is connected to a pixel, a video signal stored in the pixel is sometimes influenced by the waveform of the signal OUT. For example, when the voltage of the signal OUT in the High level is not increased to V2, the length of the time during which a transistor (e.g., a selection transistor or a switching transistor) included in the pixel is on becomes shorter. As a result, a shortage of writing of a video signal to the pixel occurs and display quality is degraded in some cases. Alternatively, when a falling time and a rising time of the signal OUT are long, a video signal for a pixel which belongs to a different row is written to a pixel which belongs to a selected row in some cases. As a result, display quality is degraded. Alternatively, when the falling time of the signal OUT varies, influence of feedthrough for the video signal held in the pixel varies in some cases. As a result, display unevenness such as crosstalk occurs.

In the semiconductor device of this embodiment, deterioration in characteristics of a transistor can be suppressed. Therefore, a High level voltage of the signal OUT can be increased to V2, so that the length of the time during which the transistor included in the pixel is on can be longer. As a result, the time for writing a video signal to the pixel can be adequately secured, whereby display quality can be improved. Alternatively, since a falling time and a rising time of the signal OUT can be shortened, a video signal for a pixel which belongs to a different row is prevented from being written to a pixel which belongs to a selected row. As a result, display quality can be improved. Alternatively, since variation of the falling time of the signal OUT can be suppressed, variation of influence of feedthrough for the video signal stored in the pixel can be suppressed. Accordingly, display unevenness can be reduced.

Alternatively, in the semiconductor device in this embodiment, all the transistors can be n-channel transistors or all the transistor can be p-channel transistors. Since the polarities of all the transistors are the same, the number of manufacturing steps can be reduced, yield can be improved, reliability can be improved, or cost can be reduced in comparison with the case of a CMOS circuit. In particular, when all the transistors including the transistors in a pixel portion and the like, are n-channel transistors, an amorphous semiconductor, a microcrystalline semiconductor, an organic semiconductor, an oxide semiconductor, or the like can be used for a semiconductor layer of the transistor. Note that the transistors formed using these semiconductors deteriorate easily in many cases. However, in the semiconductor device of this embodiment, deterioration of the transistor can be suppressed.

Further, it is not necessary to increase the channel width of a transistor in order that a semiconductor device may be operated even when characteristics of the transistor deteriorate. Accordingly, the channel width of the transistor can be reduced. This is because deterioration of the transistor can be suppressed in the semiconductor device of this embodiment.

Note that in the period T1, a period during which the transistor 101_1 is on (the periods A1 and B1) can be referred to as a first period or a first subperiod. A period during which the transistor 101_1 is off (the periods C1, D1, and E1) can be referred to as a second period or a second subperiod. Similarly, in the period T2, a period during which the transistor 101_2 is on (the periods A2 and B2) can be referred to as a third period or a third subperiod. A period during which the transistor 101_2 is off (the periods C2, D2, and E2) can be referred to as a fourth period or the fourth subperiod.

Note that the period during which the transistor 101_1 is on (the periods A1 and B1) is shorter than the period during which the transistor 101_1 is off (the periods C1, D1, and E1) in many cases. Alternatively, the period during which the transistor 101_2 is on (the periods A2 and B2) is shorter than the period during which the transistor 101_2 is off (the periods C2, D2, and E2) in many cases. Alternatively, the length of the period during which the transistor 101_1 is on is approximately the same as the length of the period during which the transistor 101_2 is on. Note that this embodiment is not limited thereto.

Note that in the period T1, the period B1 can function as a selection period. The periods A1, C1, D1, and E1 can function as a non-selection period. Similarly, in the period T2, the period B2 can function as a selection period. The periods A2, C2, D2, and E2 can function as a non-selection period.

Note that the periods A1 and A2 can function as set periods or start periods. The periods B1 and B2 can function as selection periods. The periods C1 and C2 can function as reset periods.

Note that the periods T1 and T2 can function as frame periods. Note that it is preferable that a frame frequency be approximately 60 Hz (or 50 Hz). Note that this embodiment is not limited thereto. For example, the frame frequency can be higher than 60 Hz, whereby a blur or after images of a moving image can be suppressed. However, when the frame frequency is too high, power consumption is increased because a drive frequency becomes higher. Accordingly, in order to suppress increase of power consumption, the frame frequency is preferably from 60 Hz to 360 Hz. More preferably, the frame frequency is from 60 Hz to 240 Hz. Further preferably, the frame frequency is from 60 Hz to 120 Hz. Meanwhile, the frame frequency can be lower than 60 Hz, whereby an external circuit can have a simple structure. Further, the power consumption can be reduced. Therefore, a semiconductor device of this invention can be mounted on mobile devices such as a mobile phone. However, when the frame frequency is too low, the aperture ratio of the pixel is decreased because the storage capacitance of the pixel is increased. Therefore, in order to suppress decrease of the aperture ratio, the frame frequency is preferably from 15 Hz to 60 Hz. More preferably, the frame frequency is from 30 Hz to 60 Hz.

Note that the periods A1 to E1 and the periods A2 to E2 each can function as a subperiod or one gate selection period.

Note that a period or a subperiod can be referred to as a step, a process, or an operation. For example, the term "the first period" can also be referred to as "a first step", "a first process", or "a first operation".

Note that in the case where operation in the periods D1 and E1 are alternately performed in the period T1 before the period A1 and operation in the periods D2 and E2 are alternately performed in the period T2 before the period A2, it is preferable that a time from the start of the period T1 to the start of the period A1 is approximately equal to a time from the start of the period T2 to the start of the period A2. Note that this embodiment is not limited thereto.

Figure 5A:
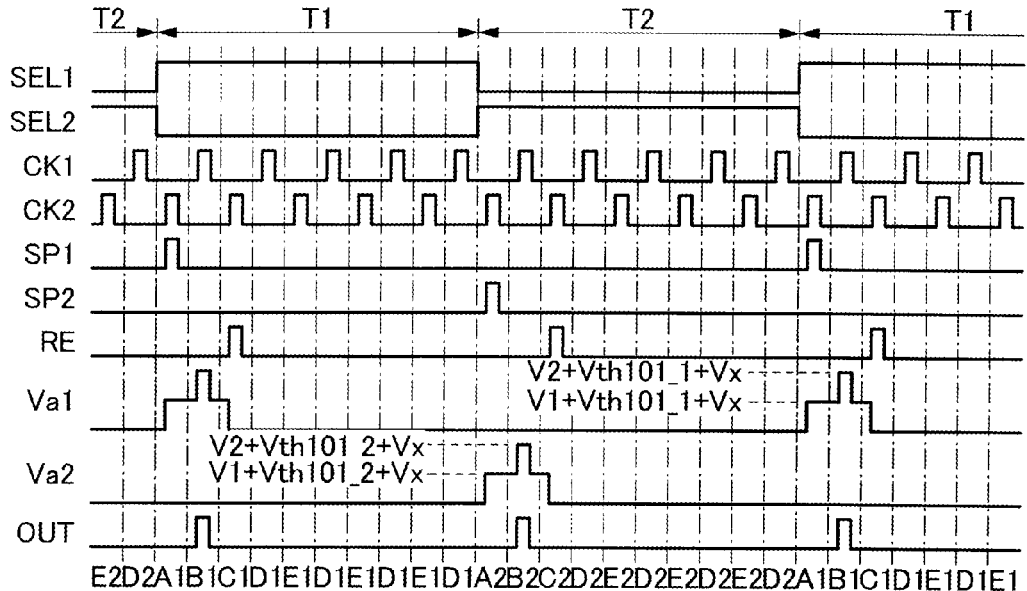
FIGS. 5A and 5B are examples of timing charts illustrating operations of a semiconductor devices in FIGS. 1A to 1E.

Note that the signal CK1 and the signal CK2 can be unbalanced signals. For example, FIG. 5A shows a timing chart in the case where, in one cycle, a period when the signal is in the High level is shorter than a period when the signal is in the Low level. Thus, since it becomes possible to supply a signal CK1 in the Low-level to the wiring 111 in the period C1 or the period C2, a falling time of the signal OUT can be shortened. In particular, in the case where the wiring 111 is formed so as to extend to the pixel portion, a false video signal can be prevented from being written to a pixel. However, this embodiment is not limited thereto. A period when the signal is in the High level can be longer than when the signal is in the Low level in one cycle.

Figure 5B:
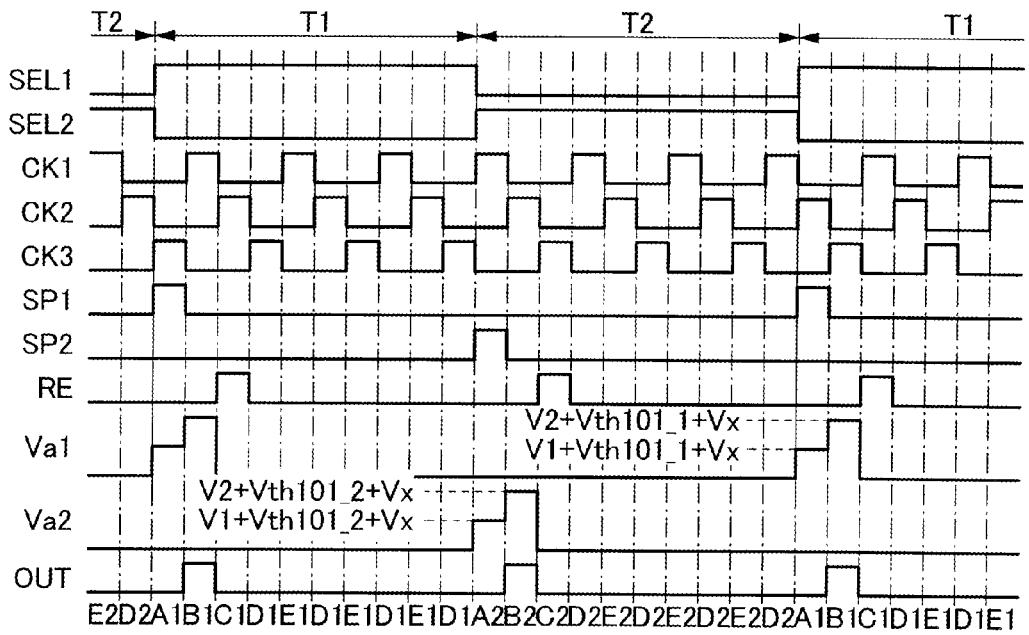

Note that in the semiconductor device, multi-phase clock signals can be used. For example, n-phase clock signals (n is a natural number not less than two) can be used for the semiconductor device. The n-phase clock signals are n clock signals whose cycles are different by 1/n cycle. FIG. 5B illustrates an example of a timing chart in the case where three-phase clock signals are used for the semiconductor device. However, this embodiment is not limited thereto.

Note that the larger n is, the smaller a clock frequency is. Therefore, power consumption can be reduced. However, when n is too large, a layout area or the scale of an external circuit becomes larger in some cases due to increase in the number of signals. Accordingly, it is preferable that n is smaller than 8. It is more preferable that n is smaller than 6. It is further preferable that n is equal to 4 or 3 is further preferable. Note that, this embodiment is not limited thereto.

Note that the transistors 101_1 and 102_2 can be turned on at the same time. In this case, the circuit 200 can supply the voltage V2 or the High-level signal to the node 11 and the node 12, for example.

It is preferable that the channel width of the transistor 101_1 is approximately equal to the channel width of the transistor 101_2. By making the transistors have approximately the same size in such a manner, the transistors can have approximately the same current supply capability. Further, the degree of deterioration in characteristics of the transistors can be approximately the same. Accordingly, when transistors which are selected are switched to be used, the waveforms of the signal OUT can be approximately the same. For a similar reason, it is preferable that the channel length of the transistor 101_1 be approximately equal to the channel length of the transistor 101_2. Note that this embodiment is not limited thereto. The channel width of the transistor 101_1 can be different from the channel width of the transistor 101_2. Alternatively, the channel length of the transistor 101_1 can be different from the channel length of the transistor 101_2.

Note that the term "the channel width of a transistor" can also be referred to as the W/L (W is channel width and L is channel length) ratio of a transistor.

Note that since the transistors 101_1 and 101_2 drive a large load such as a gate signal line, the channel width of the transistor 101_1 and the channel width of the transistor 101_2 are preferably larger than the channel widths of other transistors. For example, the channel width of the transistor 101_1 and the channel width of the transistor 101_2 are preferably 1000 μm to 30000 μm. More preferably, the channel width of the transistors 101_1 and 101_2 are 2000 μm to 20000 μm. Further preferably, the channel width of the transistors 101_1 and 101_2 are 3000 μm to 8000 μm or 10000 μm to 18000 μm. Note that this embodiment is not limited thereto.

Figure 1B:
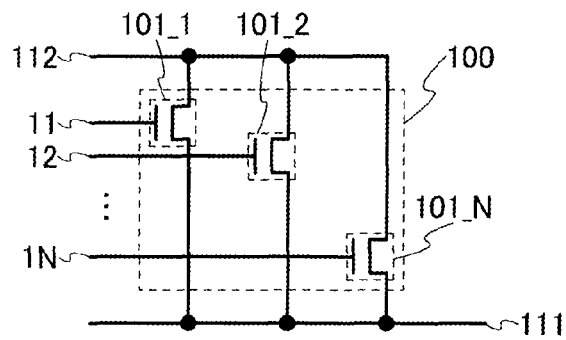

Note that as shown in FIG. 1B, the circuit 100 can include a plurality of transistors, the transistor 101_1 to a transistor 101_N (N is a natural number not less than two). First terminals of the transistor 101_1 to the transistor 101_N are connected to the wiring 112. Second terminals of the transistor 101_1 to the transistor 101_N are connected to the wiring 111. Gates of the transistor 101_1 to the transistor 101_N are connected to the circuit 200. Note that connection portions of the gates of the transistor 101_1 to the transistor 101_N and the circuit 200 are denoted by the nodes 11 to 1N, respectively.

Note that when N is large, the number of times each of the transistors is turned on and the length of the time during which each of the transistors is on can be reduced. However, when N is too large, the scale of a circuit becomes large because the number of transistors is increased too much. Accordingly, N is preferably 6 or less. More preferably, N is 4 or less. Further preferably, N is 2 or 3.

Note that, as in FIG. 1B, in the structure described in FIG. 1A, the circuit 100 can include the plurality of transistors, which are the transistor 101_1 to the transistor 101_N.

Figure 1C:
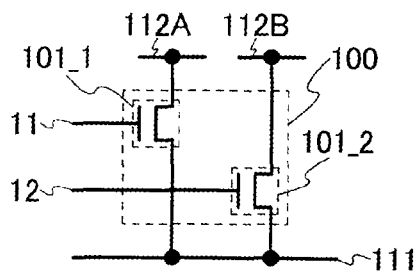

Note that as shown in FIG. 1C the first terminal of the transistor 101_1 and the first terminal of the transistor 101_2 can be connected to different wirings. In an example in FIG. 1C, the wiring 112 is divided into a plurality of wirings, which are wirings 112A and 112B. The first terminal of the transistor 101_1 is connected to the wiring 112A and the first terminal of the transistor 101_2 is connected to the wiring 112B. Note that this embodiment is not limited thereto. The first terminal of the transistor 101_1 and the first terminal of the transistor 101_2 can be connected to a variety of wirings or nodes. Note that the wirings 112A and 112B can have a similar function to the wiring 112. Therefore, a signal such as the signal CK1 can be inputted to the wirings 112A and 112B. Note that this embodiment is not limited thereto. A variety of signals, voltages, or currents can be inputted to the wirings 112A and 112B. Alternatively, different voltages or signals can be supplied to the wirings 112A and 112B.

Note that, as in FIG. 1C, in the structure described in FIGS. 1A and 1B, first terminals of the transistors included in the circuit 100 (e.g., the transistors 101_1 and 101_2, or the transistors 101_1 to 101_N) can be connected to different wirings.

Figure 1D:
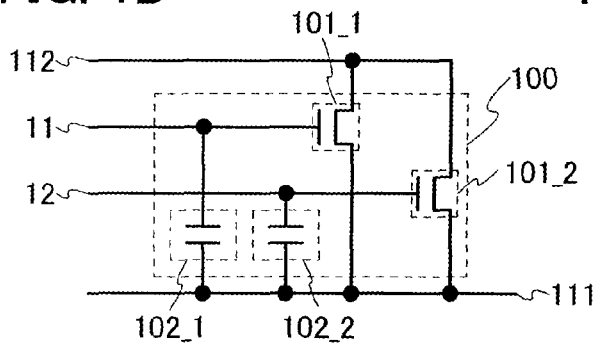

Note that as shown in FIG. 1D, a capacitor 102_1 can be connected between the gate and the second terminal of the transistor 101_1, and a capacitor 102_2 can be connected between the gate and the second terminal of the transistor 101_2. Thus, the voltage of the node 11 or the voltage of the node 12 is increased with ease in a bootstrap operation. Accordingly, the channel widths of the transistors can be smaller because Vgs of the transistors 101_1 and 101_2 can be increased. Alternatively, a falling time or a rising time of the signal OUT can be shortened. Note that this embodiment is not limited thereto. One of the capacitors 102_1 and 102_2 can be omitted. Alternatively, for example, an MIS capacitor can be used as a capacitor.

Note that a material used for one of the electrodes of the capacitor 102_1 and one of the electrodes of the capacitor 102_2 are preferably the same as that used for the gates of the transistors 101_1 and 101_2. A material used for the other of the electrodes of the capacitor 102_1 and the other of the electrodes of the capacitor 102_2 is preferably the same as that used for sources or drains of the transistors 101_1 and 101_2. Thus, a layout area can be smaller. Alternatively, a capacitance value can be larger. Note that this embodiment is not limited thereto. A variety of materials can be used for electrodes of one of the capacitors 102_1 and 102_2 and electrodes of the other of the capacitors 102_1 and 102_2.

Note that it is preferable that capacitance values of the capacitors 102_1 and 102_2 is approximately equal. Further, it is preferable that the area where one electrode of the capacitor 102_1 overlaps with the other electrode thereof is approximately equal to the area where one electrode of the capacitor 102_2 overlaps with the other electrode thereof. Thus, even when the transistors are switched to be used, the waveforms of the signal OUT can be approximately equal because Vgs of the transistor 101_1 can be approximately equal to Vgs of the transistor 101_2. Note that this embodiment is not limited thereto. The Capacitance values of the capacitors 102_1 and 102_2 can be different from each other. Alternatively, the area where one electrode of the capacitor 102_1 overlaps with the other electrode thereof can be approximately different from the area where one electrode of the capacitor 102_2 overlaps with the other electrode thereof.

Note that, as in FIG. 1D, in the structure described in FIGS. 1A to 1C, a capacitor can be connected between respective gates and second terminals of transistors (e.g., the transistors 101_1 and 101_2, or the transistors 101_1 to 101_N).

Figure 1E:
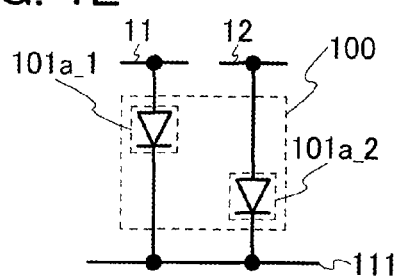
Figure 1F:
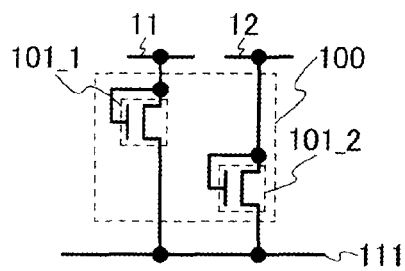

Note that as shown in FIG. 1E, the transistor 101_1 can be replaced with a diode 101a_1 one terminal of which (hereinafter also referred to as a positive electrode) is connected to the node 11 and the other terminal of which (hereinafter also refereed to as a negative electrode) is connected to the wiring 111. Similarly, the transistor 101_2 can be replaced with a diode 101a_2 one terminal of which (also referred to as a positive electrode) is connected to the node 12 and the other terminal of which (also referred to as a negative electrode) is connected to the wiring 111. However, this embodiment is not limited thereto. For example, as shown in FIG. 1F, the transistor 101_1 can be diode-connected by connecting the first terminal of the transistor 101_1 to the node 11. Similarly, the transistor 101_2 can be diode-connected by connecting the first terminal of the transistor 101_2 to the node 12.

Note that, as in FIGS. 1E and 1F, in the structures described in FIGS. 1A to 1D, transistors (e.g., the transistors 101_1 and 101_2, or the transistors 101_1 to 101_N) can be replaced with diodes or the transistors (e.g., the transistors 101_1 and 101_2, or the transistors 101_1 to 101_N) can be diode-connected.

Figure 24A:
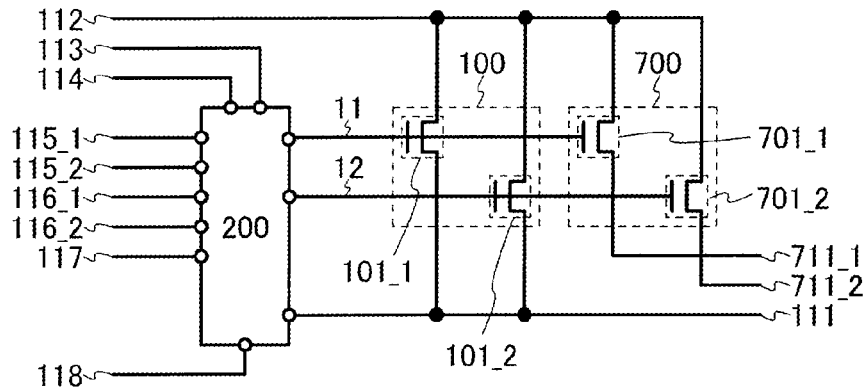
FIGS. 24A to 24F are examples of a circuit diagram of a semiconductor device in Embodiment 3.

Note that as shown in FIG. 24A, a transfer signal can be generated in addition to the signal OUT. For example, a plurality of semiconductor devices are connected in cascade. In this case, delay or distortion of the transfer signal can be reduced as compared to that of the signal OUT because the transfer signal is inputted not to the gate signal line but to a semiconductor device of the following stage as a start signal in many cases. Therefore, since the semiconductor device can be driven by using a signal whose delay or distortion is slight, delay in an output signal of the semiconductor device can be reduced. Further, timing of inputting a signal to the node 11 or the node 12 can be made earlier, so that operation range can be made wider. Further, FIG. 25 illustrates the waveforms of signals of each period in an operation of the semiconductor device shown in FIG. 24A.

Therefore, the semiconductor device can include a circuit 700. The circuit 700 includes a plurality of transistors, which are the transistors 701_1 and 701_2. The transistors 701_1 and 701_2 preferably have the same polarity as the transistors 101_1 and 101_2 and are preferably n-channel transistors. Note that this embodiment is not limited thereto. The transistors 701_1 and 701_2 can be p-channel transistors.

A first terminal of the transistor 701_1 is connected to the wiring 112. A second terminal of the transistor 701_1 is connected to a wiring 711_1. A gate of the transistor 701_1 is connected to the node 11. A first terminal of the transistor 701_2 is connected to the wiring 112. A second terminal of the transistor 701_2, is connected to a wiring 711_2. A gate of the transistor 701_2 is connected to the node 12. Note that when a plurality of semiconductor devices are connected in cascade, the wiring 711_1 can be connected to a wiring 115_1 of a semiconductor device of the following stage, for example. The wiring 711_2 can be connected to the wiring 115_2 of the semiconductor device of the following stage, for example. In such a case, the wiring 111 can be formed so as to extend to a pixel portion or can be connected to a gate of a transistor (e.g., a switching transistor, a selection transistor) included in a pixel. However, this embodiment is not limited thereto.

A signal SOUT1 is outputted from the wiring 711_1. The signal SOUT1 is a digital signal having the High level and the Low level in many cases and can function as an output signal of a semiconductor device. Accordingly, the wirings 711_1 can function as a signal line. The signal SOUT2 is outputted from the wiring 711_2. The signal SOUT2 is a digital signal having the High level and the Low level in many cases and can function as an output signal of the semiconductor device. Accordingly, the wiring 711_2 can function as a signal line.

The circuit 700 has a function of controlling an electrical continuity state of the wirings 112 and 711_1 in accordance with the voltage of node 11, and/or a function of controlling an electrical continuity of the wirings 112 and 711_2 in accordance with the voltage of node 12, for example. Further alternatively, the circuit 700 has a function of controlling a timing of supplying the voltage of the wiring 112 to the wirings 711_1 or/and 711_2. For example, when a voltage such as the voltage V2 or a signal such as the signal CK1 is supplied to the wiring 112, the circuit 700 has a function of controlling a timing of supplying a voltage, a signal, or the like, which is supplied to the wiring 112, to the wirings 711_1 or/and 711_2. Alternatively, the circuit 700 has a function of controlling a timing of supplying the High-level signal (e.g., the signal CK1) to the wiring 711_1 and/or the wiring 711_2. Alternatively, the circuit 700 has a function of controlling a timing of increasing the voltage of the wiring 711_1 and/or the voltage of the wiring 711_2. Alternatively, the circuit 700 has a function of controlling a timing of supplying the Low-level signal (e.g., the signal CK1) to the wiring 711_1 and/or the wiring 711_2. Alternatively, the circuit 700 has a function of controlling a timing of decreasing the voltage of the wiring 711_1 and/or the voltage of the wiring 711_2 to V1, for example. Alternatively, the circuit 700 has a function of keeping the voltage of the wiring 711_1 and/or the voltage of wiring 711_2. Alternatively, the circuit 700 has a function of increasing a voltage of the node 11 and/or the node 12 to V2 or more, for example, by a bootstrap operation. As thus described, the circuit 700 can function as a control circuit, a buffer circuit, a switch, or the like. Note that this embodiment is not limited thereto. The circuit 700 can have a variety of other functions. Note that the circuit 700 does not need to have all the above functions.

For example, the transistor 701_1 has a function of controlling an electrical continuity state of the wirings 112 and 711_1 in accordance with the voltage of the node 11. Alternatively, the transistor 701_1 has a function of controlling a timing of supplying a voltage of the wiring 112 to the wiring 711_1. For example, when a voltage such as the voltage V2 or a signal such as the CK1 is supplied to the wiring 112, the transistor 701_1 has a function of controlling a timing of supplying a voltage, a signal, or the like, which is supplied to the wiring 112, to the wiring 711_1. Alternatively, the transistor 701_1 has a function of controlling a timing of supplying the High-level signal (e.g., the signal CK1) to the wiring 711_1. Alternatively, the transistor 701_1 has a function of controlling a timing of increasing the voltage of the wiring 711_1. Alternatively, the transistor 701_1 has a function of controlling a timing of supplying the Low-level signal (e.g., the signal CK1) to the wiring 711_1. Alternatively, the transistor 701_1 has a function of controlling a timing of decreasing the voltage of the wiring 711_1 to V1, for example. Alternatively, the transistor 701_1 has a function of keeping the voltage of the wiring 711_1. Alternatively, the transistor 701_1 has a function of performing a bootstrap operation. Alternatively, the transistor 701_1 has a function of increasing the voltage of the node 11 to V2 or more, for example, by a bootstrap operation. As thus described, the transistor 701_1 can function as a buffer circuit, a switch, or the like. Note that this embodiment is not limited thereto. The transistor 701_1 can have a variety of other functions. Note that the transistor 701_1 does not need to have all the above functions.

For example, the transistor 701_2 has a function of controlling an electrical continuity state of the wirings 112 and 711_2 in accordance with the voltage of the node 12. Alternatively, the transistor 701_2 has a function of controlling a timing of supplying a voltage of the wiring 112 to the wiring 711_2. For example, when a voltage such as the voltage V2 or a signal such as the CK1 is supplied to the wiring 112, the transistor 701_2 has a function of controlling a timing of supplying a voltage, a signal, or the like, which is supplied to the wiring 112, to the wiring 711_2. Alternatively, the transistor 701_2 has a function of controlling a timing of supplying the High-level signal (e.g., the signal CK1) to the wiring 711_2. Alternatively, the transistor 701_2 has a function of controlling a timing of increasing the voltage of the wiring 711_2. Alternatively, the transistor 701_2 has a function of controlling a timing of supplying the Low-level signal (e.g., the signal CK1) to the wiring 711_2. Alternatively, the transistor 701_2 has a function of controlling a timing of decreasing the voltage of the wiring 711_2 to V1, for example. Alternatively, the transistor 701_2 has a function of keeping the voltage of the wiring 711_2. Alternatively, the transistor 701_2 has a function of performing a bootstrap operation. Alternatively, the transistor 701_2 has a function of increasing the voltage of the node 12 to V2 or more, for example, by a bootstrap operation. As thus described, the transistor 701_2 can function as a buffer circuit, a switch, or the like. Note that this embodiment is not limited thereto. The transistor 701_2 can have a variety of other functions. Note that the transistor 701_2 does not need to have all the above functions.

Note that, in the case where the signals SOUT1 and SOUT2 are used as transfer signals, the load of the wirings 711_1 and the load of 711_2 are smaller than that of the wiring 111 in many cases. Therefore, the channel width of the transistor 701_1 is preferably smaller than that of the transistor 101_1. Similarly, the channel width of the transistor 701_2 is preferably smaller than that of the transistor 101_2. However, this embodiment is not limited thereto.

Note that the channel length of the transistor 701_1 can be approximately equal to the channel length of the transistor 101_1. Alternatively, the channel length of the transistor 701_2 can be approximately equal to the channel length of the transistor 101_2. Note that this embodiment is not limited thereto. The channel length of the transistor 701_1 can be different from that of the transistor 101_1. The channel length of the transistor 701_2 can be different from that of the transistor 101_2.

Note that the channel widths of the transistors 701_1 and 701_2 are preferably 100 µm to 5000 µm. More preferably, the channel widths of the transistors 701_1 and 701_2 are 300 µm to 2000 µm. Further preferably, the channel widths of the transistors 701_1 and 701_2 are 500 µm to 1000 µm. However, this embodiment is not limited thereto.

Note that it is preferable that the channel width of the transistor 7011 be approximately equal to the channel width of the transistor 701_2. By making the transistors have approximately the same size in such a manner, the transistors can have approximately the same current supply capability. Further, the degree of deterioration of characteristics of the transistors can be approximately the same. Accordingly, the waveform of the signal SOUT1 and the waveform of the signal SOUT2 can be approximately equal. From a similar reason, it is preferable that the channel length of the transistor 701_1 be approximately equal to the channel length of the transistor 701_2. Note that this embodiment is not limited thereto. The channel width of the transistor 701_1 can be different from the channel width of the transistor 701_2.

Figure 24B:
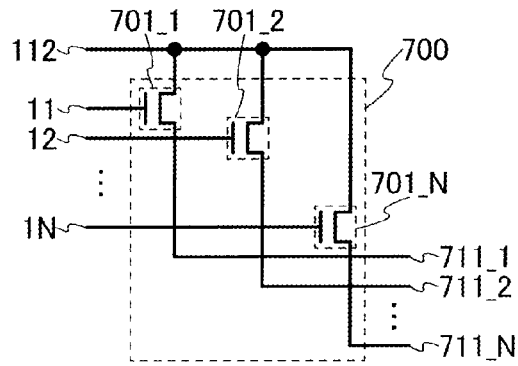

Note that as shown in FIG. 24B, as in FIG. 1B, the circuit 700 can include a plurality of transistors, which are transistors 701_1 to 701_N. First terminals of the transistors 701_1 to 701_N are connected to the wiring 112. Second terminals of the transistors 701_1 to 701_N are connected to wirings 711_1 to 711_N, respectively. Gates of the transistors 701_1 to 701_N are connected to nodes 11 to 1N, respectively.

Note that, as in FIG. 24B, in the structure described in FIG. 24A, the circuit 700 can include the plurality of transistors, which are the transistor 701_1 to the transistor 701_N.

Figure 24C:
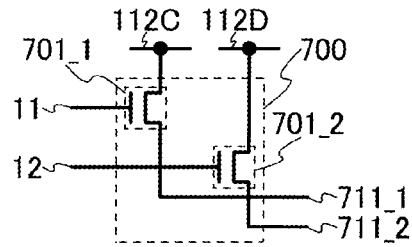

Note that as shown in FIG. 24C, as in FIG. 1C, the first terminal of the transistor 701_1 and the first terminal of the transistor 701_2 can be connected to different wirings. In an example in FIG. 1C, the wiring 112 is divided into a plurality of wirings, which are wirings 112C and 112D. The first terminal of the transistor 701_1 is connected to the wiring 112C and the first terminal of the transistor 701_2 is connected to the wiring 112D. Note that this embodiment is not limited thereto. The first terminal of the transistor 701_1 and the first terminal of the transistor 701_2 can be connected to a variety of wirings or nodes. Note that the wirings 112C and 112D can have a similar function to the wiring 112. Therefore, a signal such as the signal CK1 can be inputted to the wirings 112C and 112D. Note that this embodiment is not limited thereto. A variety of signals, voltages, or currents can be inputted to the wirings 112C and 112D.

Note that, as in FIG. 24C, in the structure described in FIGS. 24A and 24B, first terminals of the transistors included in the circuit 700 (e.g., the transistors 701_1 and 701_2, or the transistors 701_1 to 701_N) can be connected to different wirings from each other.

Figure 24D:
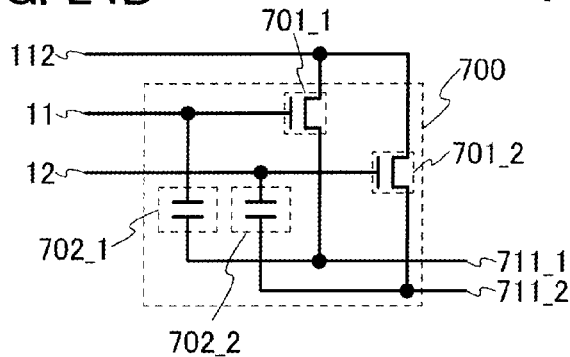

Note that as shown in FIG. 24D, as in FIG. 1D, a capacitor 702_1 can be connected between the gate and the second terminal of the transistor 701_1, and a capacitor 702_2 can be connected between the gate and the second terminal of the transistor 701_2.

Note that, as in FIG. 24D, in the structure described in FIGS. 24A to 24C, a capacitor can be connected between respective gates and second terminals of transistors (e.g., the transistors 701_1 and 701_2, or the transistors 701_1 to 701_N).

Figure 24E:
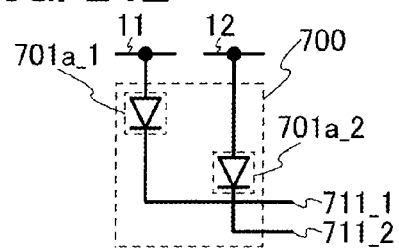
Figure 24F:
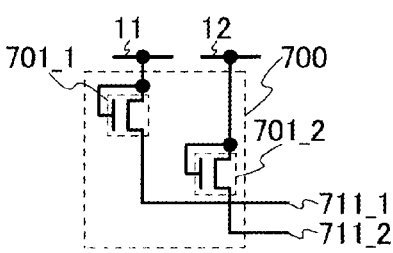

As shown in FIG. 24E, as in FIG. 1E, the transistor 701_1 can be replaced with a diode 701a_1 one terminal of which (hereinafter also referred to as a positive electrode) is connected to the node 11 and the other terminal of which (hereinafter also referred to as a negative electrode) is connected to the wiring 111. Similarly, the transistor 701_2 can be replaced with a diode 701a_2 one terminal of which (also referred to as a positive electrode) is connected to the node 12 and the other terminal of which (also referred to as a negative electrode) is connected to the wiring 711_2. However, this embodiment is not limited thereto. For example, as shown in FIG. 24F, as in FIG. 1F, the transistor 701_1 can be diode-connected by connecting the first terminal of the transistor 701_1 to the node 11. Similarly, the transistor 701_2 can be diode-connected by connecting the first terminal of the transistor 701_1 to the node 12.

Note that, as in FIGS. 24E and 24F, in the structures described in FIGS. 24A to 24D, transistors (e.g., the transistors 701_1 and 701_2, or the transistors 701_1 to 701_N) can be replaced with diodes or the transistors (e.g., the transistors 701_1 and 701_2, or the transistors 701_1 to 701_N) can be diode-connected.

Embodiment 2

In this embodiment, a specific example of the circuit 200 described in Embodiment 1 is described. Note that the circuit 200 can also be referred to as a semiconductor device or a driver circuit. Note that description of the content described in Embodiment 1 is omitted. Note that a content described in this embodiment can be freely combined with the content described in Embodiment 1.

Figure 6A:
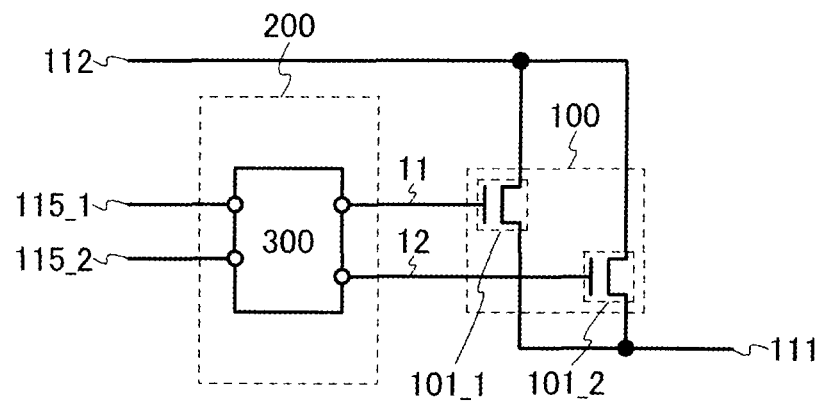
FIGS. 6A and 6B are examples of circuit diagrams of a semiconductor device in Embodiment 2.

First, an example of the circuit 200 is described with reference to FIG. 6A. In an example of FIG. 6A, the circuit 200 includes a circuit 300 which shows a part of the circuit 200. The circuit 300 can include one transistor or a plurality of transistors, for example. These transistors preferably have the same polarity as the transistors 101_1 and 101_2. However, this embodiment is not limited thereto.

The circuit 300 is connected to the wiring 115_1, the wiring 115_2, the node 11, and the node 12. Note that this embodiment is not limited thereto. The circuit 300 can be connected to a variety of wirings, a variety of nodes, or a variety of terminals. For example, when the circuit 300 has a structure in which a power supply voltage is needed, the circuit 300 can be connected to the wiring 114 and/or the wiring 118. Further, when the circuit 300 needs another signal, the circuit 300 can be connected to the wiring 112, the wiring 113, the wiring 116_1, the wiring 116_2, the wiring 117 and/or the wiring 111.

The circuit 300 has a function of controlling setting of voltages of the node 11 and the node 12, in accordance with an inputted signal or a voltage (e.g., the signal SP1 and the signal SP2). Alternatively, the circuit 300 has a function of controlling a timing of supplying the High-level signal or the voltage V2 to the node 11 and/or the node 12. Alternatively, the circuit 300 has a function of controlling a timing of supplying the Low-level signal or the voltage V1 to the node 11 and/or the node 12. Alternatively, the circuit 300 has a function of selectively stopping supplying a signal or a voltage to the node 11 and/or the node 12. Alternatively, the circuit 300 has a function of making the node 11 and/or the node 12 go into a floating state. Note that this embodiment is not limited thereto. The circuit 300 can have a variety of other functions. Note that the circuit 300 does not need to have all the above functions.

Next, an operation of the circuit 300 in FIG. 6A will be described with reference to a timing chart in FIG. 2.

In the period A1, since the signal SP1 is in the High level, the circuit 300 supplies the voltage V2 or the High-level signal to the node 11. After that, the circuit 300 stops supplying a voltage or a signal to the node 11 when the voltage of the node 11 becomes (V1+Vth101_1+Vx). Meanwhile, since the signal SP2 is in the Low level, the circuit 300 can supply the voltage V1 or the Low-level signal to the node 12. Alternatively, it is acceptable that the circuit 300 does not supply a voltage, a signal, or the like to the node 12.

In the period B1, the circuit 300 still does not supply a voltage, a signal, or the like to the node 11. Meanwhile, the circuit 300 can supply the voltage V1 or the Low-level signal to the node 12. Alternatively, it is acceptable that the circuit 300 does not supply a voltage, a signal, or the like to the node 12.

In the periods C1 to E1, the circuit 300 can supply the voltage V1 or the Low-level signal to the node 11. Alternatively, it is acceptable that the circuit 300 does not supply a voltage, a signal, or the like to the node 11. Meanwhile, the circuit 300 can supply the voltage V1 or the Low-level signal to the node 12. Alternatively, it is acceptable that the circuit 300 does not supply a voltage, a signal, or the like to the node 12.

In the period A2, since the signal SP1 is in the Low level, the circuit 300 can supply the voltage V1 or the Low-level signal to the node 11. Alternatively, it is acceptable that the circuit 300 does not supply a voltage, a signal, or the like to the node 11. Meanwhile, the signal SP2 is in the High level, the circuit 300 supplies the voltage V2 or the High-level signal to the node 12. After that, the circuit 300 stops supplying a voltage, a signal, or the like to the node 12 when the voltage of the node 12 becomes (V1+Vth101_2+Vx).

In the period B2, the circuit 300 can supply the voltage V1 or the Low-level signal to the node 11. Alternatively, it is acceptable that the circuit 300 does not supply a voltage, a signal, or the like to the node 11. Meanwhile, the circuit 300 still does not supply a voltage, a signal, or the like to the node 12.

In the periods C2 to E2, the circuit 300 can supply the voltage V1 or the Low-level signal to the node 11. Alternatively, it is acceptable that the circuit 300 does not supply a voltage, a signal, or the like to the node 11. Meanwhile, the circuit 300 can supply the voltage V1 or the Low-level signal to the node 12. Alternatively, it is acceptable that the circuit 300 does not supply a voltage, a signal, or the like to the node 12.

A specific example of the circuit 300 will be explained with reference to FIG. 6B. The circuit 300 includes a plurality of transistors, which are transistors 301_1 and 301_2. The transistors 301_1 and 301_2 preferably have the same polarity as the transistors 101_1 and 101_2 and are preferably n-channel transistors. Note that this embodiment is not limited thereto. The transistors 301_1 and 301_2 can be p-channel transistors.

A first terminal of the transistor 301_1 is connected to the wiring 115_1. A second terminal of the transistor 301_1 is connected to the node 11. A gate of the transistor 301_1 is connected to the wiring 115_1. A first terminal of the transistor 301_2 is connected to the wiring 115_2. A second terminal of the transistor 301_2 is connected to the node 12. A gate of the transistor 301_2 is connected to the wiring 115_2.

The transistor 301_1 has a function of controlling an electrical continuity state of the wiring 115_1 and the node 11, for example. Alternatively, the transistor 301_1 has a function of controlling a timing of supplying the voltage of the wiring 115_1 to the node 11. For example, when a voltage such as the voltage V1 or V2, or a signal such as the signal SP1 is supplied to the wiring 115_1, the transistor 301_1 has a function of controlling a timing of supplying a voltage, a signal, or the like, which is supplied to the wiring 115_1, to the node 11. Alternatively, the transistor 301_1 has a function of controlling a timing of supplying the High-level signal (e.g., the signal SP1) or the voltage V2 to the node 11. Further, the transistor 301_1 has a function of controlling a timing of increasing the voltage of the node 11. Alternatively, the transistor 301_1 has a function of stopping supplying a signal, a voltage, or the like to the node 11. Further, the transistor 301_1 has a function of making the node 11 go into a floating state. As thus described, the transistor 301_1 can function as a rectifying element such as a diode or a diode-connected transistor. Note that this embodiment is not limited thereto. The transistor 301_1 can have a variety of other functions. Note that the transistor 301_1 does not need to have all the above functions.

The transistor 301_2 has a function of controlling an electrical continuity state of the wiring 115_2 and the node 12, for example. Alternatively, the transistor 301_2 has a function of controlling a timing of supplying a voltage of the wiring 115_2 to the node 12. For example, when a voltage such as the voltage V1 or V2, or a signal such as the signal SP2 is supplied to the wiring 115_2, the transistor 301_2 has a function of controlling a timing of supplying a voltage, a signal, or the like supplied to the wiring 115_2 to the node 12. Alternatively, the transistor 301_2 has a function of controlling a timing of supplying a High-level signal (e.g., the signal SP2) or the voltage V2 to the node 12. Further, the transistor 301_2 has a function of controlling a timing of increasing a voltage of the node 12. Further, the transistor 301_2 has a function of stopping supplying a signal, a voltage, or the like to the node 12. Further, the transistor 301_2 has a function of making the node 12 go into a floating state. As thus described, the transistor 301_2 can function as a rectifying element such as a diode or a diode-connected transistor. Note that this embodiment is not limited thereto. The transistor 301_2 can have a variety of other functions. Note that the transistor 301_2 does not need to have all the above functions.

Figure 6B:
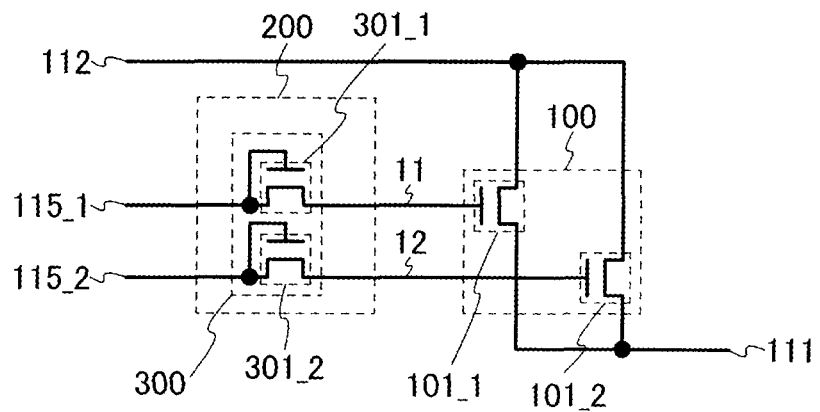
Figure 7A:
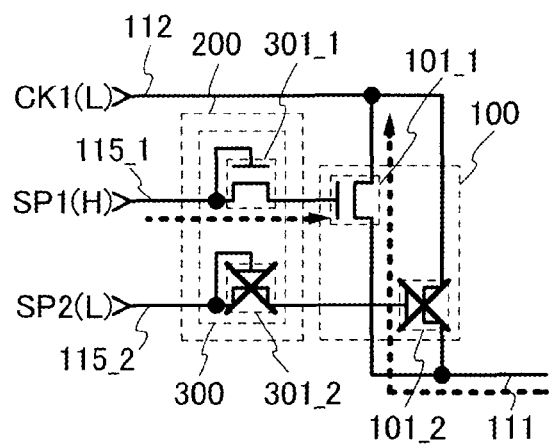
FIGS. 7A to 7D are examples of schematic diagrams illustrating operations of a semiconductor device in FIGS. 6A and 6B.
Figure 7B:
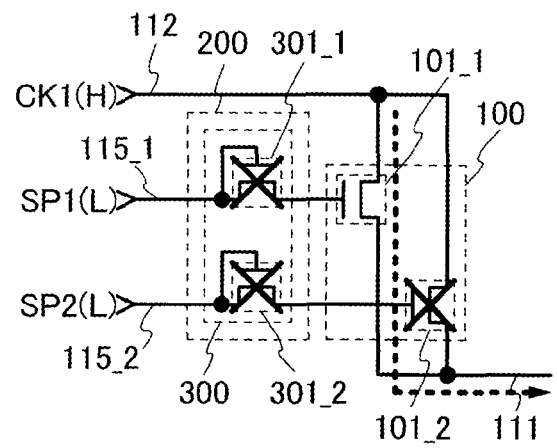
Figure 7C:
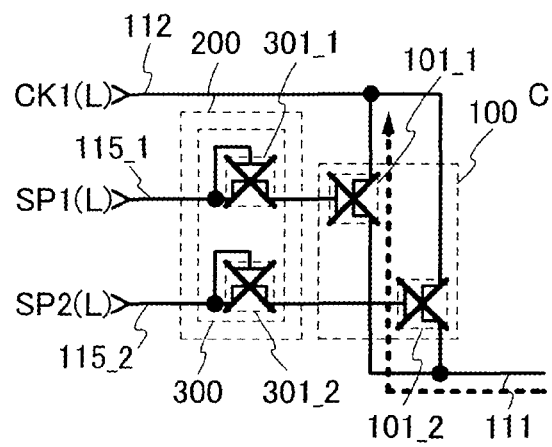
Figure 7D:
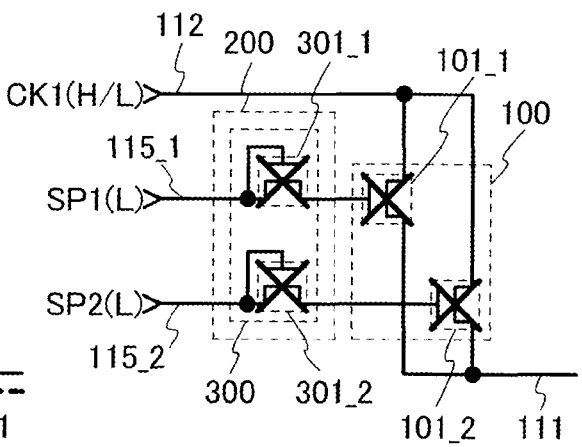
Figure 8A:
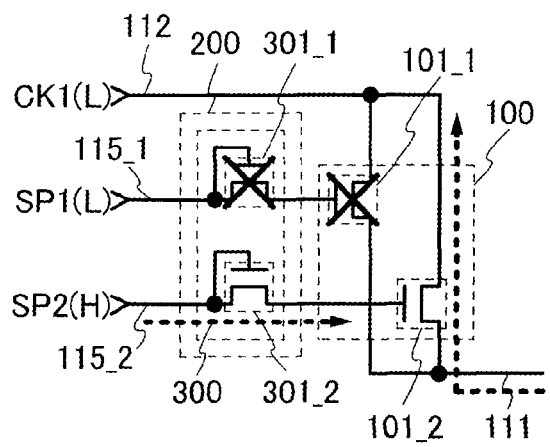
FIGS. 8A to 8D are examples of schematic diagrams illustrating operations of a semiconductor device in FIGS. 6A and 6B.
Figure 8B:
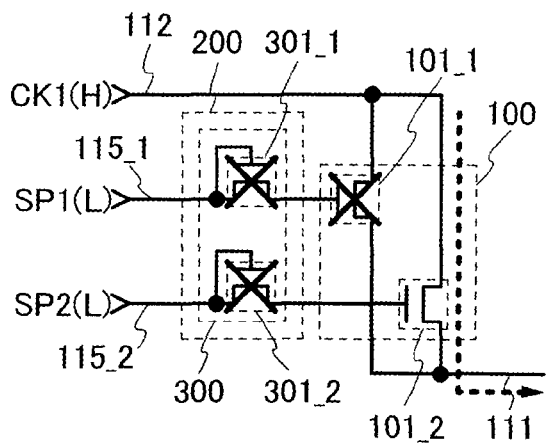
Figure 8C:
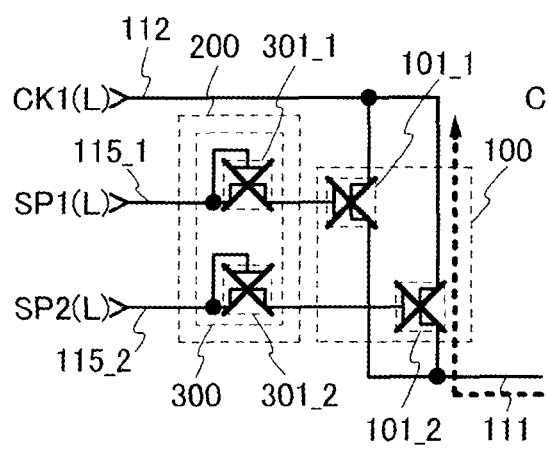
Figure 8D:
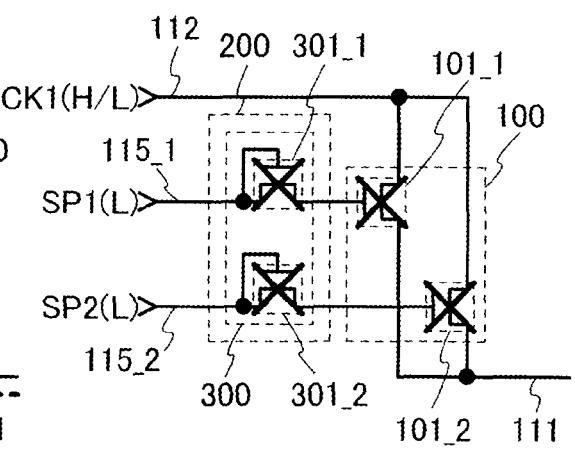

Next, an example of an operation of the circuit 300 in FIG. 6B is described with reference to the timing chart in FIG. 2. Note that a schematic view of an operation of the semiconductor device in the period. A1 is shown in FIG. 7A. A schematic view of an operation of the semiconductor device in the period B1 is shown in FIG. 7B. A schematic view of an operation of the semiconductor device in the period C1 is shown in FIG. 7C. A schematic view of an operation of the semiconductor device in the periods D1 and E1 is shown in FIG. 7D. Note that a schematic view of an operation of the semiconductor device in the period A2 is shown in FIG. 8A. A schematic view of an operation of the semiconductor device in the period B2 is shown in FIG. 8B. A schematic view of an operation of the semiconductor device in the period C2 is shown in FIG. 8C. A schematic view of an operation of the semiconductor device in the periods D2 and E2 is shown in FIG. 8D.

In the period A1, since the signal SP1 goes into the High level, the transistor 301_1 is turned on. Therefore, the wiring 115_1 and the node 11 are brought into electrical continuity through the transistor 301_1, so that the signal SP1 in the High level is supplied from the wiring 115_1 to the node 11 through the transistor 301_1. As a result, a voltage of the node 11 is increased. After that, the transistor 301_1 is turned off when a voltage of the node 11 is increased and exceeds a value which is obtained by subtracting a threshold voltage of the transistor 301_1 (Vth301_1) from a gate voltage of the transistor 301_1 (a High-level voltage of the signal SP1: V2), (V2−Vth301_1). Accordingly, the wiring 115_1 and the node 11 are brought out of electrical continuity, so that the node 11 goes into a floating state. Meanwhile, the signal SP2 goes into the Low level, so that the transistor 301_2 is turned off. Accordingly, the wiring 115_2 and the node 12 are brought out of electrical continuity.

In the periods B1 to E1, since the signal SP1 goes into the Low level, the transistor 301_1 is turned off. Accordingly, the wiring 115_1 and the node 11 are out of electrical continuity. Meanwhile, the signal SP2 is the Low level, so that the transistor 301_2 is off. Accordingly, the wiring 115_2 and the node 12 are out of electrical continuity.

In the period A2, since the signal SP1 goes into the Low level, the transistor 301_1 is turned off. Accordingly, the wiring 115_1 and the node 11 are brought out of electrical continuity. Meanwhile, the signal SP2 goes into the High level, so that the transistor 301_2 is turned on. Therefore, the wiring 115_2 and the node 12 are brought into electrical continuity through the transistor 301_2, so that the signal SP2 in the High level is supplied from the wiring 115_2 to the node 12 through the transistor 301_2. As a result, a voltage of the node 12 is increased. After that, the transistor 301_2 is turned off when a voltage of the node 12 is increased and exceeds a value which is obtained by subtracting a threshold voltage of the transistor 301_2 (Vth301_2) from a gate voltage of the transistor 301_2 (a High-level voltage of the signal SP2: V2), (V2−Vth301_2). Accordingly, the wiring 115_2 and the node 12 are brought out of electrical continuity, so that the node 12 goes into a floating state.

In the periods B2 to E2, since the signal SP1 is in the Low level, the transistor 301_1 is turned off. Accordingly, the wiring 115_1 and the node 11 are out of electrical continuity. Meanwhile, the signal SP2 goes into the Low level, so that the transistor 301_2 is off. Accordingly, the wiring 115_2 and the node 12 are out of electrical continuity.

As thus described, one of a signal (e.g., SP1) supplied to the wiring 115_1 and a signal (e.g., SP2) supplied to the wiring 115_2 set to be in the High level. In such a manner, either the transistor 101_1 or the transistor 101_2 is selected to be on. However, this embodiment is not limited thereto. For example, both a signal supplied to the wiring 115_1 and a signal supplied to the 115_2 can be set in the High level. In this case, both transistors 101_1 and 101_2 are turned on, so that the wirings 112 and 111 are brought into electrical continuity through the transistors 101_1 and 101_2 which are connected in parallel. Therefore, a falling time or a rising time of the signal OUT can be shortened.

Note that it is preferable that the channel width of the transistor 301_1 is approximately equal to the channel width of the transistor 301_2 because the transistors 301_1 and 301_2 have a similar function to each other. By making the transistors have approximately the same size in such a manner, the transistors can have approximately the same current supply capability. Further, the degree of deterioration of characteristics of the transistors can be approximately the same as each other. Accordingly, a voltage of the node 11 and a voltage of the node 12 can be set to be approximately equal to each other, so that waveforms of the signal OUT can be approximately the same as each other. For a similar reason, it is preferable that the channel length of the transistor 301_1 be approximately equal to the channel length of the transistor 301_2. Note that this embodiment is not limited thereto. The channel width of the transistor 301_1 can be different from the channel width of the transistor 301_2. The channel length of the transistor 301_1 can be different from the channel length of the transistor 301_2.

Note that since a load (e.g., the node 11) of the transistor 301_1 is smaller than a load (e.g., the wiring 111) of the transistor 101_1 in many cases, the channel width of the transistor 301_1 is preferably smaller than the channel width of the transistor 101_1. Similarly, since a load (e.g., the node 12) of the transistor 301_2 is smaller than a load (e.g., the wiring 112) of the transistor 101_2 in many cases, the channel width of the transistor 301_2 is preferably smaller than the channel width of the transistor 101_2. Note that this embodiment is not limited thereto. The channel width of the transistor 301_1 can be larger than the channel width of the transistor 101_1. The channel width of the transistor 301_2 can be larger than the channel width of the transistor 101_2.

Note that the channel widths of the transistors 301_1 and 301_2 are preferably 500 μm to 3000 μm. More preferably, the channel widths of the transistors 301_1 and 301_2 are 800 μm to 2500 μm. Further preferably, the channel widths of the transistors 301_1 and 301_2 are 1000 μm to 2000 μm. However, this embodiment is not limited thereto.

Figure 9A:
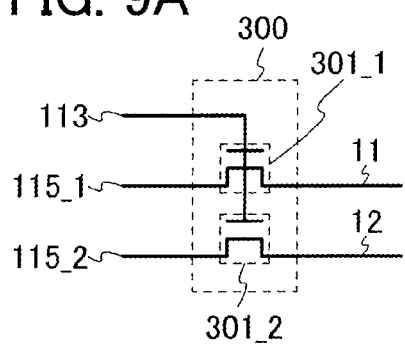
FIGS. 9A to 9F are examples of a circuit diagram of a semiconductor device in Embodiment 2.

Note that, as shown in FIG. 9A, the gates of the transistors 301_1 and 301_2 can be connected to the wiring 113. In such a case, when the signal CK2 is inputted to the wiring 113, the transistors 301_1 and 301_2 are turned on because the signal CK2 goes into the High level in the periods A1 and A2. Therefore, in the period A1, the signal SP1 in the High level is supplied from the wiring 115_1 to the node 11 through the transistor 301_1, and the signal SP2 in the Low level is supplied from the wiring 115_2 to the node 12 through the transistor 301_2. Meanwhile, in the period A2, the signal SP1 in the Low level is supplied from the wiring 115_1 to the node 11 through the transistor 301_1, and the signal SP2 in the High level is supplied from the wiring 115_2 to the node 12 through the transistor 301_2. In this manner, in the predetermined period, a voltage of the node 11 or a voltage of the node 12 can be fixed, so that a semiconductor device with strength against noise can be obtained. However, this embodiment is not limited thereto.

For example, the gates of the transistor 301_1 and 301_2 can be connected to a variety of wirings other than the wiring 113. For example, in the period A1 and/or the period A2, the gates of the transistor 301_1 and 301_2 can be connected to a wiring (e.g., the wiring 114, the wiring 116_1, or the wiring 116_2) to which a High-level signal or the voltage V2 is supplied.

Figure 9B:
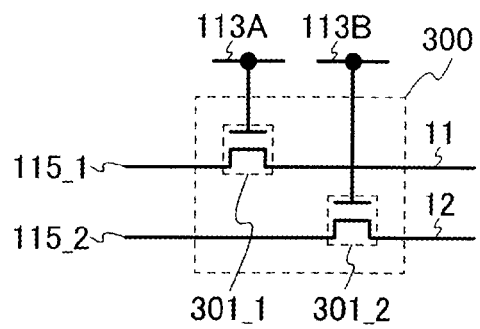

As another example, as shown in FIG. 9B, the wiring 113 can be divided into a plurality of wirings which are wirings 113A and 113B. The gate of the transistor 301_1 is connected to the wiring 113A and the gate of the transistor 301_2 is connected to the wiring 113B.

Figure 9C:
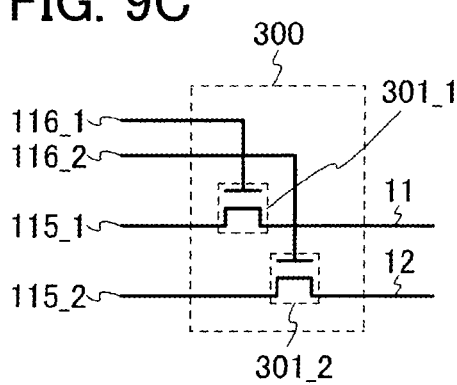

As another example, as shown in FIG. 9C, the gate of the transistor 301_1 can connected to the wiring 116_1 and the gate of the transistor 301_2 can be connected to the wiring 116_2. However, this embodiment is not limited thereto. For example, in the period A1, the gate of the transistor 301_1 can be connected to a wiring (e.g., the wiring 113, the wiring 114, the wiring 115_1, or the wiring 116_1) to which a High-level signal or the voltage V2 is supplied. Similarly, in the period A2, the gate of the transistor 301_2 can be connected to a wiring (e.g., the wiring 113, the wiring 114, the wiring 115_2, or the wiring 116_2) to which a High-level signal or the voltage V2 is supplied.

Figure 9D:
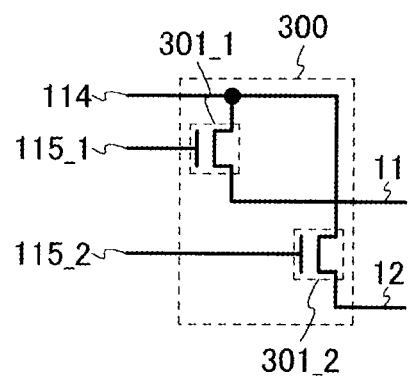

Note that, as shown in FIG. 9D, the first terminal of the transistor 301_1 can be connected to the wiring 114, the second terminal of the transistor 301_1 can be connected to the node 11, and the gate of the transistor 301_1 can be connected to the wiring 115_1. Similarly, the first terminal of the transistor 301_2 can be connected to the wiring 114, the second terminal of the transistor 301_2 can be connected to the node 12, and the gate of the transistor 301_2 can be connected to the wiring 115_2. In such a case, in the period A1, when the signal SP1 goes into the High level, the transistor 301_1 is turned on. Therefore, when the voltage V2 is supplied to the wiring 114, the voltage V2 is supplied from the wiring 114 to the node 11 through the transistor 301_1. Meanwhile, in the period A2, when the signal SP2 goes into the High level, the transistor 301_2 is turned on. Therefore, the voltage V2 is supplied from the wiring 114 to the node 12 through transistor 301_2. However, this embodiment is not limited thereto.

For example, the first terminals of the transistors 301_1 and 301_2 can be connected to a variety of wirings other than the wiring 114. For example, in the period A1 and/or the period B1, the first terminals of the transistors 301_1 and 301_2 can be connected to a wiring (e.g., the wiring 113, the wiring 116_1, or the wiring 116_2) to which a High-level signal or the voltage V2 is supplied. In such a case, a reverse bias can be applied to the transistor, so that deterioration of characteristics of the transistor can be suppressed.

Figure 9E:
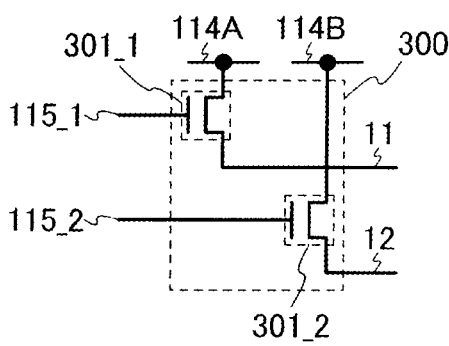

As another example, as shown in FIG. 9E, the wiring 114 can be divided into a plurality of wirings which are wirings 114A and 114B. The first terminal of the transistor 301_1 is connected to the wiring 114A and the first terminal of the transistor 301_2 is connected to the wiring 114B.

Figure 9F:
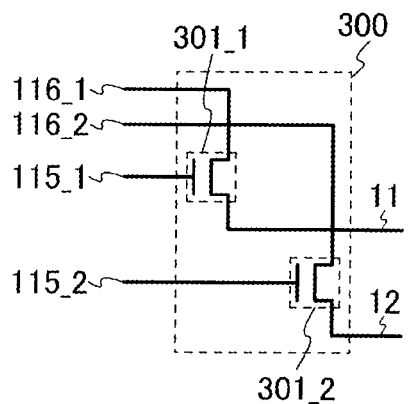

As another example, as shown in FIG. 9F, the first terminal of the transistor 301_1 is connected to the wiring 116_1 and the first terminal of the transistor 301_2 can be connected to the wiring 116_2. In such a case, a reverse bias can be applied to the transistor, so that deterioration of characteristics of the transistor can be suppressed. However, this embodiment is not limited thereto. For example, in the period A1, the first terminal of the transistor 301_1 can be connected to the wiring (e.g., the wiring 113, the wiring 114, the wiring 115_1, or the wiring 116_1) to which a High-level signal or the voltage V2 is supplied. Similarly, in the period A2, the first terminal of the transistor 301_2 can be connected to the wiring (e.g., the wiring 113, the wiring 114, the wiring 115_2, or the wiring 116_2) to which a High-level signal or the voltage V2 is supplied.

Figure 10A:
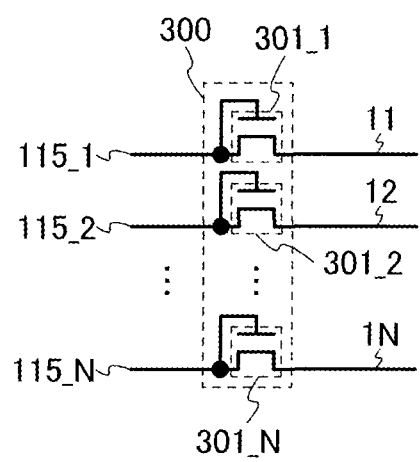
FIGS. 10A to 10D are examples of a circuit diagram of a semiconductor device in Embodiment 2.
Figure 10B:
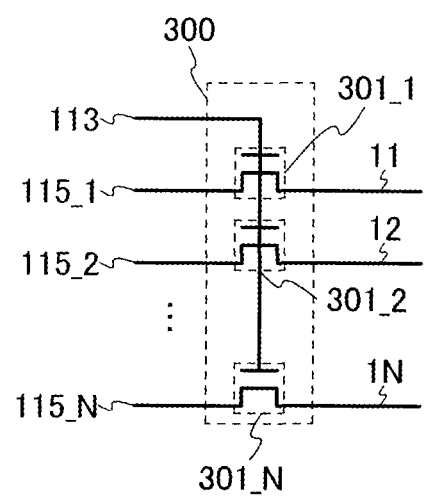

Note that as shown in FIG. 1B, in the case where the circuit 100 includes the plurality of transistors 101_1 to 101_N, the circuit 300 can include a plurality of transistors 301_1 to 301_N as shown in FIG. 10B. First terminals of the transistors 301_1 to 301_N are connected to the wirings 115_1 to 115_N, respectively. Second terminals of the transistors 301_1 to 301_N are connected to the node 11 to nodes 1N, respectively. Gates of the transistors 301_1 to 301_N are connected to wirings 115_1 to 115_N, respectively.

Note that, as in FIG. 10A, in the structure described in FIGS. 9A to 9F, the circuit 300 can include a plurality of transistors, which are the transistors 301_1 to 301_N. FIG. 10B shows the case where the circuit 300 in FIG. 9A includes the plurality of the transistors 301_1 to 301_N as an example.

Figure 10C:
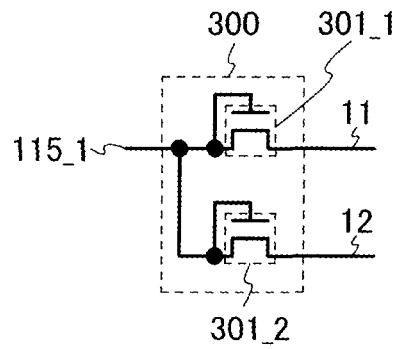

Note that as shown in FIG. 10C, the wirings 115_1 and 115_2 can be shared. The gate and the second terminal of the transistor 302_2 are connected to the wiring 115_1. However, this embodiment is not limited thereto. For example, the second terminal and the gate of the transistor 301_1, and the second terminal and the gate of the transistor 301_2 can be connected to a wiring which is different from the wiring 115_1. Note that the expression "a plurality of wirings are shared" mean that an element which is connected to each of wirings is connected to one wiring. Alternatively, the expression "a plurality of wirings are shared" mean that one of wirings is omitted and an element connected to the wiring is connected to the other wiring.

Figure 10D:
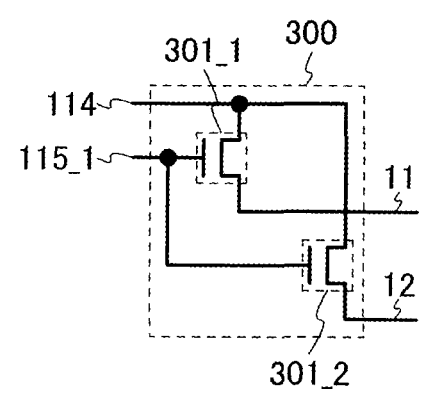

Note that, as in FIG. 10C, the wirings 115_1 and the 115_2 can be shared in the structures described in FIGS. 9A to 9F and FIGS. 10A and 10B. In particular, in FIGS. 10A and 10B, the wirings 115_1 to 115_N can be shared. FIG. 10D shows a structure in which the wirings 115_1 and 115_2 in FIG. 9D are shared.

Figure 11A:
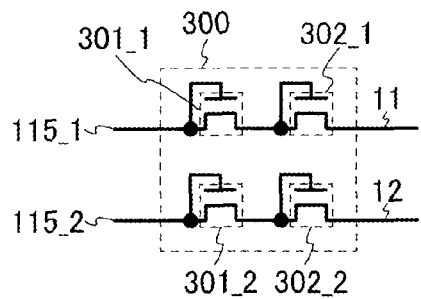
FIGS. 11A to 11H are examples of a circuit diagram of a semiconductor device in Embodiment 2.

Note that, as shown in FIG. 11A, the circuit 300 can include a plurality of transistors, which are the transistors 302_1 and 302_2, in addition to the transistors 301_1 and 301_2. The transistors 302_1 and 302_2 preferably have the same polarity as the transistors 301_1 and 301_2 and are n-channel transistors in many cases. Note that this embodiment is not limited thereto. The transistors 302_1 and 302_2 can be p-channel transistors.

Note that the transistor 302_1 has a function of making the node 11 go into a floating state, for example. Alternatively, the transistor 302_1 has a function of preventing the node 11 from leaking charge. Alternatively, the transistor 302_1 has a function of preventing a voltage of the node 11 from decreasing. Thus, the transistor 302_1 can function as a rectifying element such as a diode or a diode-connected transistor. Note that this embodiment is not limited thereto. The transistor 302_1 can have a variety of other functions. Note that the transistor 302_1 does not need to have all the above functions.

Note that the transistor 302_2 has a function of making the node 12 go into a floating state, for example. Alternatively, the transistor 302_2 has a function of preventing charge from leaking from the node 12. Alternatively, the transistor 302_2 has a function of preventing a voltage of the node 12 from decreasing. Thus, the transistor 302_2 can function as a rectifying element such as a diode or a diode-connected transistor. Note that this embodiment is not limited thereto. The transistor 302_2 can have a variety of other functions. Note that the transistor 302_2 does not need to have all the above functions.

Note that the transistor 302_1 is connected between the second terminal of the transistor 301_1 and the node 11. The transistor 302_2 is connected between the second terminal of the transistor 301_2 and the node 12. The first terminal of the transistor 302_1 is connected to the second terminal of the transistor 301_1. The second terminal of the transistor 302_1 is connected to the node 11. A gate of the transistor 302_1 is connected to the second terminal of the transistor 301_1. The first terminal of the transistor 302_2 is connected to the second terminal of the transistor 301_2. The second terminal of the transistor 302_2 is connected to the node 12. A gate of the transistor 302_2 is connected to the second terminal of the transistor 301_2. However, this embodiment is not limited thereto.

Figure 11B:
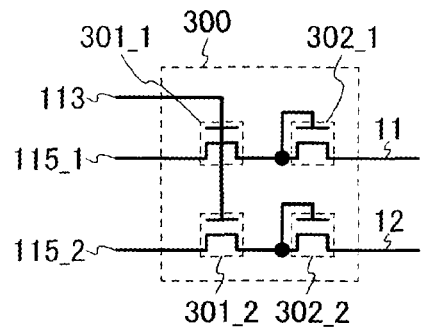
Figure 11C:
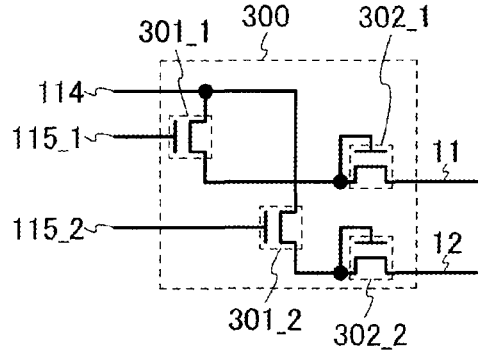

Note that, as in FIG. 11A, in the structure described in FIGS. 9A to 9F and FIGS. 10A to 10D, the circuit 300 can include a plurality of transistors, which are the transistors 302_1 and 302_2, in addition to the transistors 301_1 and 301_2. FIG. 11B shows the case where the circuit 300 in FIG. 9A includes the plurality of the transistors 302_1 to 302_2 in addition to the transistors 301_1 and 301_2 as an example. FIG. 11C shows the case where the circuit 300 in FIG. 9D includes the plurality of the transistors 302_1 and 302_2, in addition to the transistors 301_1 and 301_2 as an example.

Figure 11D:
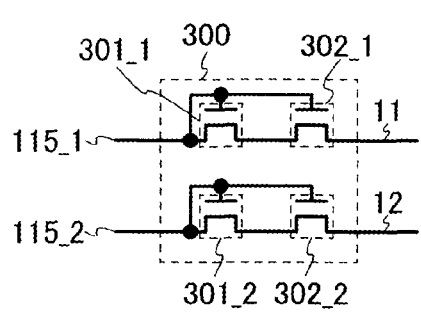

Note that as shown in FIG. 11D, the gate of the transistor 302_1 can be connected to the wiring 115_1. Further, the gate of the transistor 302_2 can be connected to the wiring 115_2. However, this embodiment is not limited thereto. The gates of the transistors 302_1 and 302_2 can be connected a variety wirings or a variety of terminals. For example, the gate of the transistor 302_1 can be connected to the first terminal or the gate of the transistor 301_1. Alternatively, the gate of the transistor 302_2 can be connected to the first terminal or the gate of the transistor 301_2.

Figure 11E:
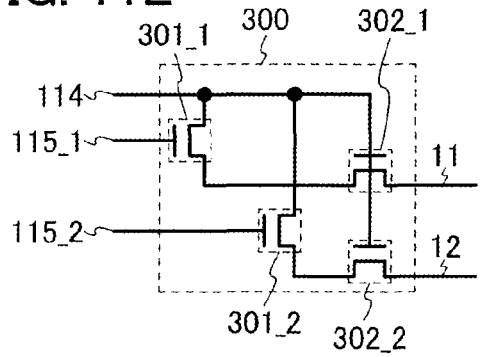

Note that, as in FIG. 11D, the gate of the transistor 302_1 can be connected to the first terminal and the gate of the transistor 301_1, and the gate of the transistor 302_2 can be connected to the first terminal and the gate of the transistor 301_2 in FIGS. 9A to 9F, FIGS. 10A to 10D, and FIGS. 11A to 11C. In FIG. 11E, a structure where the gate of the transistor 302_1 in FIG. 11C is connected to the wiring 114, and the gate of the transistor 302_2 in FIG. 11C is connected to the wiring 114 is shown.

Figure 11F:
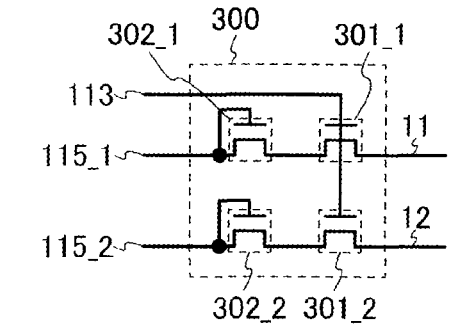

Note that as shown in FIG. 11F, the transistor 302_1 is not necessarily connected to the second terminal of the transistor 301_1 and can be connected to the first terminal of the transistor 301_1. Further, the transistor 302_2 is not necessarily connected to the second terminal of the transistor 301_2 and can be connected to the first terminal of the transistor 301_2. For example, the transistor 302_1 can be connected between the first terminal of the transistor 301_1 and the wiring 115_1. Further, the transistor 302_2 can be connected between the first terminal of the transistor 301_2 and the wiring 115_2. The first terminal of the transistor 302_1 is connected to the wiring 115_1. The second terminal of the transistor 302_1 is connected to the first terminal of the transistor 301_1. The gate of the transistor 302_1 is connected to the wiring 115_1. The first terminal of the transistor 302_2 is connected to the wiring 115_2. The second terminal of the transistor 302_2 is connected to the first terminal of the transistor 301_2. The gate of the transistor 302_2 is connected to the wiring 115_2. However, this embodiment is not limited thereto.

Figure 11G:
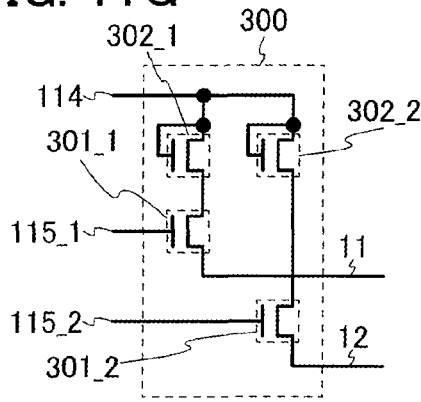

Note that, as in FIG. 11F, the transistor 302_1 is not necessarily connected to the second terminal of the transistor 301_1 and can be connected to the first terminal of the transistor 301_1 in the structures described in FIGS. 9A to 9F, FIGS. 10A to 10D, and FIGS. 11A to 11E. Further, the transistor 302_2 is not necessarily connected to the second terminal of the transistor 301_2, and can be connected to the first terminal of the transistor 301_2. In FIG. 11G the transistor 302_1 in FIG. 11C is connected between the first terminal of the transistor 301_1 and the wiring 114, and the transistor 302_2 in FIG. 11C is connected between the first terminal of the transistor 301_2 and the wiring 114 as an example. The first terminal of the transistor 302_1 is connected to the wiring 114. The second terminal of the transistor 302_1 is connected to the first terminal of the transistor 301_1. The gate of the transistor 302_1 is connected to the wiring 114. The first terminal of the transistor 302_2 is connected to the wiring 114. The second terminal of the transistor 302_2 is connected to the first terminal of the transistor 301_2. The gate of the transistor 302_2 is connected to the wiring 114.

Figure 12A:
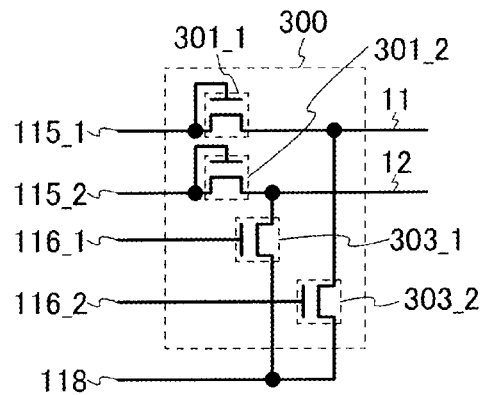
FIGS. 12A to 12F are examples of a circuit diagram of a semiconductor device in Embodiment 2.

Note that, as shown in FIG. 12A, the circuit 300 can include a plurality of transistors 303_1 and 303_2 in addition to the transistors 301_1 and 301_2. The transistors 303_1 and 303_2 preferably have the same polarity as the transistors 301_1 and 301_2 and are n-channel transistors in many cases. Note that this embodiment is not limited thereto. The transistors 303_1 and 303_2 can be p-channel transistors.

The transistor 303_1 has a function of controlling an electrical continuity state of the wiring 118 and the node 12 in accordance with the signal SEL1, for example. Alternatively, the transistor 303_1 has a function of controlling a timing of supplying a voltage of the wiring 118 to the node 12. For example, when a voltage such as the voltage V1, or a signal is supplied to the wiring 118, the transistor 303_1 has a function of controlling a timing of supplying a voltage, a signal, or the like supplied to the wiring 118 to the node 12. Alternatively, the transistor 303_1 has a function of controlling a timing of supplying the voltage V1 to the node 12. Alternatively, the transistor 303_1 has a function of controlling a timing of supplying a Low-level signal (e.g., the signal SP1, the signal SP2, the signal SELL, or the signal SEL2) to the node 12. Alternatively, the transistor 303_1 has a function of controlling a timing of decreasing a voltage of the node 12 to V1, for example. Alternatively, the transistor 303_1 has a function of maintaining a voltage of the node 12. As thus described, the transistor 303_1 functions as a switch. Note that this embodiment is not limited thereto. The transistor 303_1 can have a variety of other functions. Note that the transistor 303_1 does not need to have all the above functions.

The transistor 303_2 has a function of controlling an electrical continuity state of the wiring 118 and the node 11 in accordance with the signal SEL2, for example. Alternatively, the transistor 303_2 has a function of controlling a timing of supplying a voltage of the wiring 118 to the node 11. For example, when a voltage such as the voltage V1, or a signal is supplied to the wiring 118, the transistor 303_2 has a function of controlling a timing of supplying a voltage, a signal, or the like supplied to the wiring 118 to the node 11. Alternatively, the transistor 303_2 has a function of controlling a timing of supplying the voltage V1 to the node 11. Alternatively, the transistor 303_2 has a function of controlling a timing of supplying a Low-level signal (e.g., the signal SP1, the signal SP2, the signal SEL1, or the signal SEL2) to the node 11. Alternatively, the transistor 303_2 has a function of controlling a timing of decreasing a voltage of the node 11 to V1, for example. Alternatively, the transistor 303_2 has a function of maintaining a voltage of the node 11. As thus described, the transistor 303_2 functions as a switch. Note that this embodiment is not limited thereto. The transistor 303_2 can have a variety of other functions. Note that the transistor 303_2 does not need to have all the above functions.

A first terminal of the transistor 303_1 is connected to the wiring 118. A second terminal of the transistor 303_1 is connected to the node 12. A gate of the transistor 303_1 is connected to a wiring 116_1. A first terminal of the transistor 303_2 is connected to the wiring 118. A second terminal of the transistor 303_2 is connected to the node 11. A gate of the transistor 303_2 is connected to a wiring 116_2. However, this embodiment is not limited thereto.

Next, an operation of the semiconductor device in FIG. 12A is described with reference to the timing chart in FIG. 2. Note that a schematic view of an operation of a semiconductor device in the period A1 is shown in FIG. 38A. A schematic view of an operation of the semiconductor device in the period B1 is shown in FIG. 38B. A schematic view of an operation of the semiconductor device in the period C1 is shown in FIG. 38C. A schematic view of an operation of the semiconductor device in the periods D1 and E1 is shown in FIG. 38D. Note that a schematic view of an operation of the semiconductor device in the period A2 is shown in FIG. 39A. A schematic view of an operation of the semiconductor device in the period B2 is shown in FIG. 39B. A schematic view of an operation of the semiconductor device in the period C2 is shown in FIG. 39C. A schematic view of an operation of the semiconductor device in the periods D2 and E2 is shown in FIG. 39D. Note that FIGS. 38A to 38D and FIGS. 39A to 39D show a schematic view of an operation in the case where the semiconductor devices in FIG. 6B and FIG. 12A are combined.

In the periods A1 to E1, since the signal SEL1 goes into the High level, the transistor 303_1 is turned on. Therefore, the wiring 118 and the node 12 are brought into electrical continuity through the transistor 303_1, so that the voltage V1 is supplied from the wiring 118 to the node 12 through the transistor 303_1. As a result, a voltage of the node 12 is maintained so as to be V1. Meanwhile, the signal SEL2 goes into the Low level, so that the transistor 303_2 is turned off. Therefore, the wiring 118 and the node 11 are brought out of electrical continuity.

In the periods A2 to E2, since the signal SEL1 goes into the Low level, the transistor 303_1 is turned off. Therefore, the wiring 118 and the node 12 are brought out of electrical continuity. Meanwhile, the signal SEL2 goes into the High level, so that the transistor 303_2 is turned on. Therefore, the wiring 118 and the node 11 are brought into electrical continuity through the transistor 303_2, so that the voltage V1 is supplied from the wiring 118 to the node 11 through the transistor 303_2. As a result, a voltage of the node 11 is maintained so as to be V1.

In this manner, a voltage of the node 11 can be fixed by turning the transistor 303_2 on even when the transistor 301_1 is off. Alternatively, a voltage of the node 12 can be fixed by turning the transistor 303_1 on even when the transistor 301_2 is off. In this manner, a voltage of the node 11 or a voltage of the node 12 can be fixed, so that a semiconductor device with strength against noise can be obtained.

Figure 12B:
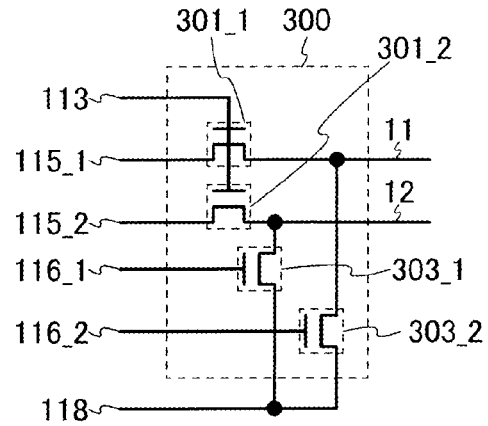
Figure 12C:
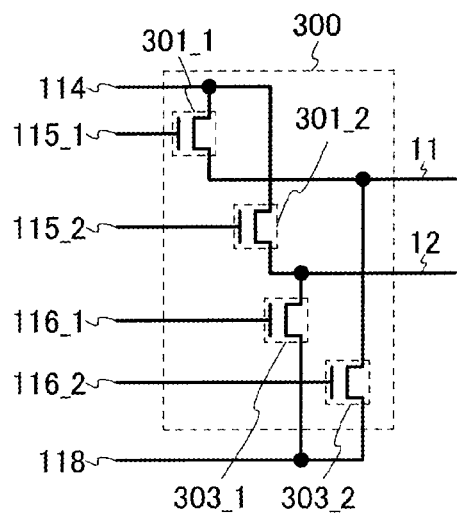
Figure 12D:
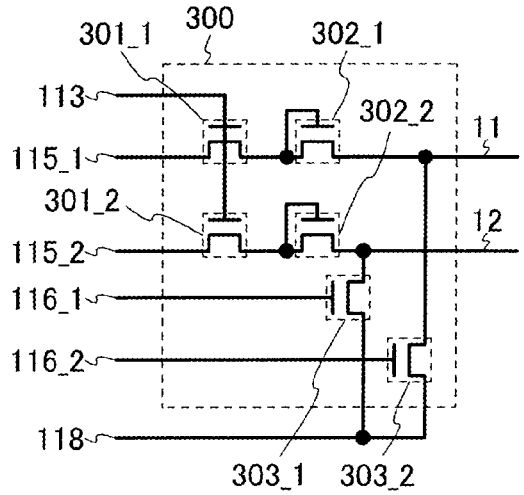
Figure 12E:
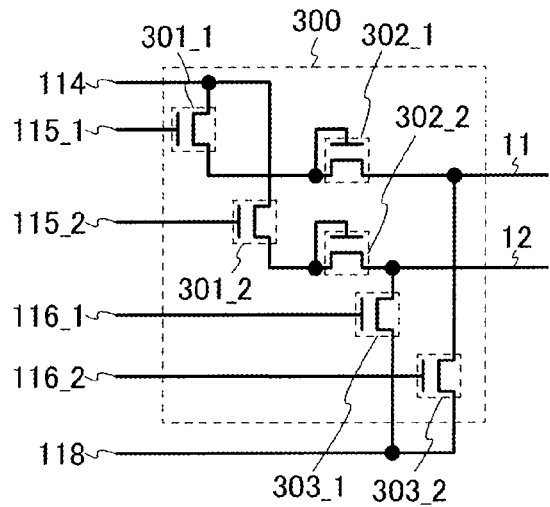
Figure 13A:
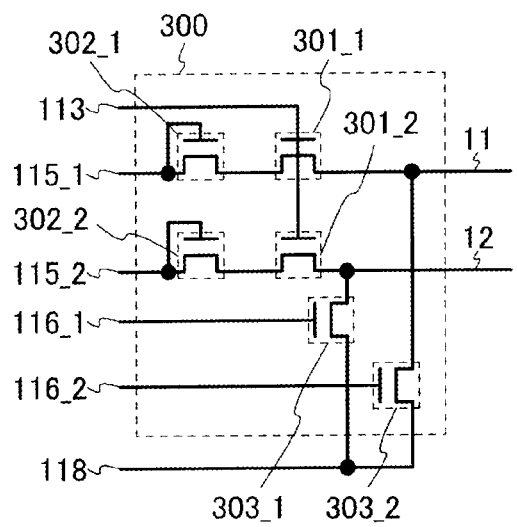
FIGS. 13A to 13F are examples of a circuit diagram of a semiconductor device in Embodiment 2.

Note that, as in FIG. 12A, in the structure described in FIGS. 9A to 9F, FIGS. 10A to 10D, and FIGS. 11A to 11G, the circuit 300 can include a plurality of transistors, which are the transistors 303_1 and 303_2. FIG. 12B shows the case where the circuit 300 in FIG. 9A includes the plurality of the transistors, which are the transistors 303_1 and 303_2, as an example FIG. 12C shows the case where the circuit 300 in FIG. 9D includes the plurality of the transistors, which are the transistors 303_1 and 303_2, as an example. FIG. 12D shows the case where the circuit 300 in FIG. 11B includes the plurality of the transistors, which are the transistors 303_1 and 303_2, as an example. FIG. 12E shows the case where the circuit 300 in FIG. 11C includes the plurality of the transistors, which are the transistors 303_1 and 303_2, as an example. FIG. 13A shows the case where the circuit 300 in FIG. 11F includes the plurality of the transistors, which are the transistors 303_1 and 303_2, as an example.

Figure 13B:
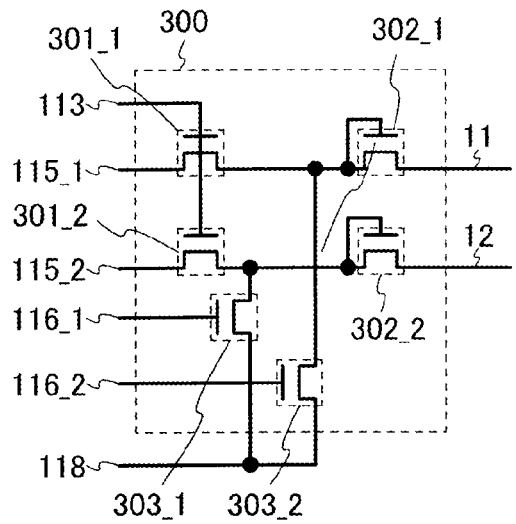

Note that as shown in FIG. 13B, the second terminal of the transistor 303_1 can be connected to a connection portion of the second terminal of the transistor 301_2 and the first terminal of the transistor 302_2. Further, the second terminal of the transistor 303_2 can be connected to the connection portion of the second terminal of the transistor 301_1 and the first terminal of the transistor 302_1. Note that this embodiment is not limited thereto. The second terminal of the transistor 303_1 can be connected to a variety of wirings or nodes. The second terminal of the transistor 303_2 can be connected to a variety of wirings or nodes. For example, the second terminal of the transistor 303_1 can be connected to a connection portion of the second terminal of the transistor 301_2 and the first terminal of the transistor 302_2 or a connection portion of the first terminal of the transistor 301_2 and the second terminal of the transistor 302_2. Alternatively, the second terminal of the transistor 303_2 can be connected to a connection portion of the second terminal of the transistor 301_1 and the first terminal of the transistor 302_1, a connection portion of the first terminal of the transistor 301_1 and the second terminal of the transistor 302_1, or the like.

Note that, as in FIG. 13B, the second terminal of the transistor 303_1 can be connected to a connection portion of the second terminal of the transistor 301_2 and the first terminal of the transistor 302_2, a connection portion of the first terminal of the transistor 301_2 and the second terminal of the transistor 302_2, or the like in the structures shown in FIGS. 9A to 9F, FIGS. 10A to 10D, FIGS. 11A to 11G, FIGS. 12A to 12E, and FIG. 13A. Alternatively, the second terminal of the transistor 303_2 can be connected to a connection portion of the second terminal of the transistor 301_1 and the first terminal of the transistor 302_1, a connection portion of the first terminal of the transistor 301_1 and the second terminal of the transistor 302_1, or the like.

Figure 13C:
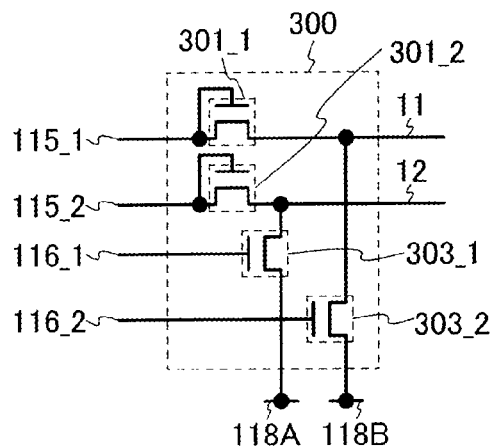

Note that as shown in FIG. 13C, the first terminal of the transistor 303_1 and the first terminal of the transistor 303_2 can be connected to different wirings from each other. In an example in FIG. 13C, the wiring 118 is divided into a plurality of wirings, which are wirings 118A and 118B. The first terminal of the transistor 303_1 is connected to the wiring 118A and the first terminal of the transistor 303_2 is connected to the wiring 118B. Note that this embodiment is not limited thereto. The first terminal of the transistor 303_1 and the first terminal of the transistor 303_2 can be connected to a variety of wirings or nodes. Note that the wirings 118A and 118B can have a similar function to the wiring 118. Therefore, a signal such as the signal CK1 can be inputted to the wirings 118A and 118B. Note that this embodiment is not limited thereto. A variety of signals, voltages, or currents can be inputted to the wirings 118A and 118B.

Note that, as in FIG. 13C, the first terminal of the transistor 303_1 and the first terminal of the transistor 303_2 can be connected to different wirings from each other in the structures described in FIGS. 9A to 9F, FIGS. 10A to 10D, FIGS. 11A to 11G, FIGS. 12A to 12 E, and FIGS. 13A and 13B.

Figure 13D:
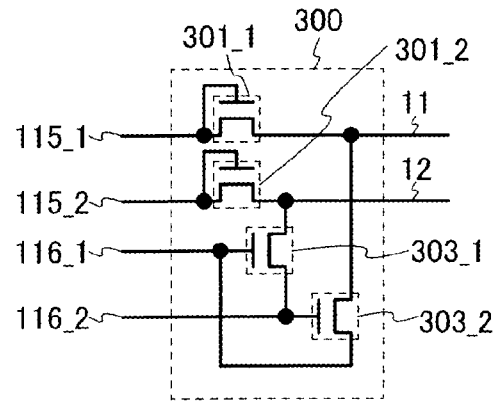

Note that as shown in FIG. 13D, the first terminal of the transistor 303_1 can be connected to the wiring 116_2. Alternatively, the first terminal of the transistor 303_2 can be connected to the wiring 116_1. Thus, in a period during which the transistor 303_1 is off, a High-level signal can be supplied to the first terminal. Similarly, in a period during which the transistor 303_2 is off, a High-level signal can be supplied to the first terminal. Therefore, a reverse bias can be applied to the transistor, so that deterioration of characteristics of the transistor can be suppressed.

Note that, as in FIG. 13D, the first terminal of the transistor 303_1 can be connected to the wiring 116_2 in the structures described in FIGS. 9A to 9F, FIGS. 10A to 10D, FIGS. 11A to 11G, FIGS. 12A to 12 E, and FIGS. 13A to 13C. Further, the first terminal of the transistor 303_2 can be connected to the wiring 116_1.

Figure 13E:
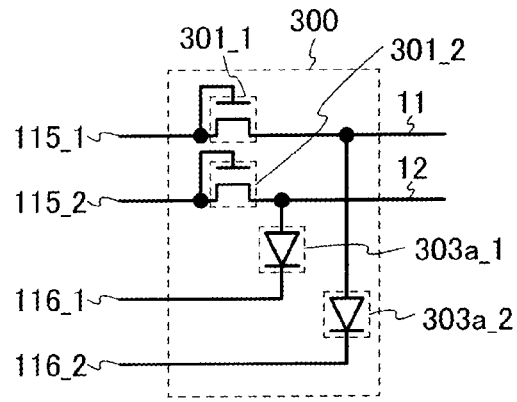
Figure 13F:
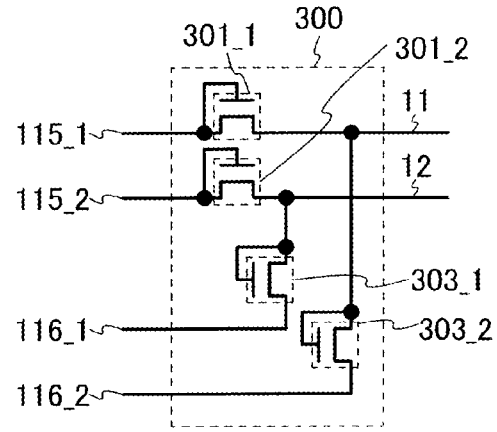

As shown in FIG. 13E, the transistor 301_1 can be replaced with a diode 303a_1 of which one terminal (hereinafter also referred to as a positive electrode) is connected to the node 12 and the other terminal (hereinafter also referred to as a negative electrode) is connected to the wiring 116_1. Alternatively, the transistor 301_2 can be replaced with a diode 303a_2 of which one terminal (also referred to as a positive electrode) is connected to the node 11 and the other terminal (also referred to as a negative electrode) is connected to the wiring 116_2. However, this embodiment is not limited thereto. For example, as shown in FIG. 13F, the transistor 303_1 can be diode-connected by connecting the first terminal of the transistor 303_1 to the node 12. Similarly, the transistor 303_2 can be diode-connected by connecting the first terminal of the transistor 303_2 to the node 11.

Note that, as in FIGS. 13E and 13F, transistors (e.g., the transistors 303_1 and 303_2) can be replaced with diodes, or the transistors (e.g., the transistors 303_1 and 303_2) can be diode-connected transistors in the structures described in FIGS. 9A to 9F, FIGS. 10A to 10D, FIGS. 11A to 11G, FIGS. 12A to 12 E, and FIGS. 13A to 13D.

Figure 11H:
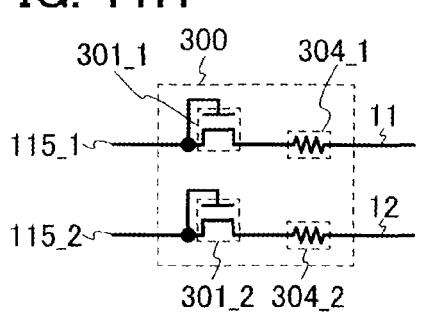
Figure 12F:
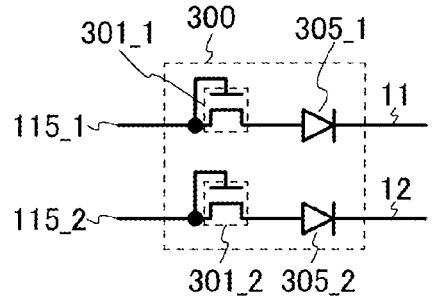

Note that as shown in FIG. 11H, the transistors 302_1 and 302_2 can be replaced with resistors 304_1 and 304_2. Further as shown in FIG. 12F, the transistors 302_1 and 302_2 can be replaced with diodes 305_1 and 305_2. However, this embodiment is not limited thereto.

Note that, as in FIGS. 11H and 12F, transistors can be replaced with resistors or diodes in the structures described in FIGS. 9A to 9F, FIGS. 10A to 10D, FIGS. 11A to 11G, FIGS. 12A to 12 E, and FIGS. 13A to 13F.

Figure 14A:
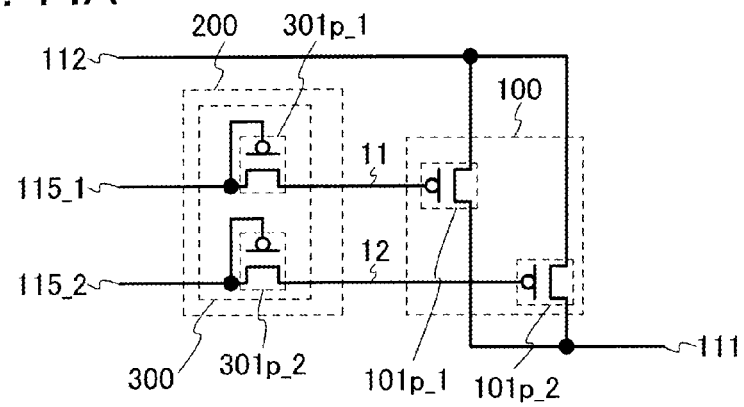
FIG. 14A is an example of a circuit diagram of a semiconductor device in Embodiment 2.
Figure 14B:
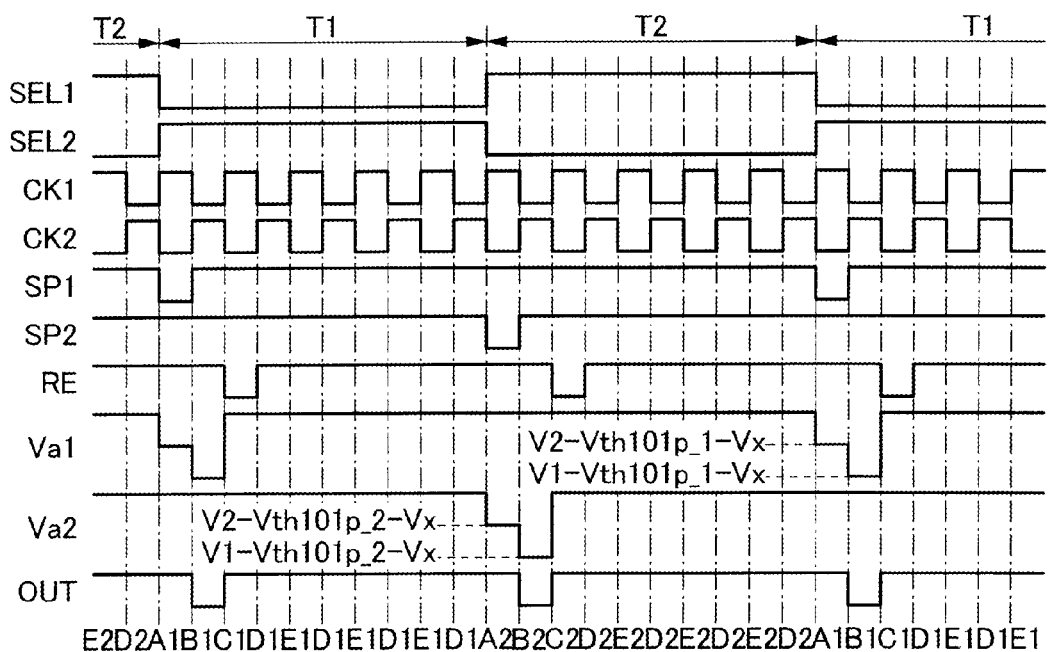
FIG. 14B is an example of a timing chart illustrating an operation of the semiconductor device.

Note that as shown in FIG. 14A, a p-channel transistor can be used as the transistor. The transistors 101p_1 and 101p_2 corresponds to the transistors 101_1 and 101_2 and are p-channel transistors. The transistors 301p_1 and 301p_2 corresponds to the transistors 301_1 and 301_2 and are p-channel transistors. When the transistors have p-type conductivity as shown in FIG. 14B, the voltage V1 is supplied to the wiring 113 and the voltage V2 is supplied to the wiring 118. The signal CK1, the signal CK2, the signal SP1, the signal SP2, the signal SEL1, the signal SEL2, the signal RE, a voltage of the node 11, a voltage of the node 12, and the signal OUT are inverted from those in the timing chart in FIG. 2.

Note that, as in FIG. 14A, p-channel transistors can be used as transistors in the structures described in FIGS. 9A to 9F, FIGS. 10A to 10D, FIGS. 11A to 11H, FIGS. 12A to 12F, and FIGS. 13A to 13F.

Embodiment 3

In this embodiment, a specific example of the circuit 200 which is different from that in Embodiment 2 is described. Note that description of the content described in Embodiments 1 and 2 is omitted. Note that a content described in this embodiment can be freely combined with the content described in Embodiments 1 and 2.

First, one example of the circuit 200 is described with reference to FIG. 15A. In one example in FIG. 15A, the circuit 200 includes a circuit 400. For example, the circuit 400 is a part of the circuit 200. The circuit 400 can include one or more transistors. These transistors preferably have the same polarity as the transistors 101_1 and 101_2. However, this embodiment is not limited thereto.

Figure 15A:
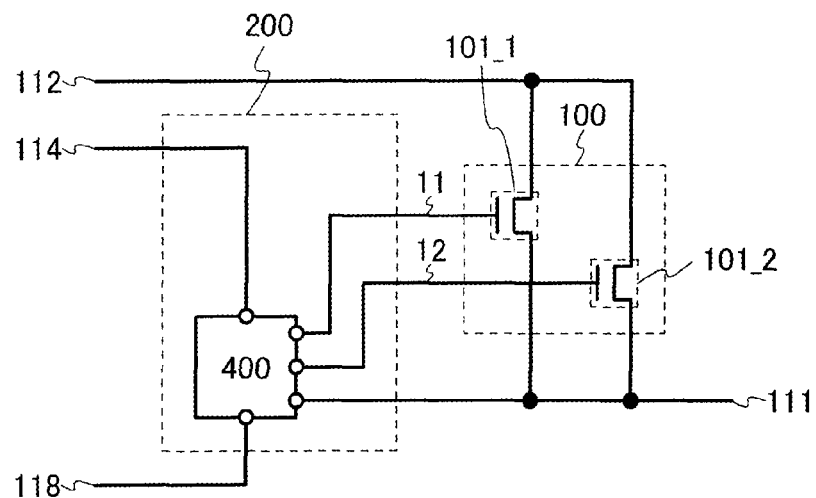
FIGS. 15A and 15B are examples of a circuit diagram of a semiconductor device in Embodiment 3.
Figure 15B:
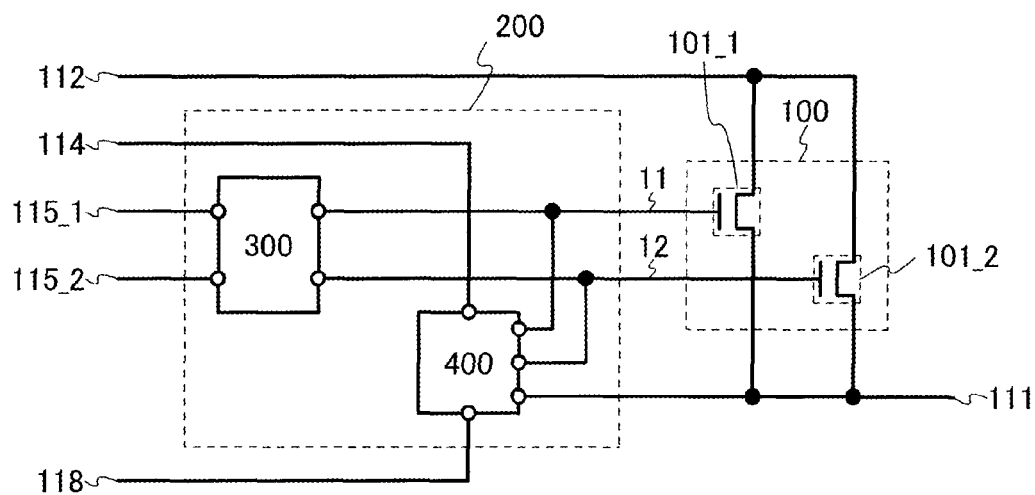

Note that as shown in FIG. 15B, the circuit 200 can include the circuit 300 described in Embodiment 2 in addition to the circuit 400. Note that a part of or the whole of the circuit 300 can be used as a part of or the whole of the circuit 400. In addition, a part of or the whole of the circuit 400 can be used as a part of or the whole of the circuit 300.

The circuit 400 is connected to the wiring 114, the wiring 118, the node 11, the node 12, and the wiring 111, for example. Note that this embodiment is not limited thereto. The circuit 400 can be connected to a variety of other wirings, a variety of other nodes, or a variety of other terminals in accordance with the structure. For example, when the circuit 400 needs a signal, the circuit 400 can be connected to the wiring 112, the wiring 113, the wiring 115_1, the wiring 115_2, the wiring 116_1, the wiring 116_2, and/or the wiring 117.

The circuit 400 has a function of controlling voltages of the node 11, the node 12, and/or the wiring 111 in accordance with the voltages of the node 11, the node 12, and/or the wiring 111, for example. Alternatively, the circuit 400 has a function of controlling a timing of supplying a Low-level signal or the voltage V1 to the node 11, the node 12, and/or the wiring 111. Alternatively, the circuit 400 has a function of making the node 11, the node 12, and/or the wiring 111 go into a floating state. Alternatively, the circuit 400 has a function of controlling an electrical continuity state of the wiring 111 and the node 11. Alternatively, the circuit 400 has a function of controlling an electrical continuity state of the wiring 111 and the node 12. Note that this embodiment is not limited thereto. The circuit 400 can have a variety of other functions. Note that the circuit 400 does not need to have all the above functions.

Next, an example of an operation of the circuit 400 in FIG. 15A is described with reference to the timing chart in FIG. 2.

In the period A1, the circuit 400 does not supply a signal, a voltage, or the like to the node 11 in many cases. Meanwhile, the circuit 400 can supply the voltage V1 or a signal in the Low level to the node 12 and/or the wiring 111. Alternatively, it is acceptable that the circuit 400 does not supply a voltage, a signal, or the like to the node 12 and/or the wiring 111.

In the period B1, the circuit 400 does not supply a signal, a voltage, or the like to the node 11 and/or the wiring 111 in many cases. Meanwhile, the circuit 400 can supply the voltage V1 or a signal in the Low level to the node 12. Alternatively, it is acceptable that the circuit 400 does not supply a voltage, a signal, or the like to the node 12.

In the periods C1 to E1, the circuit 400 can supply the voltage V1 or a signal in the Low level to the node 11, the node 12, and/or the wiring 111. Alternatively, it is acceptable that the circuit 400 does not supply a voltage, a signal, or the like to the node 11, the node 12, and/or the wiring 111.

In the period A2, the circuit 400 does not supply a signal, a voltage, or the like to the node 12 in many cases. Meanwhile, the circuit 400 can supply the voltage V1 or a signal in the Low level to the node 11 and/or the wiring 111. Alternatively, it is acceptable that the circuit 400 does not supply a voltage, a signal, or the like to the node 11 and/or the wiring 111.

In the period. B2, the circuit 400 does not supply a signal, a voltage, or the like to the node 12 and/or the wiring 111 in many cases. Meanwhile, the circuit 400 can supply the voltage V1 or a signal in the Low level to the node 11. Alternatively, it is acceptable that the circuit 400 does not supply a voltage, a signal, or the like to the node 11.

In the periods C2 to E2, the circuit 400 can supply the voltage V1 or a signal in the Low level to the node 11, the node 12, and/or the wiring 111. Alternatively, it is acceptable that the circuit 400 does not supply a voltage, a signal, or the like to the node 11, the node 12, or/and the wiring 111.

Next, a specific example of the circuit 400 is described with reference to FIG. 16A. The circuit 400 includes a circuit 500, a plurality of transistors, which are transistors 401_1 and 401_2, and a transistor 402. The plurality of transistors, which are the transistors 401_1 and 401_2, and the transistor 402, preferably have the same polarity as the transistors 101_1 and 101_2 and are n-channel transistors. However, this embodiment is not limited thereto. For example, any of the transistors 401_1, 401_2, and 402 can be omitted. Alternatively, the plurality of transistors, which are the transistors 401_1 and 401_2, and the transistor 402 can be p-channel transistors.

A first terminal of the transistor 401_1 is connected to the wiring 118. A second terminal of the transistor 401_1 is connected to the node 11. A first terminal of the transistor 401_2 is connected to the wiring 118. A second terminal of the transistor 401_2 is connected to the node 12. A first terminal of the transistor 402 is connected to the wiring 118. A second terminal of the transistor 402 is connected to the wiring 111. The circuit 500 is connected to the wiring 118, the wiring 114, the node 11, the node 12, the wiring 111, a gate of the transistor 401_1, a gate of the transistor 401_2, and/or, a gate of the transistor 402. Note that this embodiment is not limited thereto. The circuit 500 can be connected to a variety of wirings or nodes in accordance with the structure.

Note that the connection portion of the gate of the transistor 401_1 and the circuit 500 is denoted by a node 21, the connection portion of the gate of the transistor 401_2 and the circuit 500 is denoted by a node 22, the connection portion of the gate of the transistor 402 and the circuit 500 is denoted by a node 31.

The transistor 401_1 has a function of controlling an electrical continuity state of the wiring 118 and the node 11, for example. Alternatively, the transistor 401_1 has a function of controlling a timing of supplying a voltage of the wiring 118 to the node 11. For example, when a voltage such as the voltage V1, or a signal such as the signal CK2 is supplied to the wiring 118, the transistor 401_1 has a function of controlling a timing of supplying a voltage, a signal, or the like supplied to the wiring 118 to the node 11. As thus described, the transistor 401_1 can function as a switch. Note that this embodiment is not limited thereto. The transistor 401_1 can have a variety of other functions. Note that the transistor 401_1 does not need to have all the above functions.

The transistor 401_2 has a function of controlling an electrical continuity state of the wiring 118 and the node 12, for example. Alternatively, the transistor 401_2 has a function of controlling a timing of supplying a voltage of the wiring 118 to the node 12. For example, when a voltage such as the voltage V1, or a signal such as the signal CK2 is supplied to the wiring 118, the transistor 401_2 has a function of controlling a timing of supplying a voltage, a signal, or the like supplied to the wiring 118 to the node 12. As thus described, the transistor 401_2 can function as a switch. Note that this embodiment is not limited thereto. The transistor 401_2 can have a variety of other functions. Note that the transistor 401_2 does not need to have all the above functions.

The transistor 402 has a function of controlling an electrical continuity state of the wiring 118 and the wiring 111, for example. Alternatively, the transistor 402 has a function of controlling a timing of supplying a voltage of the wiring 118 to the wiring 111. For example, when a voltage such as the voltage V1, or a signal such as the signal CK2 is supplied to the wiring 118, the transistor 402 has a function of controlling a timing of supplying a voltage, a signal, or the like supplied to the wiring 118 to the wiring 111. As thus described, the transistor 402 can function as a switch. Note that this embodiment is not limited thereto. The transistor 402 can have a variety of other functions. Note that the transistor 402 does not need to have all the above functions.

The circuit 500 has a function of controlling a timing of controlling a voltage of the node 21, a voltage of the node 22, and/or a voltage of the node 31 in accordance with a voltage of the node 11, a voltage of the node 12, and/or a voltage of the wiring 111, for example. Alternatively, the circuit 500 has a function of controlling a timing of supplying a High-level signal, a Low-level signal, or a voltage such as the voltage V1, the voltage V2, or the like to the node 21, the node 22, and/or the node 31. As thus described, the circuit 500 functions as a control circuit. Note that this embodiment is not limited thereto. The circuit 500 can have a variety of other functions. Note that the circuit 500 does not need to have all the above functions.

Figure 16A:
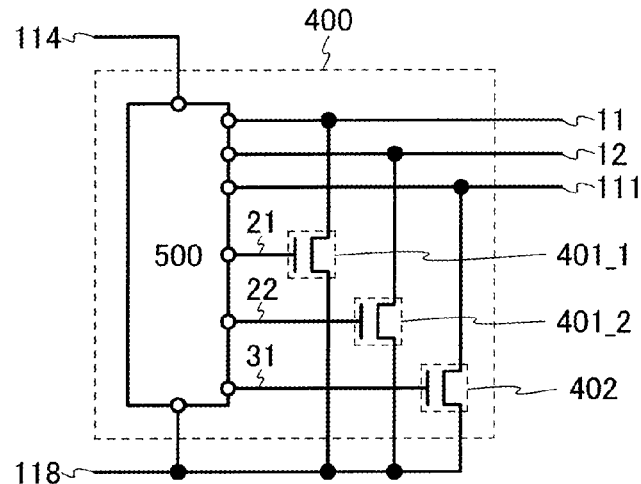
FIG. 16A is an example of a circuit diagram of a semiconductor device in Embodiment 2.
Figure 16B:
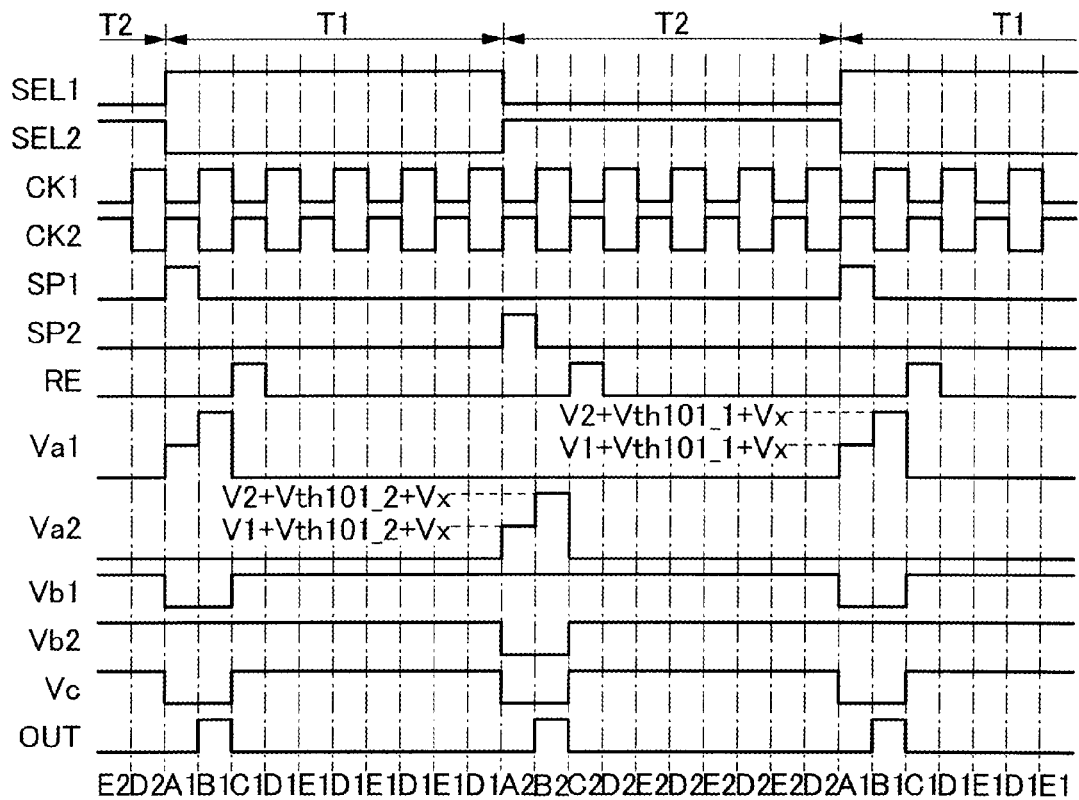
FIG. 16B is an example of a timing chart illustrating an operation of the semiconductor device.
Figure 40A:
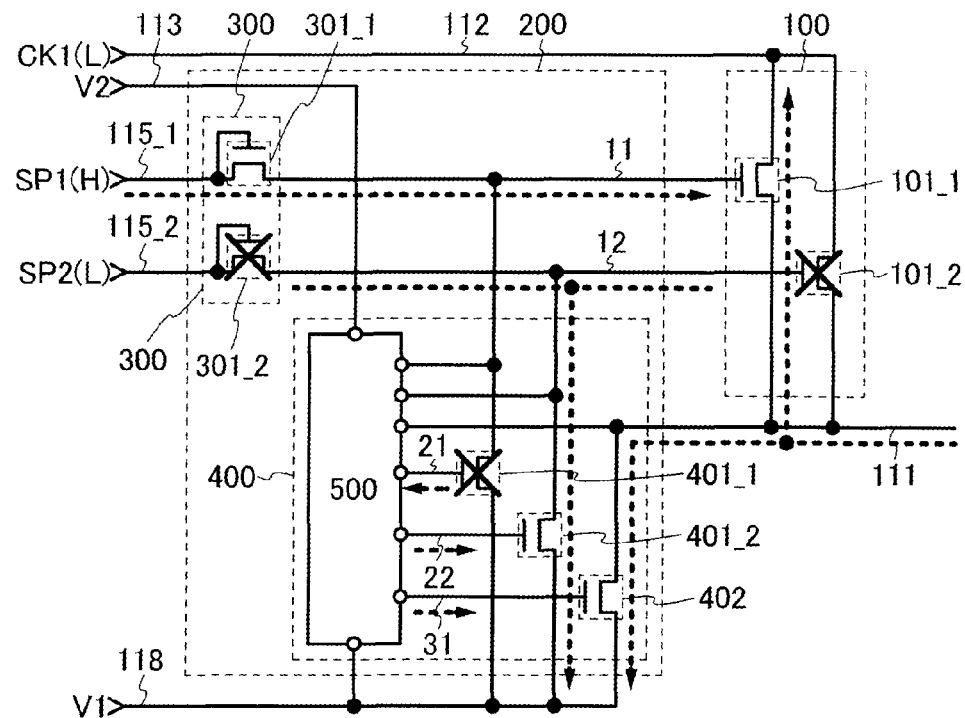
FIGS. 40A and 40B are examples of schematic diagrams illustrating an operation of a semiconductor device in FIGS. 16A and 16B.
Figure 40B:
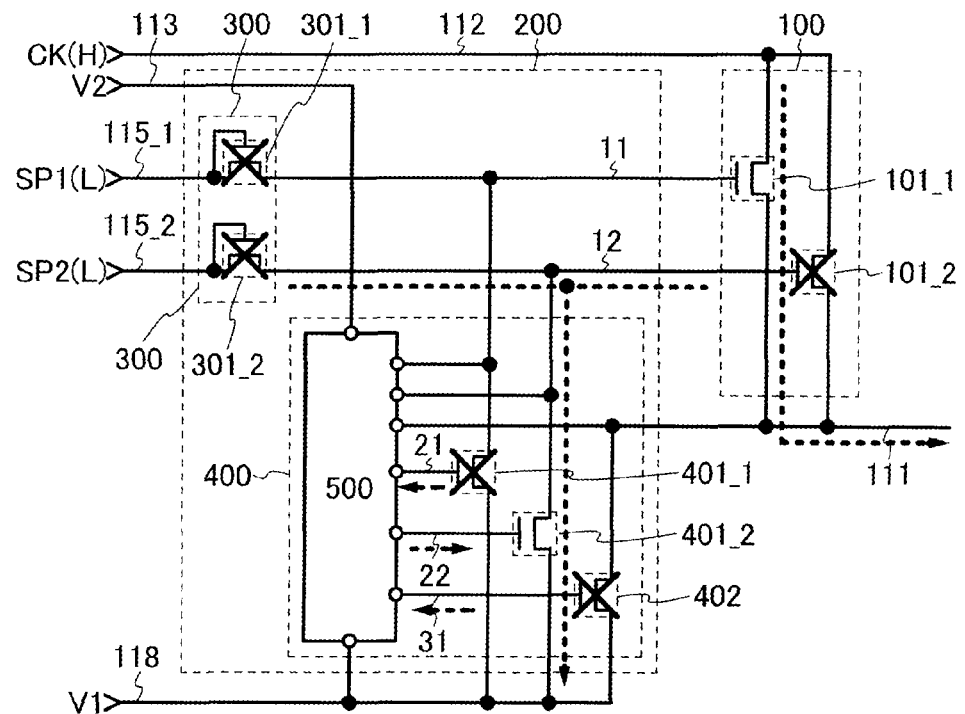
Figure 41A:
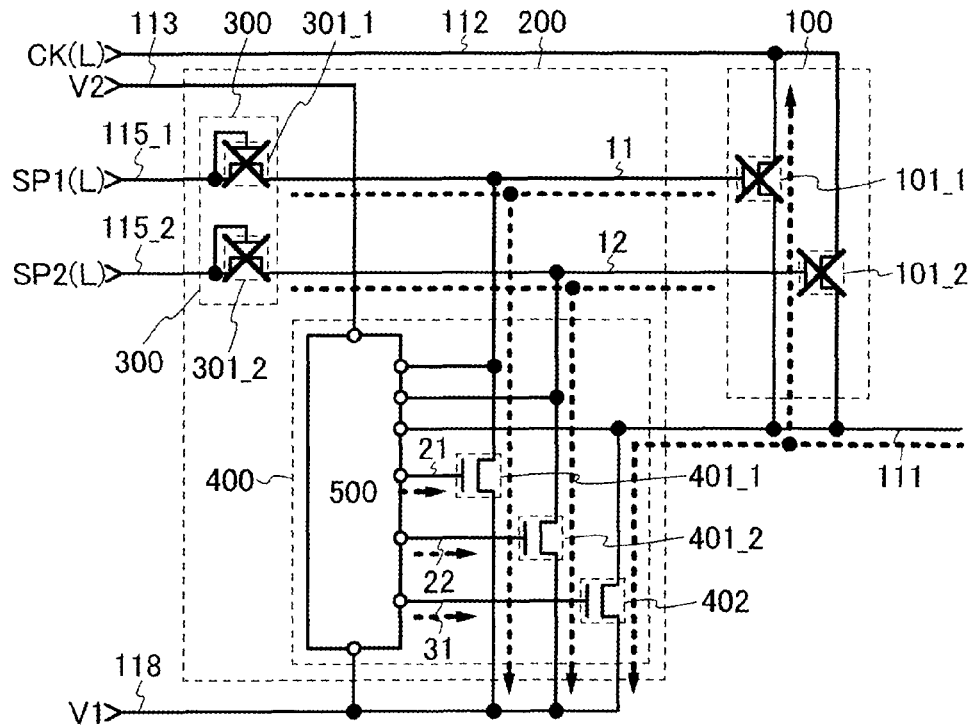
FIGS. 41A and 41B are examples of schematic diagrams illustrating an operation of a semiconductor device in FIGS. 16A and 16B.
Figure 41B:
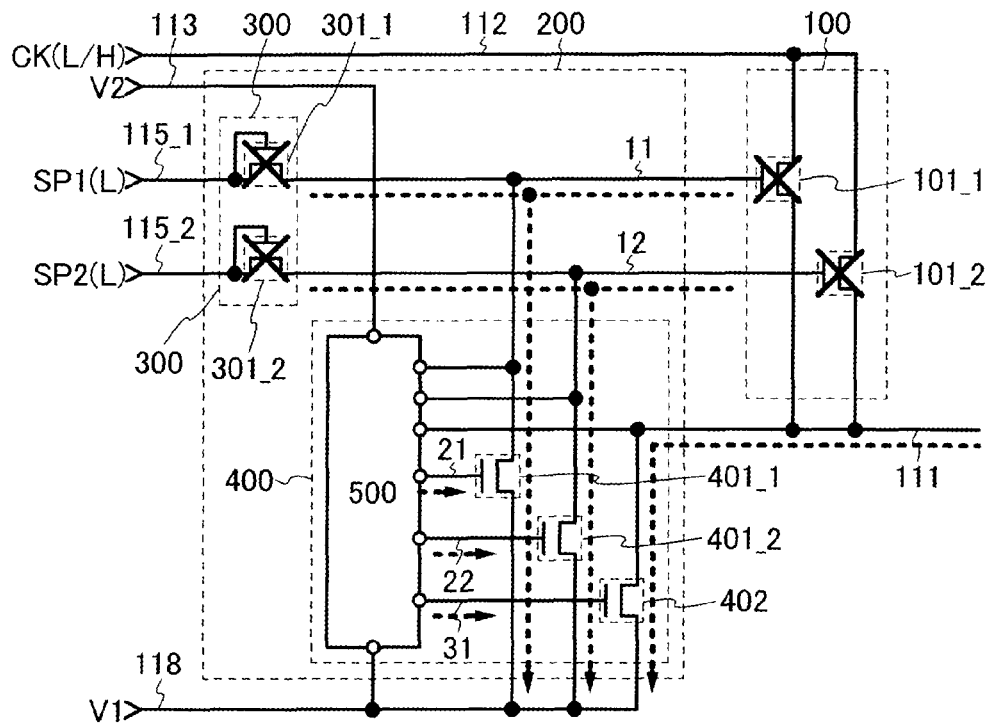
Figure 42A:
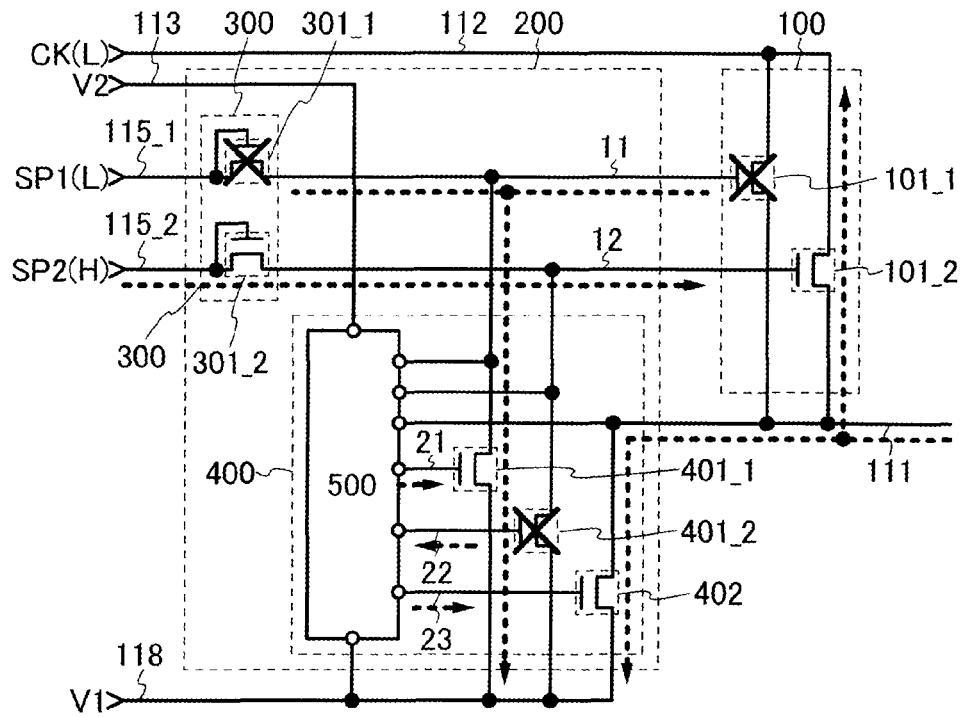
FIGS. 42A and 42B are examples of schematic diagrams illustrating an operation of a semiconductor device in FIGS. 16A and 16B.
Figure 42B:
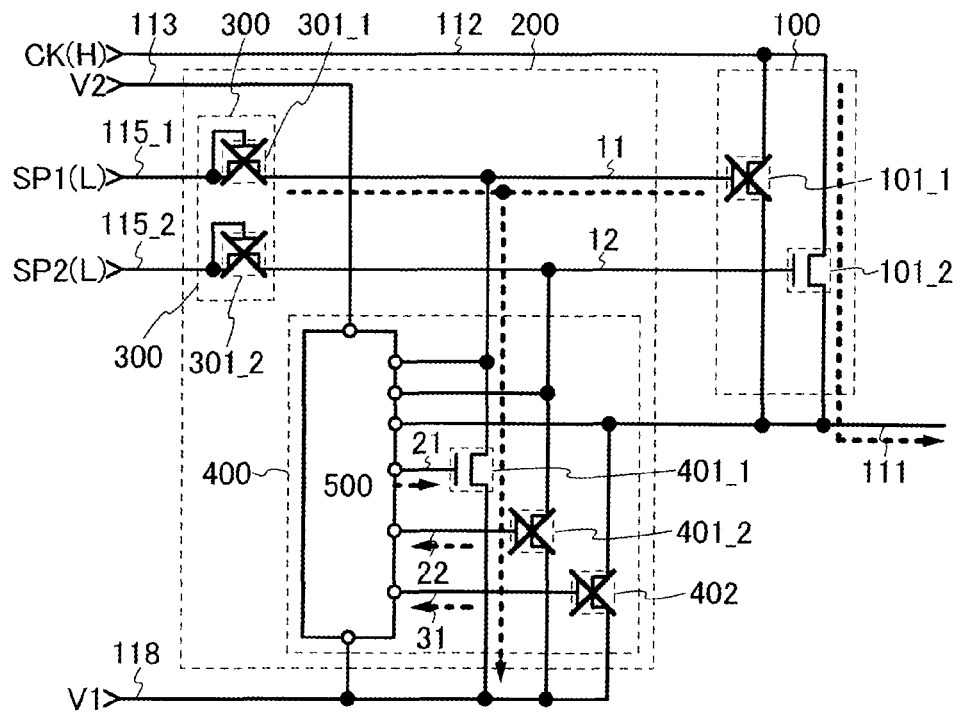
Figure 43A:
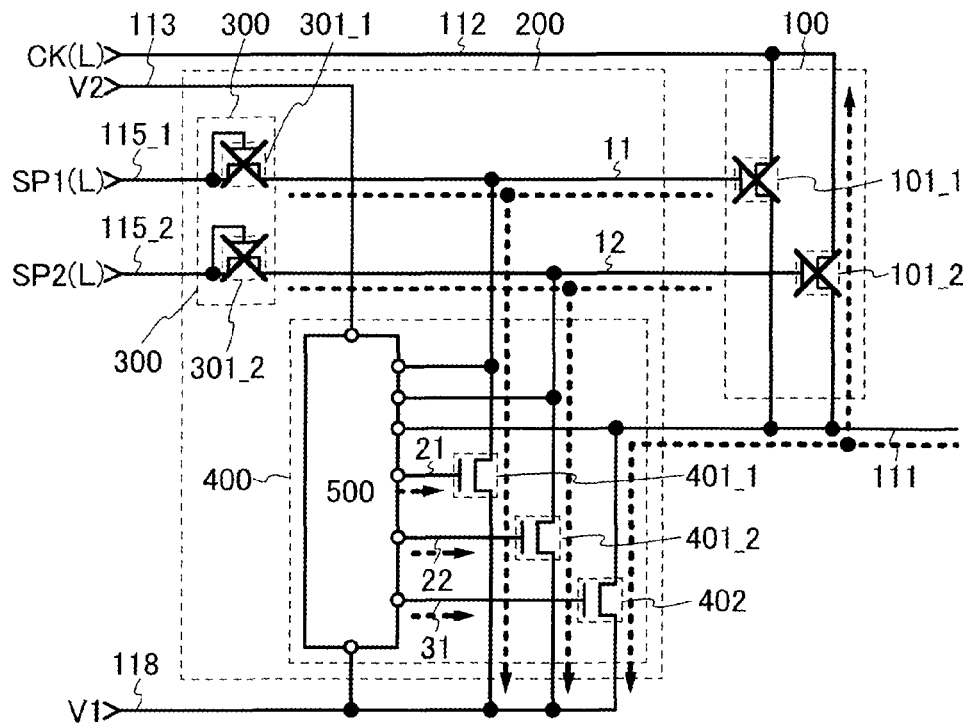
FIGS. 43A and 43B are examples of schematic diagrams illustrating an operation of a semiconductor device in FIGS. 16A and 16B.
Figure 43B:
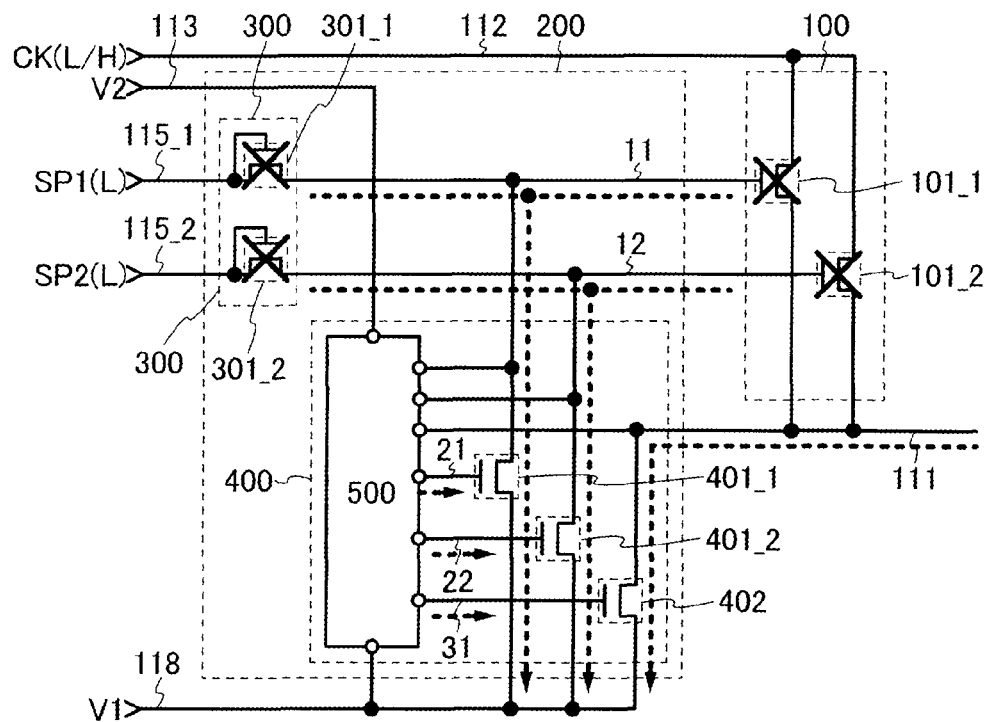

Next, an example of an operation of the circuit 400 in FIG. 16A is described with reference to a timing chart in FIG. 16B. Note that a schematic view of an operation of a semiconductor device in the period A1 is shown in FIG. 40A. A schematic view of an operation of the semiconductor device in the period B1 is shown in FIG. 40B. A schematic view of an operation of the semiconductor device in the period C1 is shown in FIG. 41A. A schematic view of an operation of the semiconductor device in the periods D1 and E1 is shown in FIG. 41B. Note that a schematic view of an operation of the semiconductor device in the period A2 is shown in FIG. 42A. A schematic view of an operation of the semiconductor device in the period B2 is shown in FIG. 42B. A schematic view of an operation of the semiconductor device in the period C2 is shown in FIG. 43A. A schematic view of an operation of the semiconductor device in the periods D2 and E2 is shown in FIG. 43B. Note that in FIGS. 40A and 40B, FIGS. 41A and 41B, FIGS. 42A and 42B, and FIGS. 43A and 43B, structures in which the semiconductor device in FIG. 6B is used as the circuit 300, and the semiconductor device in FIG. 16A is used as the circuit 400 are shown.

In the period A1, the signal SP1 goes into a High level, so that a voltage of the node 11 is increased. Accordingly, the circuit 500 supplies a Low-level signal or the voltage V1 to the node 21. Then, the transistor 401_1 is turned off, so that the wiring 118 and the node 11 are brought out of electrical continuity. Since the signal SP2 goes into the Low level, a voltage of the node 12 is maintained as approximate V1. Accordingly, the circuit 500 supplies a High-level signal or the voltage V2 to the node 22. Then, the transistor 401_2 is turned on, so that the wiring 118 and the node 12 are brought into electrical continuity through the transistor 401_2. Accordingly, the voltage V1 is supplied to the node 12 through the transistor 401_2. Since the signal CK1 in the Low level is supplied to the wiring 111, a voltage of the wiring 111 becomes V1. Accordingly, the circuit 500 supplies a High-level signal or the voltage V2 to the node 31. Then, the transistor 402 is turned on, so that the wiring 118 and the wiring 111 are brought into electrical continuity through the transistor 402. Accordingly, the voltage V1 is supplied to the wiring 111 through the transistor 402. However, this embodiment is not limited thereto. For example, in the period A1, the circuit 500 can supply a signal in the Low level or the voltage V1 to the node 22. In this case, the transistor 401_2 is turned off, the wiring 118 and the node 12 can be brought out of electrical continuity. As another example, in the period A1, the circuit 500 can supply a signal in the Low level or the voltage V1 to the node 31. In this case, the transistor 402 is turned off, so that the wiring 118 and the wiring 111 can be brought out of electrical continuity.

In the period B1, since a voltage of the node 11 is increased by a bootstrap operation, the circuit 500 supplies a Low-level signal or the voltage V1 to the node 21. Then, the transistor 401_1 is turned off, so that the wiring 118 and the node 11 are brought out of electrical continuity. Since a voltage of the node 12 is maintained as approximate V1, the circuit 500 supplies a High-level signal or the voltage V2 to the node 22. Then, the transistor 401_2 is turned on, so that the wiring 118 and the node 12 are brought into electrical continuity through the transistor 401_2. Accordingly, the voltage V1 is supplied to the node 12 through the transistor 401_2. Since the signal CK1 in a High level is supplied to the wiring 111, a voltage of the wiring 111 becomes V2. Accordingly, the circuit 500 supplies a Low-level signal or the voltage V1 to the node 31. Then, the transistor 402 is turned off, so that the wiring 118 and the wiring 111 are brought out of electrical continuity. However, this embodiment is not limited thereto. For example, in the period B1, the circuit 500 can supply a signal in the Low level or the voltage V1 to the node 22. In this case, the transistor 401_2 is turned off, so that the wiring 118 and the node 12 can be brought out of electrical continuity.

In the periods C1 to E1, a voltage of the node 11 becomes approximate V1, so that the circuit 500 supplies a High-level signal or the voltage V2 to the node 21. Therefore, the transistor 401_1 is turned on, so that the wiring 118 and the node 11 are brought into electrical continuity through the transistor 401_1. Then, the voltage V1 is supplied from the wiring 118 to the node 11 through the transistor 401_1. Since a voltage of the node 12 becomes approximate V1, the circuit 500 supplies a High-level signal or the voltage V2 to the node 22. Therefore, the transistor 401_2 is turned on, so that the wiring 118 and the node 12 are brought into electrical continuity through the transistor 401_2. Then, the voltage V1 is supplied from the wiring 118 to the node 12 through the transistor 401_2. Since a voltage of the wiring 111 becomes approximate V1, the circuit 500 supplies a High-level signal or the voltage V2 to the node 31. Therefore, the transistor 402 is turned on, so that the wiring 118 and the wiring 111 are brought into electrical continuity through the transistor 402. Then, the voltage V1 is supplied from the wiring 118 to the wiring 111 through the transistor 402. However, this embodiment is not limited thereto. For example, in one of the periods D1 and E1, the circuit 500 can supply a signal in the Low level or the voltage V1 to the node 21, the node 22, and/or the node 31. Accordingly, the transistors 401_1, 401_2, and/or 402 can be turned off. Then, the wiring 118 and the node 11, the wiring 118 and the node 12, and/or the wiring 118 and the wiring 111 can be brought out of electrical continuity.

In the period A2, the signal SP1 goes into the Low level, so that a voltage of the node 11 is maintained as approximate V1. Accordingly, the circuit 500 supplies a High-level signal or the voltage V2 to the node 21. Then, the transistor 401_1 is turned on, so that the wiring 118 and the node 11 are brought into electrical continuity through the transistor 401_1. Accordingly, the voltage V1 is supplied to the node 11 through the transistor 401_1. Further, the signal SP2 goes into a High level, so that a voltage of the node 12 is increased. Accordingly, the circuit 500 supplies a Low-level signal or the voltage V1 to the node 22. Then, the transistor 401_2 is turned off, so that the wiring 118 and the node 12 are brought out of electrical continuity. Since the signal CK1 in the Low level is supplied to the wiring 111, a voltage of the wiring 111 becomes V1. Accordingly, the circuit 500 supplies a High-level signal or the voltage V2 to the node 31. Then, the transistor 402 is turned on, so that the wiring 118 and the wiring 111 are brought into electrical continuity through the transistor 402. Accordingly, the voltage V1 is supplied to the wiring 111 through the transistor 402. However, this embodiment is not limited thereto. For example, in the period A2, the circuit 500 can supply a signal in the Low level or the voltage V1 to the node 21. In this case, the transistor 401_1 is turned off, the wiring 118 and the node 11 can be brought out of electrical continuity. As another example, in the period A2, the circuit 500 can supply a signal in the Low level or the voltage V1 to the node 31. In this case, the transistor 402 is turned off, so that the wiring 118 and the wiring 111 can be brought out of electrical continuity.

In the period B2, since a voltage of the node 11 is maintained as approximate V1, the circuit 500 supplies a High-level signal or the voltage V2 to the node 21. Then, the transistor 401_1 is turned on, so that the wiring 118 and the node 11 are brought into electrical continuity through the transistor 401_1. Accordingly, the voltage V1 is supplied to the node 11 through the transistor 401_1. Since a voltage of the node 12 is increased by a bootstrap operation, the circuit 500 supplies a Low-level signal or the voltage V1 to the node 22. Then, the transistor 401_2 is turned off, so that the wiring 118 and the node 12 are brought out of electrical continuity. Since the signal CK1 in a High level is supplied to the wiring 111, a voltage of the wiring 111 becomes V2. Accordingly, the circuit 500 supplies a Low-level signal or the voltage V1 to the node 31. Then, the transistor 402 is turned off, so that the wiring 118 and the wiring 111 are brought out of electrical continuity. However, this embodiment is not limited thereto. For example, in the period B2, the circuit 500 can supply a signal in the Low level or the voltage V1 to the node 21. In this case, the transistor 401_1 is turned off, so that the wiring 118 and the node 11 can be brought out of electrical continuity.

In the periods C2 to E2, a voltage of the node 11 becomes approximate V1, so that the circuit 500 supplies a High-level signal or the voltage V2 to the node 21. Therefore, the transistor 401_1 is turned on, so that the wiring 118 and the node 11 are brought into electrical continuity through the transistor 401_1. Then, the voltage V1 is supplied from the wiring 118 to the node 11 through the wiring 401_1. Since a voltage of the node 12 becomes approximately V1, the circuit 500 supplies a High-level signal or the voltage V2 to the node 22. Therefore, the transistor 401_2 is turned on, so that the wiring 118 and the node 12 are brought into electrical continuity through the transistor 401_2. Then, the voltage V1 is supplied from the wiring 118 to the node 12 through the transistor 401_2. Since a voltage of the wiring 111 becomes approximate V1, the circuit 500 supplies a High-level signal or the voltage V2 to the node 31. Therefore, the transistor 402 is turned on, so that the wiring 118 and the wiring 111 are brought into electrical continuity through the transistor 402. Then, the voltage V1 is supplied from the wiring 118 to the wiring 111 through the transistor 402. However, this embodiment is not limited thereto. For example, in one of the periods D2 and E2, the circuit 500 can supply a signal in the Low level or the voltage V1 to the node 21, the node 22, and/or the node 31. Accordingly, the transistors 401_1, 401_2, and/or, 402 can be turned off. Then, the wiring 118 and the node 11, the wiring 118 and the node 12, and/or the wiring 118 and the wiring 111 can be brought out of electrical continuity.

Note that it is preferable that the channel width of the transistor 401_1 be approximately equal to the channel width of the transistor 401_2. Thus, degree of change in a voltage of the node 11 in the period T1 can be approximately equal to degree of change in a voltage of the node 12 in the period T2. Accordingly, the waveforms of the signal OUT can be approximately the same. Note that this embodiment is not limited thereto. The channel width of the transistor 401_1 can be different from the channel width of the transistor 401_2.

Note that the channel widths of the transistors 401_1 and 401_2 are preferably 100 μm to 4000 μm. More preferably, the channel widths of the transistors 401_1 and 401_2 are 500 μm to 3000 μm. Further preferably, the channel widths of the transistors 401_1 and 401_2 are 1000 μm to 2000 μm. However, this embodiment is not limited thereto.

Note that the channel width of the transistor 402 is preferably 500 μm to 5000 μm. More preferably, the channel width of the transistor 402 is 1000 μm to 3000 μm. Further preferably, the channel width of the transistor 402 is 2000 μm to 3000 μm. However, this embodiment is not limited thereto.

Figure 17A:
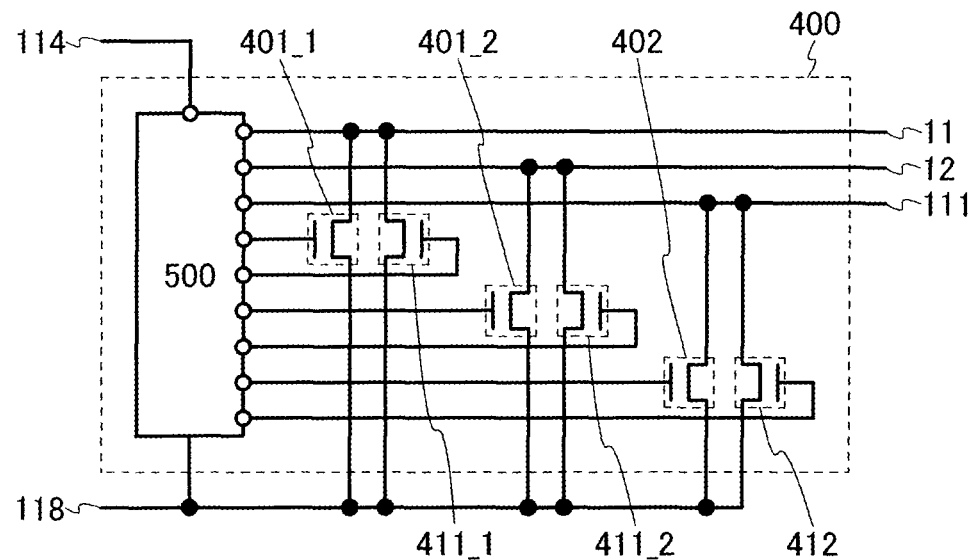
FIGS. 17A and 17B are examples of a circuit diagram of a semiconductor device in Embodiment 3.

Note that as shown in FIG. 17A, a plurality of transistors can be connected in parallel. In addition, the plurality of transistors can be turned on in a certain order or at random. In FIG. 17A, a structure of the case where two transistors are connected in parallel is shown, as one example. In this case, the two transistors can be repeatedly turned on and off every one gate selection period or every half period. A transistor is connected to the transistors 401_1, 401_2, and 402 so as to be parallel to each other. For example, the transistor 411_1 is additionally provided so as to be connected to the transistor 401_1 in parallel. A first terminal of the transistor 411_1 is connected to the wiring 118. A second terminal of the transistor 411_1 is connected to the node 11. A gate of the transistor 411_1 is connected to the circuit 500. Further, the transistor 411_2 is additionally provided so as to be connected to the transistor 401_2 in parallel. A first terminal of the transistor 411_2 is connected to the wiring 118. A second terminal of the transistor 411_2 is connected to the node 11. A gate of the transistor 411_2 is connected to the circuit 500. Further, the transistor 412 is additionally provided so as to be connected to the transistor 402 in parallel. A first terminal of the transistor 412 is connected to the wiring 118. A second terminal of the transistor 412 is connected to the node 11. A gate of the transistor 412 is connected to the circuit 500. Note that this embodiment is not limited thereto. Just any of the transistors 411_1, 411_2, and 412 can be added.

Figure 17B:
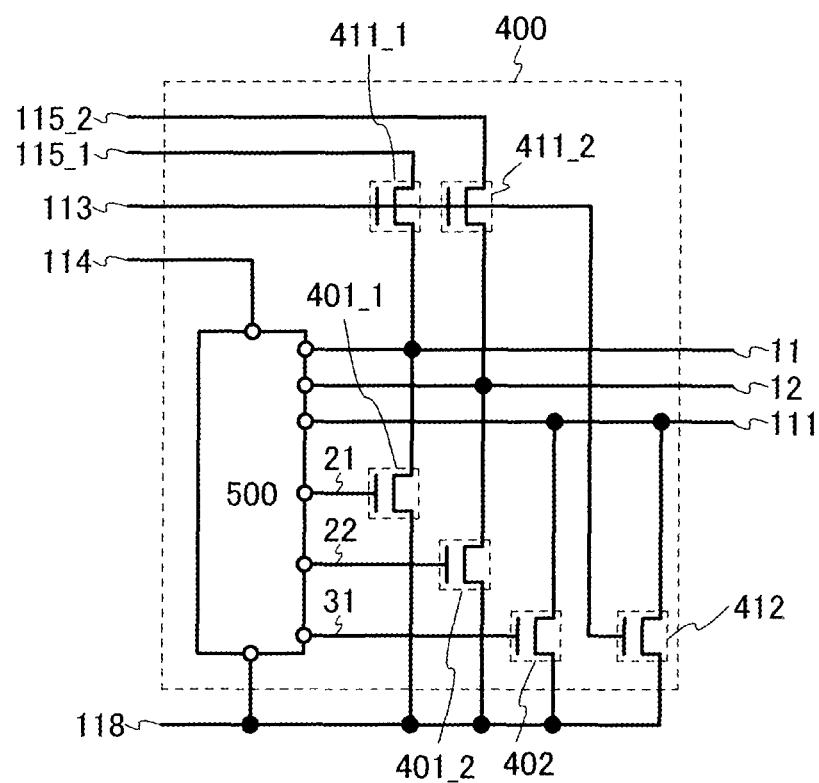

Note that as shown in FIG. 17B, the first terminal of the transistor 411_1 can be connected to the wiring 115_1 and the gate of the transistor 411_1 can be connected to the wiring 113. Further, the first terminal of the transistor 411_2 can be connected to the wiring 115_2 and the gate of the transistor 411_2 can be connected to the wiring 113. Further, the gate of the transistor 412 can be connected to the wiring 113. Thus, a circuit for controlling a conduction state of the transistors 411_1, 411_2, and 412 can be omitted. However, this embodiment is not limited thereto. Transistors can be connected so as to form a variety of structures. For example, the second terminals of the transistors 401_1, 401_2, and 402 can be connected to the wiring 113. Thus, a reverse bias can be applied to the transistor, so that deterioration of characteristics of the transistor can be suppressed.

Figure 18A:
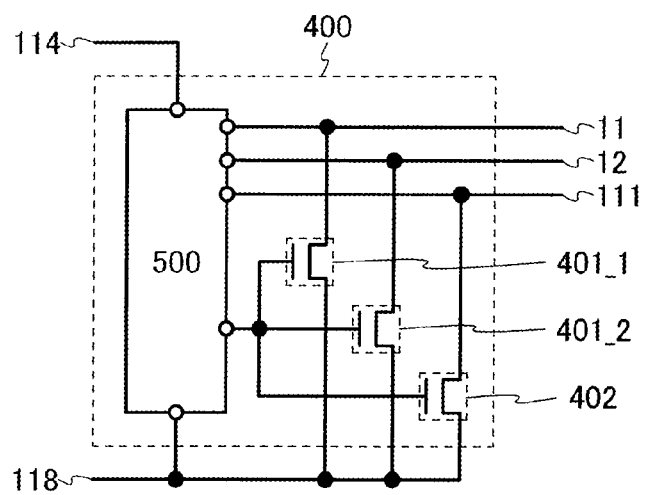
FIGS. 18A to 18C are examples of a circuit diagram of a semiconductor device in Embodiment 3.
Figure 18B:
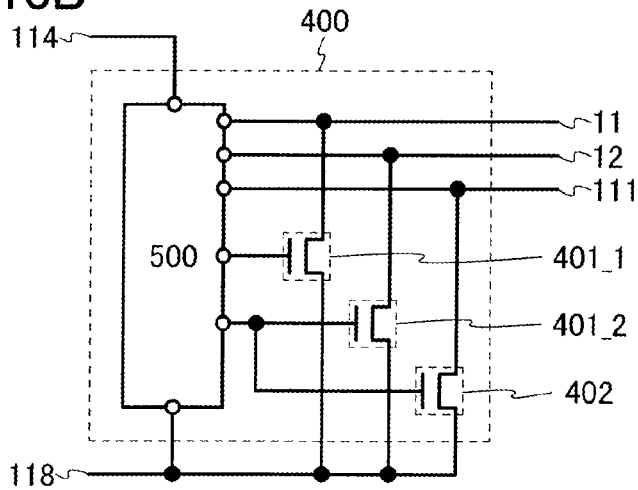

Note that as shown in FIGS. 18A and 18B, the gates of the transistors 401_1, 401_2, and 402 can be connected to each other. A semiconductor device shown in FIG. 18A has a structure in which the transistors 401_1 and 401_2 are connected to the gate of the transistor 402. A semiconductor device shown in FIG. 18B has a structure in which the transistor 401_1 or the transistor 401_2 is connected to the gate of the transistor 402. In this case, in the periods A1 and B1 and the periods A2 and B2, the circuit 500 supplies a Low-level signal or the voltage V1 to the gates of the transistors 401_1, 401_2, and 402. Meanwhile, in the periods C1 to E1 and the periods C2 to E2, the circuit 500 supplies a High-level signal or the voltage V2 to the gates of the transistors 401_1, 401_2, and 402. Therefore, the transistors 401_1, 401_2, and 402 can be off in the periods A1 and B1 and the periods A2 and B2, and can be on the periods C1 to E1 and the periods C2 to E2. In this manner, conduction states of the transistors 401_1, 401_2, and 402 can be controlled by one circuit, so that the size of the circuit can be reduced. However, this embodiment is not limited thereto. For example, in one of the periods D1 and E1, and in one of the periods D2 and E2, the circuit 500 can supply a Low-level signal or the voltage V1 to the gates of the transistors 401_1, 401_2, and 402. Further, in one of the periods C1 to E1 and the periods C2 to E2, the circuit 500 can supply a Low-level signal or the voltage V1 to the gates of the transistors 401_1, 401_2, and 402. Thus, since it is possible for the transistors can be repeatedly turned on/off every one gate selection period or every one frame, deterioration of characteristics of the transistors can be suppressed. As another example, the gate of the transistor 402 can be connected to one of the gates of the transistors 401_1 and 401_2.

Figure 18C:
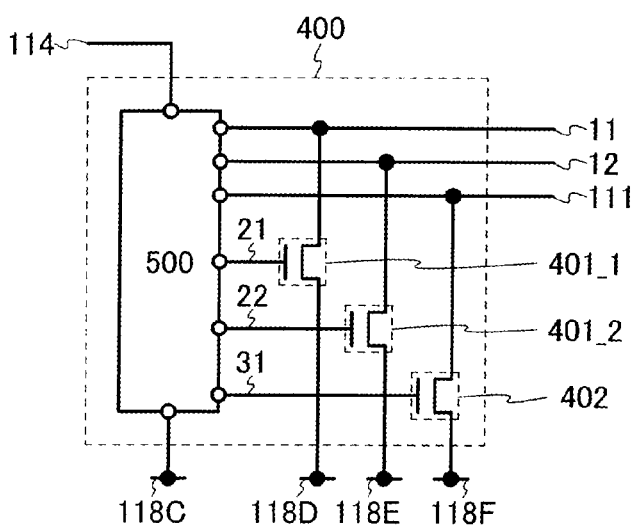

Note that as shown in FIG. 18C, the first terminals of the transistors 401_1, 401_2, and 402 can be connected to different wirings from each other. In FIG. 18C, the wiring 118 is divided into a plurality of wirings, which are wirings 118C to 118F, for example. The circuit 500 is connected to the wiring 18C. The first terminal of the transistor 401_1 is connected to the wiring 118D. The first terminal of the transistor 401_2 is connected to the wiring 118E. The first terminal of the transistor 402 is connected to the wiring 118F. Note that this embodiment is not limited thereto. The first terminals of the transistors 401_1, 401_2, and 402 can be connected to a variety of wirings or nodes. Note that the wirings 118C to 118F can have a similar function to the wiring 118. Therefore, a voltage such as the voltage V1 can be inputted to the wirings 118C to 118F. Note that this embodiment is not limited thereto. A variety of signals, voltages, or currents can be inputted to the wirings 118C to 118F.

Note that, as in FIG. 18A, the second terminals of the transistors 401_1, 401_2, and 402 are connected to different wirings from each other in the structures described in FIG. 16A, FIGS. 17A and 17B, and FIGS. 18B and 18C. In the structures described in FIGS. 17A and 17B particularly, the second terminals of the transistors 411_1, 411_2, and 412 can be connected to different wirings from each other.

Figure 19A:
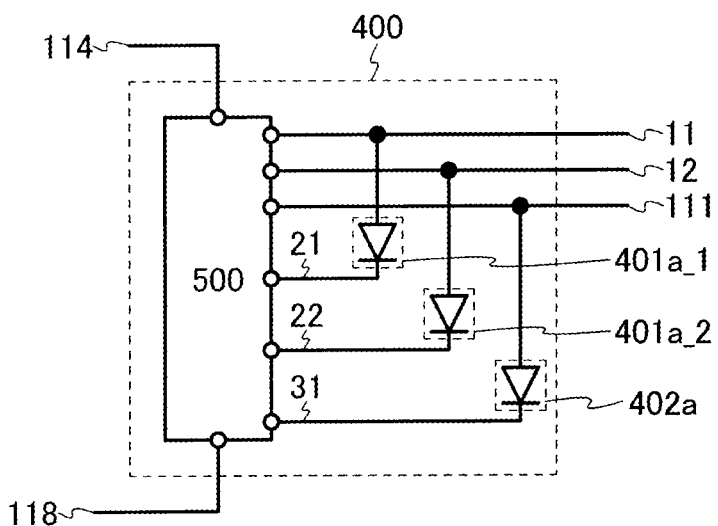
FIGS. 19A and 19B are examples of a circuit diagram of a semiconductor device in Embodiment 3.

As shown in FIG. 19A, the transistor 401_1 can be replaced with a diode 401a_1 of which one terminal (hereinafter also referred to as a positive electrode) is connected to the node 11, and the other terminal (hereinafter also referred to as a negative electrode) is connected to the node 12. Alternatively, the transistor 401_2 can be replaced with a diode 401a_2 of which one terminal (also referred to as a positive electrode) is connected to the node 12, and the other terminal (also referred to as a negative electrode) is connected to the node 22. Alternatively, the transistor 402 can be replaced with a diode 402a of which one terminal (also referred to as a positive electrode) is connected to the wiring 111 and the other terminal (also referred to as a negative electrode) is connected to the node 31. However, this embodiment is not limited thereto. For example, as shown in FIG. 19A, the transistor 401_1 can be diode-connected by connecting the first terminal of the transistor 401_1 to the node 21 and by connecting the second terminal of the transistor 401_1 to the node 11. Alternatively, the transistor 401_2 can be diode-connected by connecting the first terminal of the transistor 401_2 to the node 22 and by connecting the second terminal of the transistor 401_2 to the node 12. The transistor 402 can be diode-connected by connecting the first terminal of the transistor 402 to the node 31 and by connecting the second terminal of the transistor 402 to the wiring 111.

Figure 19B:
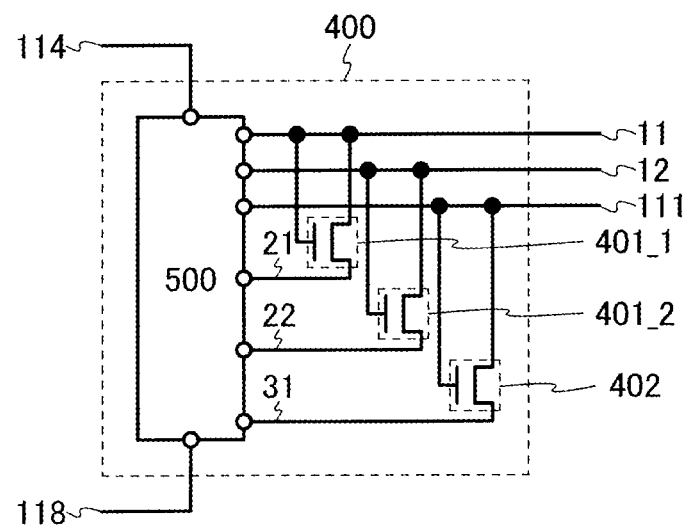

Note that, as in FIGS. 19A and 19B, transistors can be replaced with diodes in FIG. 16A, FIGS. 17A and 17B, and FIGS. 18A to 18C, and these transistors can be diode-connected in the structures.

Figure 20A:
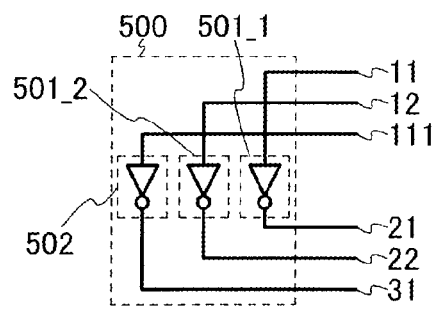
FIGS. 20A to 20H are examples of a circuit diagram of a semiconductor device in Embodiment 3.

Next, a specific example of the circuit 500 is described with reference to FIG. 20A. The circuit 500 includes circuits 501_1, 501_2, and 502. The circuits 501_1, 501_2, and 502 can function as, as an example, NOT circuits or inverters. An input terminal of the circuit 501_1 is connected to the node 11, and an output terminal of the circuit 501_1 is connected to the node 21. An input terminal of the circuit 501_2 is connected to the node 12, and an output terminal of the circuit 501_2 is connected to the node 22. An input terminal of the circuit 502 is connected to the wiring 111, and an output terminal of the circuit 502 is connected to the node 31.

Figure 20B:
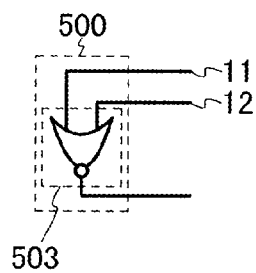

Another example of the circuit 500 is described with reference to FIG. 20B. The circuit 500 includes a circuit 503. The circuit 503 can include a function of a NOR circuit with two inputs, for example. One of input terminals of the circuit 503 is connected to the node 11. The other input terminal of the circuit 503 is connected to the node 12. An output terminal of the circuit 503 is connected to the gates of the transistors 401_1, 401_2, and/or 402.

Figure 20C:
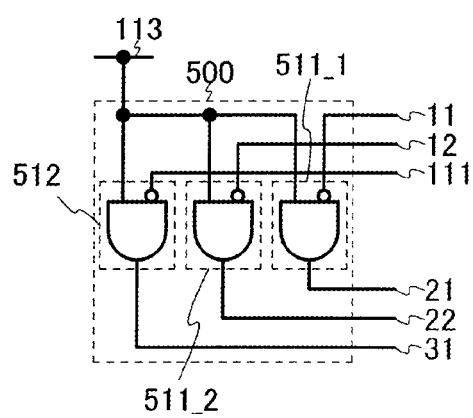

Next, another example of the circuit 500 is described with reference to FIG. 20C. The circuit 500 includes circuits 511_1, 511_2, and 512. The circuits 511_1, 511_2, and 512 can function as, for example, logic circuits in which an AND circuit with two inputs and a NOT circuit are combined. One of input terminals of the circuit 511_1 is connected to the wiring 113. The other terminal of the circuit 511_1 is connected to the node 11. An output terminal of the circuit 511_1 is connected to the node 21. One of input terminals of the circuit 511_2 is connected to the wiring 113. The other terminal of the circuit 511_2 is connected to the node 12. An output terminal of the circuit 511_2 is connected to the node 22. One of input terminals of the circuit 512 is connected to the wiring 113. The other terminal of the circuit 512 is connected to the wiring 111. An output terminal of the circuit 512 is connected to the node 31.

Figure 20D:
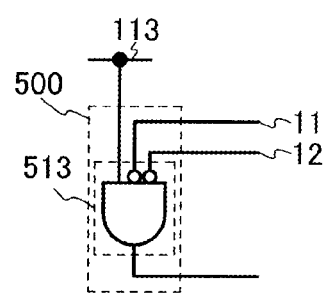

Next, another example of the circuit 500 is described with reference to FIG. 20D. The circuit 500 includes a circuit 513. The circuit 513 can function as a logic circuit in which an AND circuit with three inputs and a NOT circuit are combined. A first input terminal of the circuit 513 is connected to the wiring 111. A second input terminal of the circuit 513 is connected to the node 11. A third input terminal of the circuit 513 is connected to the node 12. An output terminal of the circuit 513 is connected to the gates of the transistors 401_1, 401_2, and/or 402.

Figure 20E:
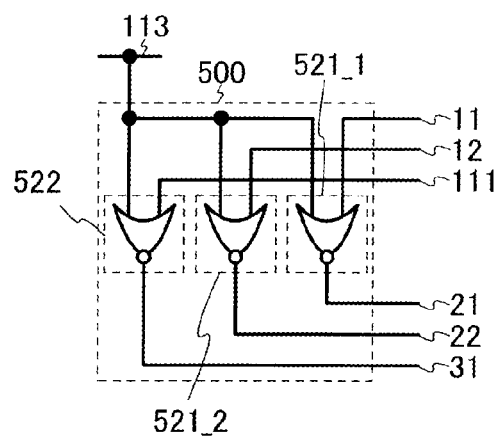

Another example of the circuit 500 is described with reference to FIG. 20E. The circuit 500 includes circuits 521_1 and 521_2 and a circuit 522. The circuits 521_1 and 521_2 and the circuit 522 can function as a NOR circuit with two inputs, as an example. One of input terminals of the circuit 521_1 is connected to the wiring 113. The other terminal of the circuit 521_1 is connected to the node 11. An output terminal of the circuit 521_1 is connected to the node 21. One of input terminals of the circuit 521_2 is connected to the wiring 113. The other terminal of the circuit 521_2 is connected to the node 12. An output terminal of the circuit 521_2 is connected to the node 22. One of input terminals of the circuit 522 is connected to the wiring 113. The other terminal of the circuit 522 is connected to the wiring 111. An output terminal of the circuit 522 is connected to the node 31.

Figure 20F:
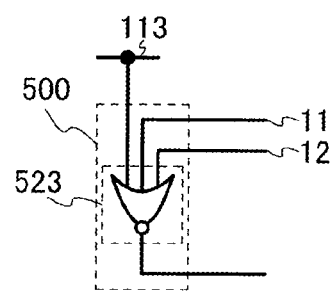

Next, another example of the circuit 500 is described with reference to FIG. 20F. The circuit 500 includes a circuit 523. The circuit 523 can function as a NOR circuit with three inputs. A first terminal of the circuit 523 is connected to the wiring 113. A second terminal of the circuit 523 is connected to the node 11. A third input terminal of the circuit 523 is connected to the node 12. An output terminal of the circuit 523 is connected to the gate of the transistor 401_1, the gate of the transistor 401_2, and/or the gate of the transistor 402.

Figure 20G:
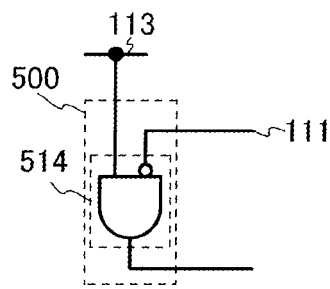

Another example of the circuit 500 is described with reference to FIG. 20G. The circuit 500 includes a circuit 514. The circuit 514 can function as a logic circuit in which an AND circuit with two inputs and a NOT circuit are combined. A first input terminal of the circuit 514 is connected to the wiring 113. A second input terminal of the circuit 514 is connected to the wiring 111. An output terminal of the circuit 514 is connected to the gate of the transistor 401_1, the gate of the transistor 401_2, and/or the gate of the transistor 402.

Figure 20H:
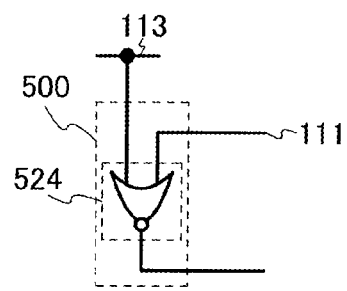

Another example of the circuit 500 is described with reference to FIG. 20H. The circuit 500 includes a circuit 524. The circuit 524 can function as a NOR circuit with two inputs. A first input terminal of the circuit 524 is connected to the wiring 113. A second input terminal of the circuit 524 is connected to the wiring 111. An output terminal of the circuit 524 is connected to the gates of the transistors 401_1, 401_2, and/or 402.

Examples of the circuit 501_1, the circuit 501_2, the circuit 502, the circuit 503, the circuit 511_1, the circuit 511_2, the circuit 512, the circuit 513, the circuit 514, the circuits 521_1 and 521_2, the circuit 522, the circuit 523, and the circuit 524 shown in FIGS. 20A to 20H are described with reference to FIGS. 21A to 21F and FIGS. 22A to 22D. Note that a variety of structures are used for the circuit 501_1, the circuit 501_2, the circuit 502, the circuit 503, the circuit 511_1, the circuit 511_2, the circuit 512, the circuit 513, the circuit 514, the circuits 521_1 and 521_2, the circuit 522, the circuit 523, and the circuit 524.

Figure 21A:
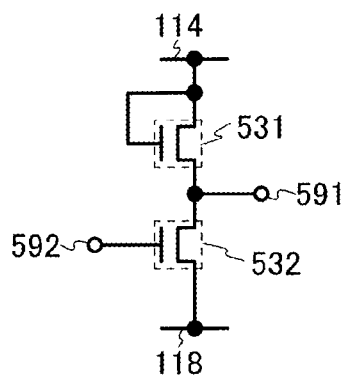
FIGS. 21A to 21F are examples of a circuit diagram of a semiconductor device in Embodiment 3.

A circuit shown in FIG. 21A includes a transistor 531 whose first terminal is connected to the wiring 114, second terminal is connected to the output terminal 591, and gate is connected to the wiring 114, and a transistor 532 whose first terminal is connected to the wiring 118, second terminal is connected to the output terminal 591, and gate is connected to an input terminal 592. The circuit shown in FIG. 21A can be applied to the circuit 501_1, the circuit 501_2, the circuit 502, and/or the like. Therefore, the output terminal 591 can be connected to the node 21, the node 22, the node 31, or the like. Further, the input terminal 592 can be connected to the node 11, the node 12, the wiring 111, or the like.

Figure 21B:
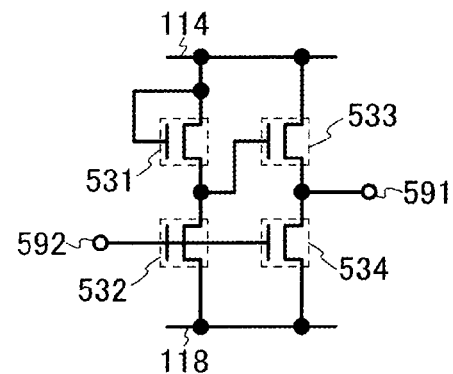

A circuit shown in FIG. 21B includes the transistor 531 whose first terminal is connected to the wiring 114, second terminal is connected to a gate of a transistor 533, and gate is connected to the wiring 114, a transistor 532 whose first terminal is connected to the wiring 118, second terminal is connected to the gate of the transistor 533, and gate is connected to the input terminal 592, the transistor 533 whose first terminal is connected to the wiring 114 and second terminal is connected to the output terminal 591, and a transistor 534 whose first terminal is connected to the wiring 118, second terminal is connected to the output terminal 591, and gate is connected to an input terminal 592. The circuit shown in FIG. 21B can be applied to the circuit 501_1, the circuit 501_2, the circuit 502, and/or the like. Therefore, the output terminal 591 can be connected to the node 21, the node 22, the node 31, or the like. The input terminal 592 can be connected to the node 11, the node 12, the wiring 111, or the like.

Figure 21C:
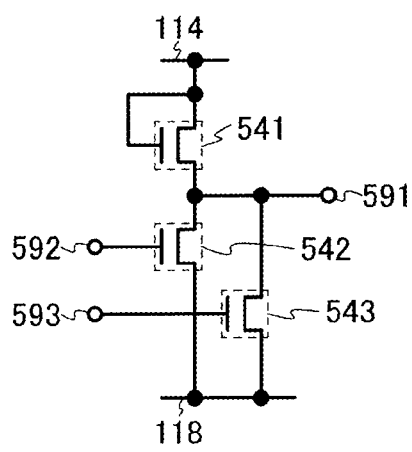

A circuit shown in FIG. 21C includes a transistor 541 whose first terminal is connected to the wiring 114, second terminal is connected to the output terminal 591, and gate is connected to the wiring 114, a transistor 542 whose first terminal is connected to the wiring 118, second terminal is connected to the output terminal 591, and gate is connected to an input terminal 592, and a transistor 543 whose first terminal is connected to the wiring 118, second terminal is connected to the output terminal 591, and gate is connected to an input terminal 593. The circuit shown in FIG. 21C can be applied to the circuit 503, the circuit 521_1, the circuit 521_2, the circuit 522, the circuit 524, or the like. Therefore, the output terminal 591 can be connected to a connection portion of gates of the transistors 401_1 and 401_2 and the gate of the transistor 402, the node 21, the node 22, the node 31, or the like. Further, the input terminals 592 and 593 can be connected to the node 11, the node 12, the wiring 111, the wiring 113, or the like.

Figure 21D:
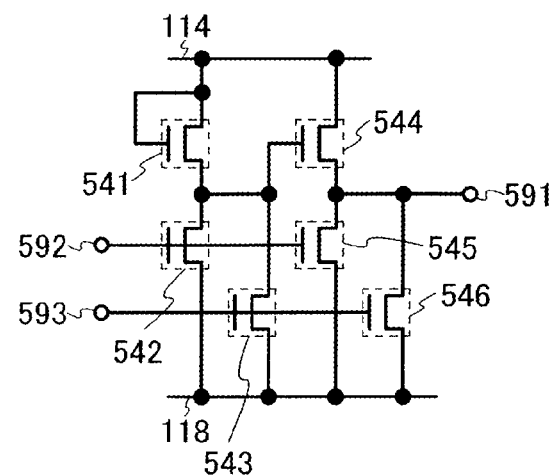

A circuit shown in FIG. 21D includes the transistor 541 whose first terminal is connected to the wiring 114, second terminal is connected to a gate of a transistor 544, and gate is connected to the wiring 114, the transistor 542 whose first terminal is connected to the wiring 118, second terminal is connected to the gate of the transistor 544, and gate is connected to the input terminal 592, the transistor 543 whose first terminal is connected to the wiring 118, second terminal is connected to the gate of the transistor 544, and gate is connected to the input terminal 593, the transistor 544 whose first terminal is connected to the wiring 114 and second terminal is connected to the output terminal 591, a transistor 545 whose first terminal is connected to the wiring 118, second terminal is connected to the output terminal 591, and gate is connected to the input terminal 592, and a transistor 546 whose first terminal is connected to the wiring 118, second terminal is connected to the output terminal 591, and gate is connected to the input terminal 593. The circuit shown in FIG. 21D can be applied to the circuit 503, the circuit 521_1, the circuit 521_2, the circuit 522, the circuit 524, or the like. Therefore, the output terminal 591 can be connected to the node 21, the node 22, the node 31, the connection portion of gates of the transistors 401_1 and 401_2 and the gate of the transistor 402, or the like. Further, the input terminals 592 and 593 can be connected to the node 11, the node 12, the wiring 111, the wiring 113, or the like.

Figure 21E:
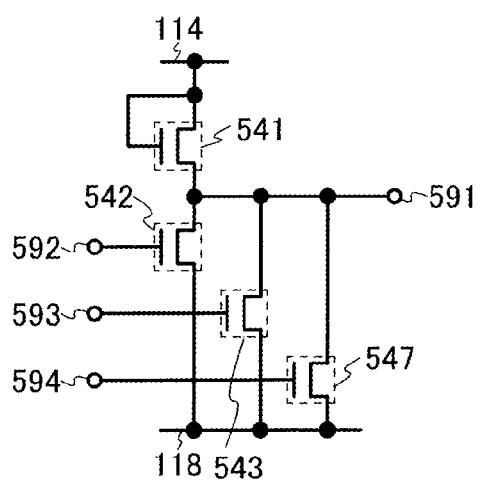

A circuit shown in FIG. 21E includes the transistor 541 whose first terminal is connected to the wiring 114, second terminal is connected to the output terminal 591, and gate is connected to the wiring 114, the transistor 542 whose first terminal is connected to the wiring 118, second terminal is connected to the output terminal 591, and gate is connected to an input terminal 592, the transistor 543 whose first terminal is connected to the wiring 118, second terminal is connected to the output terminal 591, and gate is connected to the input terminal 593, and a transistor 547 whose first terminal is connected to the wiring 118, second terminal is connected to the output terminal 591, and gate is connected to an input terminal 595. The circuit shown in FIG. 21E can be applied to the circuit 523, or the like. Therefore, the output terminal 591 can be connected to the connection portion of gates of the transistors 401_1 and 401_2 and the gate of the transistor 402, or the like. Further, the input terminals 592 to 594 can be connected to the node 11, the node 12, the wiring 113, or the like.

Figure 21F:
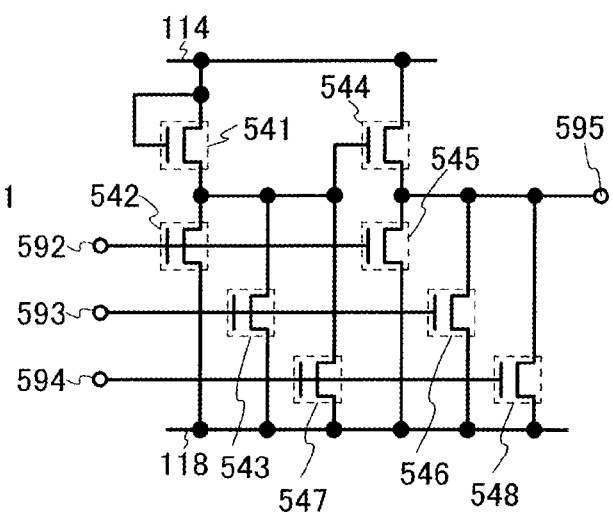

A circuit shown in FIG. 21F includes the transistor 541 whose first terminal is connected to the wiring 114, second terminal is connected to the gate of the transistor 544, and gate is connected to the wiring 114, the transistor 542 whose first terminal is connected to the wiring 118, second terminal is connected to the gate of the transistor 544, and gate is connected to the input terminal 592, the transistor 543 whose first terminal is connected to the wiring 118, second terminal is connected to the gate of the transistor 544, and gate is connected to the input terminal 593, and the transistor 547 whose first terminal is connected to the wiring 118, second terminal is connected to the gate of the transistor 544, and gate is connected to an input terminal 594, the transistor 544 whose first terminal is connected to the wiring 114, and second terminal is connected to the output terminal 595, the transistor 545 whose first terminal is connected to the wiring 118, second terminal is connected to the output terminal 595, and gate is connected to an input terminal 592, the transistor 546 whose first terminal is connected to the wiring 118, second terminal is connected to the output terminal 595, and gate is connected to the input terminal 593, and a transistor 548 whose first terminal is connected to the wiring 118, second terminal is connected to the output terminal 595, and gate is connected to an input terminal 594. The circuit shown in FIG. 21F can be applied to the circuit 523, or the like. Therefore, the output terminal 595 can be connected to the connection portion of gates of the transistors 401_1 and 401_2 and the gate of the transistor 402, or the like. Further, the input terminals 592 to 594 can be connected to the node 11, the node 12, the wiring 113, or the like.

A circuit shown in FIG. 22A includes a transistor 551 whose first terminal is connected to the input terminal 592, second terminal is connected to the gate of a transistor 553, and gate is connected to the input terminal 592, a transistor 552 whose first terminal is connected to the wiring 118, and second terminal is connected to the gate of the transistor 553, and a gate is connected to the input terminal 593, the transistor 553 whose first terminal is connected to the input terminal 592 and second terminal is connected to the output terminal 591, and a transistor 554 whose first terminal is connected to the wiring 118, second terminal is connected to the output terminal 591, and gate is connected to the input terminal 593. The circuit shown in FIG. 22A can be applied to the circuit 511_1, the circuit 511_2, the circuit 512, the circuit 514, and/or the like. Therefore, the output terminal 591 can be connected to the node 21, the node 22, the node 31, or the like. Further, the input terminal 592 can be connected to the wiring 113 or the like. Further, the input terminal 593 can be connected to the node 11, the node 12, the wiring 111, or the like.

A circuit shown in FIG. 22B includes the transistor 551 whose first terminal is connected to the input terminal 592, second terminal is connected to the gate of the transistor 553, and gate is connected to the input terminal 592, the transistor 552 whose first terminal is connected to the wiring 118, second terminal is connected to the gate of the transistor 553, and gate is connected to the input terminal 593, the transistor 553 whose first terminal is connected to the input terminal 592 and second terminal is connected to the output terminal 591, the transistor 554 whose first terminal is connected to the wiring 118, second terminal is connected to the output terminal 591, and gate is connected to the input terminal 593, a transistor 555 whose first terminal is connected to the wiring 118, second terminal is connected to the gate of the transistor 553, and gate is connected to the input terminal 594, and the transistor 556 whose first terminal is connected to the wiring 118, second terminal is connected to the output terminal 591, and gate is connected to the input terminal 594. The circuit shown in FIG. 22B can be applied to the circuit 513, or the like. Therefore, the output terminal 591 can be connected to the connection portion of the gates of the transistors 404_1 and 404_2 and the gate of the transistor 402, or the like. Further, the input terminal 592 can be connected to the wiring 113 or the like. Further, the input terminals 593 and 594 can be connected to the node 11, the node 12, or the like.

A circuit shown in FIG. 22C includes a transistor 561 whose first terminal is connected to the wiring 118, second terminal is connected to the output terminal 591, and gate is connected to the input terminal 593, and a capacitor 562 of which one electrode can connected to the input terminal 592 and the other electrode is connected to the output terminal 591. The circuit shown in FIG. 22C can be applied to the circuit 511_1, the circuit 511_2, the circuit 512, the circuit 514, and/or the like. Therefore, the output terminal 591 can be connected to the node 21, the node 22, the node 31, the connection portion of the gates of the transistors 401_1 and 401_2 and the gate of the transistor 402, or the like. Further, the input terminal 592 can be connected to the wiring 113. Further, the input terminal 593 can be connected to the node 11, the node 12, the wiring 111, or the like.

A circuit shown in FIG. 22D includes the transistor 561 whose first terminal is connected to the wiring 118, second terminal is connected to the output terminal 591, and gate is connected to the input terminal 593, the capacitor 562 of which one electrode is connected to the input terminal 592 and the other electrode is connected to the output terminal 591, and the transistor 563 whose first terminal is connected to the wiring 118, second terminal is connected to the output terminal 591, and gate is connected to the input terminal 594. The circuit shown in FIG. 22D can be applied to the circuit 513 shown in FIG. 20D, or the like. Therefore, the output terminal 591 can be connected to the connection portion of the gates of the transistors 404_1 and the gate of the transistor 402, or the like. Further, the input terminal 592 can be connected to the wiring 113. Further, the input terminals 593 and 594 can be connected to the node 11, the node 12, or the like.

Note that a circuit structure is not limited to that in FIGS. 21A to 21F and FIGS. 22A to 22D. For example, as shown in FIG. 22E, each terminal of transistors can be connected to a different wiring or a different terminal. Further, in one example of FIG. 22E, the first terminal of the transistor 551 is connected to the wiring 581, the first terminal of the transistor 553 is connected to a wiring 582, the first terminal of the transistor 552 is connected to a wiring 583, and the first terminal of the transistor 554 is connected to a wiring 584. Wirings (e.g., the wirings 581 to 584) connected to the terminals of these transistors can be connected to a variety of wirings or a variety of nodes. Further, the wirings connected to each of the terminals of these transistors can function as a power supply line or a signal line because a voltage, a signal, or the like can be inputted thereto. As another example, as shown in FIG. 22F, another element such as a resistor or a diode can be used instead of a diode-connected transistor. An element 535 is used instead of the transistor 531. One terminal of the element 535 is connected to the wiring 114, and the other terminal of the element 535 is connected to the output terminal 591. The element 535 functions as an element (e.g., a transistor, a resistor, or a diode) including a resistive component. As another example, as shown in FIG. 22G a transistor or an MIS capacitor can be used as a capacitor. A transistor 562A is used as the capacitor 562. A first terminal and a second terminal of the transistor 562A are connected to the output terminal 591. A gate of the transistor 562A is connected to the input terminal 592.

Figure 23A:
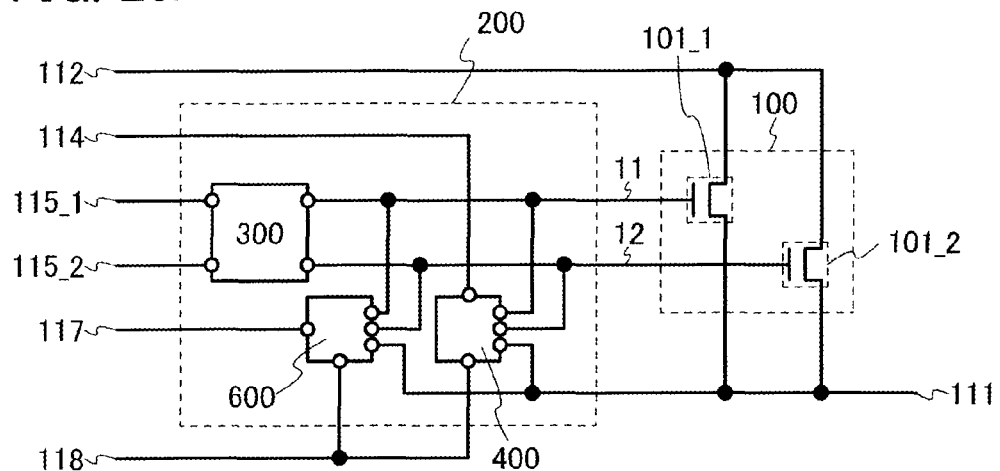
FIGS. 23A to 23E are examples of a circuit diagram of a semiconductor device in Embodiment 3.

Next, another example of the circuit 200 is described with reference to FIG. 23A. The circuit 200 can includes a circuit 600 which is a part of the circuit 200. Note that, a structure of the case where the circuit 200 includes the circuits 300, 400, and 600 is shown in FIG. 23A. A part of or the whole of the circuit 300 can be used as a part of or the whole of the circuits 400 and 600. A part of or the whole of the circuit 400 can be used as a part of or the whole of the circuits 300 and 600. A part of or the whole of the circuit 600 can be used as a part of or the whole of the circuits 300 and 400. For example, the circuit 600 can include one or more transistors. These transistors preferably have the same polarity as the transistors 101_1 and 101_2. However, this embodiment is not limited thereto.

The circuit 600 is connected to the wiring 117, the wiring 118, the node 11, the node 12, and the wiring 111, for example. Note that this embodiment is not limited thereto. The circuit 600 can be connected to a variety of other wirings or other nodes in accordance with the structure.

The circuit 600 has a function of controlling an electrical continuity state of the wiring 118 and the node 11, an electrical continuity state of the wiring 118 and the node 12, and/or, an electrical continuity state of the wiring 118 and the wiring 111 in accordance with the signal RE, for example. For example, when a voltage such as the voltage V1, or a signal such as the signal CK2 is supplied to the wiring 118, the circuit 600 has a function of controlling a timing of supplying a voltage, a signal, or the like supplied to the wiring 118 to the node 11, the node 12, and/or the wiring 111. Alternatively, the circuit 600 has a function of controlling a timing of making a voltage of the wiring 111 decrease to V1, for example. As thus described, the circuit 600 functions as a control circuit, a circuit performing a reset operation, a switch, or the like. Note that this embodiment is not limited thereto. The circuit 600 can have a variety of other functions. Note that the circuit 600 does not need to have all the above functions.

Next, an example of an operation of the circuit 600 in FIG. 23A is described with reference to the timing chart in FIG. 2.

In the periods A1 and B1, the periods D1 and E1, the periods A2 and B2, and the periods D2 and E2, since the signal RE is in the Low level, the circuit 600 does not supply a signal, a voltage, or the like to the node 11, the node 12, and the wiring 111 in many cases. However, this embodiment is not limited thereto. For example, in the period A1, the periods D1 and E1, the period A2, and the periods D2 and E2, the circuit 600 can supply the voltage V1 or a Low-level signal to the node 11, the node 12, and/or the wiring 111.

In the periods C1 and C2, since the signal RE goes into a High level, the circuit 600 can supply the voltage V1 or a Low-level signal to the node 11, the node 12, and/or the wiring 111. However, this embodiment is not limited thereto. It is acceptable that the circuit 600 does not supply a voltage or signal to the node 11, the node 12, and/or the wiring 111.

Next, a specific example of the circuit 600 is described with reference to FIG. 23B. The circuit 600 includes a plurality of transistors, which are transistors 601_1 and 601_2, and a transistor 602. However, this embodiment is not limited thereto. Just one or more transistors, which are the transistors 601_1, 601_2, and 602 can be included in the circuit 600. The plurality of transistors, which are the transistors 601_1 and 601_2, and the transistor 602 preferably have the same polarity as the transistors 101_1 and 101_2 and are n-channel transistors. However, this embodiment is not limited thereto. The plurality of transistors, which are the transistors 601_1 and 601_2, and the transistor 602 can be p-channel transistors.

A first terminal of the transistor 601_1 is connected to the wiring 118, a second terminal of the transistor 601_1 is connected to the node 11, and a gate of the transistor 601_1 is connected to the wiring 117. A first terminal of the transistor 601_2 is connected to the wiring 118, a second terminal of the transistor 601_2 is connected to the node 12, and a gate of the transistor 601_2 is connected to the wiring 117. A first terminal of the transistor 602 is connected to the wiring 118, a second terminal of the transistor 602 is connected to the wiring 111, and a gate of the transistor 602 is connected to the wiring 117.

The transistor 601_1 has a function of controlling an electrical continuity state of the wiring 118 and the node 11, for example. Alternatively, the transistor 601_1 has a function of controlling a timing of supplying a voltage of the wiring 118 to the node 11. For example, when a voltage such as the voltage V1, or a signal such as the signal CK2 is supplied to the wiring 118, the transistor 601_1 has a function of controlling a timing of supplying a voltage, a signal, or the like supplied to the wiring 118 to the node 11. As thus described, the transistor 601_1 functions as a switch. Note that this embodiment is not limited thereto. The transistor 601_1 can have a variety of other functions. Note that the transistor 601_1 does not need to have all the above functions.

The transistor 601_2 has a function of controlling an electrical continuity state of the wiring 118 and the node 12, for example. Alternatively, the transistor 601_2 has a function of controlling a timing of supplying a voltage of the wiring 118 to the node 12. For example, when a voltage such as the voltage V1, or a signal such as the signal CK2 is supplied to the wiring 118, the transistor 601_2 has a function of controlling a timing of supplying a voltage, a signal, or the like supplied to the wiring 118 to the node 12. As thus described, the transistor 601_2 functions as a switch. Note that this embodiment is not limited thereto. The transistor 601_2 can have a variety of other functions. Note that the transistor 601_2 does not need to have all the above functions.

The transistor 602 has a function of controlling an electrical continuity state of the wiring 118 and the wiring 111, for example, the transistor 602 has a function of controlling a timing of supplying a voltage of the wiring 118 to the wiring 111. For example, when a voltage such as the voltage V1, or a signal such as the signal CK2 is supplied to the wiring 118, the transistor 602 has a function of controlling a timing of supplying a voltage, a signal, or the like supplied to the wiring 118 to the wiring 111. As thus described, the transistor 602 functions as a switch. Note that this embodiment is not limited thereto. The transistor 602 can have a variety of other functions. Note that the transistor 602 does not need to have all the above functions.

Figure 44A:
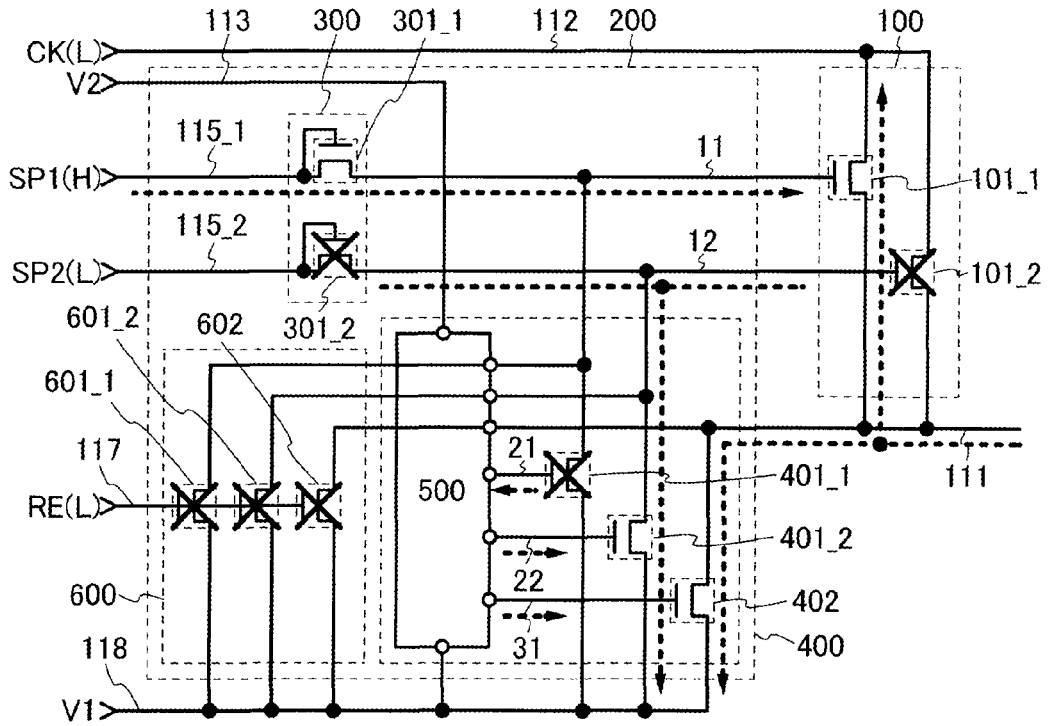
FIGS. 44A and 44B are examples of schematic diagrams illustrating an operation of a semiconductor device in FIGS. 23A to 23E.
Figure 44B:
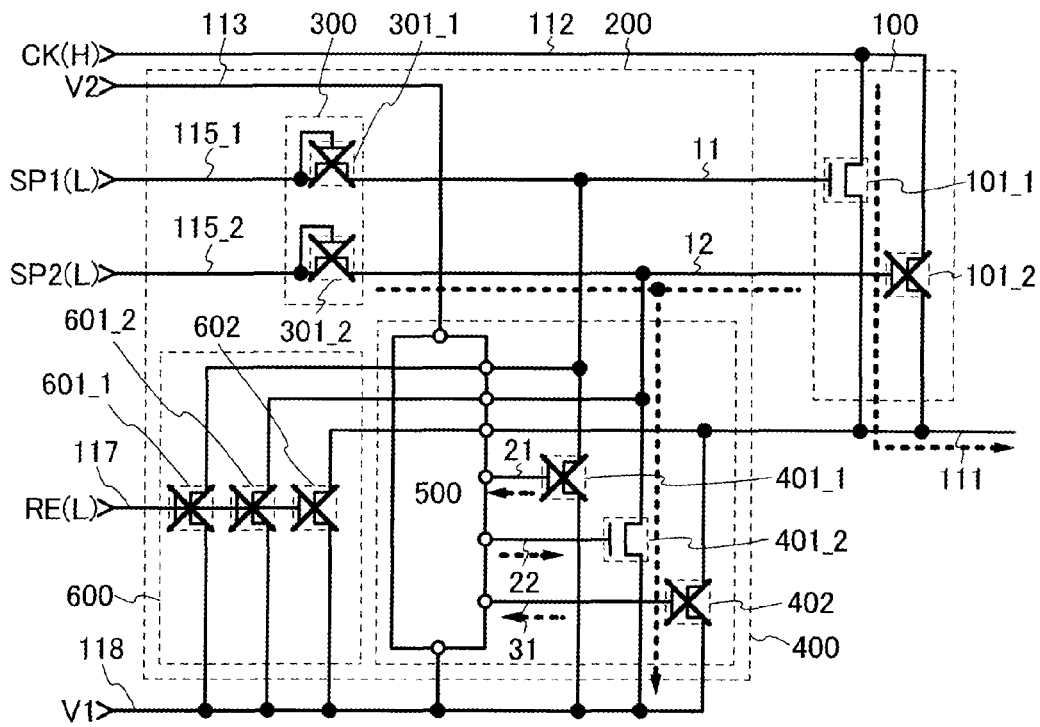
Figure 45A:
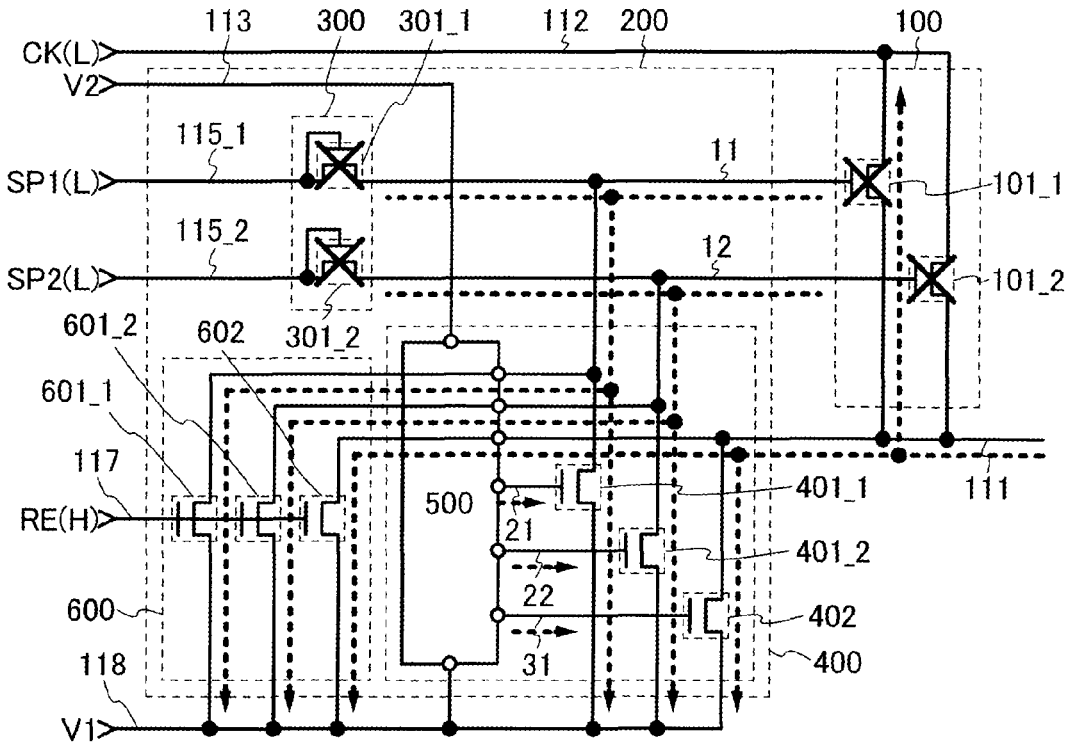
FIGS. 45A and 45B are examples of schematic diagrams illustrating an operation of a semiconductor device in FIGS. 23A to 23E.
Figure 45B:
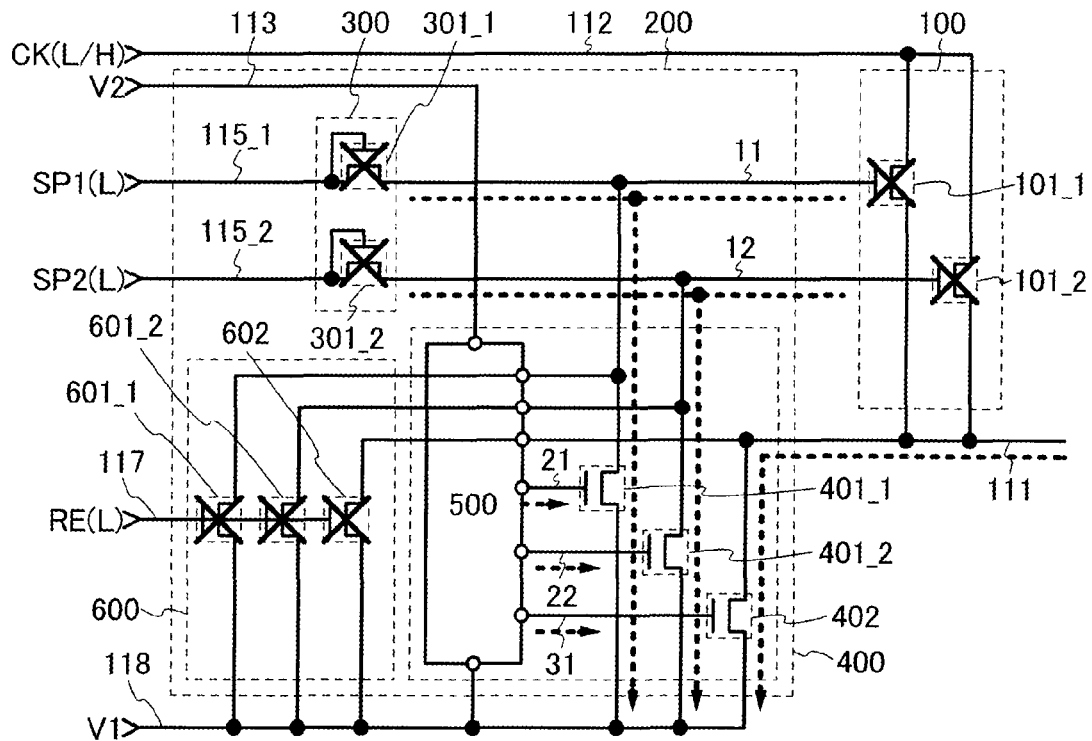
Figure 46A:
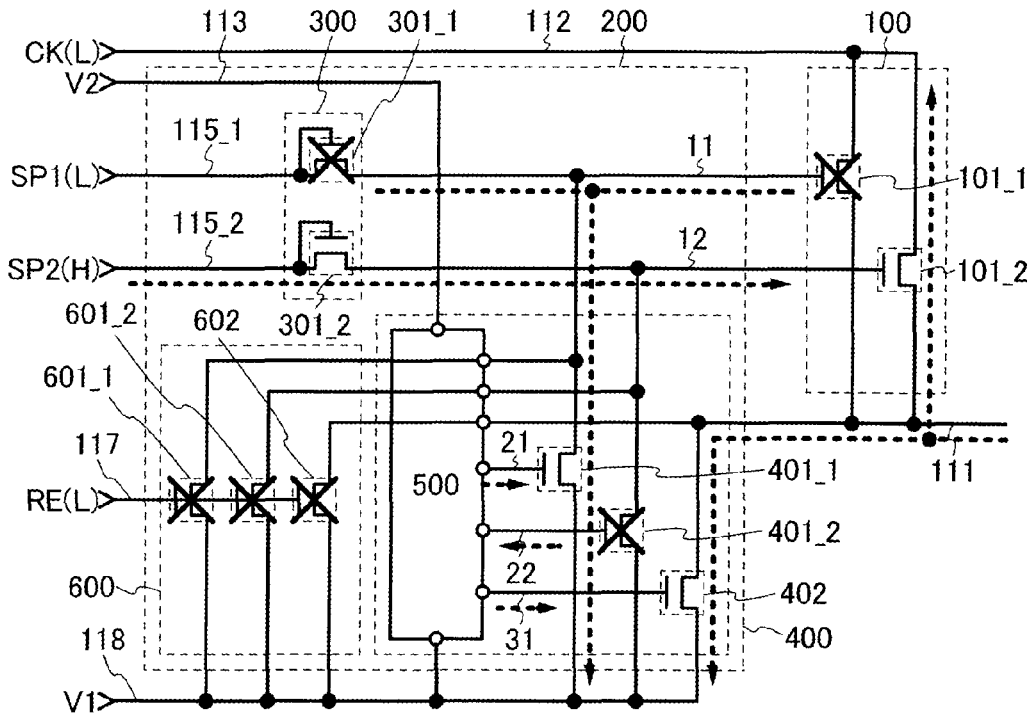
FIGS. 46A and 46B are examples of schematic diagrams illustrating an operation of a semiconductor device in FIGS. 23A to 23E.
Figure 46B:
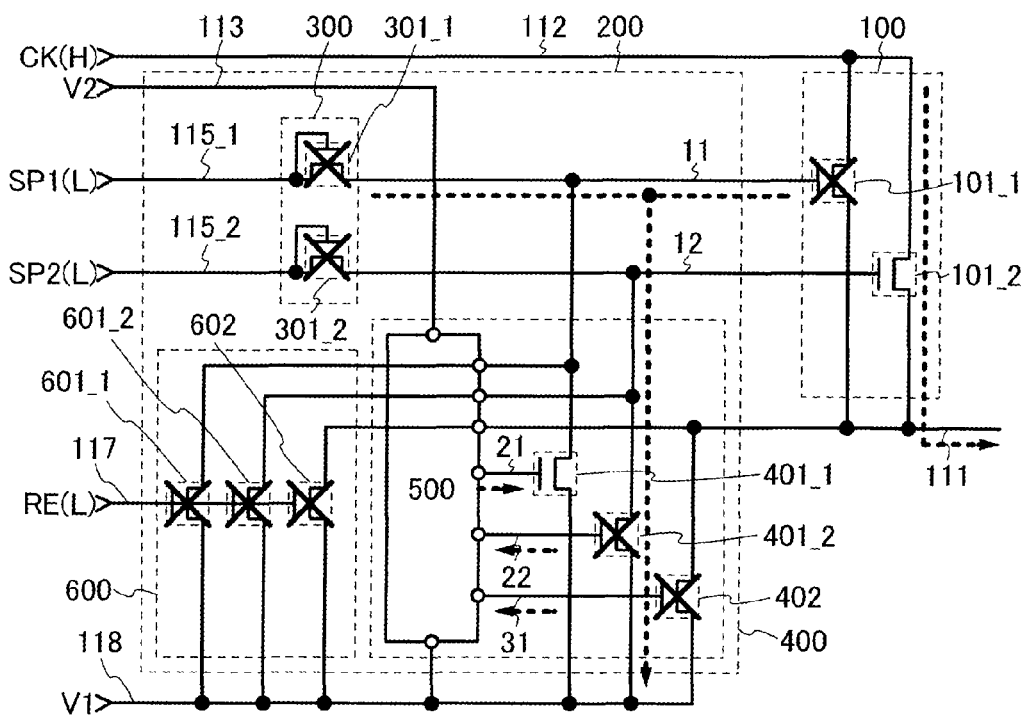
Figure 47A:
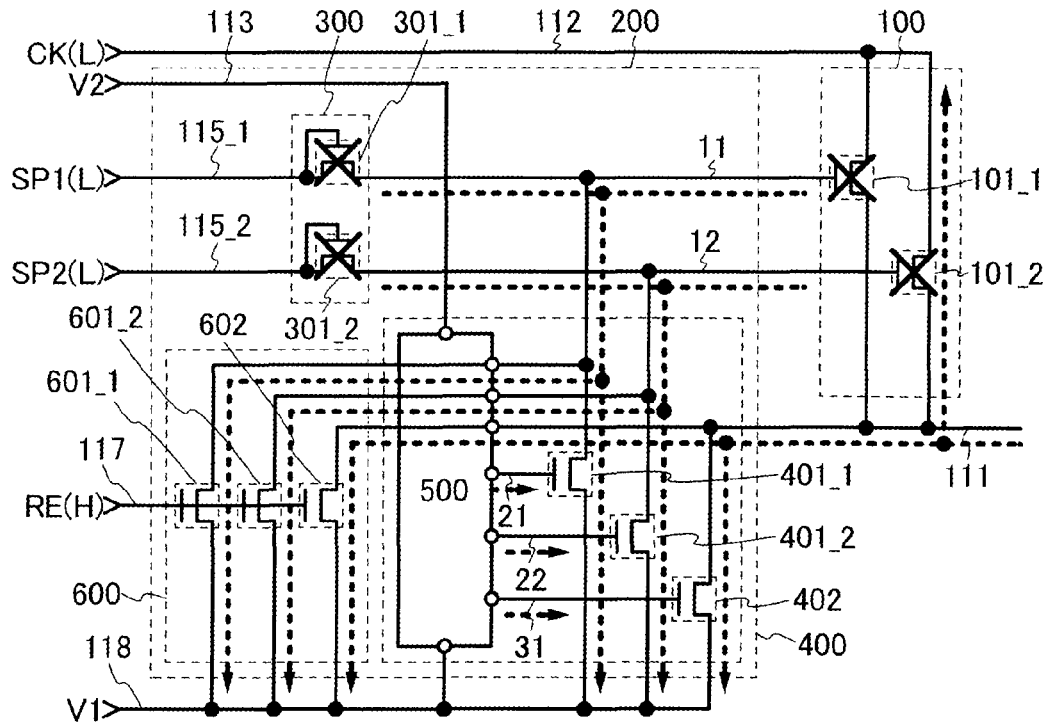
FIGS. 47A and 47B are examples of schematic diagrams illustrating an operation of a semiconductor device in FIGS. 23A to 23E.
Figure 47B:
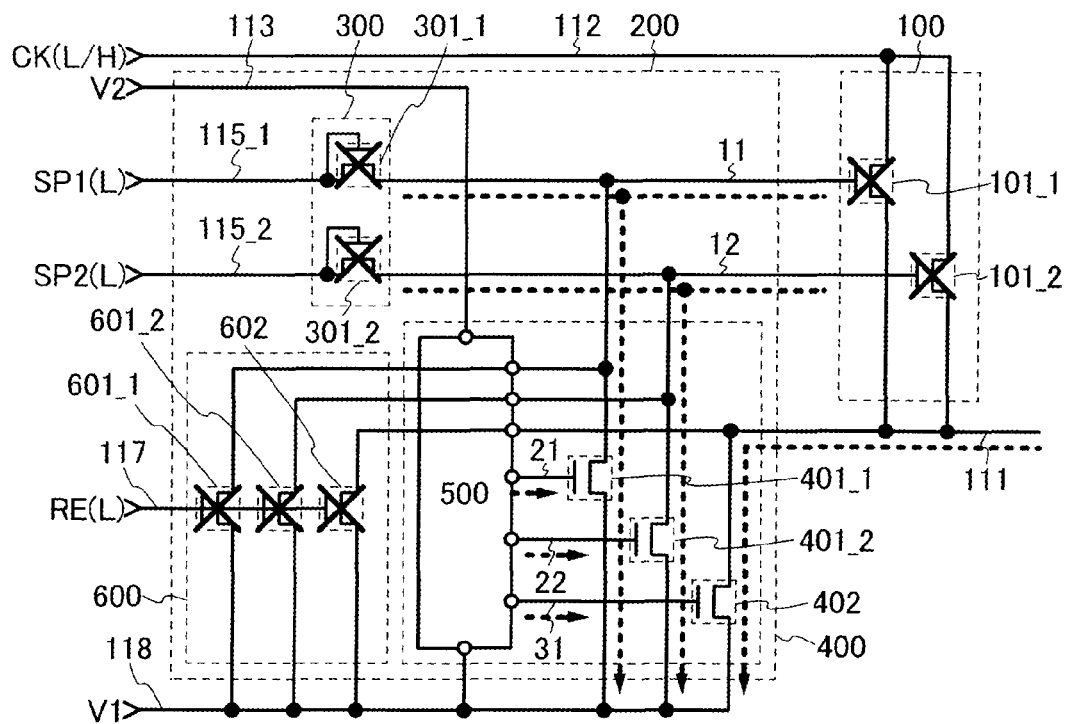

Next, an example of an operation of a semiconductor device in FIG. 23A is described. Since an operation of a semiconductor device in FIG. 23A is partly the same as that of a semiconductor device in FIG. 16A, the operation is described with reference to the timing chart in FIG. 16B as appropriate. Note that a schematic view of an operation of a semiconductor device in the period A1 is shown in FIG. 44A. A schematic view of an operation of the semiconductor device in the period B1 is shown in FIG. 44B. A schematic view of an operation of the semiconductor device in the period C1 is shown in FIG. 45A. A schematic view of an operation of the semiconductor device in the periods D1 and E1 is shown in FIG. 45B. Note that a schematic view of an operation of the semiconductor device in the period A2 is shown in FIG. 46A. A schematic view of an operation of the semiconductor device in the period B2 is shown in FIG. 46B. A schematic view of an operation of the semiconductor device in the period C2 is shown in FIG. 47A. A schematic view of an operation of the semiconductor device in the periods D2 and E2 is shown in FIG. 47B. Note that in FIGS. 45A and 45B, FIGS. 46A and 46B, and FIGS. 47A and 47B, the structure shown in FIG. 6B is used for the circuit 300, the semiconductor device shown in FIG. 16A is used as the circuit 400, and the structure shown in FIG. 23B is used for the circuit 600.

In the periods A1 and B1, the periods D1 and E1, the periods A2 and B2, and the periods D2 and E2, the signal RE goes into the Low level, so that the transistors 601_1, 601_2, and 602 are turned off. Accordingly, the wiring 118 and the node 11, the wiring 118 and the node 12, and the wiring 118 and the wiring 111 are brought out of electrical continuity.

In the periods C1 and C2, the signal RE goes into a High level, so that the transistors 601_1, 601_2, and 602 are turned on. Accordingly, the wiring 118 and the node 11, the wiring 118 and the node 12, and the wiring 118 and the wiring 111 are brought into electrical continuity.

Note that it is preferable that the channel width of the transistor 601_1 be approximately equal to the channel width of the transistor 601_2. Thus, degree of change in a voltage of the node 11 in the period T1 can be approximately equal to degree of change in a voltage of the node 12 in the period T2. Accordingly, the waveforms of the signal OUT can be equal to each other. Note that this embodiment is not limited thereto. The channel width of the transistor 601_1 can be different from the channel width of the transistor 601_2.

Note that the channel widths of the transistors 601_1 and 601_2 are preferably 100 μm to 3000 μm. More preferably, the channel widths of the transistors 601_1 and 601_2 are 300 μm to 2000 μm. Further preferably, the channel widths of the transistors 601_1 and 601_2 are 300 μm to 2000 μm. However, this embodiment is not limited thereto.

Note that the channel width of the transistor 602 is preferably 500 μm to 5000 μm. More preferably, the channel width of the transistor 602 is 1000 μm to 3000 μm. Further preferably, the channel width of the transistor 602 is 2000 μm to 3000 μm. However, this embodiment is not limited thereto.

Note that the circuit 600 does not need to include all of the transistors 601_1, 601_2, and 602. One or two of these transistors can be included.

Figure 23B:
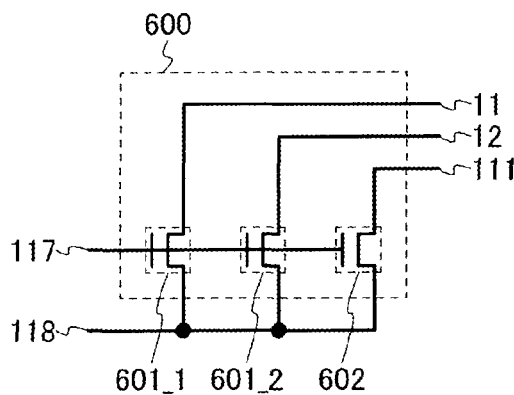
Figure 23C:
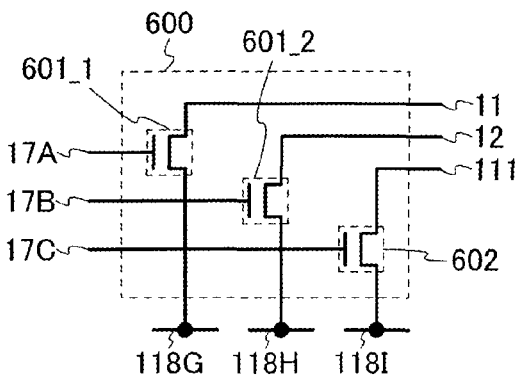

Note that as shown in FIG. 23C, the first terminal of the transistor 601_1, the first terminal of the transistor 601_2, and the first terminal of the transistor 602 can be connected to different wirings from each other. In an example in FIG. 23C, the wiring 118 is divided into a plurality of wirings, which are wirings 118G to 118I. The first terminal of the transistor 601_1 is connected to the wiring 118G, the first terminal of the transistor 601_2 is connected to the wiring 118H, and the first terminal of the transistor 602 is connected to the wiring 118I. Note that this embodiment is not limited thereto. The first terminal of the transistor 601_1, the first terminal of the transistor 601_2, and the first terminal of the transistor 602 can be connected to a variety of wirings or nodes. Note that the wirings 118G to 118I can have a similar function to the wiring 118. Therefore, a voltage such as the voltage V1 can be inputted to the wirings 118G to 118I which can function as power supply lines. Note that this embodiment is not limited thereto. A variety of signals, voltages, or currents can be inputted to the wirings 118G to 118I.

Figure 23D:
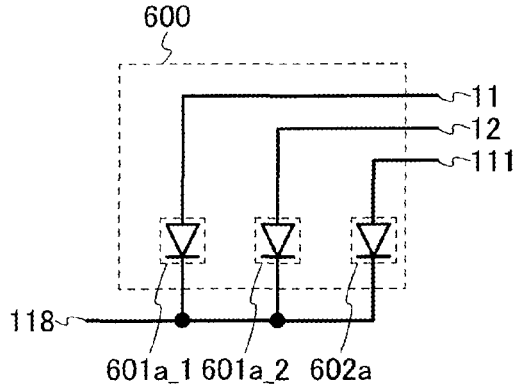
Figure 23E:
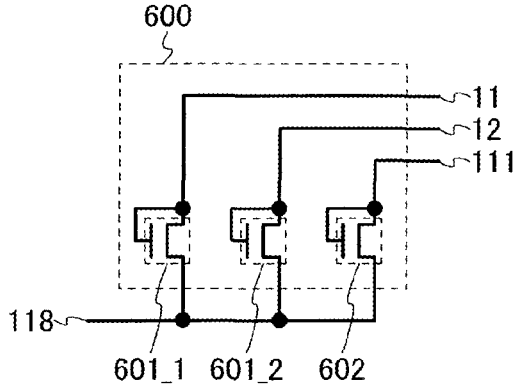

As shown in FIG. 23D, the transistor 601_1 can be replaced with a diode 601a_1 of which one terminal (hereinafter also referred to as a positive electrode) is connected to the node 11 and the other terminal (hereinafter also referred to as a negative electrode) is connected to the wiring 118. Similarly, the transistor 601_2 can be replaced with a diode 601a_2 of which one terminal (also referred to as a positive electrode) is connected to the node 12 and the other terminal (also referred to as a negative electrode) is connected to the wiring 118. Similarly, the transistor 602 can be replaced with a diode 602a of which one terminal (also referred to as a positive electrode) is connected to the wiring 111 and the other terminal (also referred to as a negative electrode) is connected to the wiring 118. However, this embodiment is not limited thereto. For example, as shown in FIG. 23E, the transistor 601_1 can be diode-connected by connecting the first terminal of the transistor 601_1 to the node 11. Similarly, the transistor 601_2 can be diode-connected by connecting the first terminal of the transistor 601_1 to the node 12. Similarly, the transistor 602 can be diode-connected by connecting the first terminal of the transistor 601_1 to the wiring 111.

Note that, as in FIGS. 23D and 23E, in the structure described in FIGS. 23B and 23C, a transistor (e.g., the transistor 601_1, the transistor 601_2, or the transistor 602) can be replaced with a diode and can be diode-connected.

Figure 48:
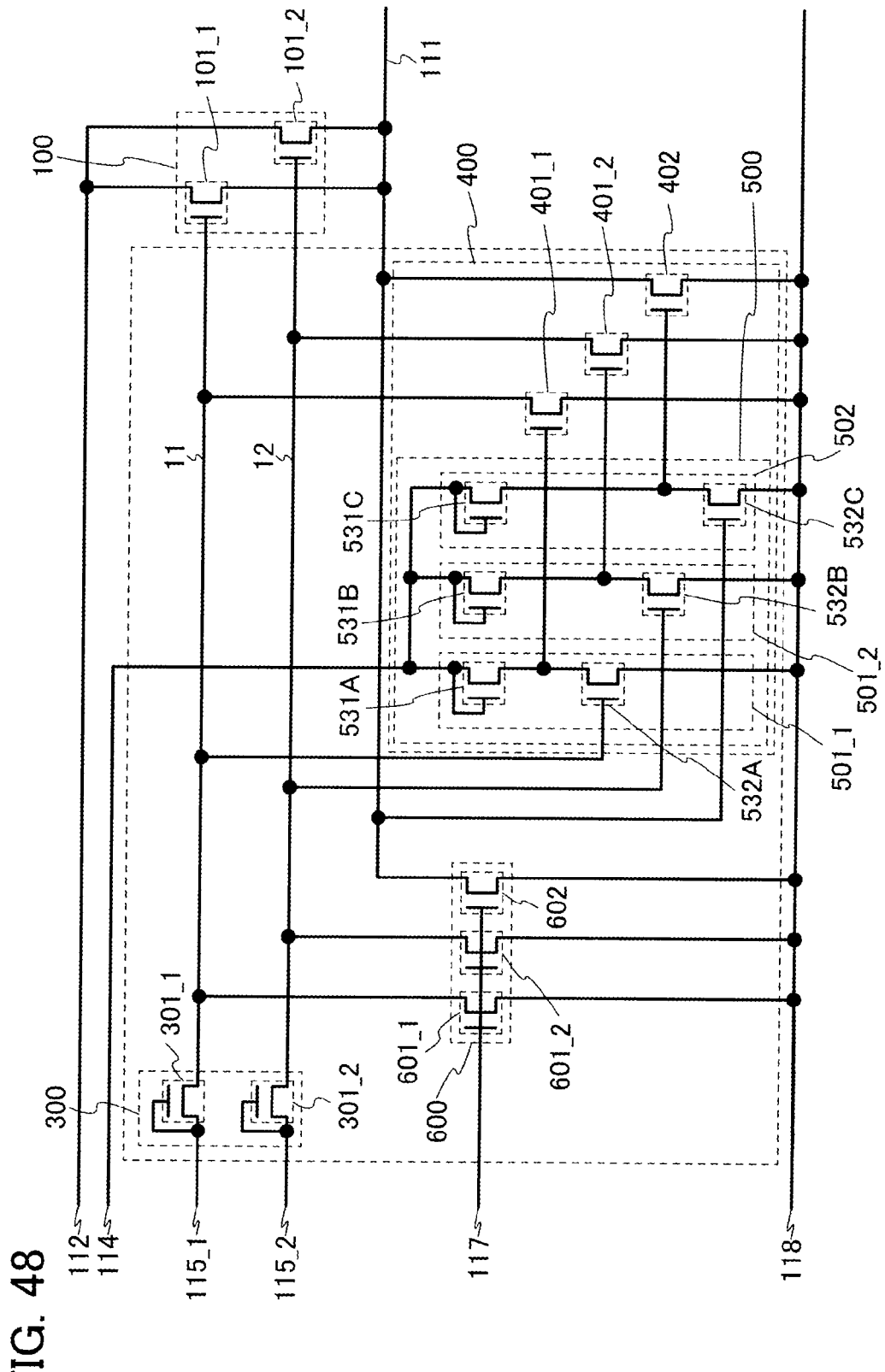
FIG. 48 is an example of a circuit diagram of a semiconductor device in Embodiment 3.
Figure 49:
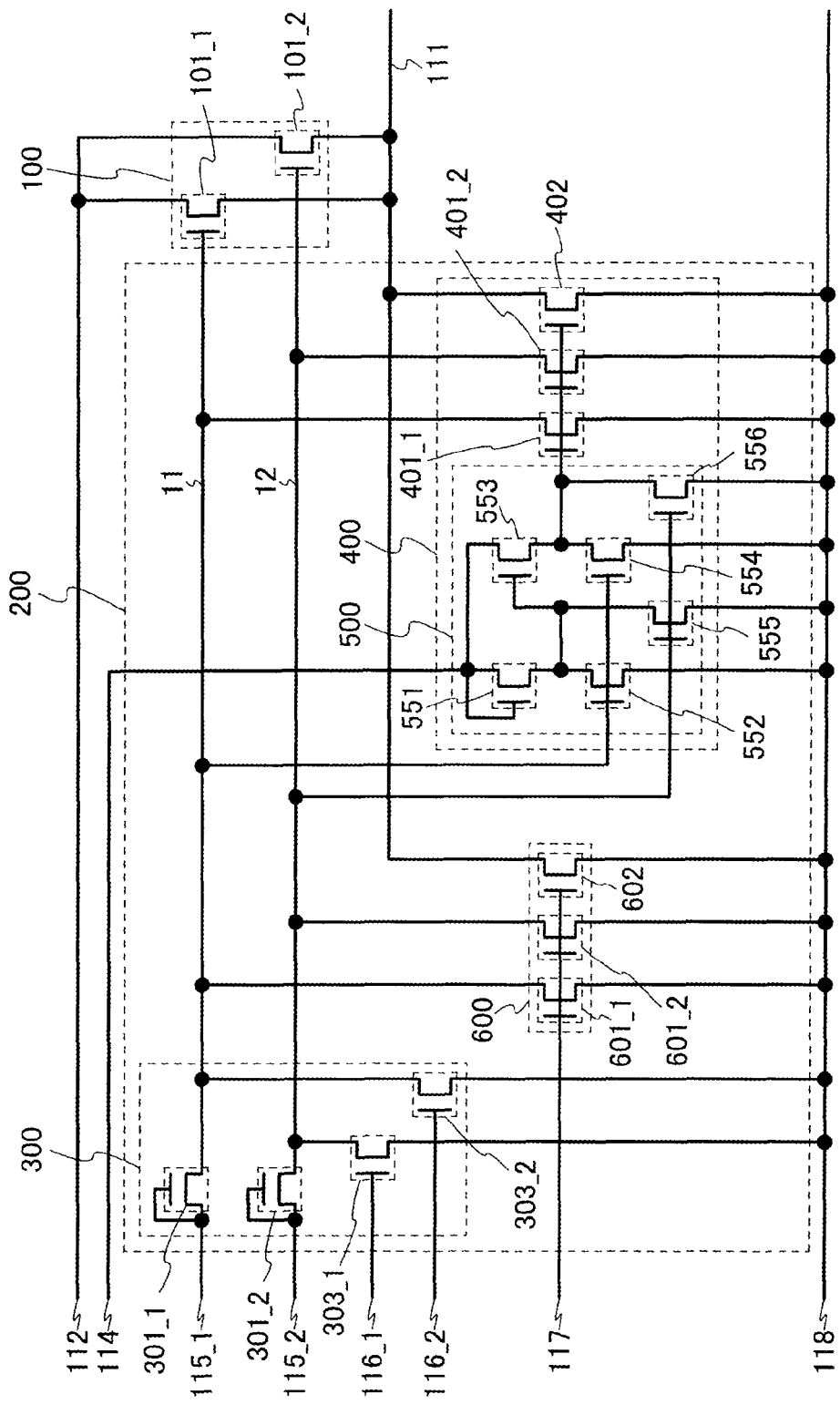
FIG. 49 is an example of a circuit diagram of a semiconductor device in Embodiment 3.

Here, one example of a semiconductor device of the case where contents described in Embodiments 1 to 3 are combined is shown in FIG. 48 and FIG. 49. This embodiment are not limited thereto. A semiconductor device can have a variety of structures by combining the contents described in Embodiments 1 to 4.

A semiconductor device shown in FIG. 48 includes the circuits 100 and 200. The circuit 200 includes the circuits 300, 400, and 600. The circuit 400 includes the circuit 500. In the semiconductor device shown in FIG. 48, the structure shown in FIG. 1A is used for the circuit 100. The structure shown in FIG. 6B is used for the circuit 300 included in the circuit 200. The structure shown in FIG. 16A is used for the circuit 400 included in the circuit 200. The structure shown in FIG. 23B is used for the circuit 600 included in the circuit 200. The structure shown in FIG. 20A is used for the circuit 500 included in the circuit 400. The structure shown in FIG. 12A is used for the circuits 501_1, 501_2, and 502 included in the circuit 500.

In the semiconductor device shown in FIG. 49, the structure shown in FIG. 1A is used for the circuit 100. The structure shown in FIG. 12A is used for the circuit 300 included in the circuit 200. The structure shown in FIG. 18A is used for the circuit 400 included in the circuit 200. The structure shown in FIG. 23B is used for the circuit 600 included in the circuit 200. The structure shown in FIG. 21D is used for the circuit 500 included in the circuit 400.

Figure 50:
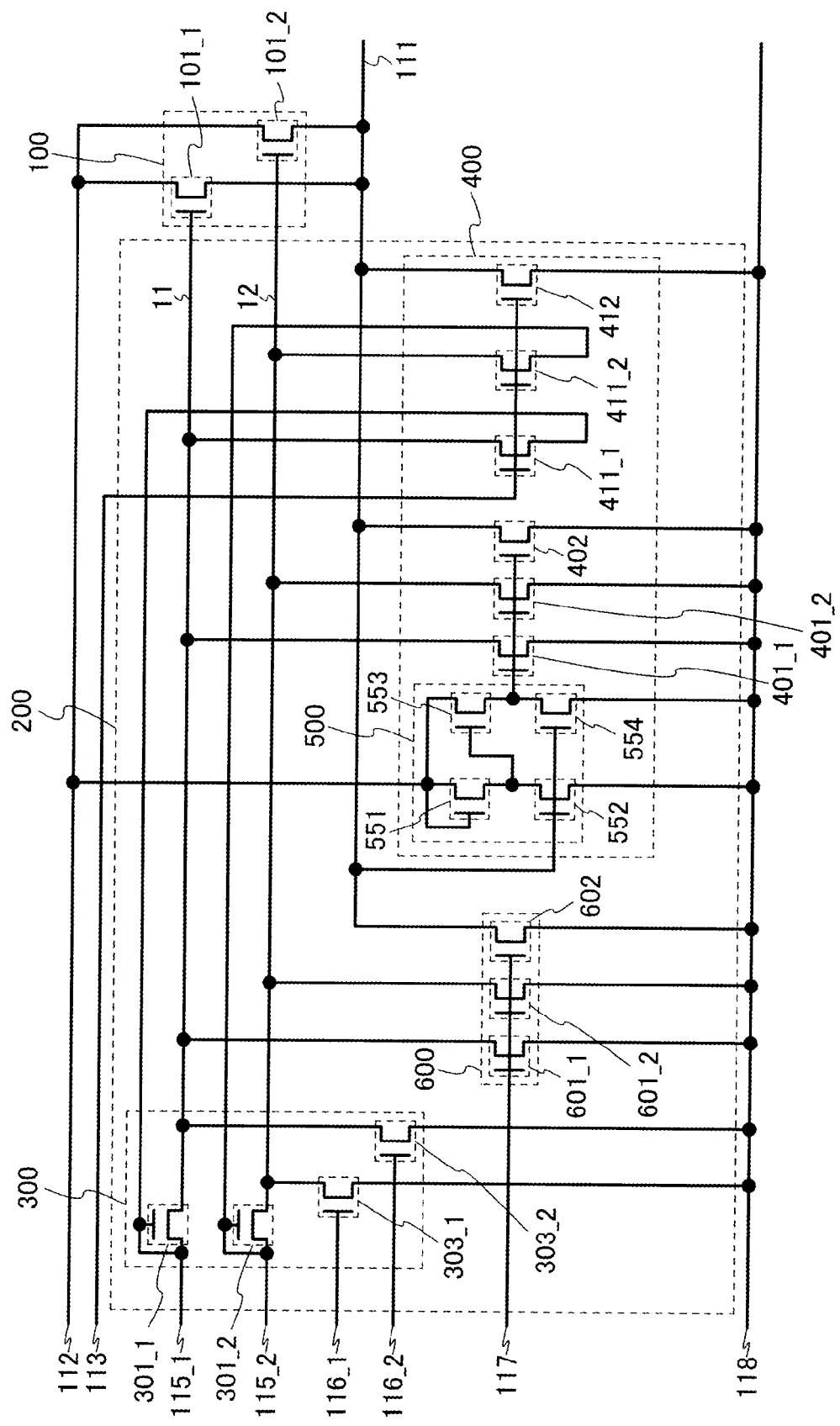
FIG. 50 is an example of a circuit diagram of a semiconductor device in Embodiment 3.

In the semiconductor device shown in FIG. 50, the structure shown in FIG. 1A is used for the circuit 100. The structure shown in FIG. 12A is used for the circuit 300 included in the circuit 200. The structure shown in FIG. 17B is used for the circuit 400 included in the circuit 200. The structure shown in FIG. 23B is used for the circuit 600 included in the circuit 200. The structure shown in FIG. 22A is used for the circuit 500 included in the circuit 400.

Note that an operation of the semiconductor device shown in FIG. 48 is described as an example. In the period A1, the signal SP1 goes into a High level. Then, the transistor 301_1 is turned on, so that the wiring 115_1 and the node 11 are brought into electrical continuity. Therefore, the signal SP1 in a High level is supplied to the node 11, and accordingly a voltage of the node 11 is increased. At that time, the transistor 101_1 is turned on, so that the wiring 118 and the wiring 111 are brought into electrical continuity. Since the signal CK1 in the Low level is supplied to the wiring 111, the voltage of the wiring 111 is decreased. Meanwhile, the signal SP2 goes into the Low level. Then, the transistor 301_2 is turned off. Here, a voltage of the node 12 is maintained as V1 when an initial value of a voltage of the node 12. At that time, a transistor 532A is turned on in the circuit 501_1, so that the wiring 118 and the gate of the transistor 401_1 are brought into electrical continuity. Therefore, the voltage V1 is supplied thereto, and accordingly a voltage of the gate of the transistor 401_1 is decreased. Then, the transistor 401_1 is turned off, so that the wiring 118 and, the node 11 are brought out of electrical continuity. A transistor 532B is turned off in the circuit 501_2, so that the wiring 118 and the gate of the transistor 401_2 are brought out of electrical continuity. Therefore, the voltage V2 is supplied thereto through the transistor 531B, and accordingly a voltage of the gate of the transistor 401_2 is increased. Then, the transistor 401_2 is turned on, so that the wiring 118 and the node 12 are brought into electrical continuity. Therefore, the voltage V1 is supplied to the node 12. A transistor 532C is turned off in the circuit 502, so that the wiring 118 and the gate of the transistor 402 are brought out of electrical continuity. Therefore, the voltage V2 is supplied thereto through the transistor 531C, and accordingly a voltage of the gate of the transistor 402 is increased. Then, the transistor 402 is turned on, so that the wiring 118 and the wiring 111 are brought into electrical continuity. Therefore, the voltage V1 is supplied to the wiring 111.

In the period B1, a voltage of the node 11 is still (V2+Vth101_1+Vx) and a voltage of the node 12 is approximate V1. Accordingly, the transistor 101_1 remains on, so that the wirings 112 and 111 are still in a conduction state. Then, the signal CK1 in a High level is supplied to the wiring 111, so that a voltage of the wiring 111 is increased. At that time, as in the period A1, transistor 532A in the circuit 501_1 remains on. Accordingly, the transistor 401_1 remains off. As in the period A1, transistor 532B in the circuit 501_1 remains off. Accordingly, the transistor 401_2 remains on. In the circuit 502, the wiring 118 and the gate of the transistor 402 are brought into electrical continuity because the transistor 532C is turned on. Therefore, the voltage V1 is supplied to the gate of the transistor 402, so that a voltage of the transistor 402 is decreased. Then, the transistor 402 is turned off, whereby the wiring 118 and the wiring 111 are brought out of electrical continuity.

In the periods C1 and C2, the signal RE goes into a High level. Then, the transistor 601_1, the transistor 601_2, and the transistor 602 are turned on, so that the wiring 118 and the node 11, the wiring 118 and the node 12, the wiring 118 and the wiring 111 are brought into electrical continuity. Accordingly, the voltage V1 is supplied to the node 11, the node 12, and the wiring 111, whereby a voltage of the node 11, a voltage of the node 12, and a voltage of the wiring 111 are decreased. At that time, a transistor 532A in the circuit 501_1 is turned off, so that the wiring 118 and the gate of the transistor 401_1 are brought out of electrical continuity. Therefore, the voltage V2 is supplied thereto through a transistor 531A, and accordingly a voltage of the gate of the transistor 401_1 is increased. Then, the wiring 118 and the node 11 are brought into electrical continuity because the transistor 401_1 is turned on. As in the period A1, the transistor 532B in the circuit 501_2 remains off. Accordingly, the transistor 401_2 remains on. As in the period A1, the transistor 532C in the circuit 501_2 remains off. Accordingly, the transistor 402 remains on.

In the periods D1 and E1 and the periods D2 and E2, the transistor 401_1, the transistor 401_2, and the transistor 402 are turned on, so that the wiring 118 and the node 11, the wiring 118 and the node 12, the wiring 118 and the wiring 111 are brought into electrical continuity. Accordingly, the voltage V1 is supplied to the node 11, the node 12, and the wiring 111, whereby a voltage of the node 11, a voltage of the node 12, and a voltage of the wiring 111 are maintained as approximate V1. At that time, as in the period C1, a transistor 532A in the circuit 501_1 is turned off. The transistor 401_1 is turned on. As in the period A1, the transistor 532B in the circuit 501_2 remains off. Accordingly, the transistor 401_2 remains on. As in the period A1, the transistor 532C in the circuit 501_2 remains off. Accordingly, the transistor 402 remains on.

In the period A2, the signal SP1 goes into the Low level. Then, the transistor 301_2 is turned off. Here, a voltage of the node 11 is still V1 when an initial value of a voltage of the node 11 is V1. Meanwhile, the signal SP2 goes into a High level. Then, the transistor 301_2 is turned on, so that the wiring 115_2 and the node 12 are brought into electrical continuity. Accordingly, a voltage of the node 12 is increased because the signal SP2 in a High level is supplied to the node 12. At that time, the transistor 101_2 is turned on, so that the wiring 118 and the wiring 111 are brought into electrical continuity. Therefore, the signal CK1 in the Low level is supplied to the wiring 111, and accordingly a voltage of the wiring 111 is decreased. At that time, as in the period C1, the transistor 532A in the circuit 501_1 is turned off. Accordingly, the transistor 401_1 is turned on. Since the transistor 532B in the circuit 501_1 is turned on, the wiring 118 and the gate of the transistor 401_2 are brought into electrical continuity. Therefore, the voltage V1 is supplied thereto through the transistor 531B, and accordingly a voltage of the gate of the transistor 401_2 is decreased. Then, the transistor 401_2 is turned off, so that the wiring 118 and the node 12 are brought out of electrical continuity. Similarly, as in the period A1, the transistor 532C in the circuit 502 is turned off. Accordingly, the transistor 402 is turned off.

In the period B2, a voltage of the node 11 is still approximate V1 and a voltage of the node 12 is still (V2+Vth101_2+Vx). Accordingly, the transistor 101_2 remains on, so that the wiring 112 and the wiring 111 are still in a conduction state. Then, a voltage of the wiring 111 is increased because the signal CK1 in a High level is supplied to the wiring 111. At that time, as in the period A2, the transistor 532A in the circuit 501_1 remains off. Accordingly, the transistor 401_1 remains on. As in the period A2, the transistor 532B in the circuit 501_2 remains on. Accordingly, the transistor 401_2 remains off. As in the period B1, the transistor 532C in the circuit 502 remains on. Accordingly, the transistor 402 is turned off.

Figure 51A:
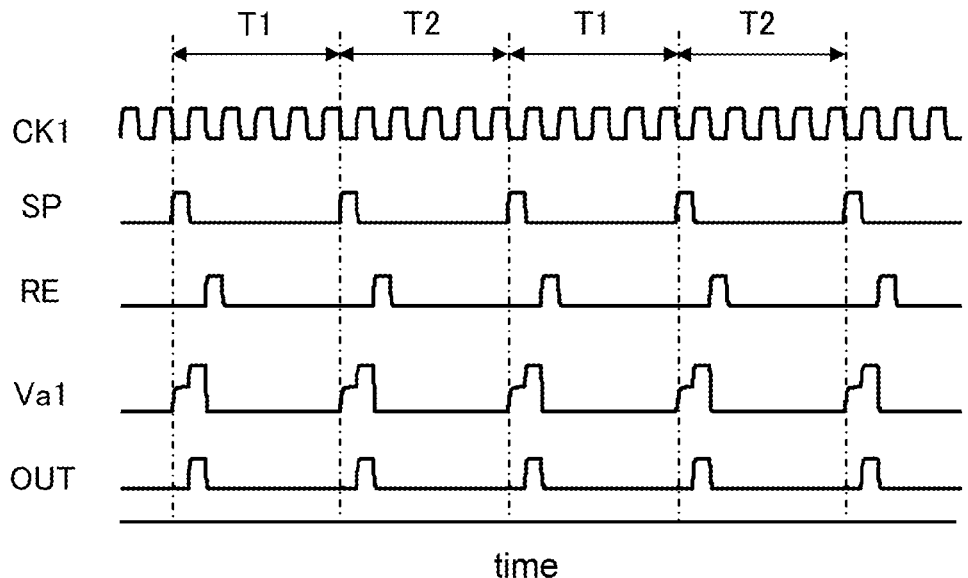
FIGS. 51A and 51B are timing charts each showing a result of the verification of a semiconductor device in Embodiment 3.
Figure 51B:
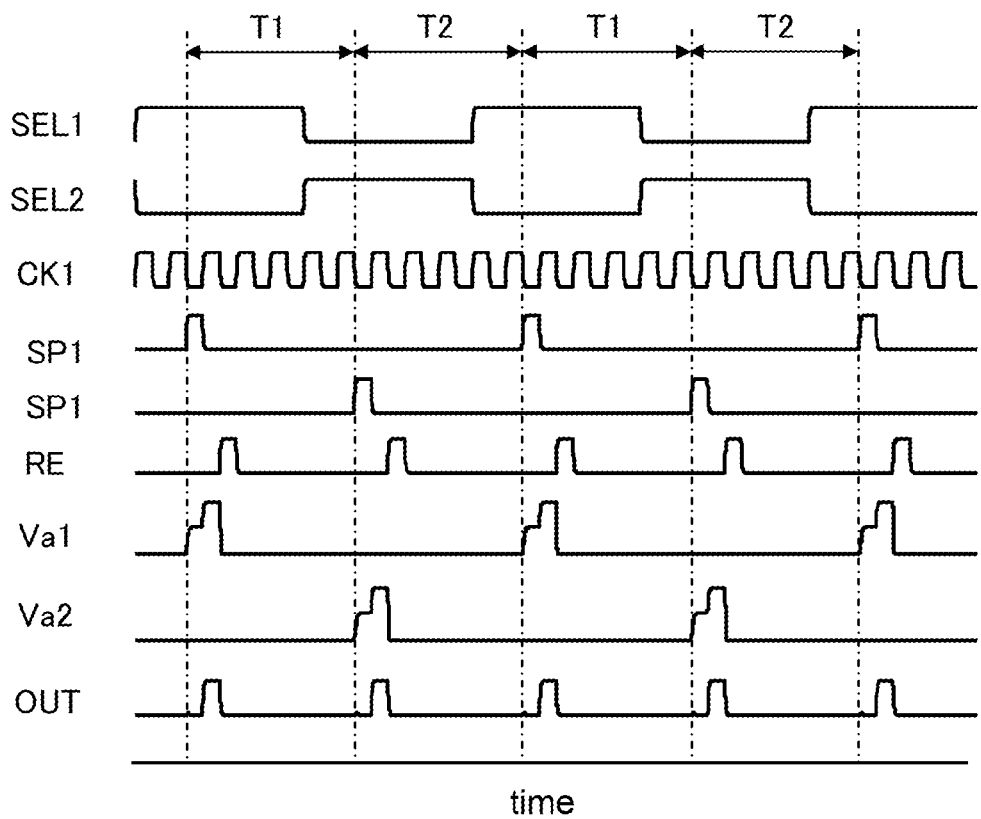

Further, an operation of the semiconductor device in FIG. 49 is verified. The result of the verification is shown in FIGS. 51A and 51B. FIGS. 51A and 51B are diagrams showing the result of the verification of the semiconductor device in this embodiment. Note that the verification was performed using a SPICE circuit simulator. In addition, for a comparison example, verification is performed also for an operation of the semiconductor device with a circuit structure in which the transistor 101_2, the transistor 301_2, the transistor 303_1, the transistor 303_2, the transistor 401_2, the transistor 555, the transistor 556, and the transistor 601_2 are not provided. Further, the verification was performed under the following conditions; Vdd is 30V; Vss is 0V; a clock frequency is 25 kHz (one cycle is 20 μsec); the mobility of each transistor is 1 cm²/Vs; the threshold voltage of each transistor is 5V; and output capacitance is 50 pF.

FIG. 51A is a timing chart of the verification result of the semiconductor device used as the comparison example. As shown in FIG. 51A, in the semiconductor device of the comparison example, in both of the period T1 and the period T2, the transistor 101_1 is on in accordance with the voltage of the node n1, the wiring 112 and the wiring 111 are in electrical continuity through the transistor 101_1, and the signal CK1 is supplied from the wiring 112 to the wiring 111 through the transistor 101_1.

FIG. 51B is a timing chart of the verification result of the semiconductor device shown in FIG. 48. As shown in FIG. 51B, in the semiconductor device shown in FIG. 48, in the period T1, the voltage of the node 11 varies in accordance with the signal SEL1, and the transistor 101_1 is turned on in accordance with the voltage of the node 11, the wiring 112 and the wiring 111 are brought into electrical continuity through the transistor 101_1, the signal CK1 is supplied from the wiring 112 to the wiring 111 through the transistor 101_1; and in the period T2, the voltage of the node 12 varies in accordance with the signal SEL2, and the transistor 101_2 is turned on in accordance with the voltage of the node 12, the wiring 112 and the wiring 111 are brought into electrical continuity through the transistor 101_1, and the signal CK1 is supplied from the wiring 112 to the wiring 111 through the transistor 101_1. Therefore, as shown in FIG. 49, it can be seen that, when transistors which are on and operated are different in each period in the semiconductor device of this embodiment, the number of times when each of the transistors is turned on and the length of time when each of the transistors is on can be reduced.

Embodiment 4

In this embodiment, a display device and an example of a shift register included in the display device is described. The shift register can include the semiconductor device in Embodiments 1 to 3. Note that the shift register can be referred to as a semiconductor device or a gate driver. Note that description of the content described in Embodiments 1 to 3 is omitted. Note that the content described in Embodiments 1 to 3 can be freely combined with a content described in this embodiment.

First, an example of a display device is described with reference to FIGS. 26A to 26D. A display device in FIG. 26A includes a circuit 1001, a circuit 1002, a circuit 1003_1, a pixel portion 1004, and a terminal 1005. A plurality of wirings can be arranged so as to extend to the pixel portion 1004 from the circuit 1003_1. The plurality of wirings can function as a gate signal line or a scan line. Alternatively, a plurality of wirings can be arranged so as to extend to the pixel portion 1004 from the circuit 1002 or the terminal 1005. The plurality of wirings has a function of a video signal line or a data line. Alternatively, a plurality of wirings can be arranged so as to extend to the pixel portion 1004 from the terminal 1005. The plurality of wirings can function as a power supply line or an anode line. However, this embodiment is not limited thereto. As a wiring arranged in the pixel portion 1004, a variety of wirings can be used in accordance with a structure of a pixel included in the pixel portion 1004.

The circuit 1001 has a function of controlling a timing of supplying a signal, a voltage, a current, or the like to the circuits 1002 and 1003. Further, the circuit 1001 has a function of controlling the circuits 1002 and 1003. As thus described, the circuit 1001 can function as a controller, a control circuit, a timing generator, a power supply circuit, a regulator, or the like.

The circuit 1002 has a function of controlling a timing of supplying a video signal to the pixel portion 1004. Alternatively, the circuit 1002 has a function of controlling the pixel portion 1004 including a pixel. The circuit 1002 has a function of controlling and the brightness, the transmittance, or the like of a pixel included in the pixel portion 1004. As thus described, the circuit 1002 has a function of a driver circuit, a source driver, a signal line driver circuit, or the like.

The circuit 1003_1 has a function of controlling a timing of supplying a scan signal or a gate signal to the pixel portion 1004. Alternatively, the circuit 1003_1 has a function of selecting a pixel included in the pixel portion 1004. As thus described, the circuit 1003_1 has a function of a driver circuit, a gate driver, a scan line driver circuit, or the like. Note that the circuit 1003_1 and the pixel portion 1004 are formed over a substrate 1006. However, this embodiment is not limited thereto. The circuit 1003_1 can be formed over a different substrate from a substrate on which the pixel portion 1004 is formed.

Figure 26A:
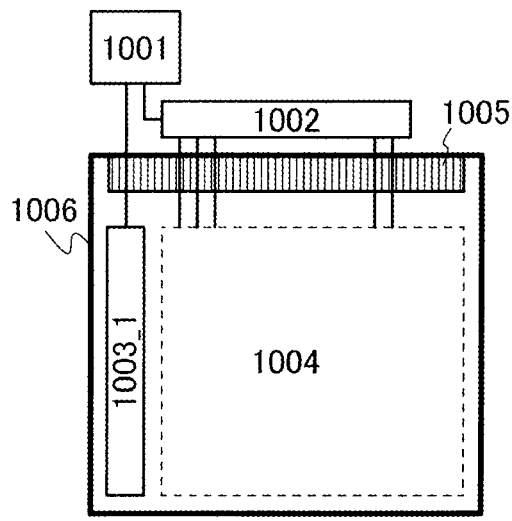
FIGS. 26A to 26D are examples of block diagrams of a display device in Embodiment 4.
Figure 26B:
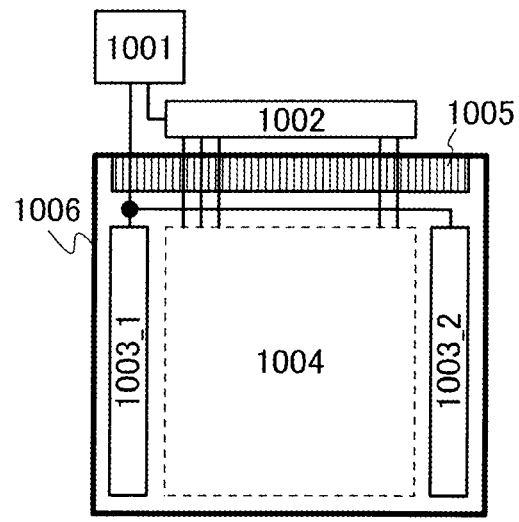

Note that as illustrated in FIG. 26B, the display device can include a circuit 1003_2. The circuit 1003_2 has a similar function to the circuit 1003_1. For example, the circuits 1003_1 and 1003_2 can supply signals to the pixel portion 1004 at the same timing. Thus, a display device can be larger because a load can be reduced. Alternatively, the circuits 1003_1 and 1003_2 can select a pixel of an even-numbered stage and a pixel of an odd-numbered stage, respectively. Thus, the driving frequency is lowered, so that power consumption can be reduced. Alternatively, an area in which one stage can be laid out can be larger, so that the display device can have higher definition.

Figure 26C:
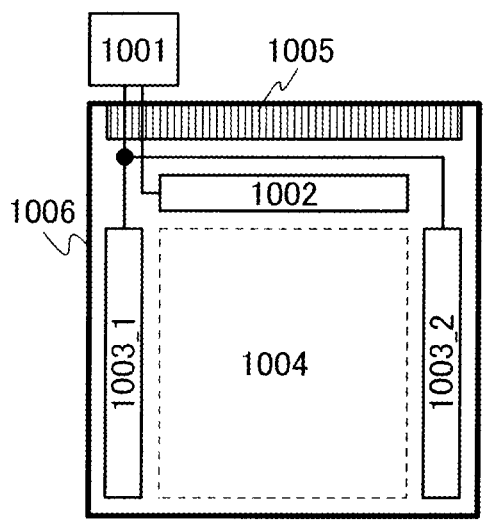
Figure 26D:
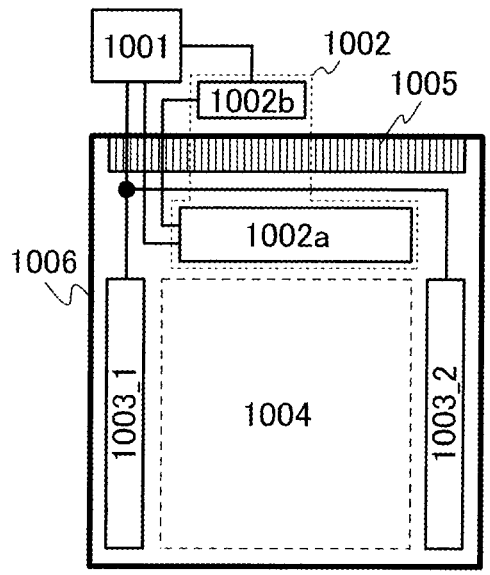

Note that as illustrated in FIG. 26C, the circuit 1002 and the pixel portion 1004 can be formed over the substrate 1006. Alternatively, as illustrated in FIG. 26D, the pixel portion 1004 and a circuit 1002a which is a part of the circuit 1002 can be formed over the substrate 1006. Another circuit 1002b can be formed over a different substrate from the substrate 1006.

Then, one example of the shift register will be described with reference to FIG. 27. The shift register can be included in the circuit 1002, the circuit 1003_1, and/or the circuit 10032. In addition, the shift register can also be referred to as a semiconductor device, a driver circuit, or a gate driver.

A shift register 1100 includes a plurality of flip flops of flip flops 1101_1 to 1101_N (N is a natural number not less than two). Note that the flip flops 1101_1 to 1101_N each correspond to the semiconductor device described in Embodiments 1 to 3. As an example, FIG. 27 illustrates the case where the semiconductor device in FIG. 24A is used for each of the flip flops 1101_1 to 1101_N. Note that this embodiment is not limited thereto. Other semiconductor devices or circuits described in Embodiment 3 can be used for the flip flops 1101_1 to 1101_N.

The shift register 1100 is connected to wirings 1111_1 to 1111_N, a wiring 1112, a wiring 1113, a wiring 1114, a wiring 1115_1, a wiring 1115_2, a wiring 1116_1, a wiring 1116_2, a wiring 1117, a wiring 1118, wirings 1200_1 to 1200_N, and wirings 1201_1 to 1201_N. Moreover, in the flip flop 1101_$i$ ($i$ is any one of 1 to N), the wiring 111, the wiring 112, the wiring 113, the wiring 114, the wiring 115_1, the wiring 115_2, the wiring 116_1, the wiring 116_2, the wiring 117, the wiring 118, a wiring 711_1, and a wiring 711_2 are connected to a wiring 1111_1, the wiring 1112, the wiring 1113, the wiring 1114, a wiring 1200_$i$–1, a wiring 1201_$i$–1, the wiring 1116_1, the wiring 1116_2, a wiring 1111_$i$+1, a wiring 1118, a wiring 1200_$i$, and a wiring 1201_$i$, respectively. Note that the wirings to which the wiring 112 and the wiring 113 are connected in flip flops of the odd-numbered stages are different from flip flops of the even-numbered stages in many cases. For example, in the case where the wirings 112 are connected to the wiring 1112 and the wirings 113 are connected to the wiring 1113 in the flip flops of an ith stage, the wirings 112 are connected to the wiring 1113 and the wirings 113 are connected to the wiring 1112 in the flip flops of an (i−1)th stage or an (i+1)th stage in many cases. Note that in a flip flop 1101_1, the wiring 115_1 is connected to the wiring 1115_1 and the wiring 115_2 is connected to the wiring 1115_2 in many cases. Note that in a flip flop 1101_N, the wiring 117 is connected the wiring 1117 in many cases. However, this embodiment is not limited thereto.

For example, signals GOUT_1 to GOUT_N are outputted from the wirings 1111_1 to 1111_N, respectively. The signals GOUT_1 to GOUT_N are outputted signals from the flip flops 1101_1 to 1101_N, respectively. The signals GOUT_1 to GOUT_N each have a similar function to a signal OUT. For example, a signal GCK1 is inputted to the wiring 1112 and a signal GCK2 is inputted to the wiring 1113. The signals GCK1 and GCK2 have similar functions to the signals CK1 and CK2, respectively. As an example, the voltage V2 is applied to the wiring 1114. For example, a signal GSP1 is inputted to the wiring 1115_1 and a signal GSP2 is inputted to the wiring 1115_2. The signals GSP1 and GSP2 have similar functions to the signals SP1 and SP2, respectively. As an example, the signals SEL1 and SEL2 are inputted to the wiring 1116_1 and 1116_2, respectively. For example, a signal GRE is inputted to the wiring 1117. The signal GRE has a similar function to the signal RE. As an example, the voltage V1 is applied to the wiring 1118. As an example, signals SOUT1_1 to SOUT1_N are outputted from the wirings 1200_1 to 1200_N, respectively, and signals SOUT2_1 to SOUT2_N are outputted from the wirings 1201_1 to 1201_N, respectively. The signals SOUT1_1 to SOUT1_N each has a similar function to the signal SOUT1 and the signals SOUT2_1 to SOUT2_N each has a similar function to the signal SOUT2_Note that this embodiment is not limited thereto. A variety of other signals, voltages, or currents can be inputted to these wirings.

Figure 27:
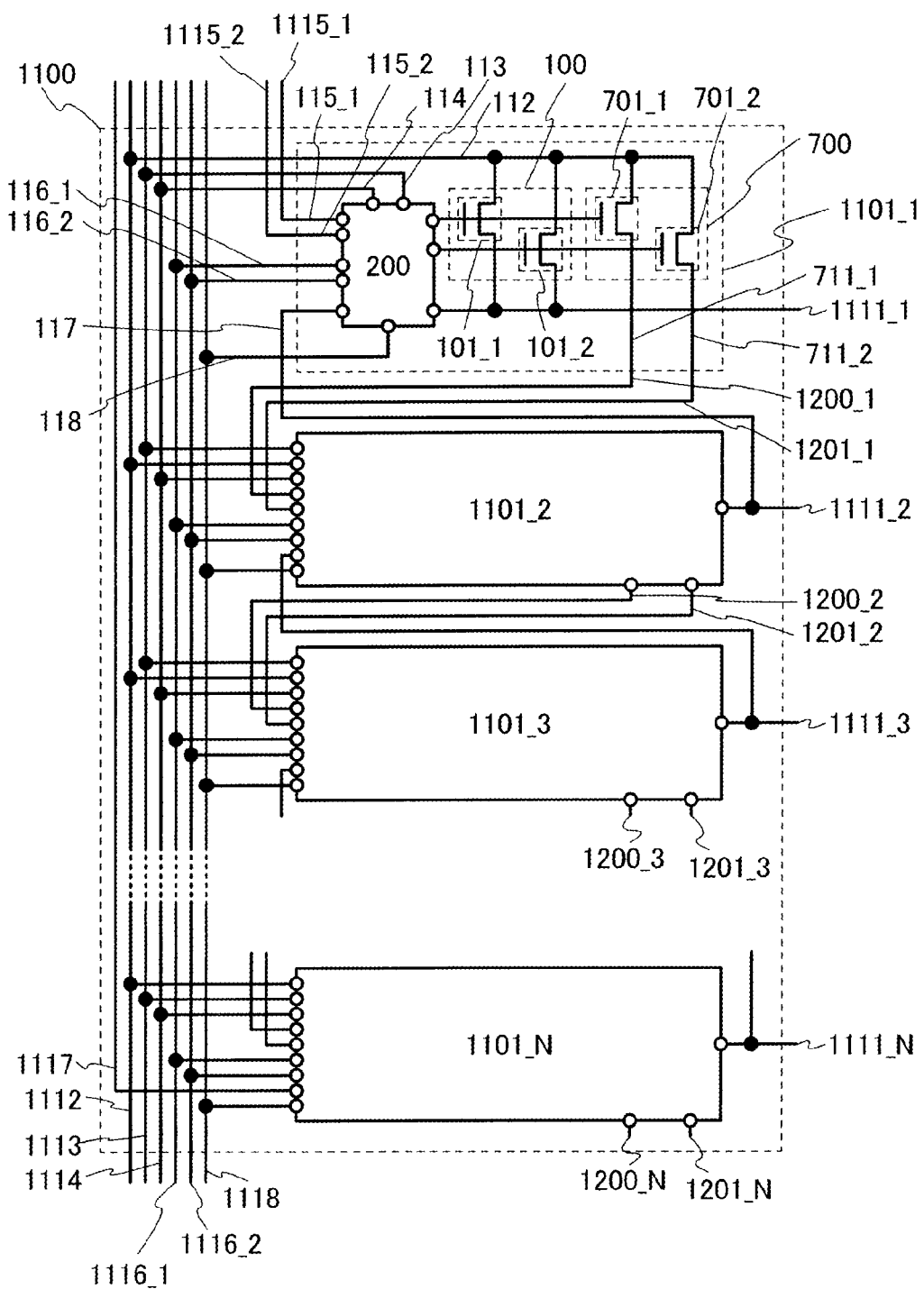
FIG. 27 is an example of a circuit diagram of a shift register in Embodiment 4.
Figure 28:
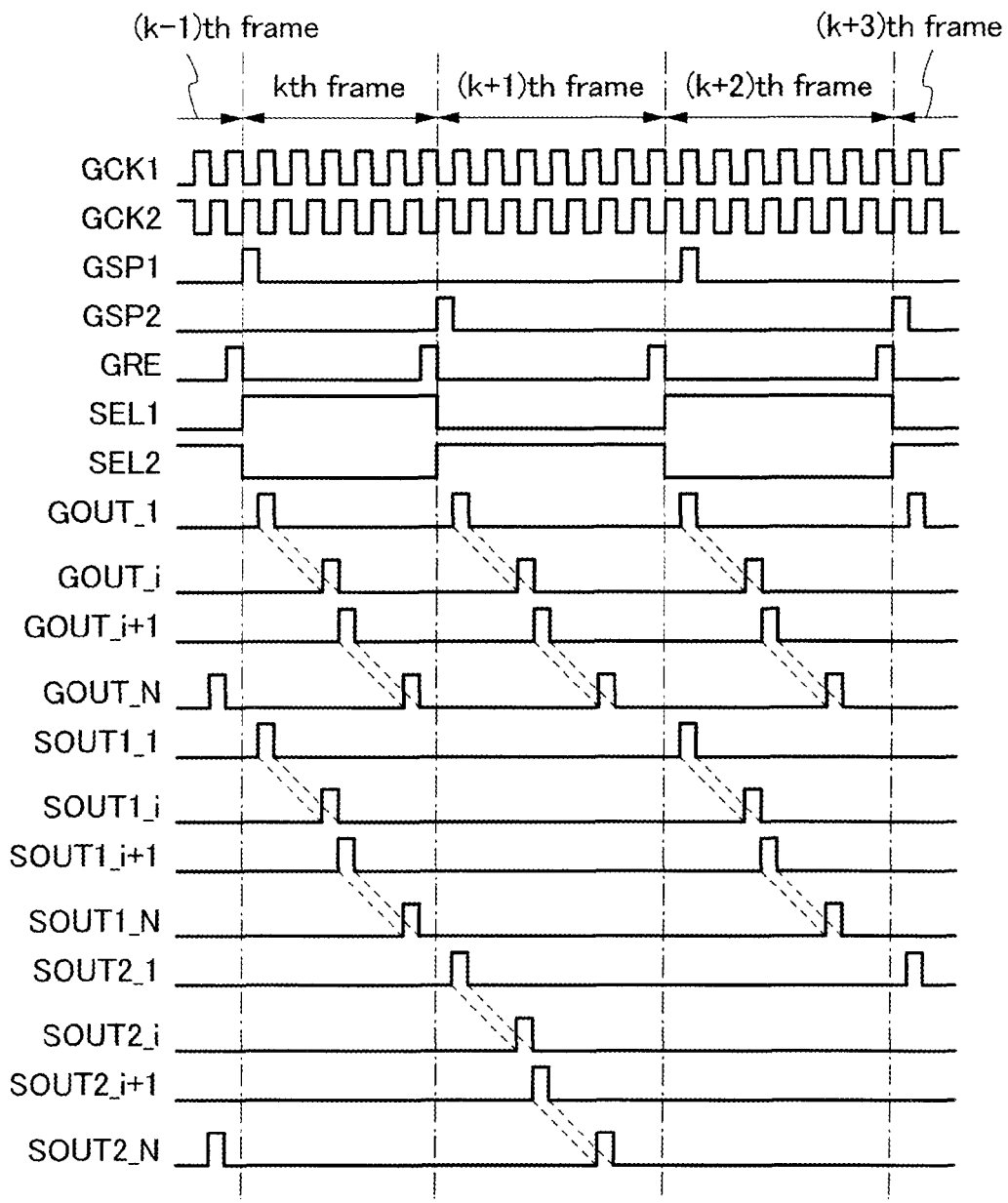
FIG. 28 is an example of a timing chart illustrating an operation of the shift register in FIG. 27.

Next, operation of the shift register in FIG. 27 is described with reference to a timing chart in FIG. 28. FIG. 28 is an example of a timing chart for illustrating operation of the shift register. FIG. 28 illustrates an example of the signals GCK1, GCK2, GSP1, GSP2, GRE, SEL1, SEL2, GOUT_1 to GOUT_N, SOUT1_1 to SOUT1_N, and SOUT2_1 to SOUT2_N.

Operation of the flip flop 1101_i in a kth (k is a natural number not less than 2) frame is described. First, the signal GOUT_i−1 goes into the High level. Accordingly, the flip flop 1101_i starts operation of the period A1. After that, the signal GCK1 and the signal GCK2 are inverted. Then, a flip flop 1101_i starts operation of a period B1 and the signals GOUT_i and SOUT1_i go into a High level. Since the signal SOUT1_i is inputted to a flip flop 1101_i+1, the flip flop 1101_i+1 starts operation in the period A1. After that, the signal GCK1 and the signal GCK2 are inverted again, and the flip flop 1101_i+1 starts operation in the period B1, whereby the signals GOUT_i+1 and SOUT1_i+1 go into a High level. Since the signal GOUT_i+1 is inputted to the flip flop 1101_i, the flip flop 1101_i starts operation in the period C1. Therefore, the signal GOUT_i goes into the Low level. After that, until the signal SOUT1_i−1 goes into the High level again, the flip flop 1101_i repeat operation of the period D1 and operation of the period E1.

Operation of the flip flop 1101_i in a (k+1)th frame is described. First, the signal SOUT2_i−1 goes into the High level. Accordingly, the flip flop 1101_i starts operation of the period A2. After that, the signal GCK1 and the signal GCK2 are inverted. Accordingly, the flip flop 1101_i starts operation of the period B2, and the signal GOUT j and the signal SOUT2_i go into the High level. Since the signal SOUT2_i is inputted to the flip flop 1101_i+1 starts operation of the period C2, the flip flop 1101_i+1 starts the operation of the period A2. The signal GCK1 and the signal GCK2 are inverted again after that, and the flip flop 1101_i+1 starts the operation of the period. B2, and the signal GOUT_i+1 and the signal SOUT2_i+1 go into the High level. Since the signal GOUT_i+1 is inputted to the flip flop 1101_j, the flip flop 1101_i starts the operation of the period C2. Therefore, the signal GOUT_i+1 goes into the Low level. After that, until the signal SOUT2_i−1 goes into the High level again, the flip flop 1101_i repeats operation of the period D2 and operation of the period E2.

In the flip flop 1101_1, instead of an output signal of a flip flop of the previous stage, the signal GSP1 is inputted through the wiring 1115_1 and the signal GSP2 is inputted through the wiring 1115_2. Accordingly, the flip flop 1101_1 starts the operation of the period A1 when the signal GSP1 is goes into the High level, and starts the operation of the period A2 when the signal GSP2 is goes into the High level.

In the flip flop 1101_N, instead of an output signal of a flip flop of the next stage, the signal GRE is inputted through the wiring 1117. Accordingly, when the signal GRE is set at the High level, the flip flop 1101_N starts the operation of the period C1 or C2.

Embodiment 5

In this embodiment, an example of a signal line driver circuit will be described. Note that the signal line driver circuit can be referred to as a semiconductor device or a signal generation circuit.

An example of the signal line driver circuit is described with reference to FIG. 29A. The signal line driver circuit includes a plurality of circuits of circuits 2002_1 to 2002_N (N is a natural number not less than two), a circuit 2000, and a circuit 2001. The circuits 2002_1 to 2002_N each include a plurality of transistors of transistors 2003_1 to 2003_k (k is a natural number of 2 or more). The transistors 20031 to 2003_k are n-channel transistors. However, this embodiment is not limited to this. For example, the transistors 2003_1 to 2003_k can be p-channel transistors or CMOS switches.

A connection relation of the signal line driver circuit will be described by using the circuit 2002_1 as an example. First terminals of the transistors 2003_1 to 2003_k are connected to a wiring 2005_1. Second terminals of the transistors 2003_1 to 2003_k are connected to wirings S1 to Sk, respectively. Gates of the transistors 2003_1 to 2003_k are connected to wirings 2004_1 to 2004_k, respectively. For example, the first terminal of the transistor 2003_1 is connected to the wiring 2005_1, the second terminal of the transistor 2003_1 is connected to the wiring S1, and the gate of the transistor 2003_1 is connected to the wiring 2004_1.

The circuit 2000 has a function of supplying a signal to the circuits 2002_1 to 2002_N through the wirings 2004_1 to 2004_k and can function as a shift register, a decoder, or the like. The signal is often a digital signal and can function as a selection signal. Moreover, the wirings 2004_1 to 2004_k can function as signal lines.

The circuit 2001 has a function of outputting a signal to the circuits 2002_1 to 2002_N and can function as a video signal generation circuit or the like. For example, the circuit 2001 supplies the signal to the circuit 2002_1 through the wiring 2005_1. At the same time, the circuit 2001 supplies the signal to the circuit 2002_2 through the wiring 2005_2. The signal is often an analog signal and can function as a video signal. Moreover, the wirings 2005_1 to 2005_N can function as signal lines.

The circuits 2002_1 to 2002_N each have a function of selecting a wiring to which an output signal from the circuit 2001 is outputted, and can function as a selector circuit. For example, the circuit 2002_1 has a function of selecting one of the wirings S1 to Sk to output a signal outputted from the circuit 2001 to the wiring 2005_1.

The transistors 2003_1 to 2003_$k$ each have a function of controlling a state of electrical continuity of the wiring 2005_1 and the wirings S1 to Sk in accordance with the output signal from the circuit 2000, and function as switches.

Figure 29A:
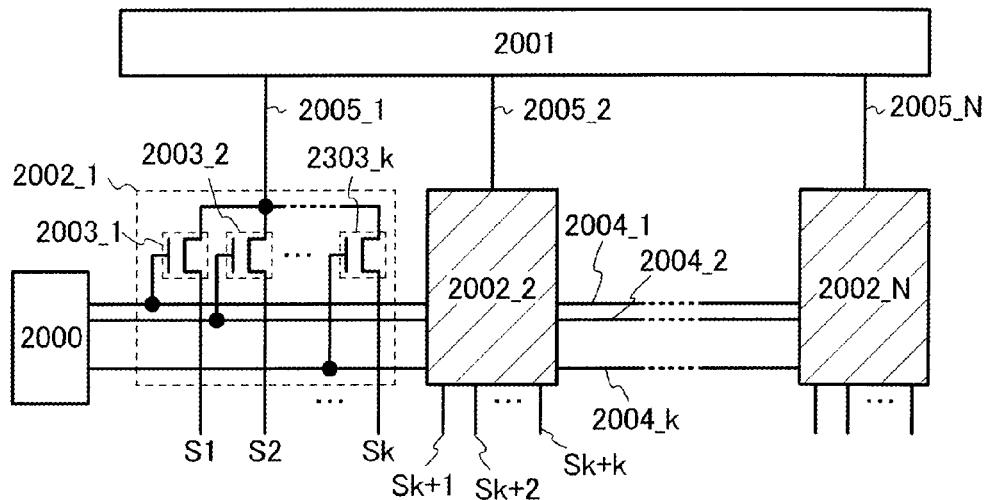
FIGS. 29A and 29B are examples of circuit diagrams of a signal line driver circuit in Embodiment 5.
Figure 29B:
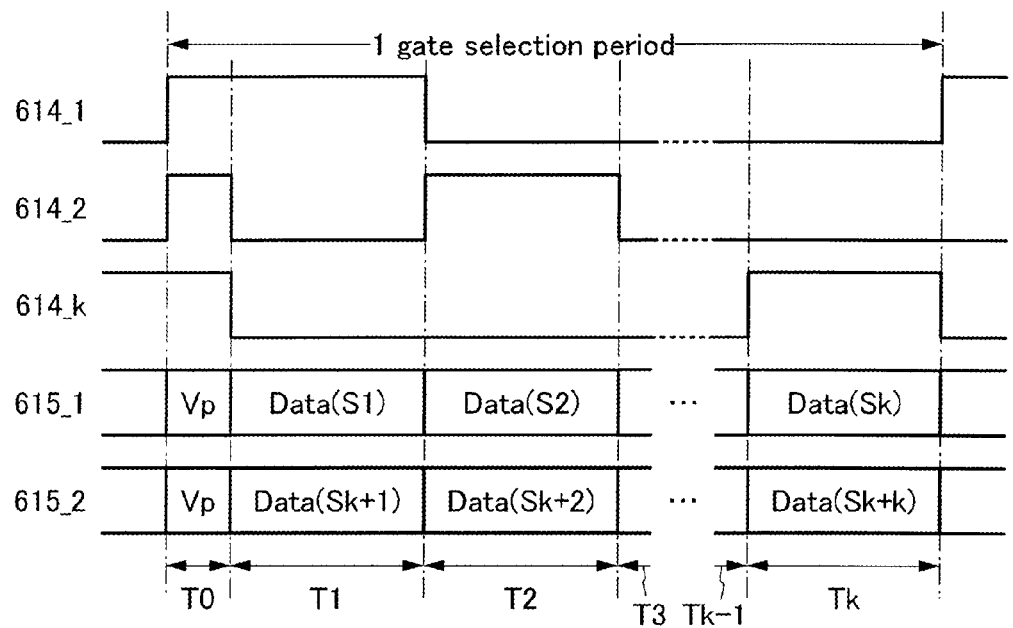

Next, operation of the signal line driver circuit in FIG. 29A is described with reference to a timing chart in FIG. 29B. FIG. 29B illustrates examples of a signal 614_1 inputted to the wiring 2004_1, a signal 614_2 inputted to the wiring 2004_2, a signal 614_$k$ inputted to the wiring 2004_$k$, a signal 615_1 inputted to the wiring 2005_1, and a signal 615_2 inputted to the wiring 2005_2.

Note that one operation period of the signal line driver circuit corresponds to one gate selection period in a display device. One gate selection period is a period during which a pixel which belongs to one row is selected and a video signal can be written to the pixel.

Note that one gate selection period is divided into a period T0 and a period T1 to a period Tk. The period T0 is a period for applying voltages for precharging to pixels which belong to a selected row at the same time, and can serve as a precharge period. Each of the periods T1 to Tk is a period for writing video signals to pixels which belong to the selected row, and can serve as a writing period.

For simplicity, operation of the signal line driver circuit is described by using operation of the circuit 2002_1 as an example.

First, in the period T0, the circuit 2000 outputs a signal in the High level to the wirings 2004_1 to 2004_$k$. Accordingly, the transistors 2003_1 to 2003_$k$ are turned on, whereby the wiring 2005_1 and the wirings S1 to Sk are brought into electrical continuity. At that time, the circuit 2001 applies a precharge voltage Vp to the wiring 2005_1, so that the precharge voltage Vp is outputted to the wirings S1 to Sk through the transistors 2003_1 to 2003_$k$, respectively. Then, the precharge voltage Vp is written to the pixels which belong to a selected row, so that the pixels which belong to the selected row are precharged.

Next, in the period T1, the circuit 2000 outputs a signal in the High level to the wiring 2004_1. Accordingly, the transistor 2003_1 is turned on, whereby the wiring 2005_1 and the wiring S1 are brought into electrical continuity. Moreover, the wiring 2005_1 and the wirings S2 to Sk are brought out of electrical continuity. At that time, if the circuit 2001 outputs a signal Data(S1) to the wiring 2005_1, the signal Data(S1) is outputted to the wiring S1 through the transistors 2003_1. In this manner, the signal Data(S1) is written to, of the pixels connected to the wiring S1, the pixels which belong to the selected row.

Next, in the period T2, the circuit 2000 outputs a signal in the High level to the wiring 2004_2. Accordingly, the transistor 2003_2 is turned on, whereby the wiring 2005_2 and the wiring S2 are brought into electrical continuity. Moreover, the wiring 2005_1 and the wirings S1 are brought out of electrical continuity, and the wiring 2005_1 and the wirings S3 to Sk are kept out of electrical continuity. At that time, if the circuit 2001 outputs a signal Data(S2) to the wiring 2005_1, the signal Data(S2) is outputted to the wiring S2 through the transistor 2003_2. In this manner, the signal Data(S2) is written to, of the pixels connected to the wiring S2, the pixels which belong to the selected row.

After that, the circuit 2000 sequentially outputs signals in the High level to the wirings 2004_1 to 2004_$k$ until the end of the period Tk, so that the circuit 2000 sequentially outputs the signals in the High level to the wirings 2004_3 to 2004_$k$ from the period. T3 to the period Tk, as in the period. T1 and the period. T2. Thus, since the transistors 2003_3 to 2003_$k$ are sequentially turned on, the transistors 2003_1 to 2003_N are sequentially turned on. Accordingly, signals outputted from the circuit 2001 are sequentially outputted to the wirings S1 to Sk. In this manner, the signals can be sequentially written to the pixels which belong to the selected row.

The above is the description of the example of the signal line driver circuit. Since the signal line driver circuit in this embodiment includes the circuit functioning as a selector, the number of signals or the number of wirings can be reduced. Alternatively, since a voltage for precharging is written to a pixel before a video signal is written to the pixel (during the period T0), a writing time of the video signal can be shortened. Accordingly, increase in the size of a display device and higher resolution of the display device can be achieved. However, this embodiment is not limited to this, and the period T0 can be eliminated so that the pixel is not precharged.

Note that if k is too large a number, a writing time to the pixel is shortened, whereby writing of a video signal to the pixel is not completed in the writing time in some cases. Accordingly, it is preferable that k≤6. It is more preferable that k 3. It is further preferable that k=2.

Specifically, in the case where a color element of a pixel is divided into n (n is a natural number not less than two), it is possible to set k=n. For example, in the case where a color element of a pixel is divided into red (R), green (G), and blue (B), it is possible to set k=3. In that case, one gate selection period is divided into a period T0, a period T1, a period T2, and a period T3. A video signal can be written to the pixel of red (R), the pixel of green (G), and the pixel of blue (B) in the period T1, the period T2, and the period T3, respectively. However, this embodiment is not limited thereto, and the order of the period T1, the period T2, and the period T3 can be set as appropriate.

Specifically, in the case where a pixel is divided into n sub-pixels (also referred to as subpixels) (n is a natural number not less than two), it is possible to set k=n. For example, in the case where the pixel is divided into two sub-pixels, it is possible to set k=2. In that case, one gate selection period is divided into the period T0, the period T1, and the period T2. A video signal can be written to one of the two sub-pixels in the period T1, and a video signal can be written to the other of the two sub-pixels in the period T2.

Note that since the driving frequency of the circuit 2000 and the circuits 2002_1 to 2002_N is low in many cases as compared to that of the circuit 2001, and a transistor which can be formed in the same manufacturing process as a transistor formed in a pixel portion can be used for the circuit 2000 and the circuits 2002_1 to 2002_N, the circuit 2000 and the circuits 2002_1 to 2002_N can be formed over the same substrate as a pixel portion. Accordingly, the number of connections between the substrate over which the pixel portion is formed and an external circuit can be reduced; thus, increase in yield, improvement in reliability, or the like can be achieved. Further, as shown in FIG. 24C, by also forming a scan line driver circuit over the same substrate as the pixel portion, the number of connections between the substrate over which the pixel portion is formed and the external circuit can be further reduced.

Note that any of the semiconductor devices or shift registers described in Embodiments 1 to 4 can be used as the circuit 2000. In that case, all the transistors in the circuit 2000 can be n-channel transistors or all the transistors in the circuit 2000 can be p-channel transistors. Accordingly, reduction in the number of steps, increase in yield, or reduction in cost can be achieved.

Note that not only the transistors included in the circuit 2000 but also all the transistors in the circuits 2002_1 to 2002_N can be n-channel transistors. Alternatively, not only the transistors included in the circuit 2000 but also all the transistors in the circuits 2002_1 to 2002_N can be p-channel transistors. Accordingly, when the circuit 2000 and the circuits 2002_1 to 2002_N are formed over the same substrate as the pixel portion, reduction in the number of steps, increase in yield, or reduction in cost can be achieved. Specifically, by using only n-channel transistors as the transistors in the circuits 2000 and 2002_1 to 2002_N, an amorphous semiconductor, a microcrystalline semiconductor, an organic semiconductor, an oxide semiconductor, or the like, for example, can be used for semiconductor layers of the transistors. That is because the driving frequency of the circuit 2000 and the circuits 2002_1 to 2002_N is low in many cases as compared to that of the circuit 2001, and a transistor which can be formed in the same manufacturing process as a transistor formed in a pixel portion can be used for the circuit 2000 and the circuits 2002_1 to 2002_N.

Embodiment 6

In this embodiment, a structure and operation of a pixel which can be applied to a liquid crystal display device will be described.

Figure 30A:
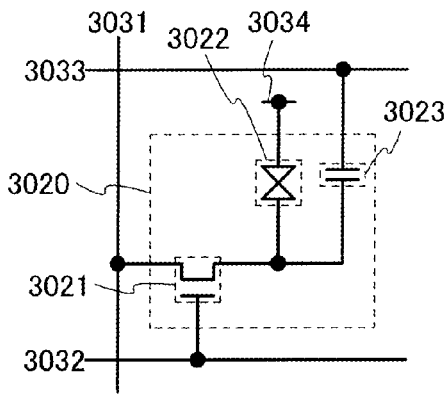
FIG. 30A is an example of a circuit diagram of a pixel in Embodiment 6.

FIG. 30A illustrates an example of a pixel. A pixel 3020 includes a transistor 3021, a liquid crystal element 3022, and a capacitor 3023. A first terminal of the transistor 3021 is connected to a wiring 3031. A second terminal of the transistor 3021 is connected to one electrode of the liquid crystal element 3022 and one electrode of the capacitor 3023. A gate of the transistor 3021 is connected to a wiring 3032. The other electrode of the liquid crystal element 3022 is connected to an electrode 3034. The other electrode of the capacitor 3023 is connected to a wiring 3033.

A video signal can be inputted to the wiring 3031, for example A scan signal, a selection signal, or a gate signal can be inputted to the wiring 3032, for example. A constant voltage can be applied to the wiring 3033, for example. A constant voltage can be applied to the electrode 3034, for example. Note that this embodiment is not limited to this example. A writing time of a video signal can be shortened by supply of a precharge voltage to the wiring 3031. Alternatively, a voltage applied to the liquid crystal element 3022 can be controlled by input of a signal to the wiring 3033. Alternatively, frame inversion driving can be achieved by input of a signal to the wiring 3033 or the electrode 3034.

Note that the wiring 3031 can function as a signal line, a video signal line, or a source line. The wiring 3032 can function as a signal line, a scan line, or a gate signal line. The wiring 3033 can function as a power supply line or a capacitor line. The electrode 3034 can function as a common electrode or a counter electrode. However, this embodiment is not limited to this example. In the case where a voltage is supplied to the wiring 3031 and the wiring 3032, these wirings can function as power supply lines. Alternatively, in the case where a signal is inputted to the wiring 3033, the wiring 3033 can function as a signal line.

The transistor 3021 has a function of controlling timing when a video signal is written to a pixel by controlling a state of electrical continuity of the wiring 3031 and one electrode of the liquid crystal element 3022, and can function as a switch. The capacitor 3023 has a function of keeping a voltage applied to the liquid crystal element 3022 as a stable value by storing the voltage difference between one electrode of the liquid crystal element 3022 and the wiring 3033, and functions as a storage capacitor. Note that this embodiment is not limited to this example.

Figure 30B:
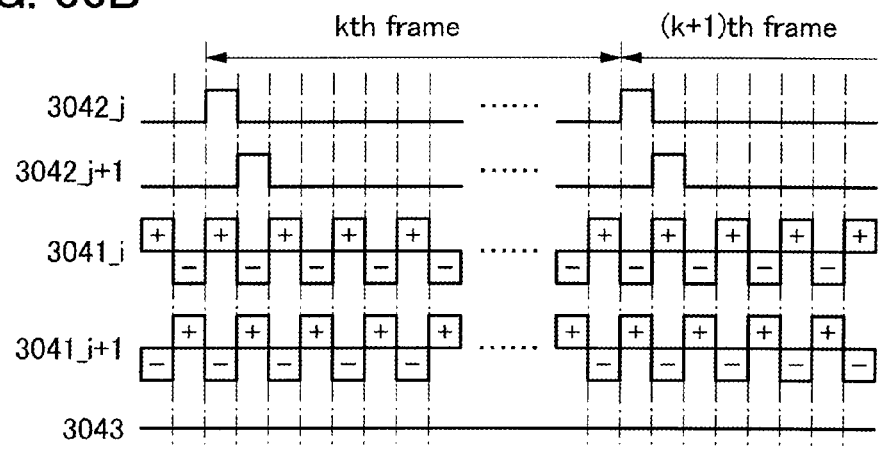
FIGS. 30B and 30C are examples of timing charts each illustrating an operation of the pixel.

FIG. 30B shows an example of a timing chart for illustrating operation of the pixel in FIG. 30A. FIG. 30B illustrates a signal 3042_$j$ (f is a natural number), a signal 3042_$j$+1, a signal 3041_$i$, a signal 3041_$i$+1, and a voltage 3043. In addition, FIG. 30B illustrates a kth (k is a natural number) frame and a (k+1)th frame. Note that the signal 3042_$j$, the signal 3042_$j$+1, the signal 3041_$i$, the signal 3041_$i$+1, and the voltage 3043 are examples of a signal inputted to the wiring 3032 in a jth row, a signal inputted to the wiring 3032 in a (j+1)th row, a signal inputted to the wiring 3031 in an ith column, a signal inputted to the wiring 3031 in an (i+1)th column, and a voltage supplied to the wiring 3033, respectively.

Operation of the pixel 3020 in the jth row and the ith column is described. When the signal 3042_$j$ is set at the High level, the transistor 3021 is turned on. Accordingly, since the wiring 303_$j$ in the ith column and one electrode of the liquid crystal element 3022 are brought into electrical continuity, the signal 3041_$j$ is inputted to one electrode of the liquid crystal element 3022 through the transistor 3021. Then, the capacitor 3023 keeps the potential difference between one electrode of the liquid crystal element 3022 and the wiring 3033. Thus, after that, a voltage applied to the liquid crystal element 3022 is constant until the signal 3042_$j$ is set at the High level again. Then, the liquid crystal element 3022 expresses gray levels corresponding to the applied a voltage.

Note that FIG. 30B illustrates an example of the case where a positive signal and a negative signal are alternately inputted to the wiring 3031 every one selection period. The positive signal is a signal whose voltage is higher than a reference value (e.g., the potential of the electrode 3034). The negative signal is a signal whose voltage is lower than a reference value (e.g., the potential of the electrode 3034). However, this embodiment is not limited to this example, and signals with the same polarity can be inputted to the wiring 3031 in one frame period.

Note that FIG. 30B illustrates an example of the case where the polarity of the signal 3041_$i$ and the polarity of the signal 3041_$i$+1 are different from each other. However, this embodiment is not limited to this example. The polarity of the signal 3041_$i$ and the polarity of the signal 3041_$i$+1 can be the same.

Figure 30C:
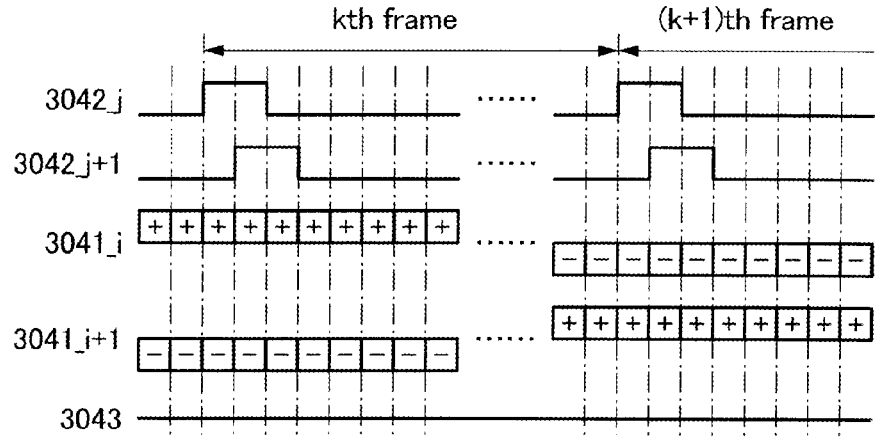

Note that FIG. 30B illustrates an example of the case where a period in which the signal 3042_$j$ is at the High level and a period in which the signal 3042_$j$+1 is at the High level do not overlap with each other. However, this embodiment is not limited to this example. As shown in FIG. 30C, the period in which the signal 3042_$j$ is at the High level and the period in which the signal 3042_$j$+1 is at the High level can overlap with each other. In that case, signals of the same polarity are preferably supplied to the wiring 3031 in one frame period. In this manner, pixels in a (j+1)th row can be precharged by using the signal 3041_$j$ written to pixels in the jth row.

Accordingly, a writing time of a video signal to a pixel can be shortened. Therefore, a high-definition display device can be obtained. Alternatively, a display portion of the display device can be made large. Alternatively, since the signals of the same polarity are inputted to the wiring 3031 in one frame period, power consumption can be reduced.

Figure 31A:
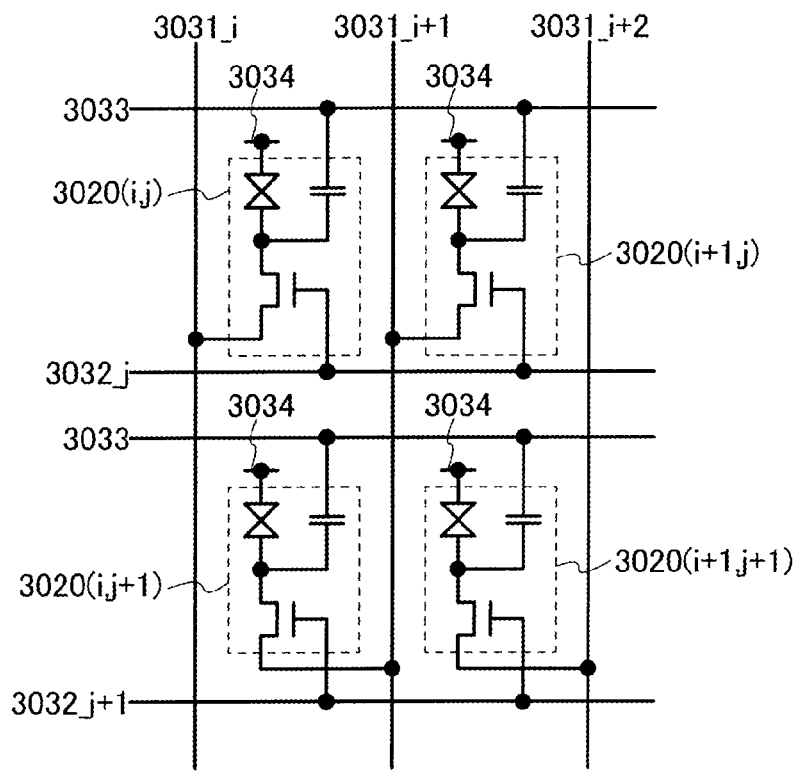
FIGS. 31A to 31C are examples of circuit diagrams of a pixel in Embodiment 6.

Note that by a combination of a pixel structure in FIG. 31A and the timing chart in FIG. 30C, dot inversion driving can be achieved. In the pixel structure in FIG. 31A, a pixel 3020($i, j$) is connected to a wiring 3031_$i$. On the other hand, a pixel 3020($i, j$+1) is connected to a wiring 3031_$i$+1. In other words, pixels in the ith column are alternately connected to the wiring 3031_$i$ and the wiring 3031_$i$+1 row-by-row. In this manner, since a positive signal and a negative signal are alternately written to the pixels in the ith column row-by-row, dot inversion driving can be achieved. However, this embodiment is not limited to this example. The pixels, which are in the ith column, of every plural rows (e.g., two rows or three rows) can be alternately connected to the wiring 3031_$i$ and the wiring 3031_$i$+1.

Figure 31B:
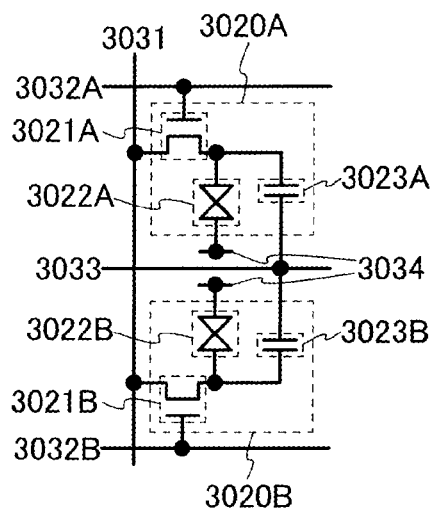
Figure 31C:
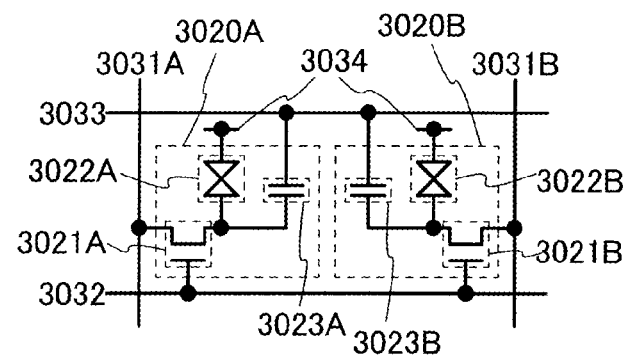

Note that a sub-pixel structure can be used as the pixel structure. FIGS. 31B and 31C each illustrate a structure of the case where a pixel is divided into two sub-pixels. FIG. 31B shows a sub-pixels structure called 1S+2G (for example, a structure in which one signal line and two scan lines are used), and FIG. 31C shows a sub-pixel structure called 2S+1G (for example, a structure in which two signal lines and one scan line are used). A sub-pixel 3020A and a sub-pixel 3020B correspond to the pixel 3020. A transistor 3021A and a transistor 3021B correspond to the transistor 3021. A liquid crystal element 3022A and a liquid crystal element 3022B correspond to the liquid crystal element 3022. A capacitor 3023A and a capacitor 3023B correspond to the capacitor 3023. A wiring 3031A and a wiring 3031B correspond to the wiring 3031. A wiring 3032A and a wiring 3032B correspond to the wiring 3032.

Here, by a combination of the pixel in this embodiment and any of the semiconductor devices, shift registers, display devices, and signal line driver circuits which are described in Embodiments 1 to 5, a variety of advantages can be obtained. For example, in the case where a sub-pixel structure is employed for the pixel, the number of signals required for driving a display device is increased. Therefore, the number of gate signal lines or source lines is increased. As a result, the number of connections between a substrate over which a pixel portion is formed and an external circuit is greatly increased in some cases. However, even if the number of gate signal lines is increased, the scan line driver circuit can be formed over a substrate over which the pixel portion is formed, as described in Embodiment 5. Accordingly, the pixel with the sub-pixel structure can be used without greatly increasing the number of connections between the substrate over which the pixel portion is formed and the external circuit. Alternatively, even if the number of source lines is increased, the use of the signal line driver circuit in Embodiment 5 can reduce the number of source lines. Accordingly, the pixel with the sub-pixel structure can be used without greatly increasing the number of connections between the substrate over which the pixel portion is formed and the external circuit.

Alternatively, in the case where a signal is inputted to a capacitor line, the number of connections between the substrate over which the pixel portion is formed and the external circuit is greatly increased in some cases. For that case, a signal can be supplied to the capacitor line by using any of the semiconductor device and the shift register in Embodiments 1 to 5. In addition, the semiconductor device or the shift register in Embodiments 1 to 5 can be formed over the substrate over which the pixel portion is formed. Accordingly, a signal can be inputted to the capacitor line without greatly increasing the number of connections between the substrate over which the pixel portion is foamed and the external circuit.

Alternatively, in the case where alternate-current driving is employed, a time for writing a video signal to the pixel is long. As a result, a shortage of the time for writing the video signal to the pixel is caused in some cases. Similarly, in the case where the pixel with the sub-pixel structure is used, the time for writing the video signal to the pixel is short. Thus, a shortage of the time for writing the video signal to the pixel is caused in some cases. For that case, the video signal can be written to the pixel by using the signal line driver circuit in Embodiment 5. In that case, since a voltage for precharging is written to the pixel before the video signal is written to the pixel, the video signal can be written to the pixel in a short time. Alternatively, when a period in which one row is selected overlaps with a period in which a different row is selected as shown in FIG. 21B, a video signal for the different row can be used as the voltage for precharging.

Embodiment 7

In this embodiment, examples of structures of transistors are described with reference to FIGS. 32A to 32C.

Figure 32A:
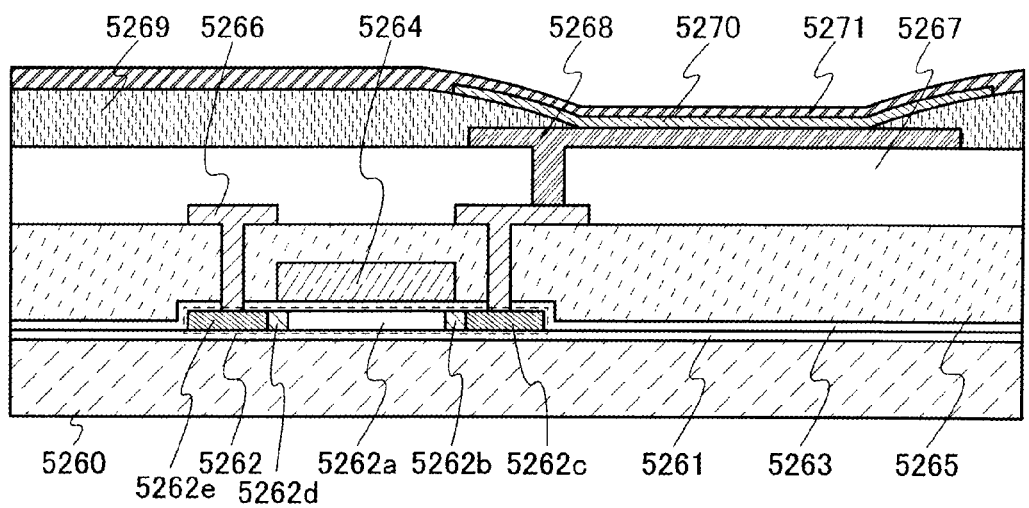
FIGS. 32A to 32C are examples of cross-sectional views of a transistor in Embodiment 7.

FIG. 32A illustrates an example of the structure of a display device or an example of the structure of a top-gate transistor. FIG. 32B illustrates an example of the structure of a display device or an example of the structure of a bottom-gate transistor. FIG. 32C illustrates an example of the structure of a transistor formed using a semiconductor substrate.

The transistor in FIG. 32A includes an insulating layer 5261 formed over the substrate 5260; a semiconductor layer 5262 which is fanned over the insulating layer 5261 and is provided with a region 5262$a$, a region 5262$b$, a region 5262$c$, a region 5262$d$, and a region 5262$e$; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with openings; and a conductive layer 5266 which is formed over the insulating layer 5265 and in the openings formed in the insulating layer 5265.

The transistor in FIG. 23B includes a substrate 5300; a conductive layer 5301 formed over the substrate 5300; an insulating layer 5302 formed so as to cover the conductive layer 5301; a semiconductor layer 5303$a$ formed over the conductive layer 5301 and the insulating layer 5302; a semiconductor layer 5303$b$ formed over the semiconductor layer 5303$a$; a conductive layer 5304 formed over the semiconductor layer 5303$b$ and the insulating layer 5302; an insulating layer 5305 which is formed over the insulating layer 5302 and the conductive layer 5304 and is provided with an opening; and a conductive layer 5306 which is formed over the insulating layer 5305 and in the opening formed in the insulating layer 5305.

Figure 32B:
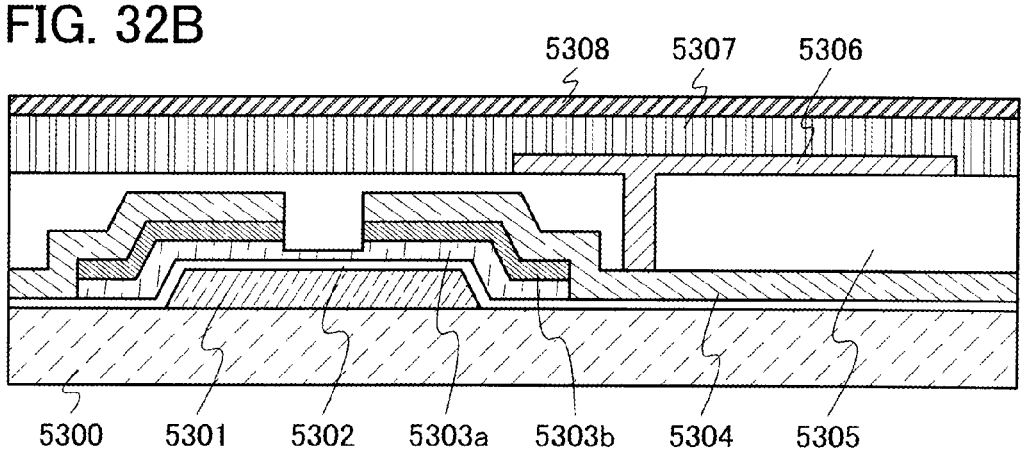
Figure 32C:
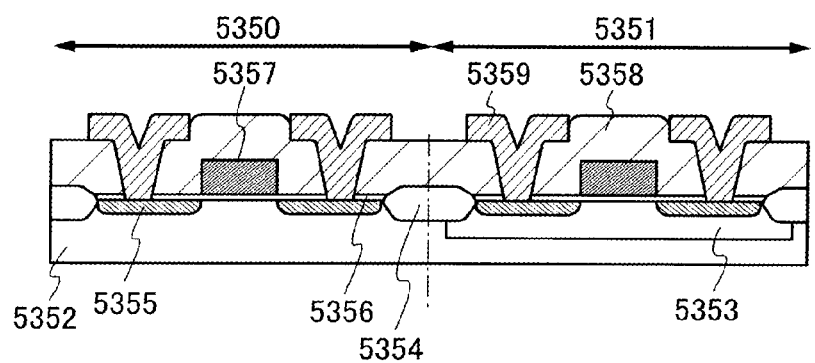

The transistor in FIG. 32C includes a semiconductor substrate 5352 including a region 5353 and a region 5355; an insulating layer 5356 formed over the semiconductor substrate 5352; an insulating layer 5354 formed over the semiconductor substrate 5352; a conductive layer 5357 formed over the insulating layer 5356; an insulating layer 5358 which is formed over the insulating layer 5354, the insulating layer 5356, and the conductive layer 5357 and is provided with openings; and a conductive layer 5359 which is formed over the insulating layer 5358 and in the openings formed in the insulating layer 5358. Thus, a transistor is formed in each of a region 5350 and a region 5351.

Note that in the case where a display device is structured by using a transistor of this embodiment, as illustrated in FIG. 32A, for example, it is possible to form an insulating layer 5267 which is formed over the conductive layer 5266 and the insulating layer 5265 and is provided with an opening; a conductive layer 5268 which is formed over the insulating layer 5267 and in the opening formed in the insulating layer 5267; an insulating layer 5269 which is formed over the insulating layer 5267 and the conductive layer 5268 and is provided with the opening; a light-emitting layer 5270 which is formed over the insulating layer 5269 and in the opening formed in the insulating layer 5269; and a conductive layer 5271 formed over the insulating layer 5269 and the light-emitting layer 5270.

In addition, as illustrated in FIG. 32B, it is possible to form a liquid crystal layer 5307 which is formed over the insulating layer 5305 and the conductive layer 5306 and a conductive layer 5308 which is formed over the liquid crystal layer 5307.

The insulating layer 5261 can serve as a base film. The insulating layer 5354 serves as an element isolation layer (e.g., a field oxide film). Each of the insulating layer 5263, the insulating layer 5302, and the insulating layer 5356 can serve as a gate insulating film. Each of the conductive layer 5264, the conductive layer 5301, and the conductive layer 5357 can serve as a gate electrode. Each of the insulating layer 5265, the insulating layer 5267, the insulating layer 5305, and the insulating layer 5358 can serve as an interlayer film or a planarization film. Each of the conductive layer 5266, the conductive layer 5304, and the conductive layer 5359 can serve as a wiring, an electrode of a transistor, an electrode of a capacitor, or the like. Each of the conductive layer 5268 and the conductive layer 5306 can serve as a pixel electrode, a reflective electrode, or the like. The insulating layer 5269 can serve as a partition wall. Each of the conductive layer 5271 and the conductive layer 5308 can serve as a counter electrode, a common electrode, or the like.

As each of the substrate 5260 and the substrate 5300, a glass substrate, a quartz substrate, a semiconductor substrate (e.g., a silicon substrate), an SOI substrate, a plastic substrate, a metal substrate, a stainless steel substrate, a substrate including stainless steel foil, a tungsten substrate, a substrate including tungsten foil, a flexible substrate, or the like can be used, for example. As a glass substrate, a barium borosilicate glass substrate, an aluminoborosilicate glass substrate, or the like can be used, for example. For a flexible substrate, a flexible synthetic resin such as plastics typified by polyethylene terephthalate (PET), polyethylene naphthalate (PEN), or polyether sulfone (PES), or acrylic can be used, for example. Alternatively, an attachment film (formed using polypropylene, polyester, vinyl, polyvinyl fluoride, polyvinyl chloride, or the like), paper of a fibrous material, a base material film (formed using polyester, polyamide, polyimide, an inorganic vapor deposition film, paper, or the like), or the like can be used.

As the semiconductor substrate 5352, for example, a single crystal silicon substrate having n-type or p-type conductivity can be used. Note that this embodiment is not limited to this, and parts or all of the substrates that can be used as the semiconductor substrate 5352 can be used as the semiconductor substrate 5352. For example, the region 5353 is a region where an impurity is added to the semiconductor substrate 5352 and serves as a well. For example, in the case where the semiconductor substrate 5352 has p-type conductivity, the region 5353 has n-type conductivity and serves as an n-well. On the other hand, in the case where the semiconductor substrate 5352 has n-type conductivity, the region 5353 has p-type conductivity and serves as a p-well. For example, the region 5355 is a region where an impurity is added to the semiconductor substrate 5352 and serves as a source region or a drain region. Note that an LDD region can be formed in the semiconductor substrate 5352.

For the insulating layer 5261, a single-layer structure or a layered structure of an insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0) can be used, for example. In an example in the case where the insulating layer 5261 has a two-layer structure, a silicon nitride film and a silicon oxide film can be formed as a first insulating layer and a second insulating layer, respectively. In an example in the case where the insulating layer 5261 has a three-layer structure, a silicon oxide film, a silicon nitride film, and a silicon oxide film can be formed as a first insulating layer, a second insulating layer, and a third insulating layer, respectively.

For each of the semiconductor layer 5262, the semiconductor layer 5303*a*, and the semiconductor layer 5303*b*, for example, a non-single-crystal semiconductor (e.g., amorphous silicon, polycrystalline silicon, or microcrystalline silicon), a single crystal semiconductor, an oxide semiconductor (e.g., ZnO, InGaZnO, IZO, ITO, SnO, TiO, or AZTO), a compound semiconductor (e.g., SiGe or GaAs), an organic semiconductor, a carbon nanotube, or the like can be used.

Note that for example, the region 5262*a* is an intrinsic region where an impurity is not added to the semiconductor layer 5262 and serves as a channel region. However, an impurity can be added to the region 5262*a*. The concentration of the impurity added to the region 5262*a* is preferably lower than the concentration of an impurity added to the region 5262*b*, the region 5262*c*, the region 5262*d*, or the region 5262*e*. Each of the region 5262*b* and the region 5262*d* is a region to which an impurity is added at lower concentration than the region 5262*c* or the region 5262*e* and serves as an LDD (lightly doped drain) region. Note that the region 5262*b* and the region 5262*d* can be eliminated. Each of the region 5262*c* and the region 5262*e* is a region to which an impurity is added at high concentration and serves as a source region or a drain region.

Note that the semiconductor layer 5303*b* is a semiconductor layer to which phosphorus or the like is added as an impurity element and has n-type conductivity.

Note that in the case where an oxide semiconductor or a compound semiconductor is used for the semiconductor layer 5303*a*, the semiconductor layer 5303*b* can be eliminated.

For each of the insulating layer 5263, the insulating layer 5273, and the insulating layer 5356, a single-layer structure or a layered structure of an insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0) can be used, for example.

Each of the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359 can have a single-layer structure or a layered structure and is formed using a conductive film. For example, for the conductive film, a single-layer film containing one element selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), gallium (Ga), indium (In), tin (Sn), zirconium (Zr), and cesium (Ce); a compound containing one or more elements selected from the above group; or the like can be used. Note that the single film or the compound can contain phosphorus (P), boron (B), arsenic (As), and/or oxygen (O), for example. Note that, an example of the compound is an alloy containing one or more elements selected from the above plurality of elements (e.g., an alloy material such as indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—Ta), aluminum-zirconium (Al—Zr), aluminum titanium (Al—Ti), aluminum-cesium (Al—Ce), magnesium-silver (Mg—Ag), molybdenum-niobium (Mo—Nb), molybdenum-tungsten (Mo—W), or molybdenum-tantalum (Mo—Ta)); a compound containing nitrogen and one or more elements selected from the above plurality of elements (e.g., a nitride film containing titanium nitride, tantalum nitride, molybdenum nitride, or the like); or a compound containing silicon and one or more elements selected from the above plurality of elements (e.g., a silicide film containing tungsten silicide, titanium silicide, nickel silicide, aluminum silicon, or molybdenum silicon); or the like. Alternatively, a nanotube material such as a carbon nanotube, an organic nanotube, an inorganic nanotube, or a metal nanotube can be used, for example.

For each of the insulating layer 5265, the insulating layer 5267, the insulating layer 5269, the insulating layer 5305, and the insulating layer 5358, an insulating layer having a single-layer structure or a layered structure, or the like can be used, for example. For example, as the insulating layer, an insulating film containing oxygen or nitrogen, such as silicon oxide ($SiO_x$), silicon nitride ($SiN_x$), silicon oxynitride ($SiO_xN_y$) (x>y>0), or silicon nitride oxide ($SiN_xO_y$) (x>y>0); a film containing carbon such as diamond-like carbon (DLC); an organic material such as a siloxane resin, epoxy, polyimide, polyamide, polyvinyl phenol, benzocyclobutene, or acrylic; or the like can be used.

For the light-emitting layer 5270, an organic EL element, an inorganic EL element, or the like can be used, for example. For the organic EL element, for example, a single-layer structure or a layered structure of a hole injection layer formed using a hole injection material, a hole transport layer formed using a hole transport material, a light-emitting layer formed using a light-emitting material, an electron transport layer formed using an electron transport material, an electron injection layer formed using an electron injection material, or a layer in which a plurality of these materials are mixed can be used.

As an example of liquid crystal layer 5307 or an example of materials which can be applied to the liquid crystal layer 5307, the following liquid crystals can be used: a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a PDLC (polymer dispersed liquid crystal), a ferroelectric liquid crystal, an anti-ferroelectric liquid crystal, a main chain type liquid crystal, a side chain type polymer liquid crystal, a plasma addressed liquid crystal (PALC), or a banana-shaped liquid crystal. As an example of a liquid crystal mode which can be applied to a liquid crystal element including the liquid crystal layer 5307, the following liquid crystal mode can be employed: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue-phase mode.

Note that an insulating layer which serves as an alignment film, an insulating layer which serves as a protrusion portion, or the like can be formed over the insulating layer 5305 and the conductive layer 5306.

Note that an insulating layer or the like which serves as a color filter, a black matrix, or a protrusion portion can be formed over the conductive layer 5308. An insulating layer which serves as an alignment film can be formed below the conductive layer 5308.

The transistor in this embodiment can be applied to Embodiments 1 to 6. In particular, in FIG. 32B, when an amorphous semiconductor, a microcrystalline semiconductor, an organic semiconductor, an oxide semiconductor, or the like is used for a semiconductor layer, the transistor sometimes deteriorates. Therefore, if the transistor in this embodiment is used for a semiconductor device, a shift register or a display device, the lifetime of the semiconductor device, the shift register, or the display device becomes shorter. However, degradation of the transistor can be suppressed in any of the semiconductor devices, shift registers, or display devices in Embodiments 1 to 6. Therefore, by application of the transistor in this embodiment to the semiconductor device, the shift register, or the display device in Embodiments 1 to 6, the lifetime thereof can be made longer.

Embodiment 8

In this embodiment, examples of cross-sectional structures of a display device are described with reference to FIGS. 33A to 33C. Here, a liquid crystal display device is described, for example.

Figure 33A:
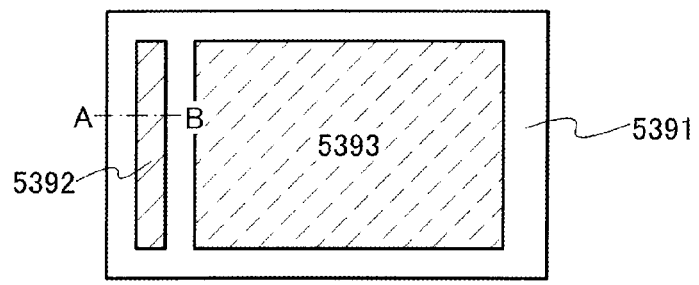
FIG. 33A is an example of a top view of a display device and FIGS. 33B and 33C are examples of cross-sectional views of a display device in Embodiment 8.

FIG. 33A illustrates an example of a top view of a display device. A driver circuit 5392 and a pixel portion 5393 are formed over a substrate 5391. An example of the driver circuit 5392 is a scan line driver circuit, a signal line driver circuit, or the like. The pixel portion 5393 includes a pixel, and the pixel is controlled by the driver circuit 5392. For example in the case of a liquid crystal display device, a voltage which is applied to a liquid crystal element is set by an output signal of the driver circuit 5392.

Figure 33B:
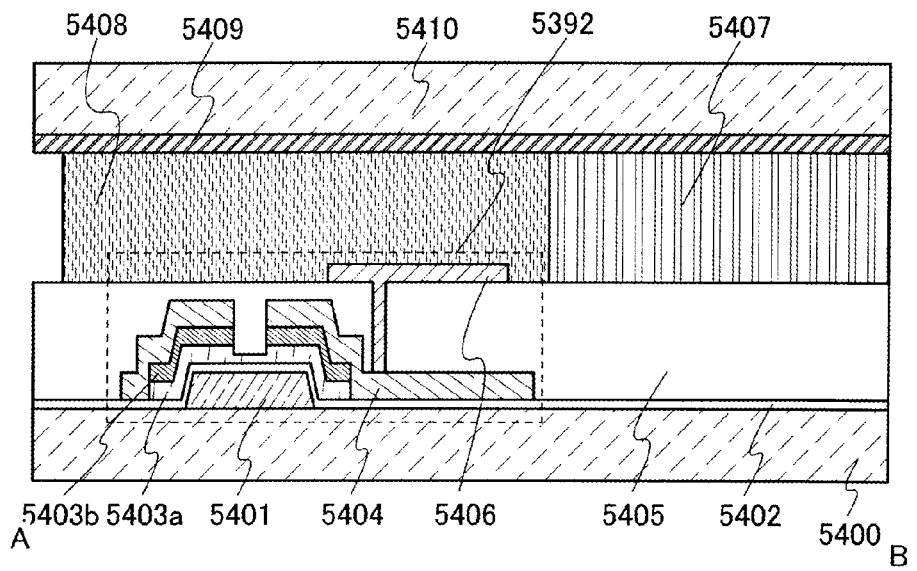

FIG. 33B illustrates an example of a cross section taken along line A-B in FIG. 33A. FIG. 33B illustrates a substrate 5400, a conductive layer 5401 formed over the substrate 5400, an insulating layer 5402 formed so as to cover the conductive layer 5401, a semiconductor layer 5403a formed over the conductive layer 5401 and the insulating layer 5402, a semiconductor layer 5403b formed over the semiconductor layer 5403a, a conductive layer 5404 formed over the semiconductor layer 5403b and the insulating layer 5402, an insulating layer 5405 which is formed over the insulating layer 5402 and the conductive layer 5404 and is provided with an opening portion, a conductive layer 5406 formed over the insulating layer 5405 and in the opening portion in the insulating layer 5405, an insulating layer 5408 provided over the insulating layer 5405 and the conductive layer 5406, a liquid crystal layer 5407 formed over the insulating layer 5405, a conductive layer 5409 formed over the liquid crystal layer 5407 and the insulating layer 5408, and a substrate 5410 provided over the conductive layer 5409.

The conductive layer 5401 can serve as a gate electrode. The insulating layer 5402 can serve as a gate insulating film. The conductive layer 5404 can serve as a wiring, an electrode of a transistor, an electrode of a capacitor, or the like. The insulating layer 5405 can serve as an interlayer film or a planarization film. The conductive layer 5406 can serve as a wiring, a pixel electrode, or a reflective electrode. The insulating layer 5408 can serve as a sealant. The conductive layer 5409 can serve as a counter electrode or a common electrode.

Here, parasitic capacitance is generated between the driver circuit 5392 and the conductive layer 5409 in some cases. Accordingly, an output signal from the driver circuit 5392 or a voltage of each node is distorted or delayed, or power consumption is increased. However, when the insulating layer 5408 which can serve as the sealant is formed over the driver circuit 5392 as illustrated in FIG. 33B, parasitic capacitance generated between the driver circuit 5392 and the conductive layer 5409 can be reduced. This is because the dielectric constant of the sealant is often lower than the dielectric constant of the liquid crystal layer. Therefore, distortion or delay of the output signal from the driver circuit 5392 or the voltage of each node can be reduced. Alternatively, power consumption of the driver circuit 5392 can be reduced.

Figure 33C:
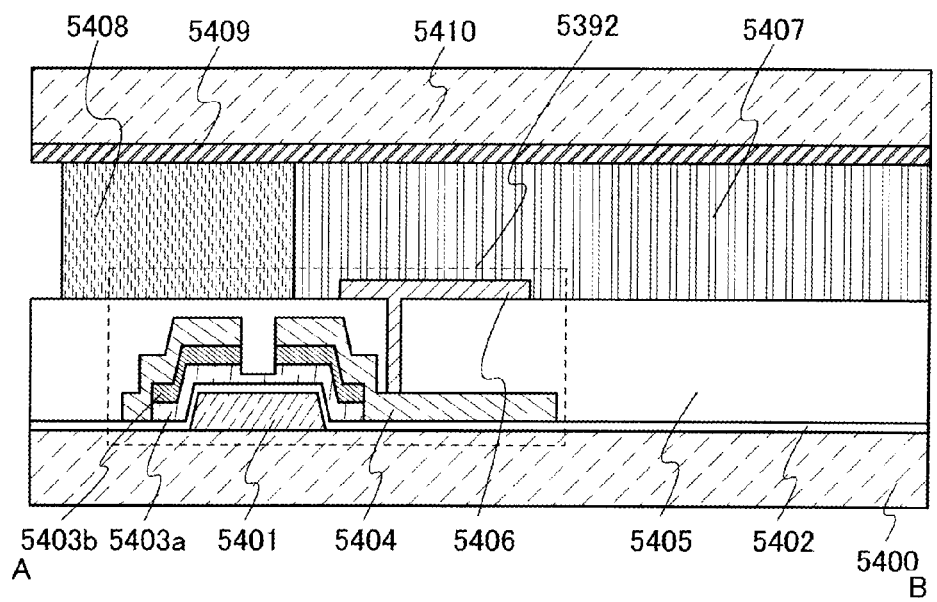

Note that as illustrated in FIG. 33C, the insulating layer 5408 which can serve as the sealant can be formed over part of the driver circuit 5392. Also in such a case, parasitic capacitance generated between the driver circuit 5392 and the conductive layer 5409 can be reduced. Thus, distortion or delay of the output signal from the driver circuit 5392 or the voltage of each node can be reduced. Note that this embodiment is not limited to this. It is possible not to form the insulating layer 5408, which can serve as the sealant, over the driver circuit 5392.

Note that a display element is not limited to a liquid crystal element, and a variety of display elements such as an EL element or an electrophoretic element can be used.

As above, this embodiment describes an example of a cross-sectional structure of a display device. Such a structure can be combined with the semiconductor device or the shift register in Embodiment 1 to 5. For example, in the case where an amorphous semiconductor, a microcrystalline semiconductor, an organic semiconductor, an oxide semiconductor, or the like is used for a semiconductor layer of a transistor, the channel width of the transistor is increased in many cases. However, by reducing parasitic capacitance of the driver circuit as in this embodiment, the channel width of the transistor can be decreased. Thus, a layout area can be reduced, so that the frame of the display device can be reduced. Alternatively, the display device can have higher definition.

Embodiment 9

In this embodiment, an example of a manufacturing process of a transistor and a capacitor is described. In particular, a manufacturing process when an oxide semiconductor is used for a semiconductor layer is described.

Figure 34A:
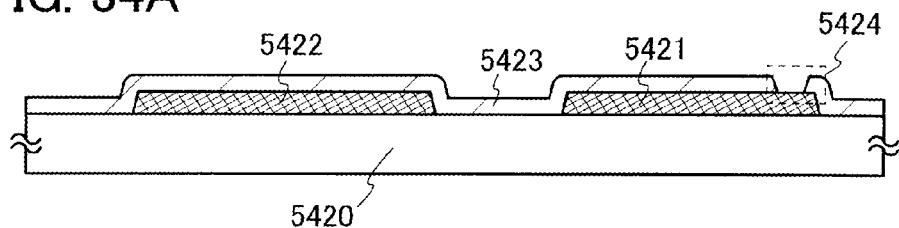
FIGS. 34A to 34E are examples of cross-sectional views illustrating a manufacturing process of a transistor in Embodiment 9.
Figure 34B:
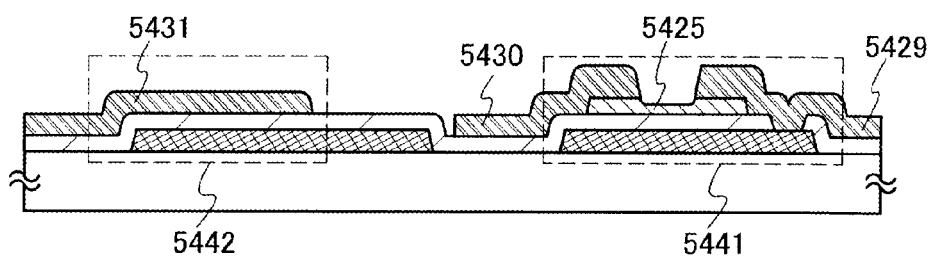
Figure 34C:
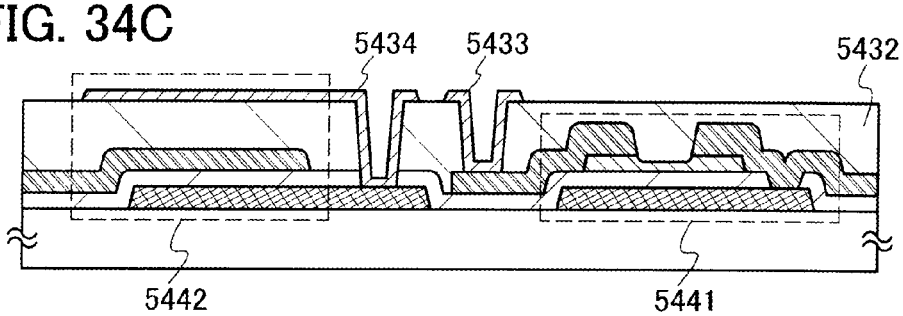

An example of a manufacturing process of a transistor 5441 and a capacitor 5442 is described with reference to FIGS. 34A to 34C. FIGS. 34A to 34C illustrate an example of a manufacturing process of a transistor and a capacitor. The transistor 5441 is an example of an inverted staggered thin film transistor, in which a wiring is provided over an oxide semiconductor layer with a source electrode or a drain electrode therebetween.

First, a first conductive layer is formed over the entire surface of a substrate 5420 by sputtering. Next, the first conductive layer is selectively etched with the use of a resist mask formed through a photolithography process using a first photomask, so that a conductive layer 5421 and a conductive layer 5422 are formed. The conductive layer 5421 can serve as a gate electrode. The conductive layer 5422 can serve as one of electrodes of the capacitor. Note that this embodiment is not limited to this, and each of the conductive layers 5421 and 5422 can include a portion serving as a wiring, a gate electrode, or an electrode of the capacitor. After that, the resist mask is removed.

Next, an insulating layer 5423 is formed over the entire surface of the substrate 5420 with the conductive layers 5421 and 5422 therebetween by plasma-enhanced CVD or sputtering. The insulating layer 5423 can serve as a gate insulating layer and is formed so as to cover the conductive layers 5421 and 5422. Note that the thickness of the insulating layer 5423 is often 50 to 250 nm.

Next, the insulating layer 5423 is selectively etched with the use of a resist mask formed through a photolithography process using a second photomask, so that a contact hole 5424 which reaches the conductive layer 5421 is formed. Then, the resist mask is removed. Note that this embodiment is not limited to this, and the contact hole 5424 can be eliminated. Alternatively, the contact hole 5424 can be formed after an oxide semiconductor layer is formed. A cross-sectional view of the steps so far corresponds to FIG. 34A.

Next, an oxide semiconductor layer is formed over the entire surface by sputtering. Note that this embodiment is not limited to this, and it is possible to form the oxide semiconductor layer by sputtering and to form a buffer layer (e.g., an $n^+$ layer) thereover. Note that the thickness of the oxide semiconductor layer is often 5 to 200 nm.

Next, the oxide semiconductor layer is selectively etched using a resist mask formed through a photolithography process using a third photomask. After that, the resist mask is removed.

Next, a second conductive layer is formed over the entire surface by sputtering. Then, the second conductive layer is selectively etched with the use of a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can serve as the source electrode and the drain electrode. The conductive layer 5431 can serve as the other of the electrodes of the capacitor. Note that this embodiment is not limited to this, and each of the conductive layers 5429, 5430, and 5431 can include a portion serving as a wiring, the source electrode, the drain electrode, or the electrode of the capacitor.

Note that if heat treatment (e.g., at 200° C. to 600° C.) is performed in a subsequent step, the second conductive layer preferably has heat resistance high enough to withstand the heat treatment. Accordingly, for the second conductive layer, Al and a conductive material with a high heat resistance (e.g., an element such as Ti, Ta, W, Mo, Cr, Nd, Sc, Zr, or Ce; an alloy in which these elements are combined; or nitride containing any of these elements) are preferably used in combination. Note that this embodiment is not limited thereto, and by employing a layered structure, the second conductive layer can have a high heat resistance. For example, it is possible to provide a conductive material with a high heat resistance such as Ti or Mo above and below an Al film.

Note that at the time of etching the second conductive layer, part of the oxide semiconductor layer is also etched, so that an oxide semiconductor layer 5425 is formed. By this etching, part of the oxide semiconductor layer 5425, which overlaps with the conductive layer 5421, or part of the oxide semiconductor layer 5425, over which the second conductive layer is not formed, is etched to be thinned in many cases. Note that this embodiment is not limited thereto, and it is possible not to etch the oxide semiconductor layer 5425. However, in the case where the n$^+$ layer is formed over the oxide semiconductor layer 5425, the oxide semiconductor layer 5425 is often etched. Then, the resist mask is removed. The transistor 5441 and the capacitor 5442 are completed when this etching is finished. A cross-sectional view of the steps so far corresponds to FIG. 34B.

Next, heat treatment is performed at 200 to 600° C. in an air atmosphere or a nitrogen atmosphere. Through this heat treatment, rearrangement at the atomic level occurs in the oxide semiconductor layer 5425. In this manner, through heat treatment (including light annealing), strain which inhibits carrier movement is released. Note that there is no particular limitation to timing at which the heat treatment is performed, and the heat treatment can be performed at any time after the oxide semiconductor film is formed.

Next, an insulating layer 5432 is formed over the entire surface. The insulating layer 5432 can have either a single-layer structure or a layered structure. For example, in the case where an organic insulating layer is used as the insulating layer 5432, the organic insulating layer is formed in such a manner that a composition which is a material for the organic insulating layer is applied and subjected to heat treatment at 200 to 600° C. in an air atmosphere or a nitrogen atmosphere. By forming the organic insulating layer which is in contact with the oxide semiconductor layer 5425 in this manner, a highly reliable thin film transistor can be manufactured. Note that in the case where an organic insulating layer is used as the insulating layer 5432, a silicon nitride film or a silicon oxide film can be provided below the organic insulating layer.

FIG. 34C illustrates a mode in which the insulating layer 5432 is formed using a non-photosensitive resin, so that an end portion of the insulating layer 5432 is angular in the cross section of a region where the contact hole is formed. However, when the insulating layer 5432 is formed using a photosensitive resin, the end portion of the insulating layer 5432 can be curved in the cross section of the region where the contact hole is formed. Thus, the coverage of the insulating layer 5432 with a third conductive layer or a pixel electrode which is formed later is increased.

Note that instead of application of the composition, the following method can be used depending on the material: dip coating, spray coating, an ink-jet method, a printing method, a doctor knife, a roll coater, a curtain coater, a knife coater, or the like.

Note that without performing the heat treatment after the oxide semiconductor layer is formed, the heat treatment for the composition, which is the material for the organic insulating layer, can also serve to heat the oxide semiconductor layer 5425.

Note that the insulating layer 5432 can be formed to a thickness of 200 nm to 5 µm, preferably 300 nm to 1 µm.

Next, a third conductive layer is formed over the entire surface. Then, the third conductive layer is selectively etched with the use of a resist mask formed through a photolithography process using a fifth photomask, so that a conductive layer 5433 and a conductive layer 5434 are formed. A cross-sectional view of the steps so far corresponds to FIG. 34C. Each of the conductive layers 5433 and 5434 can serve as a wiring, a pixel electrode, a reflective electrode, a light-transmitting electrode, or the electrode of the capacitor. In particular, since the conductive layer 5434 is connected to the conductive layer 5422, the conductive layer 5434 can serve as the electrode of the capacitor 5442. Note that this embodiment is not limited to this, and the conductive layers 5433 and 5434 can have a function of connecting a conductive layer formed using the first conductive layer and a conductive layer formed using the second conductive layer to each other. For example, by connecting the conductive layers 5433 and 5434 to each other, the conductive layer 5422 and the conductive layer 5430 can be connected to each other through the third conductive layer (the conductive layers 5433 and 5434).

Since the capacitor 5442 has a structure where the conductive layer 5431 is sandwiched between the conductive layers 5422 and 5434, the capacitance value of the capacitor 5442 can be increased. Note that this embodiment is not limited thereto, and one of the conductive layers 5422 and 5434 can be eliminated.

Note that after the resist mask is removed by wet etching, it is possible to perform heat treatment at 200° C. to 600° C. in an air atmosphere or a nitrogen atmosphere.

Through the above steps, the transistor 5441 and the capacitor 5442 can be manufactured.

Figure 34D:
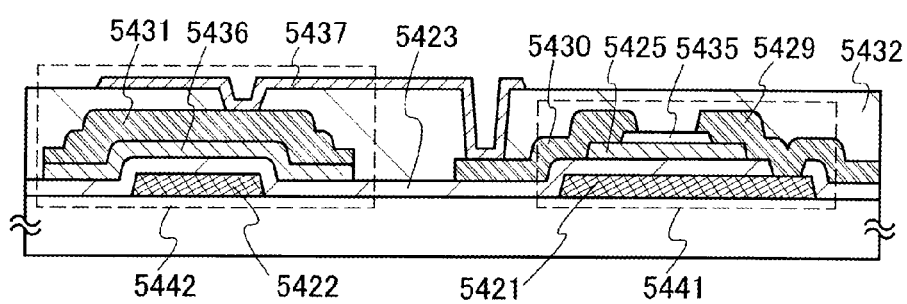

Note that as shown in FIG. 34D, an insulating layer 5435 can be formed over the oxide semiconductor layer 5425. The insulating layer 5435 has a function of preventing the oxide semiconductor layer 5425 from being etched when the second conductive layer is patterned, and functions as a channel stop film. Accordingly, the thickness of the oxide semiconductor layer 5425 can be reduced, so that reduction in driving a voltage, reduction in off-state current, increase in the on/off ratio of drain current, improvement in subthreshold swing (S value), or the like of the transistor can be achieved. The insulating layer 5435 can be formed in such a manner that an oxide semiconductor layer and an insulating layer are successively formed over the entire surface, and then, the insulating layer is selectively patterned using a resist mask formed through a photolithography process using a photomask. After that, the second conductive layer is formed over the entire surface, and the oxide semiconductor layer is patterned at the same time as the second conductive layer. That is, the oxide semiconductor layer and the second conductive layer can be patterned using the same mask (reticle). In that case, the oxide semiconductor layer is always placed below the second conductive layer. In such a manner, the insulating layer 5435 can be formed without increase in the number of steps. The oxide semiconductor layer is often formed below the second conductive layer in such a manufacturing process. However, this embodiment is not limited thereto. The insulating layer 5435 can be formed in such a manner that after an oxide semiconductor layer is patterned, an insulating layer is formed over the entire surface and is patterned.

In FIG. 34D, the capacitor 5442 has a structure where the insulating layer 5423 and an oxide semiconductor layer 5436 are sandwiched between the conductive layers 5422 and 5431. Note that the oxide semiconductor layer 5436 can be eliminated. Moreover, the conductive layers 5430 and 5431 are connected through a conductive layer 5437 which is formed by patterning the third conductive layer. Such a structure can be used for a pixel of a liquid crystal display device, for example. For example, the transistor 5441 can function as a switching transistor, and the capacitor 5442 can function as a storage capacitor. Moreover, the conductive layers 5421, 5422, 5429, and 5437 can function as a gate signal line, a capacitor line, a source line, and a pixel electrode, respectively. However, this embodiment is not limited to this. In addition, as in FIG. 34D, the conductive layer 5430 and the conductive layer 5431 can be connected through the third conductive layer in FIG. 34C.

Figure 34E:
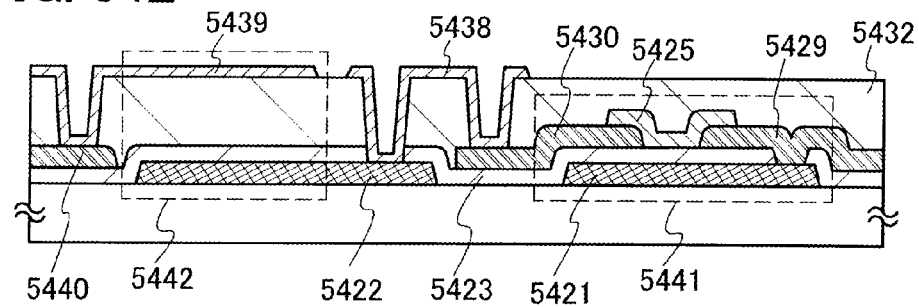

Note that as shown in FIG. 34E, the oxide semiconductor layer 5425 can be formed after the second conductive layer is patterned. Accordingly, the oxide semiconductor is not yet formed when the second conductive layer is patterned, so that the oxide semiconductor layer is not etched. Accordingly, the thickness of the oxide semiconductor layer can be reduced, so that reduction in driving a voltage, reduction in off-state current, increase in the on/off ratio of drain current, improvement in subthreshold swing (S value), or the like of the transistor can be achieved. Note that the oxide semiconductor layer can be formed in such a manner that after the second conductive layer is patterned, an oxide semiconductor layer is formed over the entire surface and selectively patterned using a resist mask formed through a photolithography process using a photomask.

In FIG. 34E, the capacitor 5442 has a structure where the insulating layers 5423 and 5432 are sandwiched between the conductive layer 5422 and a conductive layer 5439 which is formed by patterning the third conductive layer. Moreover, the conductive layers 5422 and 5430 are connected through a conductive layer 5438 which is formed by patterning the third conductive layer. Further, the conductive layer 5439 is connected to a conductive layer 5440 which is formed by patterning the second conductive layer. In addition, as in FIG. 34E, the conductive layers 5430 and 5422 can be connected through the conductive layer 5438 in FIGS. 34C and 37D.

Note that a complete depletion state can be obtained by making the thickness of the oxide semiconductor layer (or a channel layer) smaller than or equal to that of a depletion layer formed in the case where the transistor is off. Accordingly, the off-state current can be reduced. In order to achieve this, the thickness of the oxide semiconductor layer 5425 is preferably less than or equal to 20 nm. It is more preferable that the thickness of the oxide semiconductor layer 5425 be less than or equal to 10 nm. It is further preferable that the thickness of the oxide semiconductor layer 5425 be less than or equal to 6 nm.

Note that in order to realize reduction in operation a voltage, reduction in off-state current, increase in the on/off ratio of drain current, improvement in S value, or the like of the transistor, the thickness of the oxide semiconductor layer is preferably the smallest among those of the layers included in the transistor. For example, the thickness of the oxide semiconductor layer is preferably smaller than that of the insulating layer 5423. It is more preferable that the thickness of the oxide semiconductor layer be less than or equal to ½ of the thickness of the insulating layer 5423. It is further preferable that the thickness of the oxide semiconductor layer be less than or equal to ⅕ of the thickness of the insulating layer 5423. It is further preferable that the thickness of the oxide semiconductor layer be less than or equal to ¹⁄₁₀ of the thickness of the insulating layer 5423. Note that this embodiment is not limited thereto, and the thickness of the oxide semiconductor layer can be larger than that of the insulating layer 5423 in order to improve the reliability. Since the thickness of the oxide semiconductor layer is preferably larger particularly in the case where the oxide semiconductor layer is etched as in FIG. 34C, it is possible to make the thickness of the oxide semiconductor layer larger than that of the insulating layer 5423.

Note that the thickness of the insulating layer 5423 is preferably larger than that of the first conductive layer in order to increase the withstand a voltage of the transistor. It is more preferable that the thickness of the oxide semiconductor layer 5423 be more than or equal to 5/4 of the thickness of the insulating layer 5423. It is further preferable that the thickness of the oxide semiconductor layer 5423 be more than or equal to 4/3 of the thickness of the insulating layer 5423. Note that this embodiment is not limited thereto, and the thickness of the insulating layer 5423 can be smaller than that of the first conductive layer in order to increase the mobility of the transistor.

Note that for the substrate, the insulating layer, the conductive layer, and the semiconductor layer in this embodiment, the materials described in the other embodiments (e.g., Embodiment 7) or materials which are similar to those described in this specification can be used.

When the transistor in this embodiment is used in any of the semiconductor devices, shift registers, or display devices in Embodiments 1 to 5, the size of a display portion can be increased. Alternatively, the display portion can have higher definition.

Embodiment 10

In this embodiment, a layout view (hereinafter also referred to as a top view) of a shift register will be described. In this embodiment, as an example, a layout view of the shift register described in Embodiment 4 will be described. Note that a content described in this embodiment can be applied to any of the semiconductor devices, shift registers, or display devices in Embodiments 1 to 6 in addition to the shift register in Embodiment 4. Note that the layout view in this embodiment is one example and does not limit this embodiment.

Figure 35:
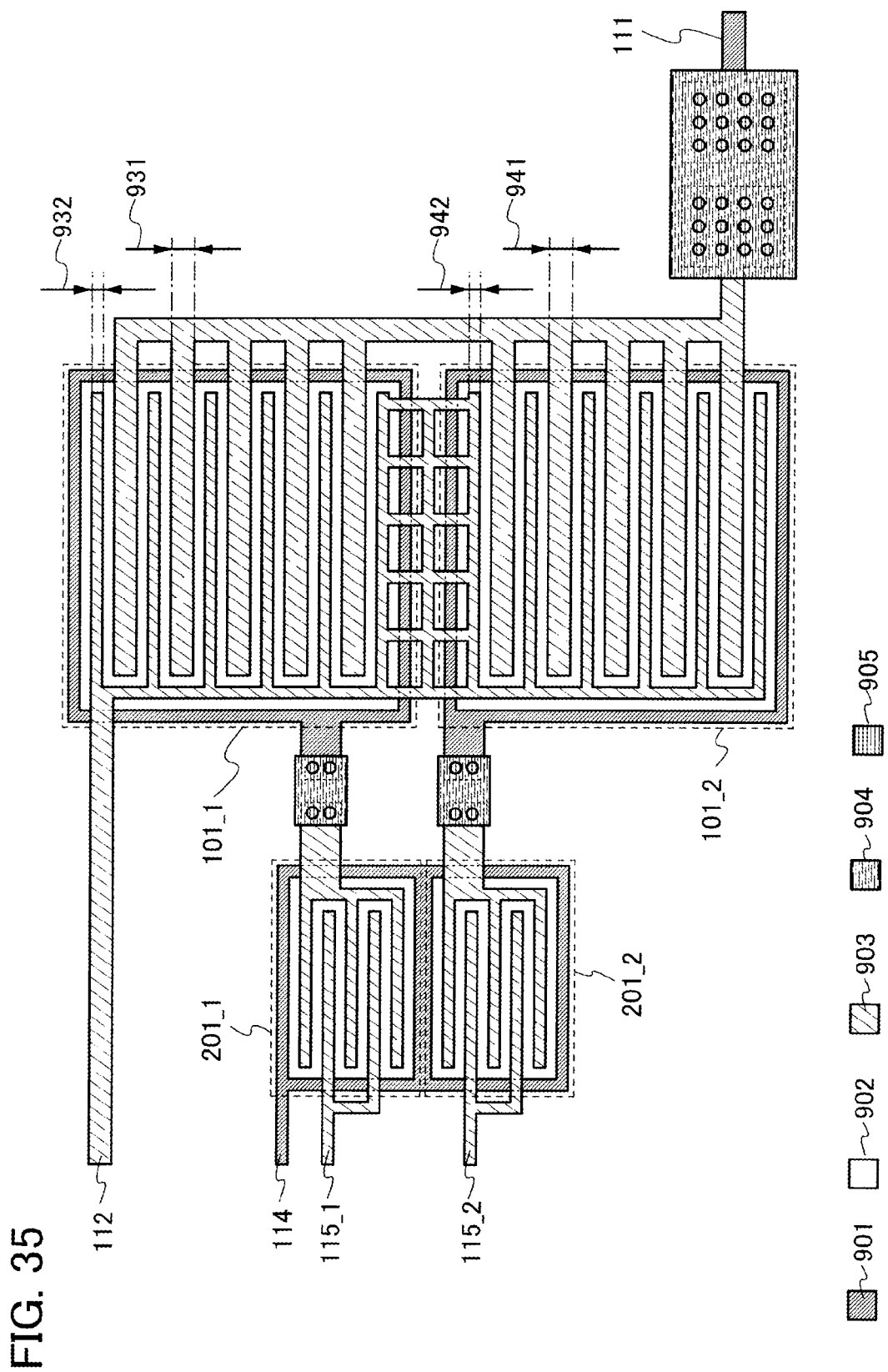
FIG. 35 is an example of a layout diagram of a semiconductor device in Embodiment 10.

The layout view in this embodiment is described with reference to FIG. 35. FIG. 35 illustrates an example of a layout view of the shift register shown in FIG. 9A. Note that a hatching pattern on the right portion of FIG. 35 is a hatching pattern of component elements of reference numerals given to each hatching pattern.

A transistor, a wiring, and the like illustrated in FIG. 35 include a conductive layer 901, a semiconductor layer 902, a conductive layer 903, a conductive layer 904, and a contact hole 905. Note that this embodiment is not limited thereto. A different conductive layer, insulating film, or contact hole can be additionally formed. For example, a contact hole which connects the conductive layer 901 to the conductive layer 903 can be additionally provided.

The conductive layer 901 can include a portion which functions as a gate electrode or a wiring. The semiconductor layer 902 can include a portion which functions as a semiconductor layer of the transistor. The conductive layer 903 can include a portion which functions as a wiring or a source electrode or drain electrode. The conductive layer 904 can include a portion which functions as a light-transmitting electrode, a pixel electrode, or a wiring. The contact hole 905 has a function of connecting the conductive layer 901 and the conductive layer 904 or a function of connecting the conductive layer 903 and the conductive layer 904.

In this embodiment, in the transistor 101_1, the transistor 101_2, the transistor 201_1, and/or the transistor 202_2, the area where the conductive layer 903 which functions as a second terminal and the conductive layer 901 overlap is preferably smaller than the area where the conductive layer 903 which functions as a first terminal and the conductive layer 901 overlap. In this manner, since concentration of an electric field on the second terminal can be suppressed, deterioration of the transistor or the breakdown of the transistor can be suppressed. However, this embodiment is not limited to this example. The area where the conductive layer 903 which functions as the second terminal and the conductive layer 901 overlap can be larger than the area where the conductive layer 903 which functions as the first terminal and the conductive layer 901 overlap.

Note that the semiconductor layer 902 can be provided in a portion where the conductive layer 901 and the conductive layer 903 overlap with each other. Accordingly, the parasitic capacitance between the conductive layer 901 and the conductive layer 903 can be reduced, whereby reduction in noise can be achieved. For a similar reason, the semiconductor layer 902 can be provided in a portion where the conductive layer 903 and the conductive layer 904 overlap with each other.

Note that the conductive layer 904 can be formed over part of the conductive layer 901 and can be connected to the conductive layer 901 through the contact hole 905. Accordingly, wiring resistance can be reduced. Alternatively, the conductive layers 903 and 904 can be formed over part of the conductive layer 901, so that the conductive layer 901 can be connected to the conductive layer 904 through the contact hole 905 and the conductive layer 903 can be connected to the conductive layer 904 through the different contact hole 905. Accordingly, wiring resistance can be reduced.

Note that the conductive layer 904 can be formed over part of the conductive layer 903, so that the conductive layer 903 can be connected to the conductive layer 904 through the contact hole 905. Accordingly, wiring resistance can be reduced.

Note that the conductive layer 901 or the conductive layer 903 can be formed below part of the conductive layer 904, so that the conductive layer 904 can be connected to the conductive layer 901 or the conductive layer 903 through the contact hole 905. Accordingly, wiring resistance can be reduced.

Note that as has been described above, the parasitic capacitance between the gate and the second terminal of the transistor 101_1 can be higher than the parasitic capacitance between the gate and the first terminal of the transistor 101_1. As shown in FIG. 35, the width of the conductive layer 903 which can function as the first terminal of the transistor 101_1 is referred to as width 931, and the width of the conductive layer 903 which can function as the second terminal of the transistor 101_1 is referred to as width 932. The width 931 can be larger than the width 932. In this manner, the parasitic capacitance between the gate and the second terminal of the transistor 101_1 can be higher than the parasitic capacitance between the gate and the first terminal of the transistor 101_2. However, this embodiment is not limited to this.

Note that as has been described above, the parasitic capacitance between the gate and the second terminal of the transistor 101_2 can be higher than the parasitic capacitance between the gate and the first terminal of the transistor 101_2. As shown in FIG. 35, the width of the conductive layer 903 which can function as the first electrode of the transistor 101_1 is referred to as width 941, and the width of the conductive layer 903 which can function as the second electrode of the transistor 101_2 is referred to as width 942. The width 941 can be larger than the width 942. Accordingly, the parasitic capacitance between the gate and the second terminal of the transistor 101_2 can be higher than the parasitic capacitance between the gate and the first terminal of the transistor 101_2. However, this embodiment is not limited to this.

Embodiment 11

In this embodiment, examples of electronic devices will be described.

FIGS. 36A to 36H and FIGS. 37A to 37D illustrate electronic devices. These electronic devices can include a housing 5000, a display portion 5001, a speaker 5003, an LED lamp 5004, operation keys 5005 (including an operation switch for controlling the operation of a display device, or a power switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, a voltage, electric power, radiation, flow rate, humidity, gradient, oscillation, odor, or infrared ray), a microphone 5008, and the like.

Figure 36A:
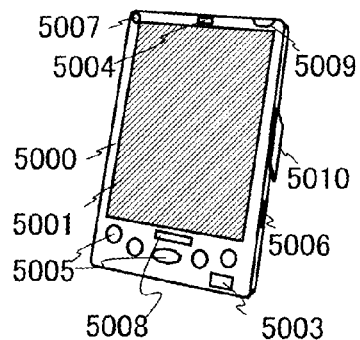
FIGS. 36A to 36H are examples of diagrams illustrating electronic devices in Embodiment 11.
Figure 36B:
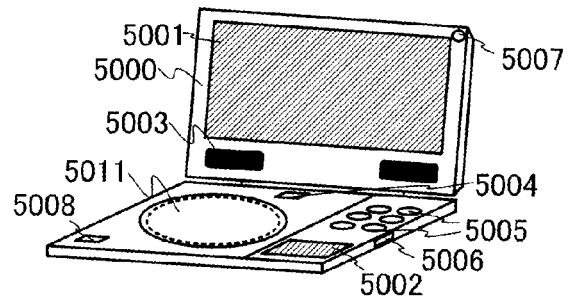
Figure 36C:
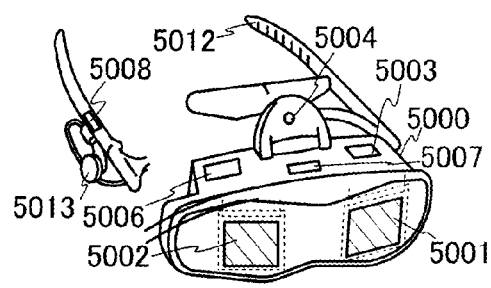
Figure 36D:
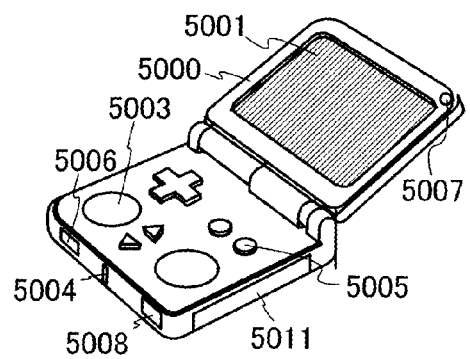
Figure 36E:
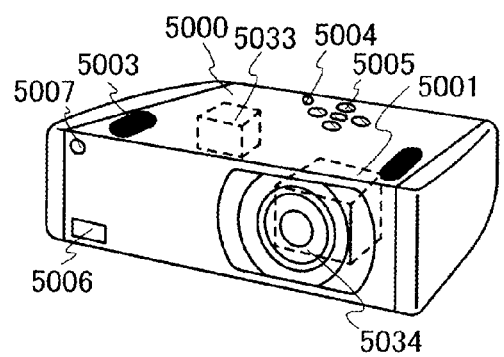
Figure 36F:
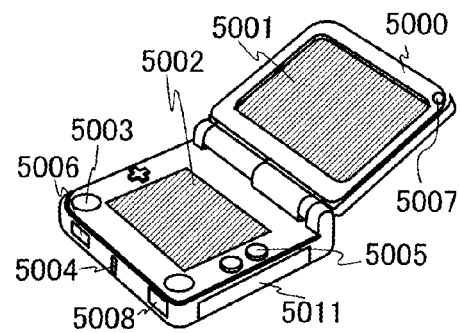
Figure 36G:
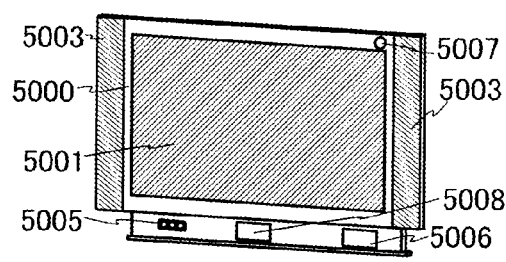
Figure 36H:
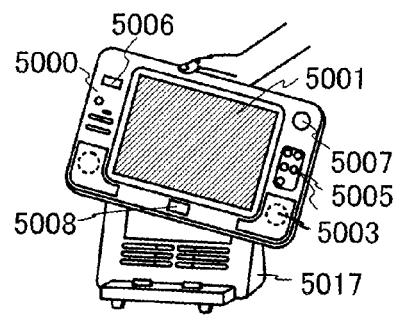
Figure 37A:
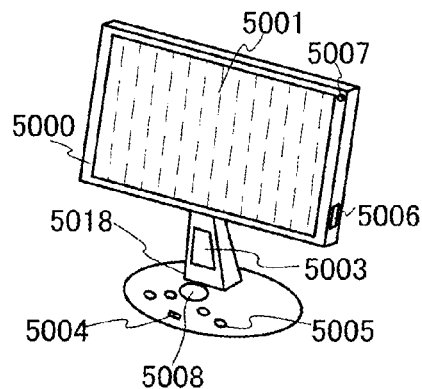
FIGS. 37A to 37H are examples of diagrams illustrating electronic devices in Embodiment 11.
Figure 37B:
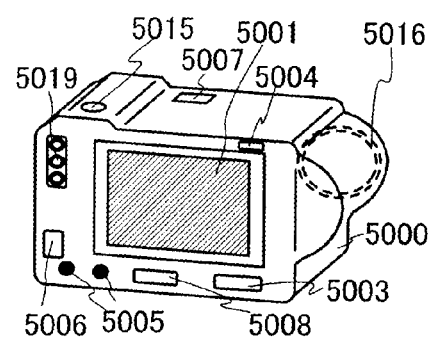
Figure 37C:
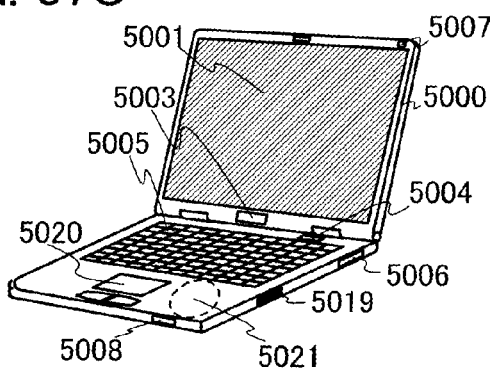
Figure 37D:
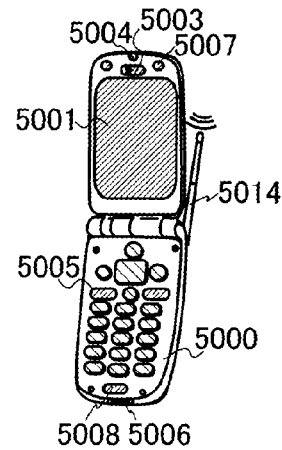

FIG. 36A illustrates a mobile computer, which can include a switch 5009, an infrared port 5010, and the like in addition to the above objects. FIG. 36B illustrates a portable image regenerating device provided with a memory medium (e.g., a DVD regenerating device), which can include a second display portion 5002, a memory medium reading portion 5011, and the like in addition to the above objects. FIG. 36C illustrates a goggle-type display, which can include the second display portion 5002, a support portion 5012, an earphone 5013, and the like in addition to the above objects. FIG. 36D illustrates a portable game machine, which can include the memory medium reading portion 5011 and the like in addition to the above objects. FIG. 36E illustrates a projector, which can include a light source 5033, a projector lens 5034, and the like in addition to the above objects. FIG. 36F illustrates a portable game machine, which can include the second display portion 5002, the memory medium reading portion 5011, and the like in addition to the above objects. FIG. 36G illustrates a television receiver, which can include a tuner, an image processing portion, and the like in addition to the above objects. FIG. 36H illustrates a portable television receiver, which can include a charger 5017 capable of transmitting and receiving signals and the like in addition to the above objects. FIG. 37A illustrates a display, which can include a support base 5018 and the like in addition to the above objects. FIG. 37B illustrates a camera, which can include an external connecting port 5019, a shutter button 5015, an image receiving portion 5016, and the like in addition to the above objects. FIG. 37C illustrates a computer, which can include a pointing device 5020, the external connecting port 5019, a reader/writer 5021, and the like in addition to the above objects. FIG. 37D illustrates a mobile phone, which can include an antenna 5014, a tuner of one-segment (1seg digital TV broadcasts) partial reception service for mobile phones and mobile terminals, and the like in addition to the above objects.

The electronic devices illustrated in FIGS. 36A to 36H and FIGS. 37A to 37D can have a variety of other functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 36A to 36H and FIGS. 37A to 37D are not limited them, and the electronic devices can have a variety of other functions.

The electronic devices described in this embodiment each include the display portion for displaying some sort of information. By a combination of the electronic device in this embodiment and the semiconductor device, shift register, or display device in Embodiments 1 to 5, improvement in reliability, improvement in yield, reduction in cost, increase in the size of the display portion, increase in the definition of the display portion, or the like can be achieved.

Next, applications of a semiconductor device will be described.

Figure 37E:
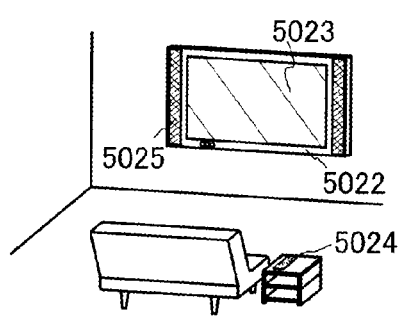

FIG. 37E illustrates an example in which a semiconductor device is incorporated in a building structure. FIG. 37E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 37F:
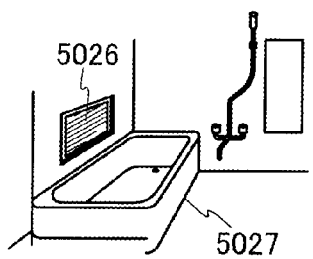

FIG. 37F illustrates another example in which a semiconductor device is incorporated in a building structure. A display panel 5026 is incorporated in a prefabricated bath unit 5027, so that a bather can view the display panel 5026.

Note that although this embodiment describes the wall and the prefabricated bath are given as examples of the building structures, this embodiment is not limited to them. The semiconductor devices can be provided in a variety of building structures.

Next, examples in which semiconductor devices are incorporated in moving objects are described.

Figure 37G:
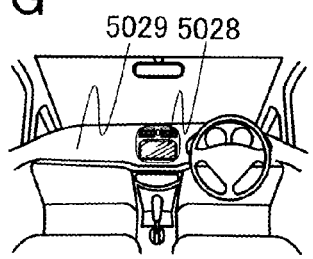

FIG. 37G illustrates an example in which a semiconductor device is incorporated in a car. A display panel 5028 is incorporated in a car body 5029 of the car and can display information related to the operation of the car or information inputted from inside or outside of the car on demand. Note that the display panel 5028 may have a navigation function.

Figure 37H:
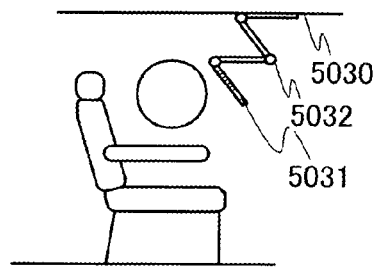

FIG. 37H illustrates an example in which a semiconductor device is incorporated in a passenger airplane. FIG. 37H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

This application is based on Japanese Patent Application serial no. 2009-077203 filed with Japan Patent Office on Mar. 26, 2009, the entire contents of which are hereby incorporated by reference.

What is claimed is:
1. A semiconductor device comprising:
a first wiring configured to be inputted a first input signal;
a second wiring configured to be inputted a second input signal;
a third wiring configured to be inputted a third input signal;
a fourth wiring;
a first transistor including a gate, a source and a drain;
a second transistor including a gate, a source and a drain;
a third transistor including a gate, a source and a drain;
a fourth transistor including a gate, a source and a drain;
a fifth transistor including a gate, a source and a drain; and
a sixth transistor including a gate, a source and a drain,
wherein one of the source and the drain of the fifth transistor is electrically connected to the first wiring;
wherein one of the source and the drain of the sixth transistor is electrically connected to the first wiring;
wherein the gate and one of the source and the drain of the first transistor are electrically connected to the other of the source and the drain of the fifth transistor,
wherein the gate and one of the source and the drain of the second transistor are electrically connected to the other of the source and the drain of the sixth transistor,
wherein the gate of the third transistor is electrically connected to the other of the source and the drain of the first transistor,
wherein one of the source and the drain of the third transistor are electrically connected to the second wiring,
wherein the gate of the fourth transistor is electrically connected to the other of the source and the drain of the second transistor,
wherein one of the source and the drain of the fourth transistor is electrically connected to the third wiring,
wherein the fourth wiring is electrically connected to the other of the source and the drain of the third transistor and the other of the source and the drain of the fourth transistor, and
wherein a voltage which is given to the fourth wiring is a voltage of an output signal.

2. A semiconductor device according to claim 1, wherein a channel width of the first transistor is equal to a channel width of the second transistor.

3. A semiconductor device according to claim 1, wherein a channel width of the third transistor is equal to a channel width of the fourth transistor.

4. A semiconductor device according to claim 1,
wherein a channel width of the first transistor is smaller than a channel width of the third transistor, and
wherein a channel width of the second transistor is smaller than a channel width of the fourth transistor.

5. An electronic device comprising a semiconductor device according to claim 1 and an operation switch controlling an operation of the semiconductor device.

6. A semiconductor device comprising:
a first wiring configured to be inputted a first input signal;
a second wiring configured to be inputted a second input signal;
a third wiring;
a first transistor including a gate, a source and a drain;
a second transistor including a gate, a source and a drain;
a third transistor including a gate, a source and a drain; and
a fourth transistor including a gate, a source and a drain,
wherein the gate and one of the source and the drain of the first transistor are electrically connected to the first wiring,
wherein the gate and one of the source and the drain of the second transistor are electrically connected to the second wiring,
wherein the gate and one of the source and the drain of the third transistor are electrically connected to the other of the source and the drain of the first transistor, wherein the gate and one of the source and the drain of the fourth transistor are electrically connected to the other of the source and the drain of the second transistor, wherein the third wiring is electrically connected to the other of the source and the drain of the third transistor and the other of the source and the drain of the fourth transistor, and wherein a voltage which is given to the third wiring is a voltage of an output signal.

7. A semiconductor device according to claim 6, wherein a channel width of the first transistor is equal to a channel width of the second transistor.

8. A semiconductor device according to claim 6, wherein a channel width of the third transistor is equal to a channel width of the fourth transistor.

9. A semiconductor device according to claim 6,
wherein a channel width of the first transistor is smaller than a channel width of the third transistor, and
wherein a channel width of the second transistor is smaller than a channel width of the fourth transistor.

10. An electronic device comprising a semiconductor device according to claim 6 and an operation switch controlling an operation of the semiconductor device.

11. A semiconductor device comprising:
a first wiring configured to be inputted a first input signal;
a second wiring configured to be inputted a second input signal;
a third wiring;
a first transistor including a gate, a source and a drain;
a second transistor including a gate, a source and a drain;
a first diode including a positive electrode and a negative electrode; and
a second diode including a positive electrode and a negative electrode,
wherein the gate and one of the source and the drain of the first transistor are electrically connected to the first wiring,
wherein the gate and one of the source and the drain of the second transistor are electrically connected to the second wiring,
wherein the positive electrode of the first diode is electrically connected to the other of the source and the drain of the first transistor,
wherein the positive electrode of the second diode is electrically connected to the other of the source and the drain of the second transistor,
wherein the third wiring is electrically connected to the negative electrode of the first diode and the negative electrode of the second diode, and
wherein a voltage which is given to the third wiring is a voltage of an output signal.

12. A semiconductor device according to claim 11, wherein a channel width of the first transistor is equal to a channel width of the second transistor.

13. An electronic device comprising a semiconductor device according to claim 11 and an operation switch controlling an operation of the semiconductor device.

14. A semiconductor device comprising:
a shift register comprising a flip-flop circuit comprising:
a first transistor including a gate, a source and a drain;
a second transistor including a gate, a source and a drain;
a third transistor including a gate, a source and a drain;
a fourth transistor including a gate, a source and a drain;
a fifth transistor including a gate, a source and a drain;
a sixth transistor including a gate, a source and a drain; and
a seventh transistor including a gate, a source and a drain,
wherein one of the source and the drain of the first transistor is electrically connected to a first input terminal,
wherein one of the source and the drain of the second transistor is electrically connected to a second input terminal,
wherein the gate of the first transistor is electrically connected to the one of the source and the drain of the first transistor,
wherein the gate of the second transistor is electrically connected to the one of the source and the drain of the second transistor,
wherein the gate of the third transistor is electrically connected to the other of the source and the drain of the first transistor,
wherein the gate of the fourth transistor is electrically connected to the other of the source and the drain of the second transistor,
wherein one of the source and the drain of the third transistor is electrically connected to a first line,
wherein one of the source and the drain of the fourth transistor is electrically connected to the first line,
wherein the other of the source and the drain of the third transistor is electrically connected to an output terminal,
wherein the other of the source and the drain of the fourth transistor is electrically connected to the output terminal,
wherein the gate of the fifth transistor is electrically connected to a third input terminal,
wherein the gate of the sixth transistor is electrically connected to the third input terminal,
wherein the gate of the seventh transistor is electrically connected to the third input terminal,
wherein one of the source and the drain of the fifth transistor is electrically connected to a second line,
wherein one of the source and the drain of the sixth transistor is electrically connected to the second line,
wherein one of the source and the drain of the seventh transistor is electrically connected to the second line,
wherein the other of the source and the drain of the fifth transistor is electrically connected to the gate of the third transistor,
wherein the other of the source and the drain of the sixth transistor is electrically connected to the gate of the fourth transistor, and
wherein the other of the source and the drain of the seventh transistor is electrically connected to the output terminal.

15. A semiconductor device according to claim 14, wherein a channel width of the first transistor is equal to a channel width of the second transistor.

16. A semiconductor device according to claim 14, wherein a channel width of the third transistor is equal to a channel width of the fourth transistor.

17. A semiconductor device according to claim 14,
wherein a channel width of the first transistor is smaller than a channel width of the third transistor, and
wherein a channel width of the second transistor is smaller than a channel width of the fourth transistor.

18. An electronic device comprising a semiconductor device according to claim 14 and an operation switch controlling an operation of the semiconductor device.

* * * * *

UNITED STATES PATENT AND TRADEMARK OFFICE
CERTIFICATE OF CORRECTION

PATENT NO. : 8,664,981 B2  
APPLICATION NO. : 13/661165  
DATED : March 4, 2014  
INVENTOR(S) : Hajime Kimura et al.

Page 1 of 1

It is certified that error appears in the above-identified patent and that said Letters Patent is hereby corrected as shown below:

In the Specification

Column 7, line 53, replace "SOT" with --SOI--;

Column 8, line 2, replace "foamed" with --formed--;

Column 14, line 36, replace "Mpieces" with --*M* pieces--;

Column 28, line 9, replace "refereed" with --referred--;

Column 30, line 57, replace "7011" with --701_1--;

Column 39, line 47, replace "SELL" with --SEL1--;

Column 50, line 60, after "wiring" replace "111" with --113--;

Column 62, line 40, replace "10032" with --1003_2--;

Column 64, line 43, replace "20031" with --2003_1--;

Column 68, line 30, replace "303_*j*" with --3031--;

Column 70, line 4, replace "foamed" with --formed--;

Column 70, line 35, replace "fanned" with --formed--.

Signed and Sealed this  
Twenty-fourth Day of June, 2014

Michelle K. Lee  
*Deputy Director of the United States Patent and Trademark Office*